(12) United States Patent
Yamazaki et al.

(10) Patent No.: US 9,825,179 B2
(45) Date of Patent: Nov. 21, 2017

(54) OXIDE SEMICONDUCTOR, TRANSISTOR, AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masashi Tsubuku, Kasukabe (JP); Masashi Oota, Atsugi (JP); Akihisa Shimomura, Atsugi (JP); Yasumasa Yamane, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/244,041

(22) Filed: Aug. 23, 2016

(65) Prior Publication Data

US 2017/0062620 A1 Mar. 2, 2017

(30) Foreign Application Priority Data

Aug. 28, 2015 (JP) .................................. 2015-168931
Dec. 28, 2015 (JP) .................................. 2015-256922

(Continued)

(51) Int. Cl.
*H01L 29/786* (2006.01)
*H01L 29/06* (2006.01)
(Continued)

(52) U.S. Cl.
CPC .......... *H01L 29/7869* (2013.01); *H01L 29/24* (2013.01); *H01L 29/66969* (2013.01); *H01L 29/78696* (2013.01)

(58) Field of Classification Search
CPC . H01L 29/7869; H01L 29/0665; H01L 29/24; H01L 29/78696
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    104380473 A    2/2015
CN    104797736 A    7/2015
(Continued)

OTHER PUBLICATIONS

International Search Report (Application No. PCT/IB2016/054995) dated Nov. 1, 2016.
(Continued)

*Primary Examiner* — Cuong Q Nguyen
*Assistant Examiner* — Tong-Ho Kim
(74) *Attorney, Agent, or Firm* — Robinson Intellectual Property Law Office; Eric J. Robinson

(57) ABSTRACT

A novel oxide semiconductor is provided. An oxide semiconductor contains In, an element M (M represents Al, Ga, Y, or Sn), and Zn. The oxide semiconductor has little characteristics variation and structure change and has high electron mobility in the case where the atomic ratio of In to M and Zn in the oxide semiconductor ranges from 4:2:3 to 4:2:4.1 or is a neighborhood thereof.

15 Claims, 76 Drawing Sheets

(30) Foreign Application Priority Data

Mar. 2, 2016 (JP) .................................. 2016-040237
Mar. 18, 2016 (JP) .................................. 2016-055215

(51) Int. Cl.
*H01L 29/24* (2006.01)
*H01L 29/66* (2006.01)

(58) Field of Classification Search
USPC ........................................ 257/43; 423/594.14
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0068335 A1 | 3/2011 | Yamazaki et al. | |
| 2013/0320334 A1* | 12/2013 | Yamazaki .......... H01L 29/7869 257/43 |
| 2014/0001032 A1 | 1/2014 | Yamazaki | |
| 2014/0241978 A1 | 8/2014 | Yamazaki et al. | |
| 2015/0108470 A1 | 4/2015 | Yamazaki et al. | |
| 2015/0187823 A1 | 7/2015 | Miyairi et al. | |
| 2015/0243738 A1 | 8/2015 | Shimomura et al. | |
| 2015/0318359 A1 | 11/2015 | Shimomura et al. | |
| 2016/0240682 A1 | 8/2016 | Shimomura et al. | |
| 2016/0284857 A1 | 9/2016 | Yamazaki et al. | |

FOREIGN PATENT DOCUMENTS

| | | |
|---|---|---|
| EP | 1737044 A | 12/2006 |
| EP | 2226847 A | 9/2010 |
| EP | 2867387 A | 5/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2011-091375 A | 5/2011 |
| JP | 2014-007399 A | 1/2014 |
| JP | 2014-133942 A | 7/2014 |
| JP | 2014-194076 A | 10/2014 |
| JP | 2015-109433 A | 6/2015 |
| JP | 2015-144267 A | 8/2015 |
| KR | 2012-0079838 A | 7/2012 |
| KR | 2015-0023054 A | 3/2015 |
| KR | 2015-0027116 A | 3/2015 |

(56) References Cited

FOREIGN PATENT DOCUMENTS

| KR | 2016-0072110 A | 6/2016 |
|---|---|---|
| KR | 2016-0102236 A | 8/2016 |
| TW | 201126717 | 8/2011 |
| TW | 201405818 | 2/2014 |
| TW | 201517276 | 5/2015 |
| TW | 201522690 | 6/2015 |
| TW | 201530698 | 8/2015 |
| WO | WO-2004/114391 | 12/2004 |
| WO | WO-2011/036999 | 3/2011 |
| WO | WO-2013/180040 | 12/2013 |
| WO | WO-2014/002916 | 1/2014 |
| WO | WO-2015/060133 | 4/2015 |
| WO | WO-2015/097593 | 7/2015 |

OTHER PUBLICATIONS

Written Opinion (Application No. PCT/IB2016/054995) dated Nov. 1, 2016.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H etal., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09: SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys, Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs ", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

●:O atom

●:O atom

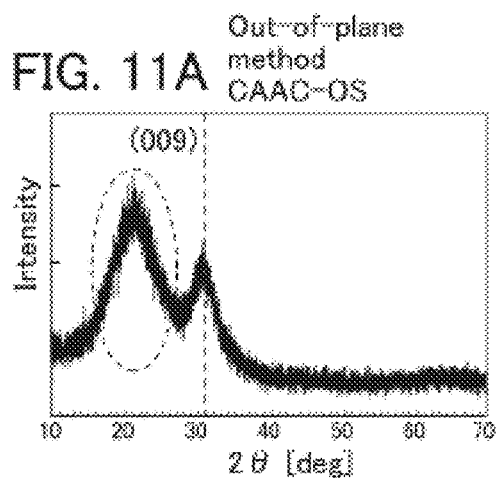
FIG. 11A Out-of-plane method CAAC-OS
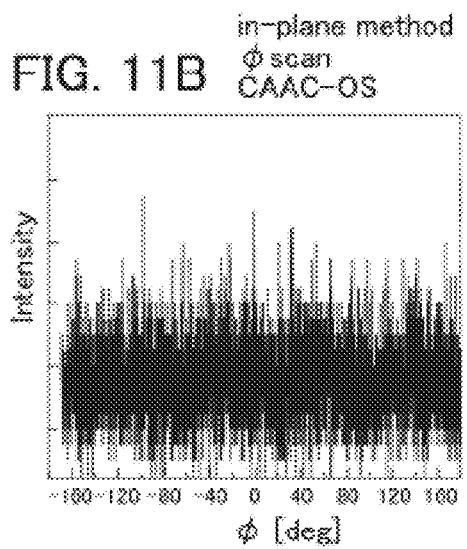
FIG. 11B in-plane method φ scan CAAC-OS
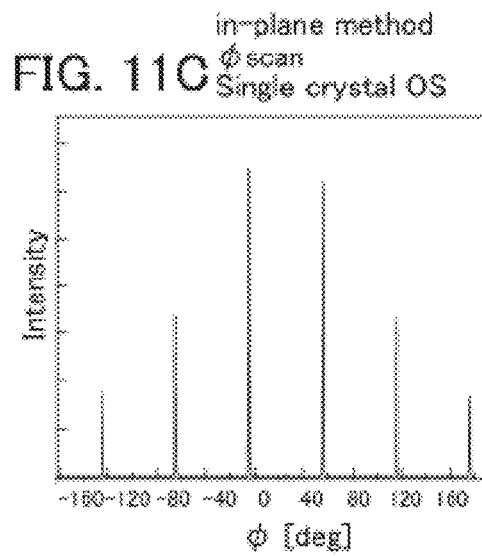
FIG. 11C in-plane method φ scan Single crystal OS
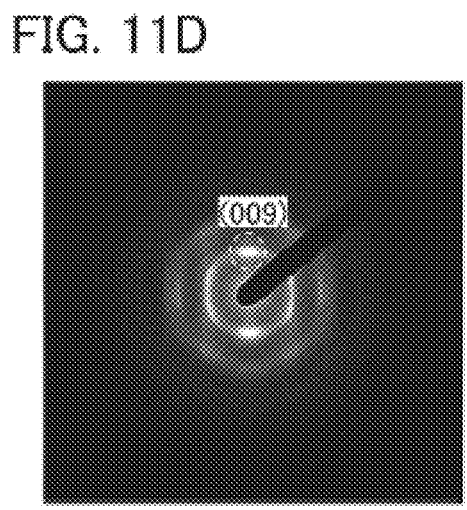
FIG. 11D
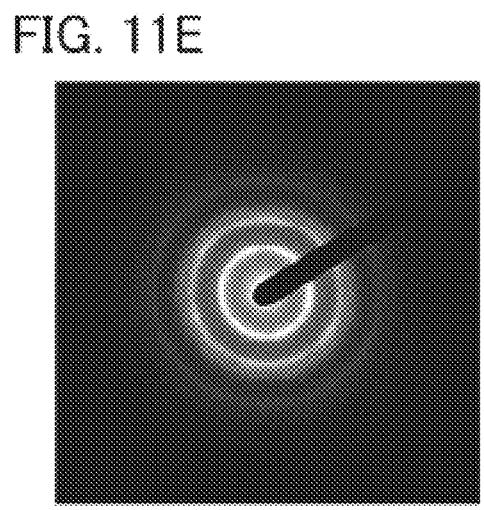
FIG. 11E FIG. 16A
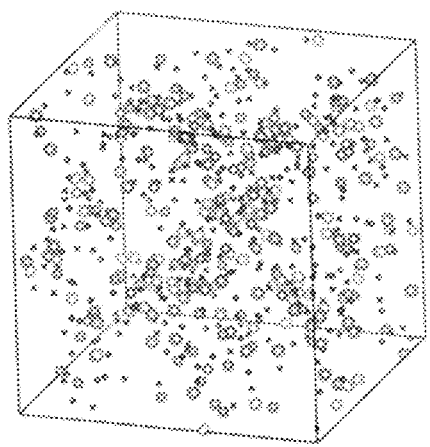
FIG. 16B1
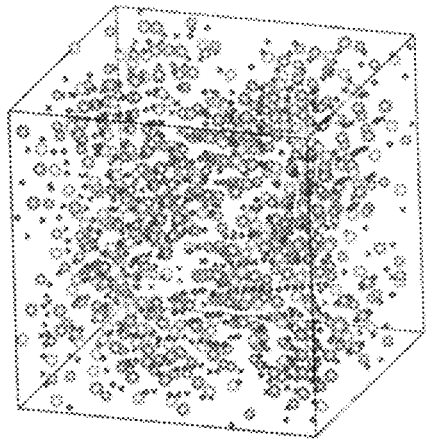
FIG. 16B2
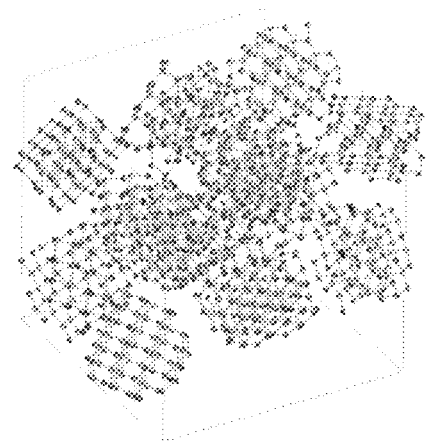
FIG. 16C
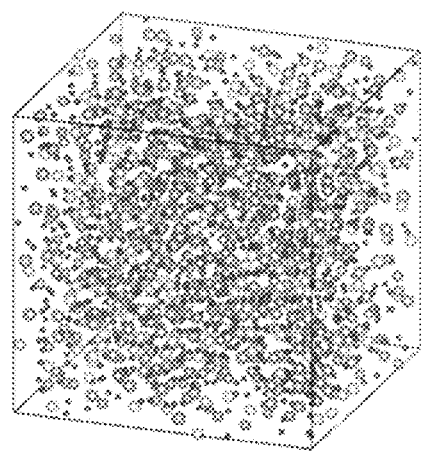

a-like OS nc-OS

FIG. 18A
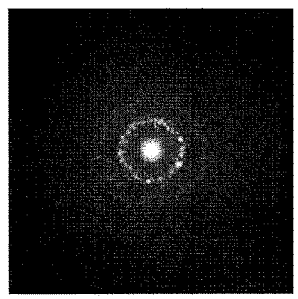
FIG. 18B
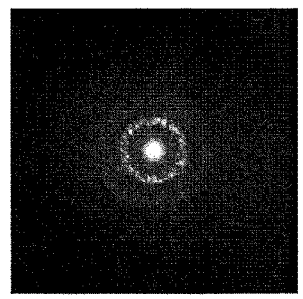
FIG. 18C
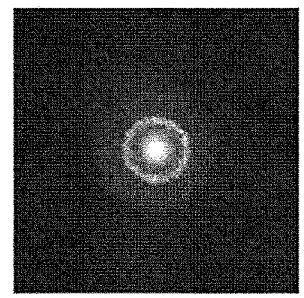
FIG. 18D
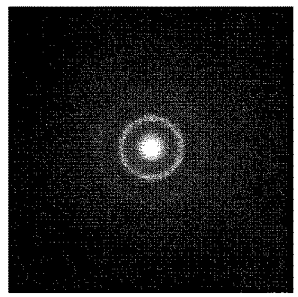
FIG. 18E
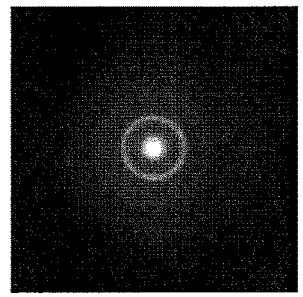
FIG. 18F
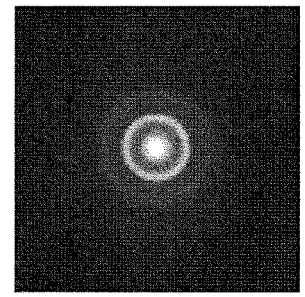

InMZnO$_4$ crystal structure

- In
- Ga
- Zn
- O
- bonding portion

200

200

200

FIG. 31A
260
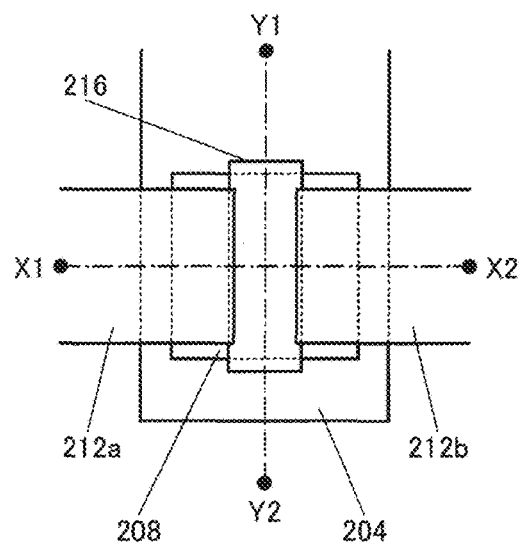
FIG. 31B
260
FIG. 31C
260
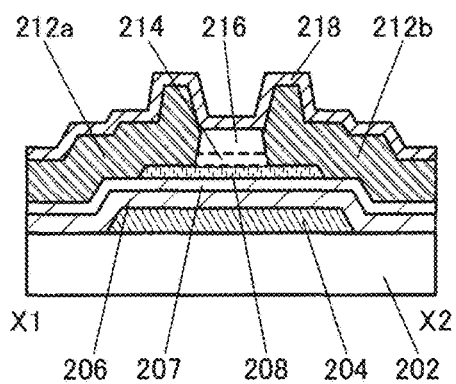
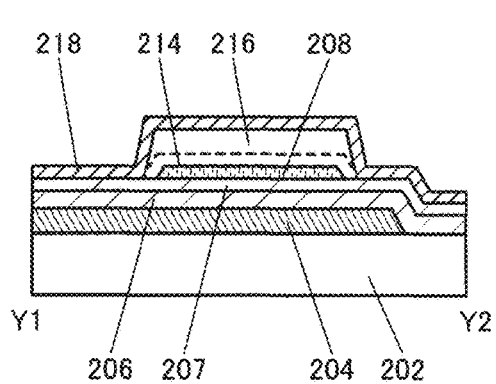

270

270

270

270A

270A

270B

270B

200

200

270B

270B

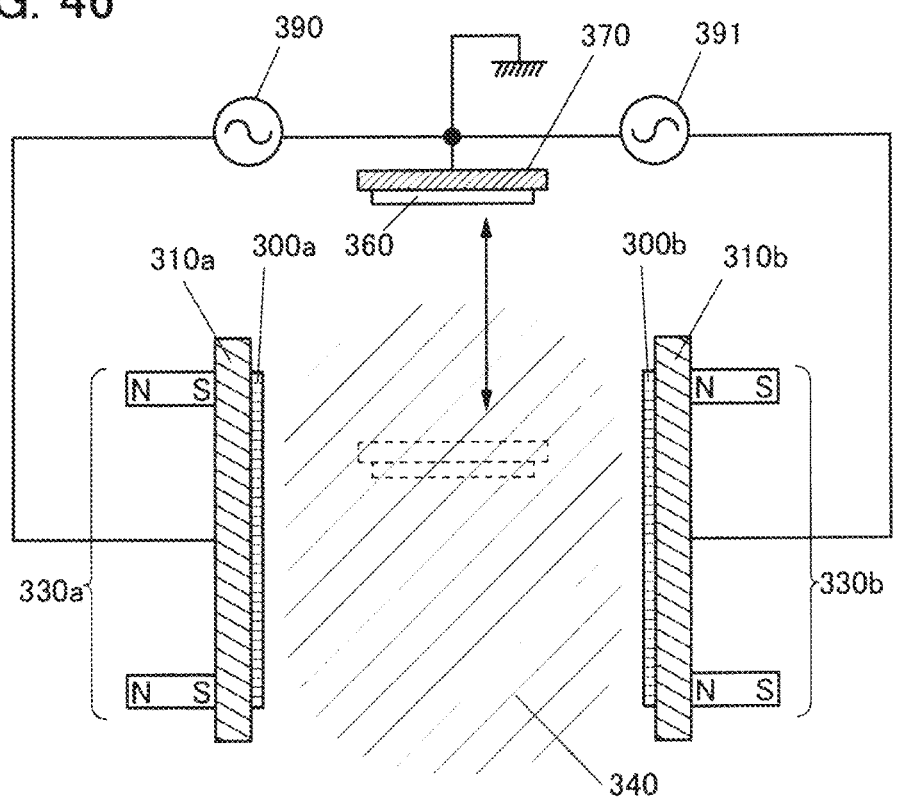

○ :In  ● :Ga  ● :Zn  ○ :O

FIG. 61A
1310
FIG. 61D
1316
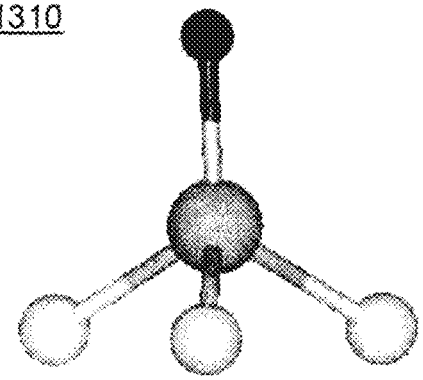
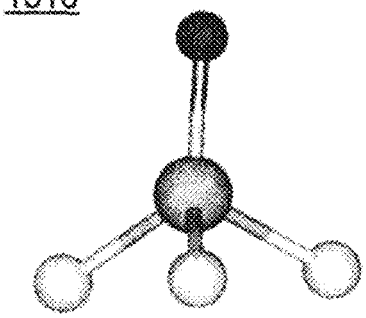
○ :In  ● :Ga  ● :Zn  ○ :O
FIG. 61B
1312
FIG. 61E
1318
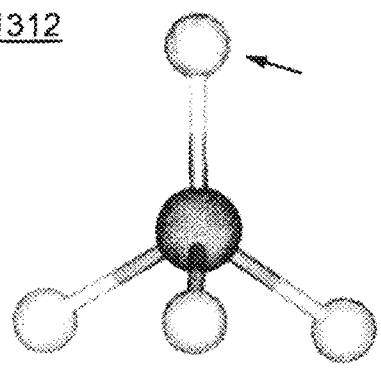
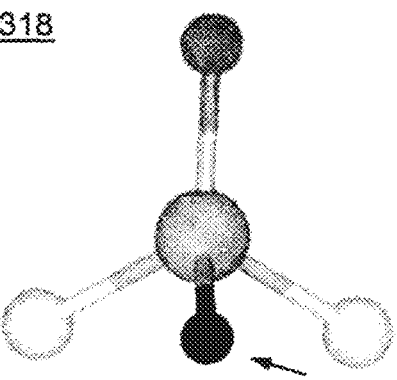
FIG. 61C
1314
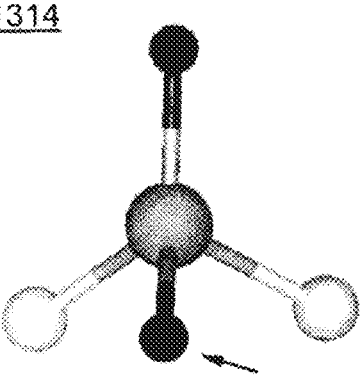

1320

○ :In  ● :Ga  ● :Zn  ○ :O

1322

1324

1326

1328

520

● : In
● : Ga
● : Zn
● : O

US 9,825,179 B2

OXIDE SEMICONDUCTOR, TRANSISTOR, AND SEMICONDUCTOR DEVICE

TECHNICAL FIELD

The present invention relates to an object, a method, or a manufacturing method. The present invention relates to a process, a machine, manufacture, or a composition of matter. One embodiment of the present invention particularly relates to an oxide semiconductor or a manufacturing method of the oxide semiconductor. One embodiment of the present invention relates to a semiconductor device, a display device, a liquid crystal display device, a light-emitting device, a power storage device, a memory device, a driving method thereof, or a manufacturing method thereof.

In this specification and the like, the term "semiconductor device" means all devices which can operate by utilizing semiconductor characteristics. Semiconductor elements such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may have a semiconductor device.

BACKGROUND ART

Non-Patent Document 1 discloses a homologous series represented by $In_{1-x}Ga_{1+x}O_3(ZnO)_m$ ($-1 \leq x \leq 1$, and m is a natural number). Furthermore, Non-Patent Document 1 discloses a solid solution range of the homologous series. For example, in the solid solution range of the homologous series in the case where m is 1, x ranges from −0.33 to 0.08, and in the solid solution range of the homologous series in the case where m is 2, x ranges from −0.68 to 0.32.

Furthermore, a technique for forming a transistor using an In—Ga—Zn-based oxide semiconductor is disclosed (see, for example, Patent Document 1).

Patent Document

[Patent Document 1] Japanese Published Patent Application No. 2007-96055

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.," *J. Solid State Chem.*, 1991, Vol. 93, pp. 298-315.

DISCLOSURE OF INVENTION

Non-Patent Document 1 discloses an example of $In_xZn_y$-$Ga_zO_w$, and when x, y, and z are set such that a composition in the neighborhood of $ZnGa_2O_4$ is obtained, that is, when x, y, and z are close to 0, 1, and 2, respectively, a spinel crystal structure is likely to be formed or mixed. A compound represented by $AB_2O_4$ (A and B are metals) is known as a compound having a spinel crystal structure.

However, when a spinel crystal structure is formed or mixed in an In—Ga—Zn-based oxide semiconductor, electrical characteristics or reliability of a semiconductor device (e.g., a transistor) including the In—Ga—Zn-based oxide semiconductor is adversely affected by the spinel crystal structure in some cases.

In view of the above problem, an object of one embodiment of the present invention is to provide a novel oxide semiconductor. Another object of one embodiment of the present invention is to provide a semiconductor device with favorable electrical characteristics. Another object is to provide a highly reliable semiconductor device. Another object is to provide a semiconductor device with a novel structure. Another object is to provide a display device having a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an oxide semiconductor film containing In, an element M (M represents aluminum, gallium, yttrium, or tin), an element M' (M' represents aluminum, gallium, yttrium, or tin), and Zn.

One embodiment of the present invention is an oxide semiconductor film containing In, an element M (M represents aluminum, gallium, yttrium, or tin), and Zn. The atomic ratio of In to the element M and Zn in the oxide semiconductor film is $(1+\alpha):(1-\alpha):\beta$ (where $-1 \leq \alpha \leq 1$ and $\beta$ is a positive real number) or a neighborhood thereof.

One embodiment of the present invention is an oxide semiconductor film containing In, an element M (M represents aluminum, gallium, yttrium, or tin), and Zn. The atomic ratio of In to the element M and Zn in the oxide semiconductor film is $(1+\alpha):(1-\alpha):\beta$ (where $-1 \leq \alpha \leq 1$ and $\beta$ is a positive non-integer) or a neighborhood thereof.

In any of the above embodiments, the oxide semiconductor film has a layered structure.

One embodiment of the present invention is a transistor including the oxide semiconductor film in any of the above embodiments.

Another embodiment of the present invention is a display device including the oxide semiconductor film in any of the above embodiments and a display element. Another embodiment of the present invention is a display module including the display device and a touch sensor. Another embodiment of the present invention is an electronic device including the oxide semiconductor film in any of the above embodiments, the semiconductor device, the display device, or the display module and an operation key or a battery.

According to one embodiment of the present invention, a novel oxide semiconductor can be provided. According to one embodiment of the present invention, a semiconductor device can be provided with favorable electrical characteristics. A highly reliable semiconductor device can be provided. A semiconductor device with a novel structure can be provided. A display device with a novel structure can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF DRAWINGS

FIGS. 11A to 11E show structural analysis of a CAAC-OS and a single crystal oxide semiconductor by XRD and selected-area electron diffraction patterns of a CAAC-OS.

FIGS. 16A, 16B1, 16B2, and 16C illustrate a structure model of $InGaZnO_4$ including nanocrystals.

FIGS. 18A to 18F each show an electron diffraction pattern of an oxide.

FIGS. 31A to 31C illustrate a top view and cross-sectional views of an example of a semiconductor device.

FIG. 46 illustrates a sputtering apparatus.

FIGS. 61A to 61E each illustrate a structure model of an oxide semiconductor of one embodiment.

BEST MODE FOR CARRYING OUT THE INVENTION

Figure 1:
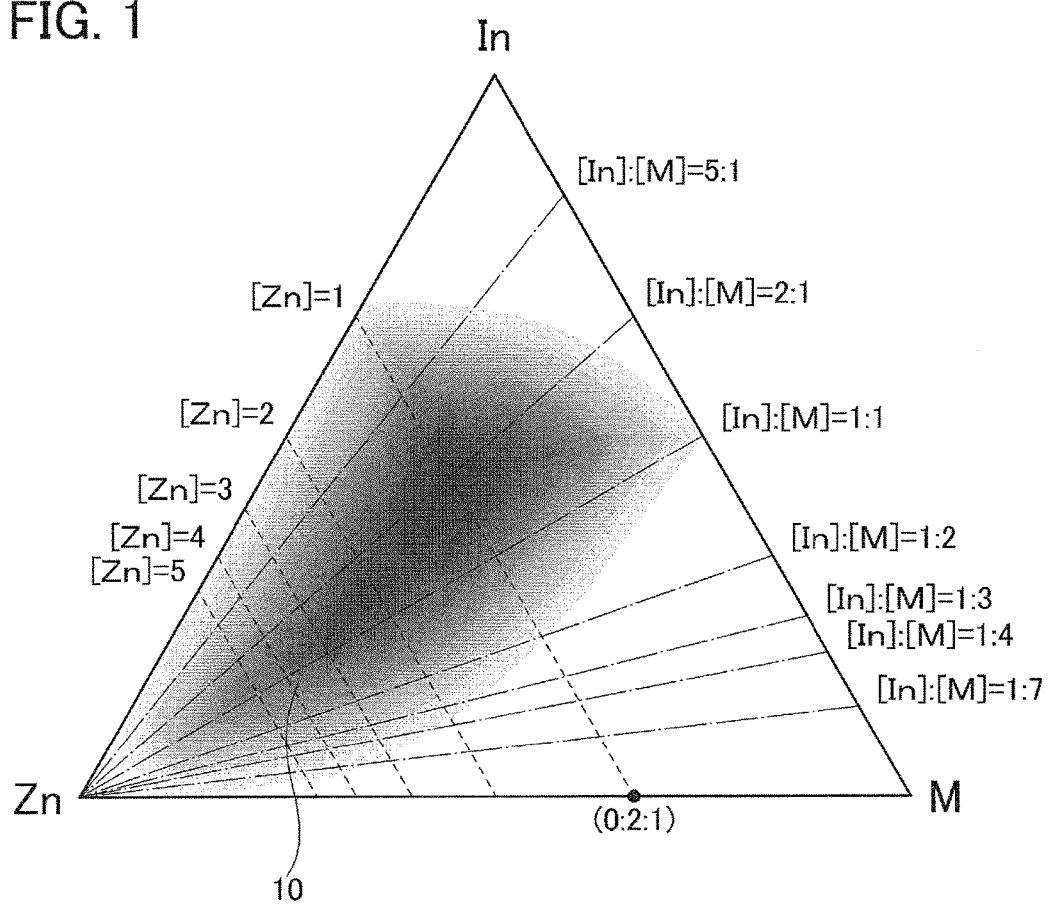
FIG. 1 illustrates an atomic ratio of an oxide semiconductor.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Ordinal numbers such as "first," "second," and "third" in this specification are used in order to avoid confusion among components, and the terms do not limit the components numerically.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow through the drain, the channel region, and the source. Note that in this specification and the like, a channel region refers to a region through which current mainly flows.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

In this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, a "silicon oxynitride film" refers to a film that contains oxygen at a higher proportion than nitrogen, and a "silicon nitride oxide film" refers to a film that contains nitrogen at a higher proportion than oxygen.

In the description of modes of the present invention with reference to the drawings in this specification and the like, the same components in different diagrams are commonly denoted by the same reference numeral in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the terms "film" and "layer" can be interchanged with each other depending on the case. For example, the term "conductive layer" can be changed into the term "conductive film" in some cases. Also, the term "insulating film" can be changed into the term "insulating layer" in some cases.

Note that a "semiconductor" includes characteristics of an "insulator" in some cases when, for example, the conductivity is sufficiently low. Furthermore, a "semiconductor" and an "insulator" cannot be strictly distinguished from each other in some cases because the border between the "semiconductor" and the "insulator" is not clear. Accordingly, a "semiconductor" in this specification can be called an "insulator" in some cases. Similarly, an "insulator" in this specification can be called a "semiconductor" in some cases.

(Embodiment 1)

In this embodiment, an oxide semiconductor which is one embodiment of the present invention will be described.

The oxide semiconductor of one embodiment of the present invention includes indium (In), M (M represents Al, Ga, Y, or Sn), and zinc (Zn). Specifically, M is preferably gallium (Ga). In the following description, Ga is used as M.

An oxide semiconductor containing In has high electron mobility (carrier mobility), for example. An oxide semiconductor containing Ga has high energy gap (Eg), for example. Note that Ga is an element having high bonding energy with oxygen, which is higher than the bonding energy of In with oxygen. In addition, an oxide semiconductor containing Zn is easily crystallized.

<Structure of Oxide Semiconductor>

A structure of an oxide semiconductor will be described below with reference to FIGS. 8 to 10, FIGS. 11A to 11E, FIGS. 12A to 12E, FIGS. 13A and 13B, FIG. 14, FIGS. 15A and 15B, FIGS. 16A, 16B1, 16B2, and 16C, FIGS. 17A and 17B, FIGS. 18A to 18F, FIGS. 19A and 19B, FIGS. 20A to 20E, FIGS. 21A and 21B, and FIG. 22.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that includes a void. Because of its instability, an a-like OS has physical properties similar to those of an amorphous oxide semiconductor.

Different structures of oxide semiconductors will be described below by using techniques such as XRD measurement, measurement of nanobeam electron diffraction (NBED) patterns, observation of a combined analysis image of a bright-field image and a diffraction pattern (also referred to as a high-resolution TEM image), and electron irradiation.

Figure 8:
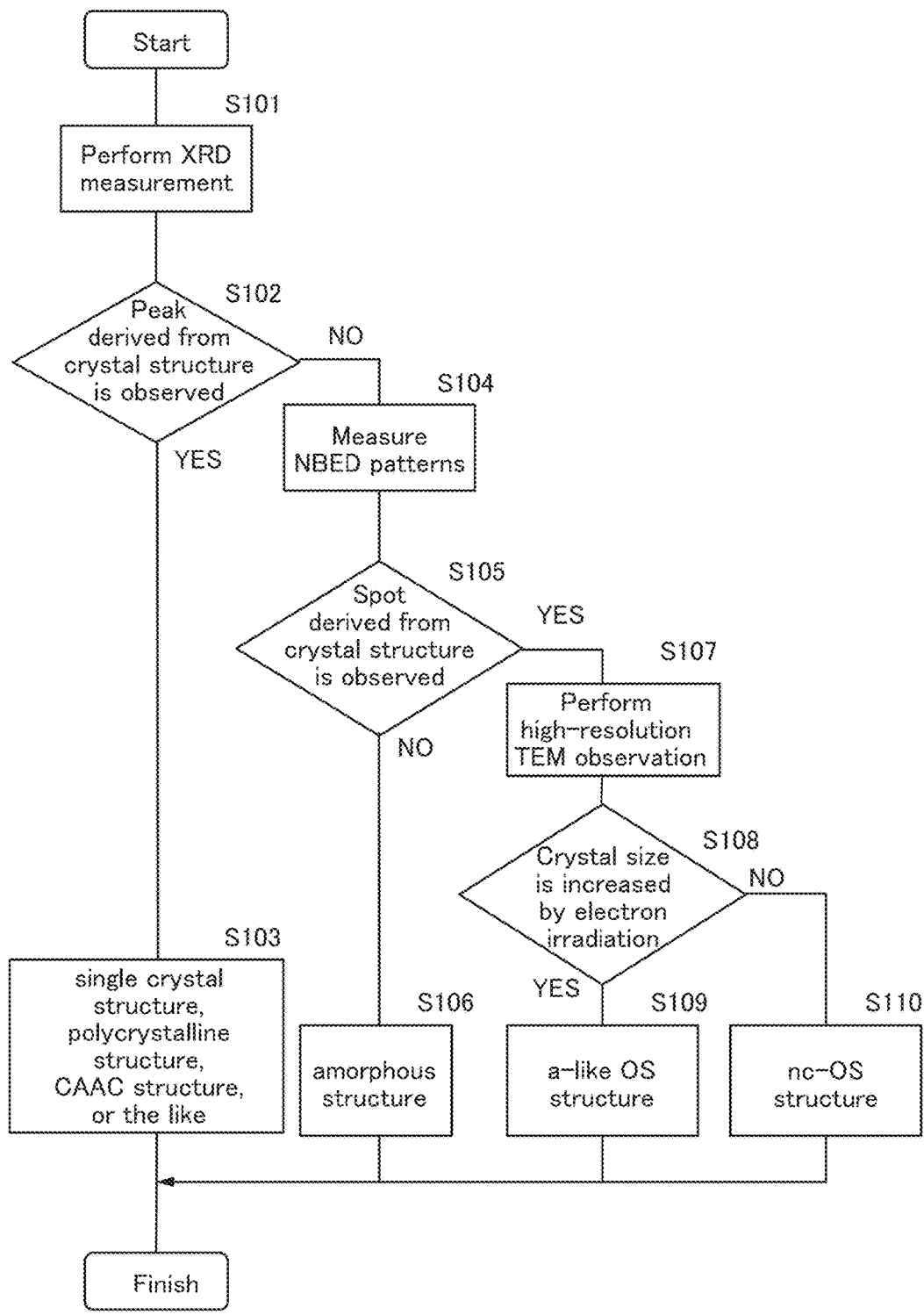
FIG. 8 is a flow chart showing an evaluation method of an oxide.

First, X-ray diffraction (XRD) measurement is performed by irradiating an oxide with X-rays (see Step S101 in FIG. 8). Note that a thin film method is preferably used for the XRD measurement because noise due to a substrate or the like over which the oxide is formed can be reduced.

Figure 9:
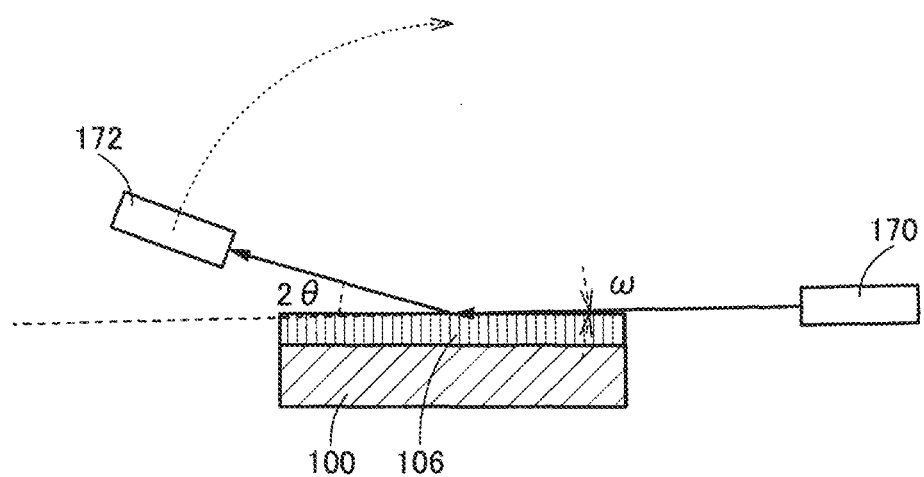
FIG. 9 is a cross-sectional view illustrating an analysis method using X-ray diffraction.

The thin film method is described below. First, as shown in FIG. 9, a sample including an oxide 106 over a substrate 100 is prepared. In the thin film method, an X-ray source 170 is set so that an angle between the X-ray source 170 and a top surface of the sample is an extremely small angle ω. As the X-ray source 170, CuKα rays or synchrotron radiation X-rays may be used, for example. As the angle ω is decreased, noise due to the substrate 100 is decreased. The angle ω is set to be greater than or equal to 0.01° and less than or equal to 2°, preferably greater than or equal to 0.05° and less than or equal to 1.5°, more preferably greater than or equal to 0.08° and less than or equal to 1°, for example. Furthermore, as the oxide 106 has a larger thickness, noise due to the substrate 100 is decreased. The thickness of the oxide 106 is set to 50 nm or larger, preferably 100 nm or larger, more preferably 500 nm or larger, still more preferably 1000 nm or larger, for example.

Next, an angle 2θ of a detection unit 172 with respect to the top surface of the sample is varied. For example, the angle 2θ is varied within a range from 2° to 140°, from 3° to 130°, or from 3° to 100°. In this manner, X-ray diffraction intensity with respect to the angle 2θ is obtained. At this time, by increasing the measurement time of the X-ray diffraction, the integrated value of the X-ray diffraction intensity can be increased. For example, in the case of measuring the X-ray diffraction while 2θ is increased in steps of 0.01°, each point may be measured for longer than or equal to one second and shorter than or equal to 20 seconds, or longer than or equal to 3 seconds and shorter than or equal to 15 seconds.

Figure 10:
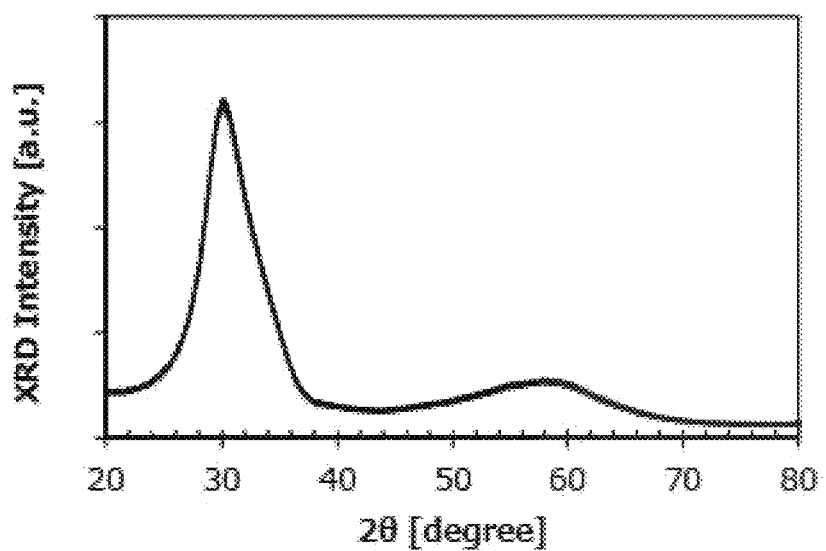
FIG. 10 shows analysis results of an oxide by X-ray diffraction.

Here, whether or not a peak derived from a crystal structure is observed is determined (see Step S102 in FIG. 8). In the case where the peak derived from a crystal structure is observed, a structure of the oxide is determined to be, for example, a single crystal structure, a polycrystalline structure, a CAAC structure, a microcrystalline structure, or the like (see Step S103 in FIG. 8). An oxide that is a single crystal oxide semiconductor, a CAAC-OS, or a polycrystalline oxide semiconductor has a crystal structure and alignment along a particular crystal plane. For example, the result of XRD analysis of an In—Ga—Zn oxide denoted by a CAAC-OS is shown in FIG. 10.

<<CAAC-OS>>

Here, the details of the CAAC-OS are described.

The CAAC-OS is one of oxide semiconductors having a plurality of c-axis-aligned crystal parts (also referred to as pellets).

Analysis of a CAAC-OS by X-ray diffraction (XRD) will be described. For example, when the structure of a CAAC-OS including an $InGaZnO_4$ crystal, which is classified into the space group R-3m, is analyzed by an out-of-plane method, a peak appears at a diffraction angle (2θ) of around 31° as shown in FIG. 11A. This peak is derived from the (009) plane of the $InGaZnO_4$ crystal, which indicates that crystals in the CAAC-OS have c-axis alignment, and that the c-axes are aligned in a direction substantially perpendicular to a surface over which a CAAC-OS film is formed (also referred to as a formation surface) or the top surface of the CAAC-OS film. Note that another peak may appear when 2θ is around 36°, in addition to the peak at 2θ of around 31°. The peak at 2θ of around 36° is attributed to a crystal structure classified into the space group Fd-3m; thus, this peak is preferably not exhibited in the CAAC-OS.

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the $InGaZnO_4$ crystal. When analysis (ϕ scan) is performed with 2θ fixed at around 56° while the sample is rotated around a normal vector to the sample surface as an axis (ϕ axis), as shown in FIG. 11B, a peak is not clearly observed. In contrast, in the case where single crystal $InGaZnO_4$ is subjected to ϕ scan with 2θ fixed at around 56°, as shown in FIG. 11C, six peaks which are derived from crystal planes equivalent to the (110) plane are observed. Accordingly, the structural analysis using XRD shows that the directions of the a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 11D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 11E shows a diffraction pattern obtained in such a manner that an electron beam with a probe diameter of 300 nm is incident on the same sample in a direction perpendicular to the sample surface. As shown in FIG. 11E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 11E is considered to be derived from the (010) plane, the (100) plane, and the like of the InGaZnO$_4$ crystal. The second ring in FIG. 11E is considered to be derived from the (110) plane and the like.

In a combined analysis image of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 12A:
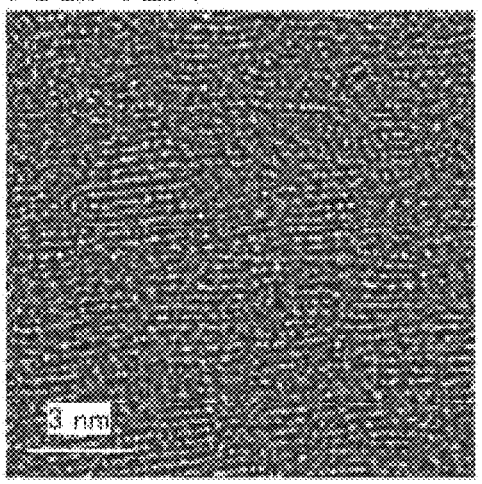
FIGS. 12A to 12E show a cross-sectional TEM image and plan-view TEM images of a CAAC-OS and images obtained through analysis thereof.

FIG. 12A shows a high-resolution TEM image of a cross section of the CAAC-OS which is observed in a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

FIG. 12A shows pellets in which metal atoms are arranged in a layered manner. FIG. 12A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 12B:
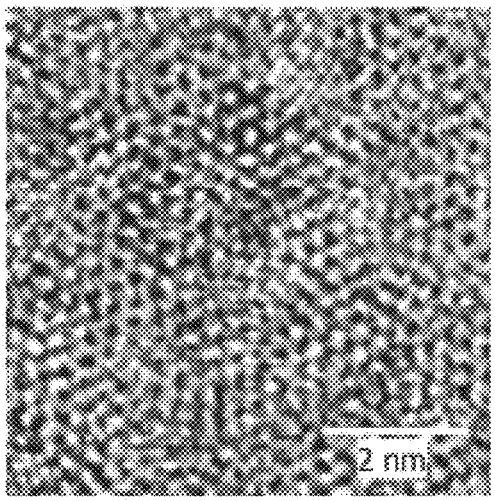
Figure 12C:
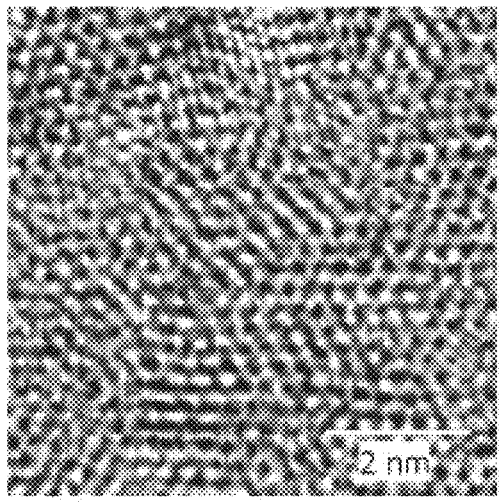
Figure 12D:
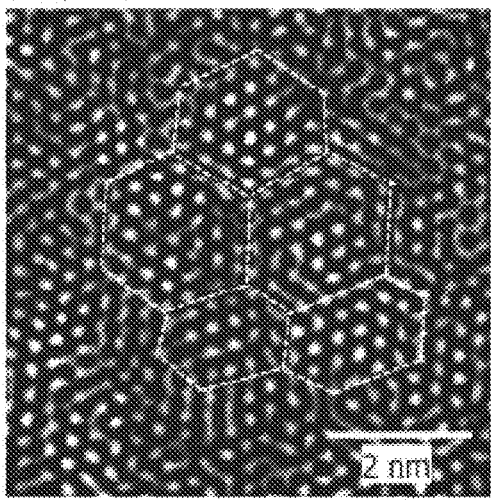
Figure 12E:
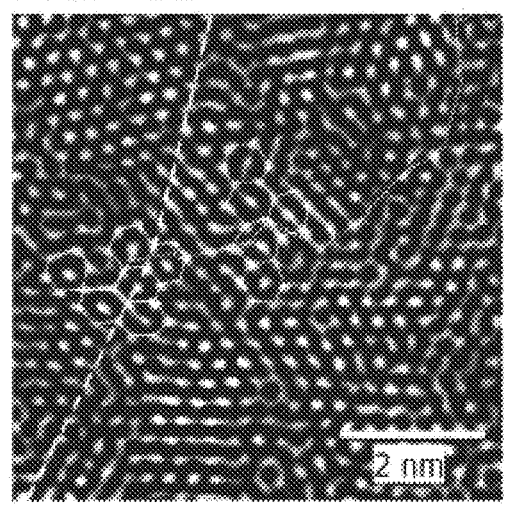

FIGS. 12B and 12C show Cs-corrected high-resolution TEM images of a plane of the CAAC-OS observed in the direction substantially perpendicular to the sample surface. FIGS. 12D and 12E are images obtained by image processing of FIGS. 12B and 12C. The method of image processing is as follows. The image in FIG. 12B is subjected to fast Fourier transform (FFT) to obtain an FFT image. Then, mask processing is performed on the obtained FFT image such that part in the range from 2.8 nm$^{-1}$ to 5.0 nm$^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 12D, a portion in which the lattice arrangement is broken is shown by dashed lines. A region surrounded by dashed lines corresponds to one pellet. The portion shown by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 12E, a dotted line denotes a portion where the direction of a lattice arrangement changes between a region with a uniform lattice arrangement and another region with a uniform lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, a change in interatomic bond distance by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8\times10^{11}/cm^3$, preferably lower than $1\times10^{11}/cm^3$, further preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

Figure 13A:
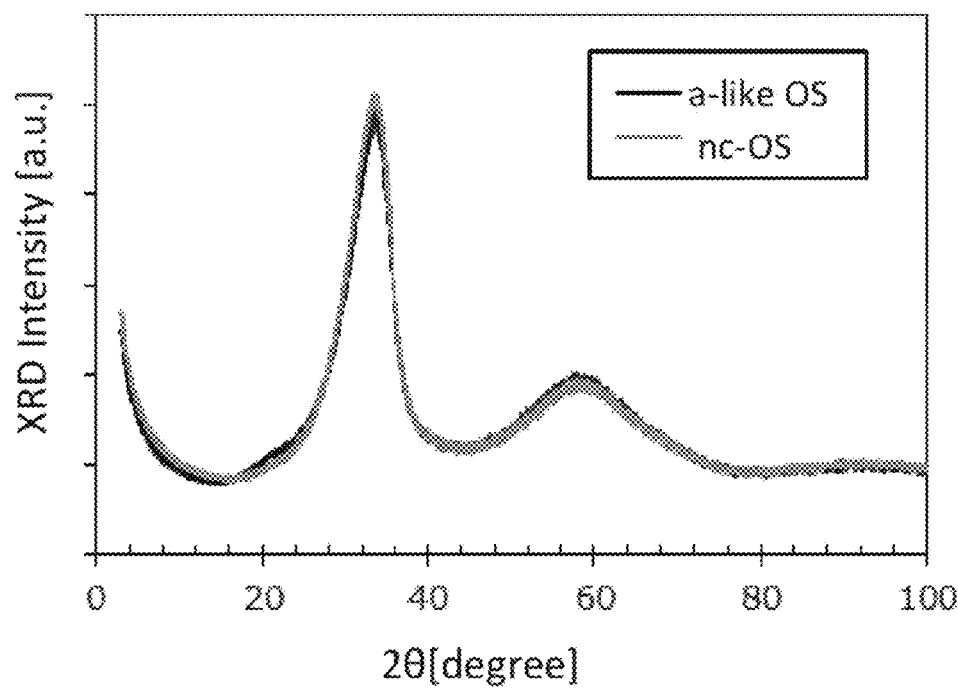
FIGS. 13A and 13B show analysis results of oxides by X-ray diffraction.

Next, in the case where a peak derived from a crystal structure is not observed, the process proceeds to Step S104 in FIG. 8. Note that even when a peak derived from a crystal structure is not observed, interference derived from a near neighbor atom can be observed in some cases. For example, the results of XRD analysis of In—Ga—Zn oxides which are a-like OS and nc-OS are shown in FIG. 13A.

It is known that X-ray diffraction intensity is expressed by Formula (1).

[Formula 1]

$$I_{norm} = \langle f^2 \rangle + \langle f \rangle^2 \int_0^\infty 4\pi r^2 \{\rho(r) - \rho_0\} \frac{\sin Qr}{Qr} dr \quad (1)$$

$I_{norm}$, f, $\rho_0$, $\rho(r)$, Q, and r represent normalized X-ray diffraction intensity, an atomic scattering factor, average number density, number density, a scattering vector, and a distance, respectively.

Note that $I_{norm}$ can be expressed by Formula (2).

[Formula 2]

$$I_{norm} = a \cdot \left(\frac{I_{obs} - c}{P}\right) - I_{Compton} \quad (2)$$

$I_{obs}$, $I_{Compton}$, P, a, and c represent measured X-ray diffraction intensity, the intensity of incoherent Compton scattering, a polarization correction factor (($1+\cos 2\theta^2$)/2), a normalization factor, and a parameter in a model assuming a background independent of the scattering vector Q, respectively.

Note that a and c are calculated by fitting. The fitting may be performed under conditions where r< 0.15 nm, a pair distribution function is 0, and the atomic number density agrees with calculation results from the measured film density. However, a and c may be calculated by a Krogh-Moe-Norman method and by fitting, respectively.

An interference function i(Q) can be expressed by Formula (3).

[Formula 3]

$$i(Q) \equiv \frac{I_{norm} - \langle f^2 \rangle}{\langle f \rangle^2} \quad (3)$$

A pair distribution function can be obtained by the Fourier transform of Q·i(Q). Thus, FIG. 13B can be made from FIG. 13A.

Figure 13B:
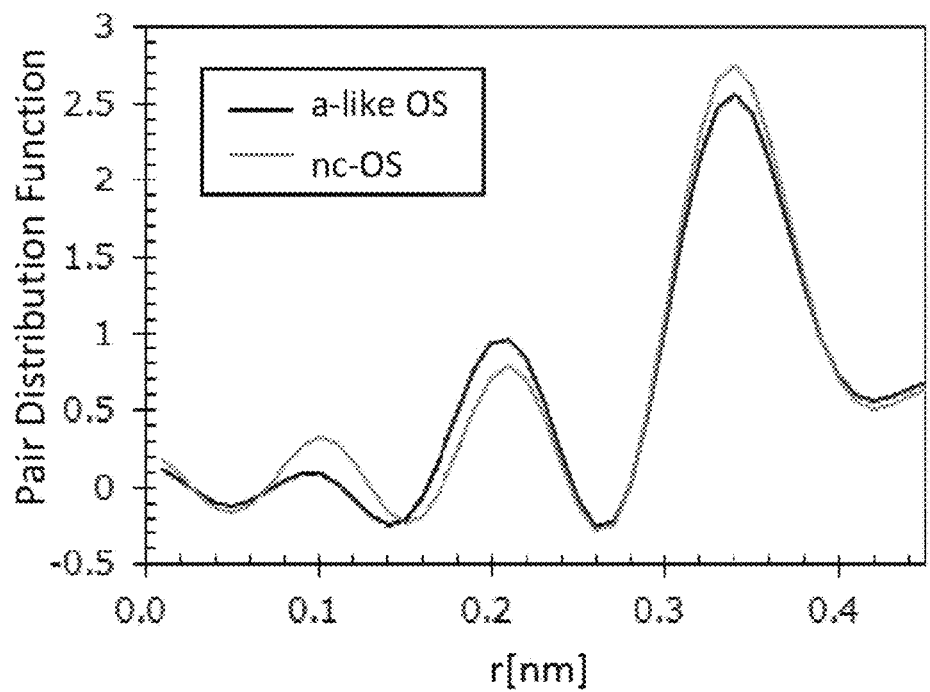

FIG. 13B shows that a peak is observed at a distance r of approximately 0.2 nm in each of the a-like OS and the nc-OS. This corresponds to a distance between a metal atom and an oxygen atom of the oxide 106. A peak is observed also at a distance r of approximately 0.35 nm. This corresponds to a distance between a metal atom and a metal atom of the oxide 106. Furthermore, it is shown that the pair distribution function approaches 1 as the distance r increases. That is, it is shown that the a-like OS and the nc-OS do not have a long-range order.

Next, an example in which a peak derived from a crystal structure is not observed by XRD measurement is described.

Figure 14:
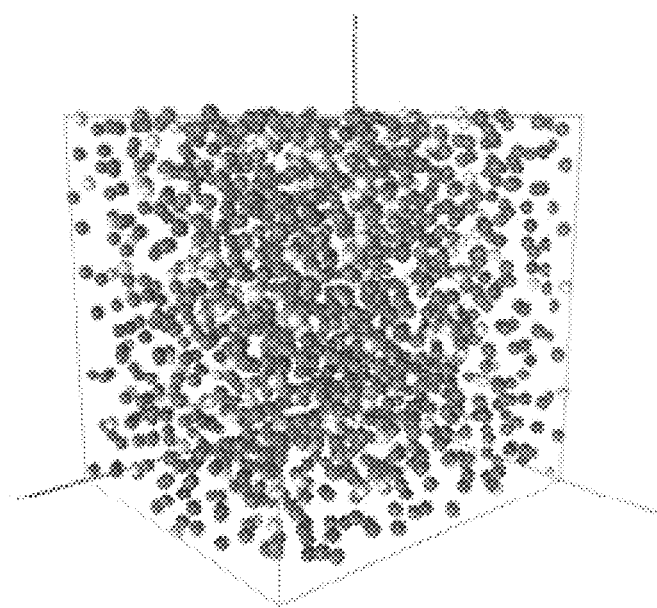
FIG. 14 illustrates a structure model of amorphous $InGaZnO_4$.

FIG. 14 shows an example of a structure model of amorphous InGaZnO$_4$ which is made by a melt-quench method in classical molecular dynamics calculation. Specifically, InGaZnO$_4$ is melted at 4000 K and then the temperature is lowered to 300 K by 200 K every 0.2 nanoseconds. Note that the temperature was lowered only by 100 K from 400 K so as to finally reach 300 K. As software for the classical molecular dynamics calculation, "SCIGRESS ME 2.0" was used, and for potential, Bom-Mayer-Huggins potential was used.

Figure 15A:
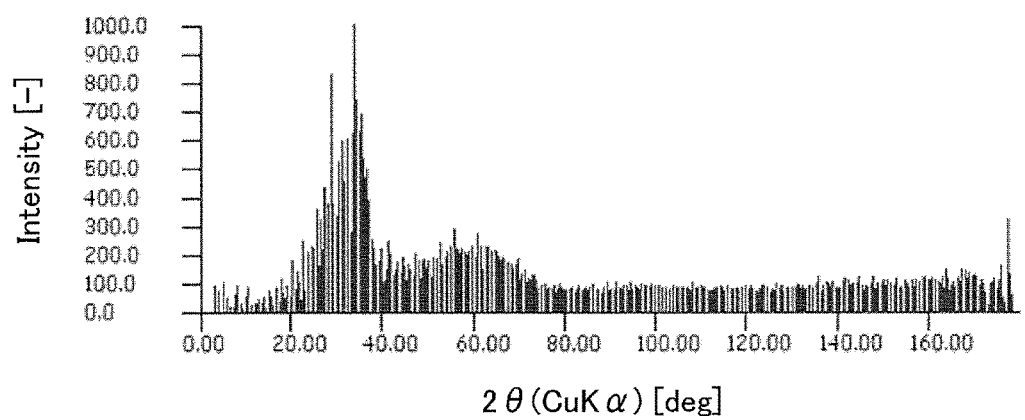
FIGS. 15A and 15B show results of XRD analysis by calculation.

XRD analysis results shown in FIG. 15A are obtained by structure analysis of the structure model of amorphous InGaZnO$_4$ using simulation software jems. Note that for the calculation, CuKα rays with a wavelength of 0.154178 nm are used as the X-ray source. Furthermore, a Debye-Scherrer camera with a diameter of 57.3 mm is used.

Figure 2:
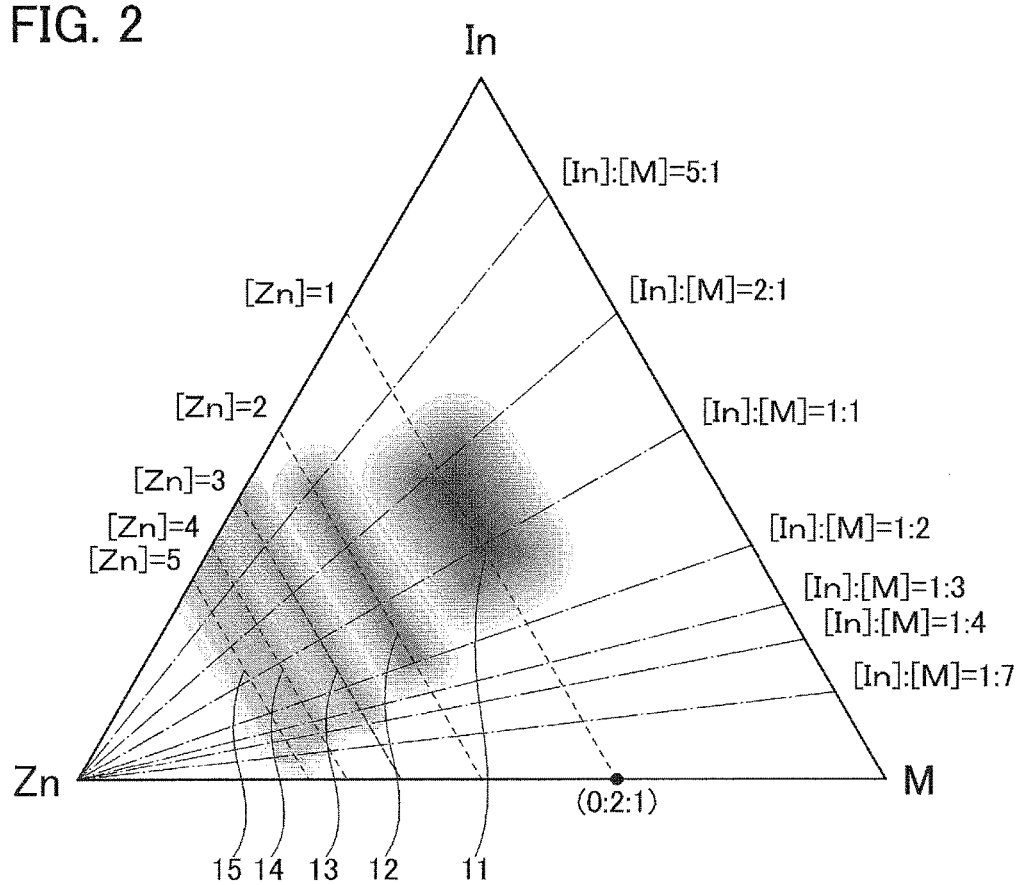
FIG. 2 illustrates an atomic ratio of an oxide semiconductor.

FIG. 16C shows an example of a structure model including nanocrystals in which a plurality of structure models of single crystal InGaZnO$_4$ (see FIGS. 16B1 and 16B2) are arranged irregularly in a structure model of amorphous InGaZnO$_4$ (see FIG. 16A). Note that the structure model shown in FIG. 16B2 is made so that the structure model of single crystal InGaZnO$_4$ can be visually recognized more easily than the structure model shown in FIG. 16B1. That is, FIGS. 16B1 and 16B2 show the same structure model.

Figure 15B:
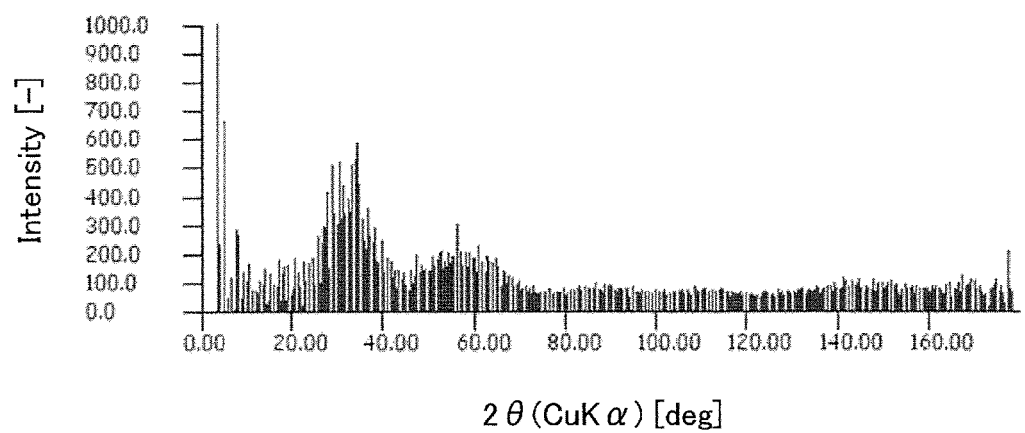

When the structure model including nanocrystals is analyzed using simulation software jems, XRD analysis results shown in FIG. 15B are obtained. Note that calculation conditions are described above.

As shown in FIGS. 15A and 15B, the XRD analysis results of the structure model of amorphous InGaZnO$_4$ and the structure model including nanocrystals are similar to each other in, for example, having a maximum value at 2θ of greater than or equal to 20° and less than or equal to 40° and a maximum value at 2θ of greater than or equal to 40° and less than or equal to 80°. Note that in FIG. 15B, a peak is observed at 2θ of less than or equal to 10°. The peak is derived from a periodic structure of a finite structure model and therefore is not derived from the difference in the structure model itself.

The maximum value at 2θ of greater than or equal to 20° and less than or equal to 40° and the maximum value at 2θ of greater than or equal to 40° and less than or equal to 80° are due to the interference derived from a near neighbor atom.

As described above, the XRD measurement demonstrates that the structure model of amorphous InGaZnO$_4$ and the structure model including nanocrystals have the interference derived from a near neighbor atom and do not have a peak derived from a crystal structure.

Next, an electron beam with a probe diameter of 0.3 nm or more and 3 nm or less is transmitted through the a-like OS and the nc-OS to measure nanobeam electron diffraction (NBED) patterns (see Step S104 in FIG. 8).

Here, whether a spot derived from a crystal structure is not observed (a halo pattern is observed) or a spot derived from a crystal structure is observed is determined (see Step S105 in FIG. 8). In the case where a spot derived from a crystal structure is not observed, the structure of the oxide is determined to be amorphous (see Step S106 in FIG. 8). The amorphous oxide does not have a crystal structure. For example, some oxides having an amorphous structure are determined to be amorphous semiconductors.

Figure 17A:
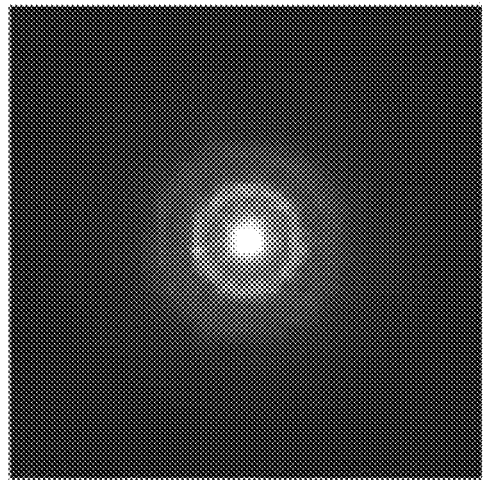
FIGS. 17A and 17B each show an electron diffraction pattern of an oxide.
Figure 17B:
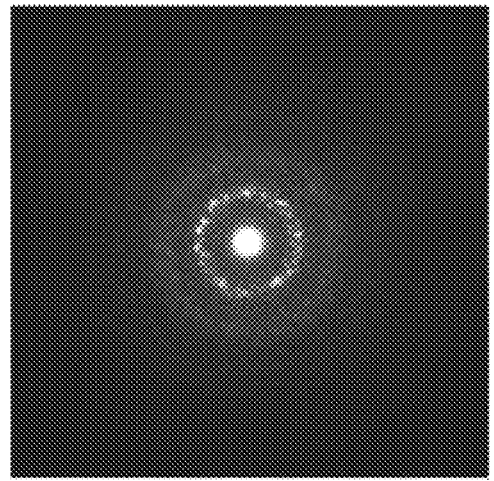

In the case where a spot derived from a crystal structure is observed, the process proceeds to Step S107 in FIG. 8. Note that a particular crystal structure cannot be identified in some cases even when a spot derived from a crystal structure is observed. For example, in the case where a plurality of crystal parts are included and the crystal parts each have no alignment along a particular crystal plane, an electron diffraction pattern in which spots derived from various crystal planes appear to overlap with each other is observed. For example, FIGS. 17A and 17B show electron diffraction patterns of In—Ga—Zn oxides represented by the a-like OS and the nc-OS, respectively. Note that an electron beam with a probe diameter of 1 nm is used to measure the electron diffraction patterns.

As shown in FIGS. 17A and 17B, the observed electron diffraction patterns of the a-like OS and the nc-OS each have a region with high luminance in a circular (ring) pattern. Furthermore, the observed electron diffraction patterns each have a plurality of spots in the ring region. It is shown that the spots of the nc-OS are clearer than those of the a-like OS. Therefore, the nc-OS has higher crystallinity than the a-like OS.

Note that in the sample having a crystal structure, a spot derived from a crystal structure is observed in some cases and a spot derived from a crystal structure is not observed in some other cases, depending on an electron diffraction method. Furthermore, in some cases, the arrangement of spots derived from a crystal structure is varied depending on a measurement method. Examples of such cases are described below using the nc-OS. For example, FIGS. 18A, 18B, 18C, 18D, 18E, and 18F are electron diffraction patterns observed using electron beams having probe diameters of 1 nm, 5 nm, 10 nm, 25 nm, 50 nm, and 100 nm, respectively. Note that the thickness of the nc-OS is 34 nm.

FIGS. 18A to 18F show that a spot derived from a crystal structure becomes clear as the probe diameter of the electron beam decreases to 10 nm, 5 nm, and 1 nm, whereas a spot derived from a crystal structure becomes unclear as the probe diameter of the electron beam increases to 25 nm, 50 nm, and 100 nm. Therefore, from the nc-OS, a spot derived from a crystal structure is observed in the electron diffraction pattern observed using the electron beam having a probe diameter of 5 nm or less, whereas a spot derived from a crystal structure is not observed in the electron diffraction pattern observed using the electron beam having a probe diameter of 25 nm or more. That is, an appropriate probe diameter should be selected for a crystal structure analysis.

Figure 19A:
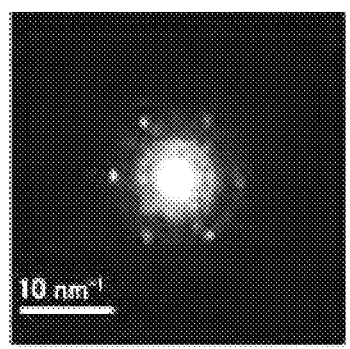
FIGS. 19A and 19B each show an electron diffraction pattern of an oxide.
Figure 19B:
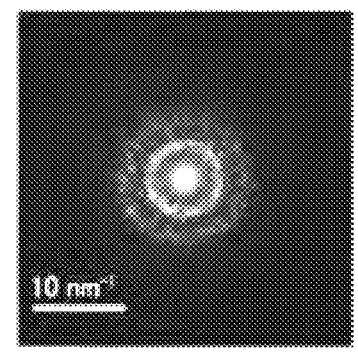

Furthermore, electron diffraction patterns shown in FIGS. 19A and 19B can be observed from the nc-OS having a thickness of less than 10 nm and the nc-OS having a thickness of 45 nm, respectively, in the case of using an electron beam having a probe diameter of 1 nm. As shown in FIG. 19A, an electron diffraction pattern in which spots are arranged in an approximately regular hexagonal shape is observed from the nc-OS having a thickness of less than 10 nm. This implies that the nc-OS has at least one crystal structure in the range of less than 10 nm in thickness. Furthermore, as shown in FIG. 19B, no order is observed in the arrangement of spots from the nc-OS having a thickness of 45 nm. This implies that a plurality of crystal structures are included in the nc-OS having a thickness of 45 nm and that the orientation of the plurality of crystal structures is not uniform. That is, a sample having an appropriate thickness should be selected for the detailed analysis of a crystal structure. However, it is clear that a spot derived from a crystal structure is included also in the nc-OS having a thickness of 45 nm.

Figure 20A:
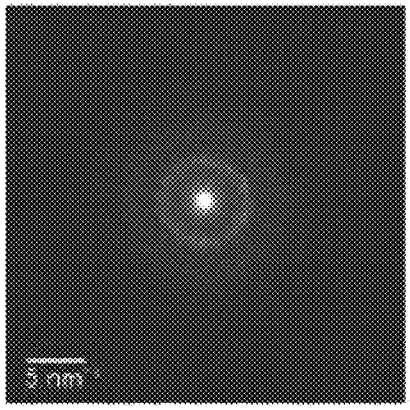
FIGS. 20A to 20E show electron diffraction patterns and cross-sectional TEM images of an nc-OS.
Figure 20B:
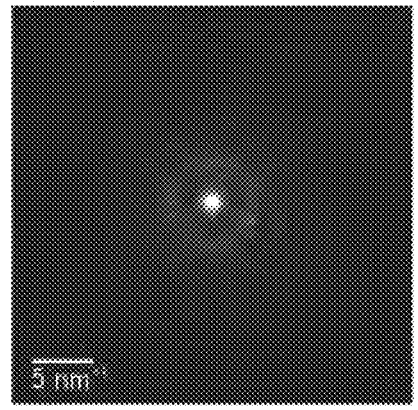
Figure 20C:
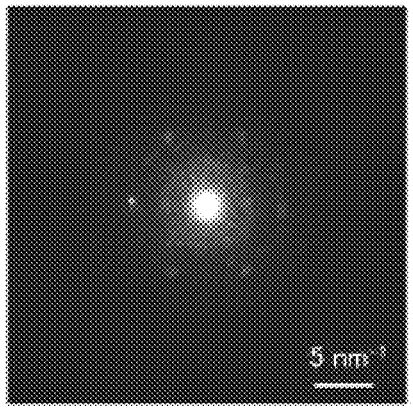
Figure 20D:
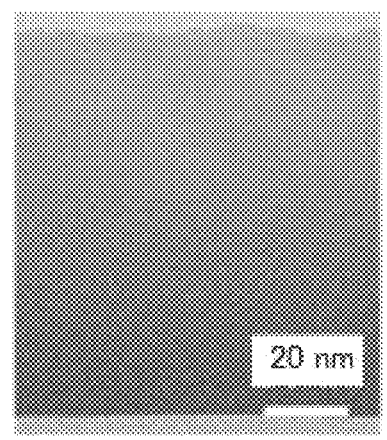
Figure 20E:
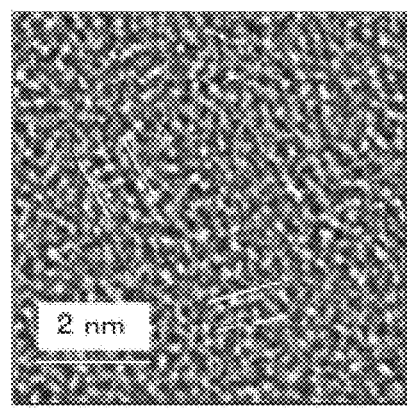

Next, high-resolution TEM images of the a-like OS and the nc-OS are observed (see FIGS. 20D and 20E). As described above, an electron diffraction pattern derived from a crystal structure is observed from each of the a-like OS and nc-OS. Therefore, a crystal part (see FIG. 20E) can be observed in the high-resolution TEM image.

The crystal part size in the a-like OS and the nc-OS can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm can be regarded as corresponding to the a-b plane of the InGaZnO$_4$ crystal. The maximum length of the region in which the lattice fringes are observed is regarded as the size of a crystal part in an oxide. Note that the crystal part whose size is 0.8 nm or larger is selectively evaluated.

Figure 22:
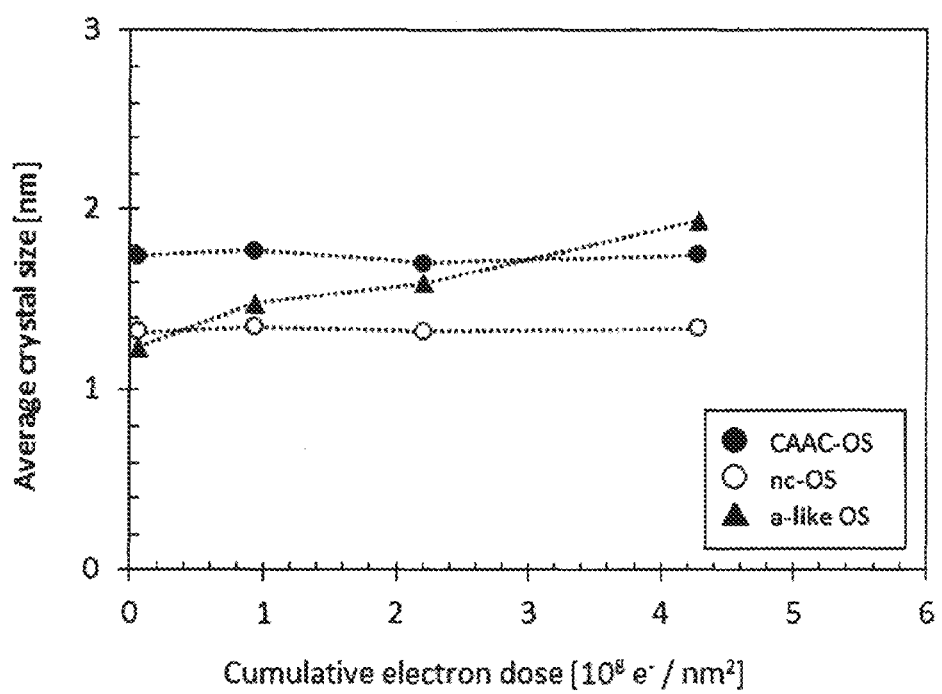
FIG. 22 shows changes of crystal parts of an In—Ga—Zn oxide owing to electron irradiation.

FIG. 22 shows examination results of change in average size of crystal parts (20 points to 40 points) in the CAAC-OS, the nc-OS, and the a-like OS using high-resolution TEM images. Here, it is determined whether or not a crystal size is increased by electron irradiation (see Step S108 in FIG. 8). Note that the length of the crystal part in the longitudinal direction is measured as a crystal part size. FIG. 22 shows that the crystal part size in the a-like OS increases with an increase in the cumulative electron dose. Specifically, a crystal part of approximately 1.2 nm at the start of TEM observation grows to a size of approximately 2.6 nm at a cumulative dose of $4.2 \times 10^8$ e$^-$/nm$^2$. In contrast, the crystal part size in the nc-OS shows little change from the start of electron irradiation to a cumulative electron dose of $4.2 \times 10^8$ e$^-$/nm$^2$ regardless of the cumulative electron dose. It is shown that the change in the crystal part size is specifically less than 10%, more specifically less than 7%.

Furthermore, in FIG. 22, by linear approximation of the change in the crystal part size in each of the a-like OS and the nc-OS and extrapolation to the total amount of electron irradiation of 0 e$^-$/nm$^2$, the average size of the crystal part is found to be a positive value. This means that the crystal parts exist in the a-like OS and the nc-OS before TEM observation.

Therefore, an oxide whose crystal size is increased by electron irradiation is determined to be the a-like OS (see Step S109 in FIG. 8). An oxide whose crystal size is not increased by electron irradiation is determined to be the nc-OS (see Step S110 in FIG. 8).

<<a-like OS>>

Here, the a-like OS will be described. The a-like OS has a structure intermediate between those of the nc-OS and the amorphous oxide semiconductor.

Figure 21A:
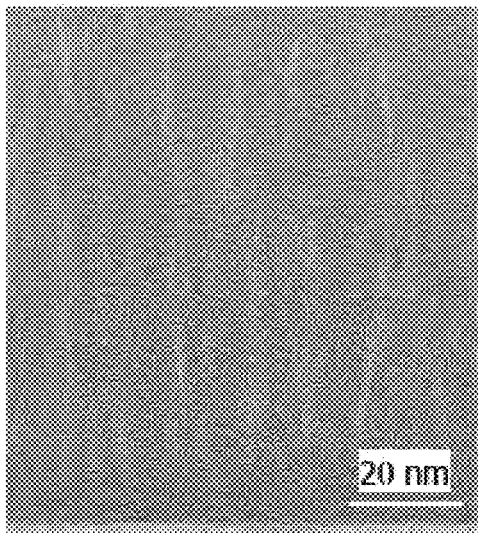
FIGS. 21A and 21B show cross-sectional TEM images of an a-like OS.
Figure 21B:
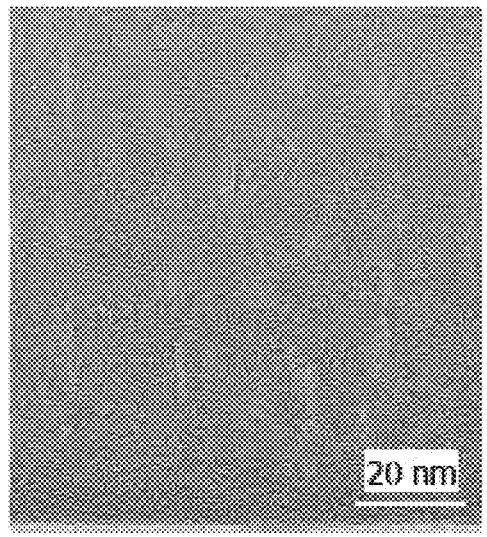

FIGS. 21A and 21B show high-resolution cross-sectional TEM images of the a-like OS. FIG. 21A is the high-resolution cross-sectional TEM image of the a-like OS taken at the start of the electron irradiation. FIG. 21B is the high-resolution cross-sectional TEM image of the a-like OS taken after the irradiation with electrons (e$^-$) at $4.3 \times 10^8$ e$^-$/nm$^2$. FIGS. 21A and 21B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that the a-like OS has an unstable structure as compared with the CAAC-OS and the nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of InGaZnO$_4$ in the following description. Each lattice fringe corresponds to the a-b plane of the InGaZnO$_4$ crystal.

FIG. 22 shows changes in the average size of crystal parts (at 22 points to 30 points) in each sample. Note that the crystal part size corresponds to the length of a lattice fringe. FIG. 22 indicates that the crystal part size in the a-like OS increases with an increase in the cumulative electron dose in obtaining TEM images, for example. As shown in FIG. 22, a crystal part with a size of approximately 1.2 nm (also referred to as an initial nucleus) at the start of TEM observation grows to a size of approximately 1.9 nm at a cumulative electron (e$^-$) dose of $4.2\times10^8$ e$^-$/nm$^2$. In contrast, the crystal part sizes in the nc-OS and the CAAC-OS show little change from the start of electron irradiation to a cumulative electron dose of $4.2\times10^8$ e$^-$/nm$^2$. As shown in FIG. 22, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7\times10^5$ e$^-$/(nm$^2$·s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density lower than 78% of the density of the single crystal oxide semiconductor.

For example, in the case of an oxide semiconductor whose atomic ratio of In to Ga and Zn is 1:1:1, the density of single crystal InGaZnO$_4$ with a rhombohedral crystal structure is 6.357 g/cm$^3$. Accordingly, in the case of the oxide semiconductor whose atomic ratio of In to Ga and Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga and Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single crystal state, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition may be calculated using a weighted average with respect to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

<<nc-OS>>

The nc-OS will be described here.

Analysis of an nc-OS by XRD will be described. When the structure of an nc-OS is analyzed by an out-of-plane method, a peak indicating orientation does not appear. That is, a crystal of an nc-OS does not have orientation.

For example, when an electron beam with a probe diameter of 50 nm is incident on a 34-nm-thick region of a thinned nc-OS including an InGaZnO$_4$ crystal in the direction parallel to the formation surface, a ring-like diffraction pattern (nanobeam electron diffraction pattern) shown in FIG. 20A is observed. FIG. 20B shows a diffraction pattern (nanobeam electron diffraction pattern) obtained when an electron beam with a probe diameter of 1 nm is incident on the same sample. In FIG. 20B, a plurality of spots is observed in a ring-like region. Thus, ordering in an nc-OS is not observed with an electron beam with a probe diameter of 50 nm but is observed with an electron beam with a probe diameter of 1 nm.

When an electron beam with a probe diameter of 1 nm is incident on a region with a thickness less than 10 nm, an electron diffraction pattern in which six spots are arranged in an approximately regular hexagonal shape as shown in FIG. 20C is observed in some cases. This means that an nc-OS has a well-ordered region, that is, a crystal, in the thickness range of less than 10 nm. Note that an electron diffraction pattern having regularity is not observed in some regions because crystals are aligned in various directions.

FIG. 20E shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<1-3. Deposition Method of CAAC-OS>

An example of a deposition model of the CAAC-OS using a sputtering method will be described below.

Figure 23:
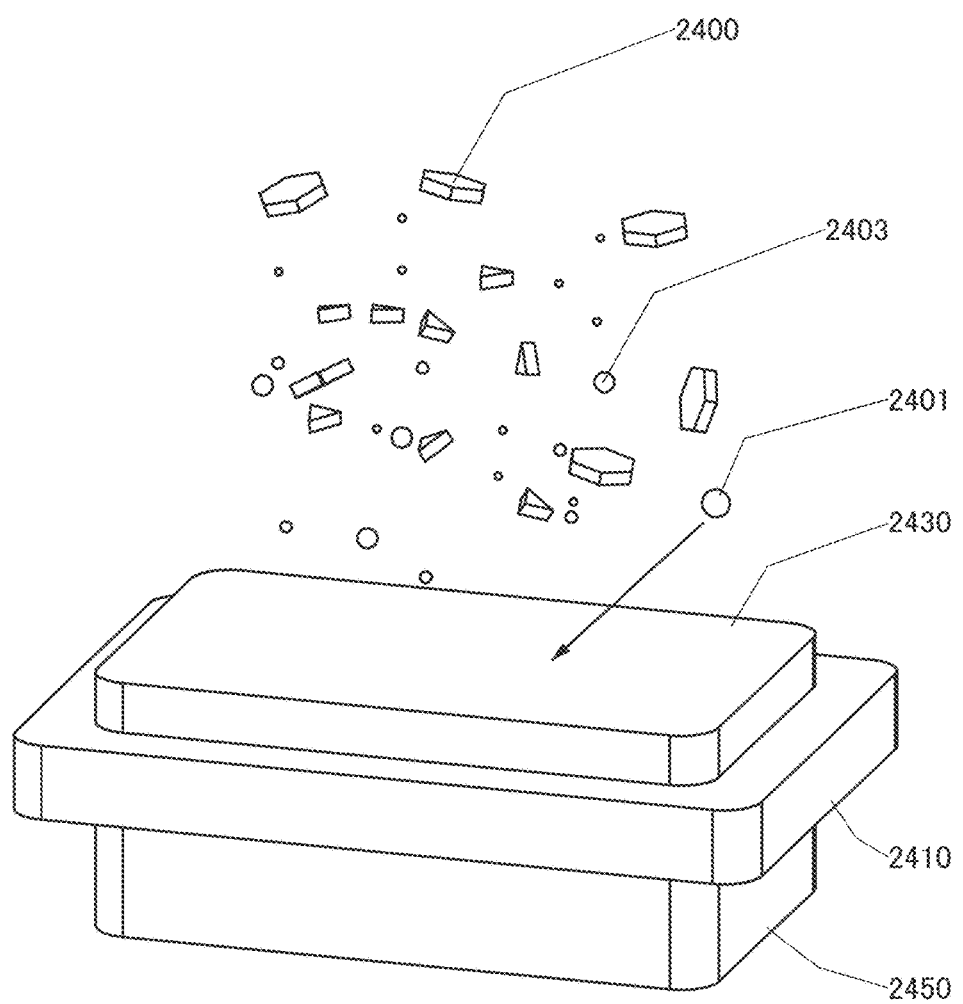
FIG. 23 illustrates a deposition method of a CAAC-OS.

A target 2430 is provided in a deposition chamber as illustrated in FIG. 23. The target 2430 is attached to a backing plate 2410. A magnet 2450 is placed to overlap with the target 2430 with the backing plate 2410 positioned therebetween. The deposition chamber is mostly filled with a deposition gas (e.g., oxygen, argon, or a mixed gas containing oxygen at 5 volume % or higher) and the pressure in the deposition chamber is controlled to be higher than or equal to 0.01 Pa and lower than or equal to 100 Pa, and preferably higher than or equal to 0.1 Pa and lower than or equal to 10 Pa. Here, discharge starts by voltage application at a certain value or higher to the target 2430, and plasma can be observed. A magnetic field of the magnet 2450 forms a high-density plasma region in the vicinity of the target 2430. In the high-density plasma region, the deposition gas is ionized, so that an ion 2401 is generated. A sputtering method in which the deposition rate is increased by utilizing a magnetic field of a magnet is referred to as a magnetron sputtering method. Examples of the ion 2401 include an oxygen cation ($O^+$) and an argon cation ($Ar^+$).

Figure 24A:
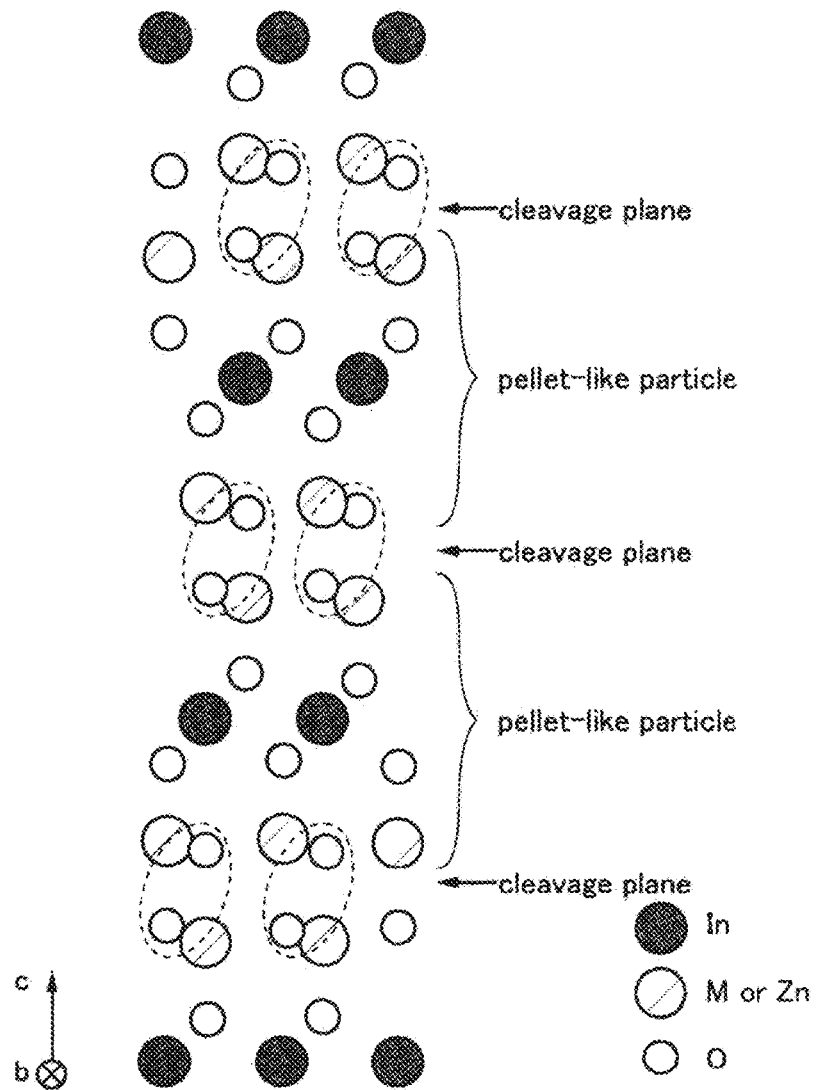
FIGS. 24A to 24C illustrate a crystal of $InMZnO_4$ and a pellet.

Here, the target 2430 has a polycrystalline structure which includes a plurality of crystal grains and in which a cleavage plane exists in any of the crystal grains. FIG. 24A shows a crystal structure of $InMZnO_4$ (the element M is aluminum, gallium, yttrium, or tin, for example) included in the target 2430 as an example. Note that FIG. 24A illustrates the crystal structure of $InMZnO_4$ observed in a direction parallel to the b-axis. In the crystal of $InMZnO_4$, oxygen atoms are negatively charged, whereby repulsive force is generated between two adjacent M-Zn—O layers. Thus, the $InMZnO_4$ crystal has a cleavage plane between two adjacent M-Zn—O layers.

The ion 2401 generated in the high-density plasma region is accelerated toward the target 2430 side by an electric field, and then collides with the target 2430. At this time, a pellet 2400 which is a flat-plate-like or pellet-like sputtered particle is separated from the cleavage plane. Note that along with the separation of the pellet 2400, atomic particles 2403 are also sputtered from the target 2430. The atomic particles 2403 each have an atom or an aggregate of several atoms.

Figure 24B:
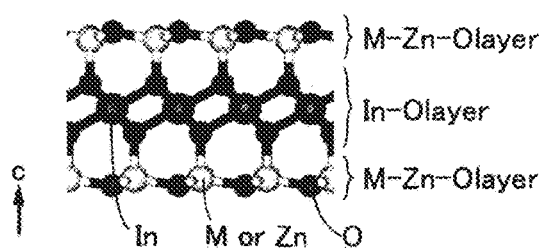
Figure 24C:
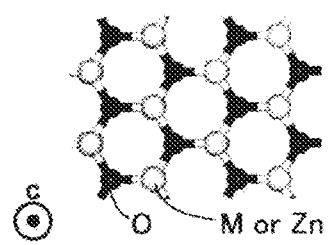
Figure 25A:
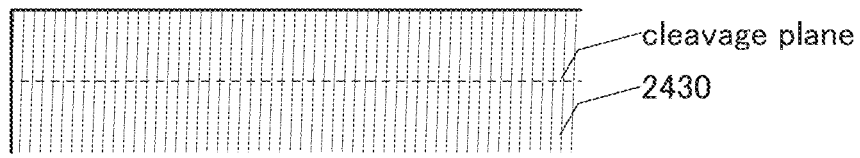
FIGS. 25A to 25D illustrate a deposition method of a CAAC-OS.
Figure 25B:
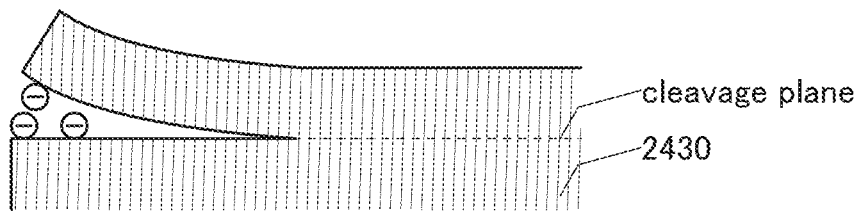
Figure 25C:
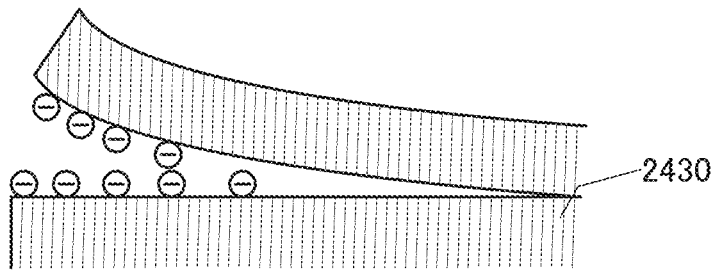
Figure 25D:
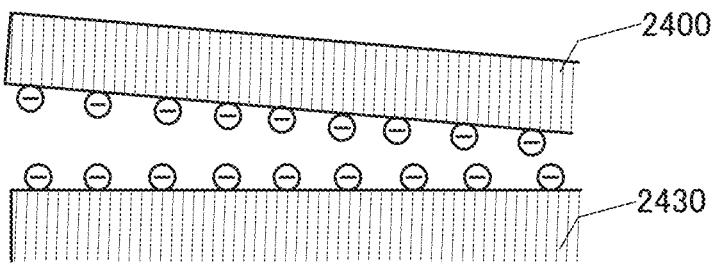

Cleavage at a surface of the target is described with reference to cross-sectional views in FIGS. 25A to 25D. FIG. 25A is a cross-sectional view of the target 2430 having a cleavage plane (indicated by a dashed line). When the ion 2401 collides with the target 2430, bonds are sequentially cut from an end portion of the cleavage plane (see FIG. 25B). The cleaved surfaces repel each other because of the existence of charges with the same polarity. For this reason, rebinding does not occur once the bond is cut. As repellency due to charges proceeds, a region where bonds are cut gradually expands (see FIG. 25C). In the end, the pellet 2400 is separated from the target 2430 (see FIG. 25D). The pellet 2400 corresponds to a portion between any two adjacent cleavage planes illustrated in FIG. 24A. Thus, when the pellet 2400 is observed, the cross-section thereof is as illustrated in FIG. 24B, and the top surface thereof is as illustrated in FIG. 24C. Note that the structure of the pellet 2400 may be distorted by an impact of collision with the ion 2401.

As illustrated in FIG. 23, the pellet 2400 is a flat-plate-like (pellet-like) sputtered particle having a triangle plane, e.g., a regular triangle plane. Alternatively, the pellet 2400 is a flat-plate-like (pellet-like) sputtered particle having a hexagon plane, e.g., a regular hexagon plane. However, the shape of a flat plane of the pellet 2400 is not limited to a triangle or a hexagon.

The thickness of the pellet 2400 is determined depending on the kind of the deposition gas and the like. For example, the thickness of the pellet 2400 is greater than or equal to 0.4 nm and less than or equal to 1 nm, preferably greater than or equal to 0.6 nm and less than or equal to 0.8 nm. In addition, for example, the width of the pellet 2400 is greater than or equal to 1 nm and less than or equal to 100 nm, preferably greater than or equal to 1 nm and less than or equal to 50 nm, further preferably greater than or equal to 1 nm and less than or equal to 30 nm, still further preferably greater than or equal to 1 nm and less than or equal to 6 nm.

A surface of the pellet 2400 might be negatively or positively charged when the pellet 2400 receives a charge from plasma. For example, the pellet 2400 receives a negative charge from $O^{2-}$ in the plasma. In that case, oxygen atoms on the surfaces of the pellet 2400 may be negatively charged. A lateral growth (also referred to as a primary growth) might occur when the atomic particles 2403 are attached and bonded to a side surface of the pellet 2400 in plasma.

The pellet 2400 and the atomic particles 2403 that have passed through plasma reach a surface of a substrate 2420. Note that some of the atomic particles 2403 are discharged to the outside by a vacuum pump or the like because of their smallness in mass.

Next, deposition of the pellets 2400 and the atomic particles 2403 on the surface of the substrate 2420 is described with reference to FIGS. 26A to 26F.

First, a first pellet 2400 is deposited on the substrate 2420. Since the pellet 2400 has a flat-plate-like shape, it is deposited with its flat plane facing the surface of the substrate 2420. At this time, a charge on a surface of the pellet 2400 on the substrate 2420 side is lost through the substrate 2420.

Next, a second pellet 2400 reaches the substrate 2420. Since a surface of the first pellet 2400 and a surface of the second pellet 2400 are charged, they repel each other. As a result, the second pellet 2400 avoids being deposited on the first pellet 2400, and is deposited with its flat plane facing the surface of the substrate 2420 so as to be a little distance away from the first pellet 2400. With repetition of this, millions of the pellets 2400 are deposited on the surface of the substrate 2420 to have a thickness of one layer. A region where no pellet 2400 is deposited is generated between adjacent pellets 2400 (see FIG. 26A).

Note that in the case where the first pellet 2400 and the second pellet 2400 are sufficiently close to each other, the second pellet 2400 interacts with the first pellet 2400. Thus, the second pellet 2400 might rotate around its c-axis so as to have its a-axis and b-axis aligned with the a-axis and b-axis directions of the first pellet 2400. However, interaction between the two pellets 2400 becomes weaker as a distance therebetween gets longer. Therefore, the size of a region where the pellets 2400 are aligned in the same direction is within the range of a region where the pellets 2400 interact with each other. For example, a region where the pellets 2400 are aligned in the same direction is formed within the size range of 10 nm or more and 100 nm or less or 20 nm or more and 70 nm or less.

Then, the atomic particles 2403 that have received energy from plasma reach the surface of the substrate 2420. The atomic particles 2403 cannot be deposited on an active region such as the surfaces of the pellets 2400. For this reason, the atomic particles 2403 move to regions where no pellet 2400 is deposited and are attached to side surfaces of the pellets 2400. Since available bonds of the atomic particles 2403 are activated by energy received from plasma, the atomic particles 2403 are chemically bonded to the pellets 2400 to form lateral growth portions 2402 (see FIG. 26B). A lateral growth (also referred to as a secondary growth) of the lateral growth portions 2402 further occurs, so that a lateral growth region is formed and the pellets 2400 are anchored to each other (see FIG. 26C). In this manner, the lateral growth portions 2402 are formed until they fill regions where no pellet 2400 is deposited. This mechanism is similar to a deposition mechanism for an atomic layer deposition (ALD) method.

Even when the pellets 2400 are deposited apart from each other, the atomic particles 2403 are subjected to a secondary growth to fill gaps between the pellets 2400; thus, a crystal part larger than the pellet 2400 separated from the target 2430 (such a crystal part is hereinafter referred to as a grain) is formed. The atomic particles 2403 make a smooth connection even in a gap between the grains, so that no clear grain boundary is formed. Since a CAAC-OS is formed with such a mechanism, a crystal structure including distortion between the grains, which is different from single crystal and polycrystalline structures, is formed. Regions filling the gaps between the grains have a trace of a crystal structure despite their distortion; thus, it will not be appropriate to say that the regions have an amorphous structure.

Figure 26A:
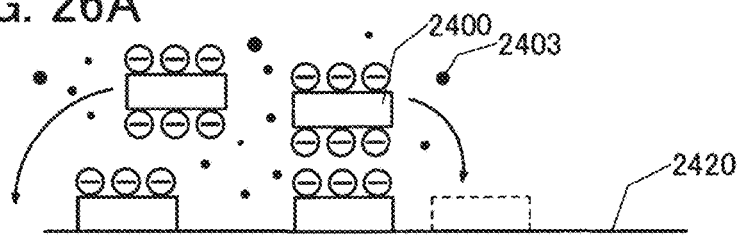
FIGS. 26A to 26F illustrate a deposition method of a CAAC-OS.
Figure 26B:
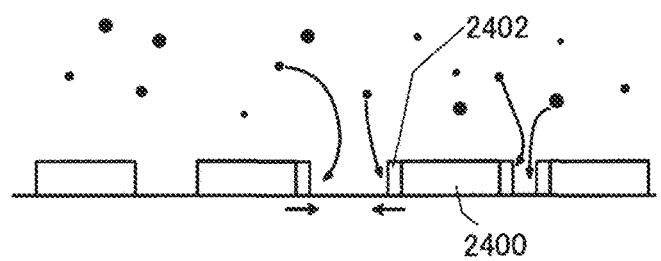
Figure 26C:
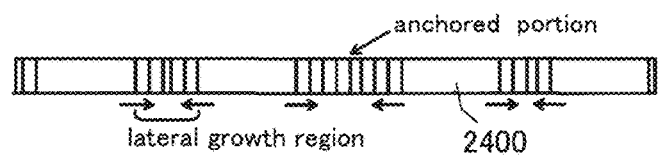
Figure 26D:
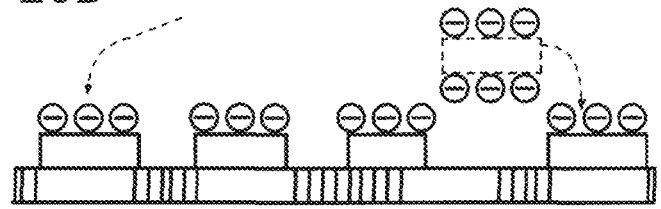
Figure 26E:
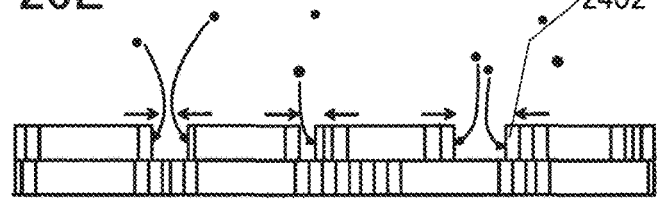
Figure 26F:
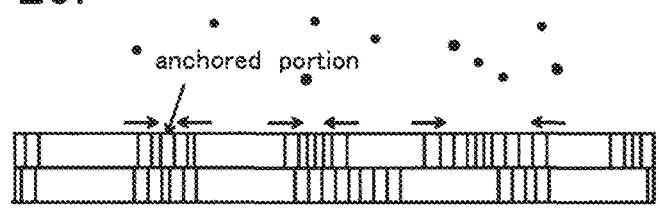

Then, on a layer where the grains are connected to each other, new pellets 2400 are deposited with their flat planes facing the surface of the substrate 2420 (see FIG. 26D). After that, the atomic particles 2403 are deposited so as to fill regions where no pellet 2400 is deposited, thereby forming the lateral growth portions 2402 (see FIG. 26E). In such a manner, the particles 2403 are attached to side surfaces of the pellets 2400 and the lateral growth portions 2402 cause a secondary growth so that the pellets 2400 in the second layer are anchored to each other (see FIG. 26F). This occurs with a mechanism similar to the mechanism described with reference to FIGS. 26A to 26C. Deposition continues until the m-th layer (m is an integer of two or more) is formed; as a result, a stacked-layer thin film structure is formed.

How the pellets 2400 are deposited depends also on the surface temperature of the substrate 2420 or the like. For example, if the surface temperature of the substrate 2420 is high, rotation and migration of the pellets 2400 occur over the surface of the substrate 2420. As a result, the proportion of the pellets 2400 that are directly connected to each other without the atomic particles 2403 increases, whereby a CAAC-OS with high orientation is made. The surface temperature of the substrate 2420 for deposition of the CAAC-OS is higher than or equal to 100° C. and lower than 500° C., preferably higher than or equal to 140° C. and lower than 450° C., further preferably higher than or equal to 170° C. and lower than 400° C. Therefore, even when a large-sized substrate of the 8th generation or a larger substrate is used as the substrate 2420, a warp or the like due to the deposition of the CAAC-OS hardly occurs.

In contrast, if the surface temperature of the substrate 2420 is low, the rotation of the pellets 2400 over the surface of the substrate 2420 does not easily occur. Therefore, the grains are not aligned in the same a-axis and b-axis directions in a gap therebetween; thus, defects might be formed at a boundary between the grains.

The above is the description of the case of a flat plate pellet. In contrast, in the case of a cubic pellet or a columnar pellet that has a small width, for example, pellets that have reached a surface of a substrate are oriented in various directions. Then, particles are attached to side surfaces of the deposited pellets while the orientations of the pellets are varied, and lateral growth portions cause a secondary growth. The crystal orientation in the resulting thin film might not be uniform.

The above-described deposition model can be used not only for the case where a target has a polycrystalline structure of a composite oxide with a plurality of crystal grains, such as an In-M-Zn oxide, and any of the crystal grains have a cleavage plane, but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around a target. Because of the high electric field region of plasma, atomic particles separated from the target are anchored to each other to cause a lateral growth (a primary growth). For example, indium atoms, which are atomic particles, are anchored to each other and cause a lateral growth to be a nanocrystal formed of an In—O layer, and then an M-Zn—O layer is bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

<Secondary Growth>

The following description explains that a secondary growth occurs when the atomic particles 2403 are attached to (bonded to or adsorbed on) the pellet 2400 laterally.

Figure 27A:
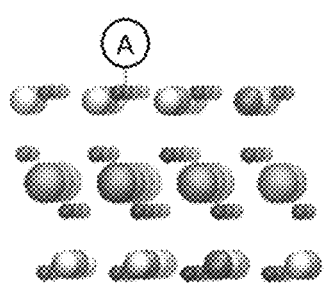
FIGS. 27A to 27G illustrate the position where a particle is attached to a pellet.
Figure 27B:
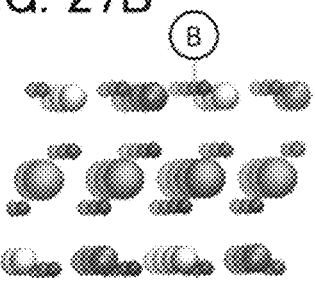
Figure 27C:
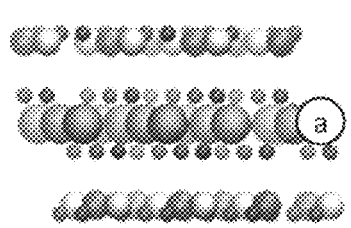
Figure 27D:
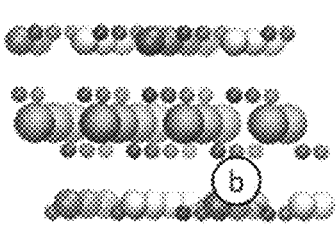
Figure 27E:
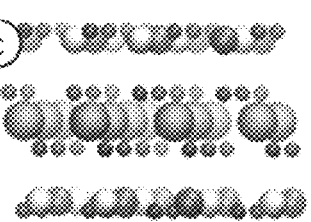
Figure 27F:
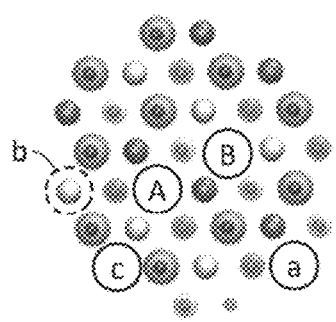
Figure 27G:
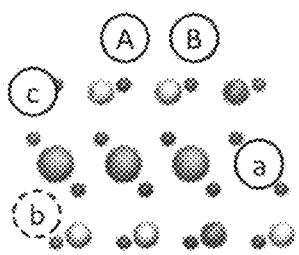

FIGS. 27A to 27E each illustrate a structure of the pellet 2400 and a position to which a metal ion can be attached. A model assumed as the pellet 2400 is a cluster model with 84 atoms extracted from an InMZnO$_4$ crystal structure with a constant stoichiometric composition. Note that the following description is made on the assumption that the element M is gallium. FIG. 27F illustrates a structure of the pellet 2400 seen in the direction parallel to the c-axis. FIG. 27G illustrates a structure of the pellet 2400 seen in the direction parallel to the a-axis.

The positions to which metal ions can be attached are represented as a position A, a position B, a position a, a position b, and a position c. The position A is an upper part of an interstitial site surrounded by one gallium atom and two zinc atoms on the top surface of the pellet 2400. The position B is an upper part of an interstitial site surrounded by two gallium atoms and one zinc atom on the top surface of the pellet 2400. The position a is in an indium site on a side surface of the pellet 2400. The position b is in an interstitial site between an In—O layer and a Ga—Zn—O layer on a side surface of the pellet 2400. The position c is in a gallium site on a side surface of the pellet 2400.

The relative energy was estimated from first principles calculation in each case where a metal ion was located in the assumed position (the position A, the position B, the position a, the position b, or the position c). In the calculation, first principles calculation software VASP (Vienna Ab initio Simulation Package) was used. For the exchange-correlation potential, Perdew-Burke-Emzerhof (PBE) type generalized gradient approximation (GGA) was used, and for the ion potential, a projector augmented wave (PAW) method was used. The cut-off energy was 400 eV, and Γ-only k-point sampling was used. The table below shows the relative energies in the case where an indium ion ($In^{3+}$), a gallium ion ($Ga^{3+}$), and a zinc ion ($Zn^{2+}$) are located at the position A, the position B, the position a, the position b, and the position c. Note that the relative energy is a relative value under the condition where the energy of the model with the lowest energy among the calculated models is set to 0 eV.

TABLE 1

| Ion | Relative energy [eV] | | | | |
| --- | --- | --- | --- | --- | --- |
| | Pellet top surface | | Pellet side surface | | |
| | A | B | a | b | c |
| $In^{3+}$ | 2.1 | 1.5 | 0.0 | 1.8 | 1.9 |
| $Ga^{3+}$ | 3.7 | 3.0 | 0.6 | 0.0 | 3.5 |
| $Zn^{2+}$ | 2.3 | 1.8 | 0.0 | 0.6 | 2.9 |

It is found that any metal ion is more likely to be attached to the side surface of the pellet 2400 than to the top surface thereof. It is also found that a zinc ion as well as an indium ion is most likely to be attached to the indium site at the position a.

Figure 28A:
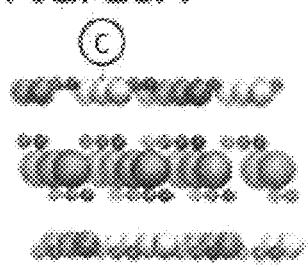
FIGS. 28A to 28G illustrate the position where a particle is attached to a pellet.
Figure 28B:
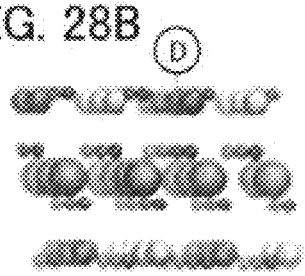
Figure 28C:
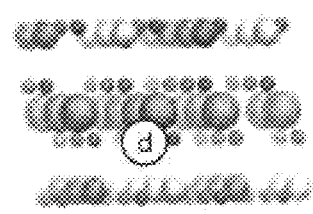
Figure 28D:
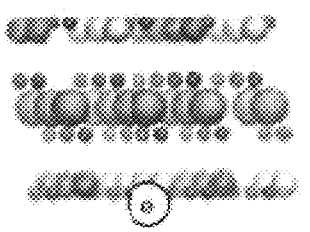
Figure 28E:
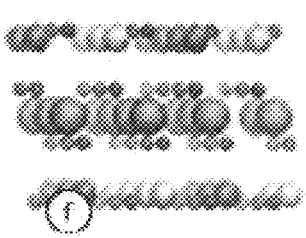
Figure 28F:
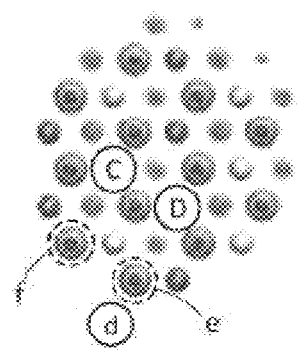
Figure 28G:
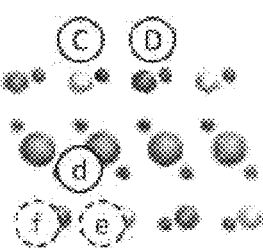

Ease of oxygen ion ($O^{2-}$) attachment to the pellet 2400 was examined. FIGS. 28A to 28E each illustrate a structure of the pellet 2400 and a position to which an oxygen ion can be attached. FIG. 28F illustrates a structure of the pellet 2400 seen in the direction parallel to the c-axis. FIG. 28G illustrates a structure of the pellet 2400 seen in the direction parallel to the b-axis.

The positions to which oxygen ions can be attached are represented as a position C, a position D, a position d, a position e, and a position f In the position C, an oxygen ion is bonded to gallium on the top surface of the pellet 2400. In the position D, an oxygen ion is bonded to zinc on the top surface of the pellet 2400. In the position d, an oxygen ion is bonded to indium on a side surface of the pellet 2400. In the position e, an oxygen ion is bonded to gallium on a side surface of the pellet 2400. In the position f, an oxygen ion is bonded to zinc on a side surface of the pellet 2400.

The relative energy was estimated from first principles calculation in each case where an oxygen ion was located in the assumed position (the position C, the position D, the position d, the position e, or the position f). The table below shows the relative energies in the case where oxygen ions ($O^{2-}$) are located at the position C, the position D, the position d, the position e, and the position f.

TABLE 2

| Ion | Relative energy [eV] | | | | |
| --- | --- | --- | --- | --- | --- |
| | Pellet top surface | | Pellet side surface | | |
| | C | D | d | e | f |
| $O^{2-}$ | 3.9 | 3.6 | 0.0 | 0.5 | 1.5 |

It is found that the oxygen ion is also likely to be attached to the side surface of the pellet 2400 than to the top surface thereof.

According to the above, the atomic particle 2403 that has approached the pellet 2400 is preferentially attached to the side surface of the pellet 2400. This suggests that the deposition model in which a secondary growth of the pellet 2400 occurs when the atomic particles 2403 are attached to the side surface of the pellet 2400 has high validity.

<Diagram Illustrating Atomic Ratio>

Next, an atomic ratio of an oxide semiconductor included in the oxide semiconductor of one embodiment of the present invention will be described.

Figure 6A:
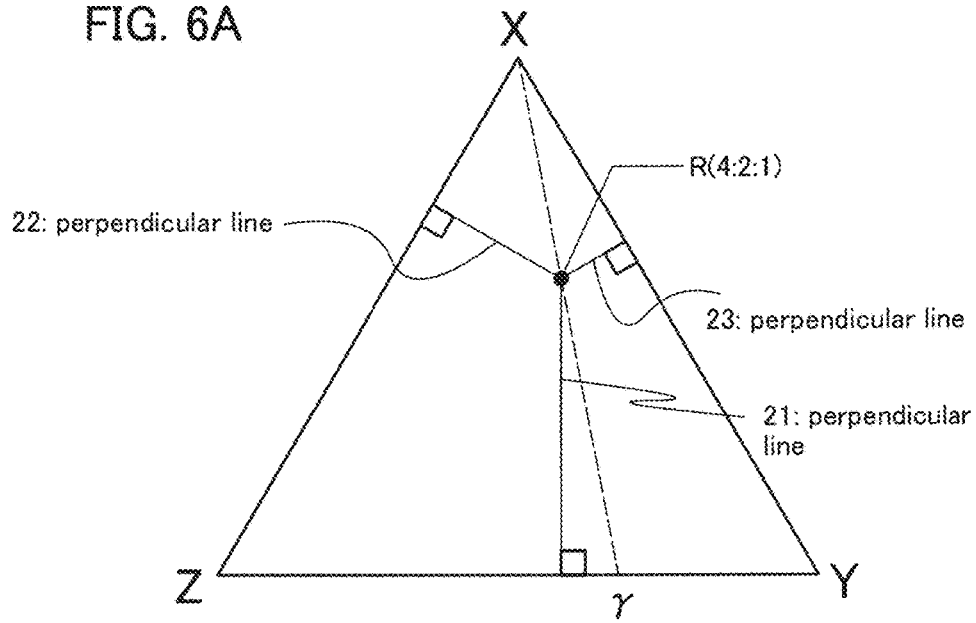
FIGS. 6A and 6B each illustrate an atomic ratio.
Figure 6B:
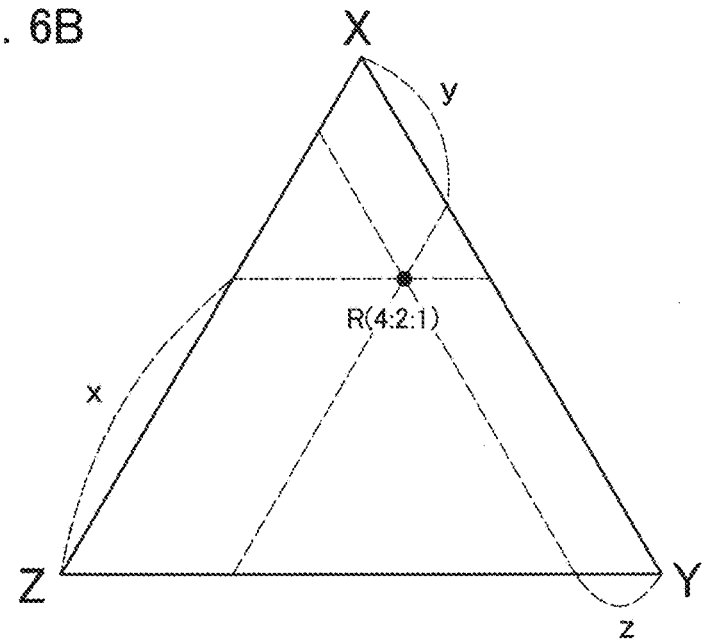

FIGS. 6A and 6B can be used to show the atomic ratio of an element X to an element Y and an element Z in a substance. The atomic ratio of the element X to the element Y and the element Z is denoted by x:y:z. This atomic ratio can be shown as coordinates (x:y:z) in FIGS. 6A and 6B.

FIGS. 6A and 6B each illustrate a regular triangle with vertices X, Y, and Z, and a coordinate point R (4:2:1) as an example. As the distance to the vertex decreases, the proportion of atoms of a corresponding element increases, whereas as the distance increases, the proportion of atoms decreases. As illustrated in FIG. 6A, the atomic ratio of the elements is represented by the ratio of the lengths of perpendicular lines from the coordinate point to the opposite sides of the respective vertexes of the triangle. For example, the proportion of atoms of the element X is represented by the length of a perpendicular line 21 from the coordinate point to the opposite side of the vertex X, that is, to a side YZ. Therefore, at the coordinate point R in FIGS. 6A and 6B, the atomic ratio of the element X to the element Y and the element Z is the ratio of the length of the perpendicular line 21 to the length of a perpendicular line 22 and the length of a perpendicular line 23, that is, x:y:z=4:2:1. The intersection of the side YZ with a line passing through the vertex X and the coordinate point R is denoted by γ. Assuming that the ratio of the length of a line Yγ to the length of a line γZ is Yγ:γZ, Yγ:γZ corresponds to (the number of atoms of the element Z): (the number of atoms of the element Y). That is, when x:y:z is 4:2:1, for example, Yγ:γZ=1:2 is satisfied.

As illustrated in FIG. 6B, three straight lines which pass through the coordinate point R and are parallel to the respective three sides of the triangle are drawn. The intersections of the three lines with the three sides can be used to determine x, y, and z in FIG. 6B.

<Atomic Ratio of Oxide Semiconductor>

Next, a favorable range of atomic ratios of indium to the element M and zinc in the oxide semiconductor according to the present invention will be described with reference to FIGS. 1 to 5. Note that the proportion of oxygen atoms is not shown. Terms of the atomic ratio of indium to the element M and zinc in the oxide semiconductor are denoted by [In], [M], and [Zn].

In FIGS. 1 to 5, dashed lines correspond to a line representing the atomic ratio of [In]:[M]:[Zn]=(1+α):(1−α):1 (−1≤α≤1), a line representing the atomic ratio of [In]:[M]:[Zn]=(1+α):(1−α):2, a line representing the atomic ratio of [In]:[M]:[Zn]=(1+α):(1−α):3, a line representing the atomic ratio of [In]:[M]:[Zn]=(1+α):(1−α):4, and a line representing the atomic ratio of [In]:[M]:[Zn]=(1+α):(1−α):5.

Dashed-dotted lines correspond to a line representing the atomic ratio of [In]:[M]:[Zn]=1:1:β (β≥0), a line representing the atomic ratio of [In]:[M]:[Zn]=1:2:β, a line representing the atomic ratio of [In]:[M]:[Zn]=1:3:β, a line representing the atomic ratio of [In]:[M]:[Zn]=1:4:β, a line representing the atomic ratio of [In]:[M]:[Zn]=1:7:β, a line representing the atomic ratio of [In]:[M]:[Zn]=2:1:β, a line representing the atomic ratio of [In]:[M]:[Zn]=3:1:β, and a line representing the atomic ratio of [In]:[M]:[Zn]=5:1:β.

The black dot in each of FIGS. 1 to 5 and FIGS. 6A and 6B indicates coordinates representing $ZnM_2O_4$, which has a spinel crystal structure.

FIG. 1 illustrates an example of a preferable range of atomic ratios of In to the element M and Zn included in the oxide semiconductor of one embodiment of the present invention.

In some cases, a plurality of crystal structures (two, three, or more phases) coexist in the oxide semiconductor. For example, in the case of the atomic ratio of [In]:[M]:[Zn]=0:2:1 or a neighborhood thereof in a region 17 in FIG. 4, two phases, i.e., a spinel crystal structure and a layered structure, tend to coexist. In the case of the atomic ratio at the coordinates representing In or a neighborhood thereof in a region 18 in FIG. 4, two phases, i.e., a cubic bixbyite crystal structure of $In_2O_3$ and a layered structure, tend to coexist.

In the case where a plurality of crystal structures coexist in an oxide semiconductor, a grain boundary might be formed between different crystal structures, so that the electrical characteristics or reliability of the oxide semiconductor might deteriorate. Alternatively, in the case where a plurality of crystal structures coexist in the oxide semiconductor, variation of the oxide semiconductor might be caused.

In addition, an oxide semiconductor containing In in a higher proportion can have higher electron mobility. In contrast, it is highly probable that an oxide semiconductor containing less In and Zn has lower electron mobility. Thus, it is possible that the insulating property is increased in the case of the atomic ratio at the coordinates representing the element M or a neighborhood thereof in a region 19 in FIG. 5.

Therefore, the oxide semiconductor of one embodiment of the present invention has an atomic ratio in a region 10 in FIG. 1 excluding the regions 17 to 19, which provides high electron mobility and corresponds to a layered crystal structure.

Figure 7A:
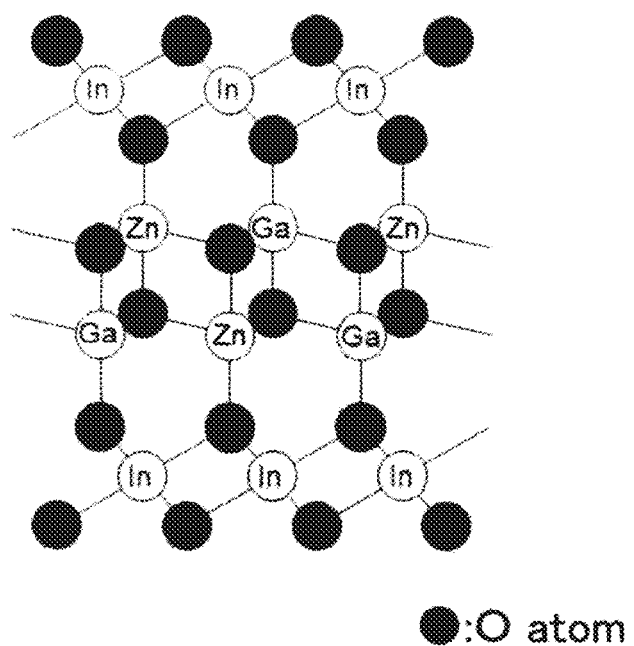
FIGS. 7A and 7B each illustrate a crystal of an oxide semiconductor.

FIG. 7A illustrates a crystal model of $InGaZnO_4$ with [In]:[M]:[Zn]=1:1:1. An oxide semiconductor with [In]:[M]:[Zn]=1:1:1 has a layered structure in which one $(InO_2)^-$ layer and two $(GaZnO_2)^+$ layers are alternately stacked.

Figure 7B:
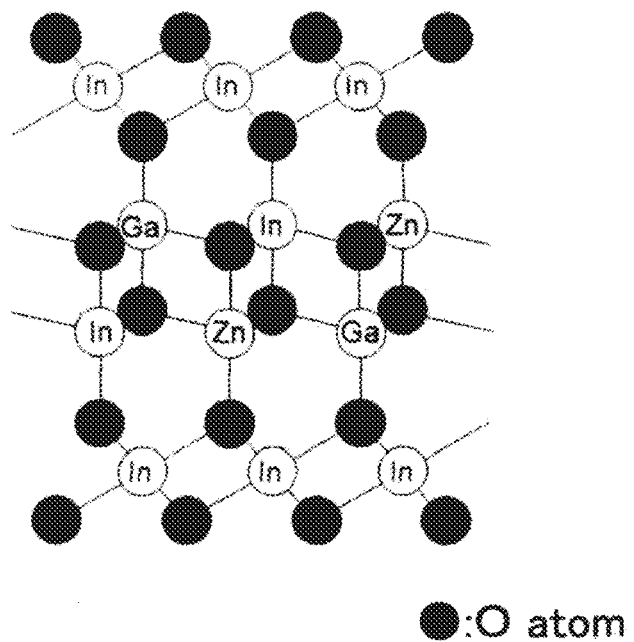

FIG. 7B illustrates a crystal model of $In_{1.33}Ga_{0.67}ZnO_4$ with [In]:[M]:[Zn]=4:2:3. Both In and Ga atoms are trivalent and can be substituted for each other. The crystal model illustrated in FIG. 7B has a layered structure which includes $(In_\gamma Ga_{1-\gamma}ZnO_2)^+$ layers with In atoms substituted for some Ga atoms in the $(GaZnO_2)^+$ layers in FIG. 7A and in which one $(InO_2)^-$ layer and two $(In_\gamma Ga_{1-\gamma}ZnO_2)^+$ layers are alternately stacked. Although not illustrated, as the proportion of Ga increases, Ga atoms substitute for some In atoms in the $(InO_2)^-$ layers; thus, $(In_{1-\gamma}Ga_\gamma O_2)^-$ layers and $(GaZnO_2)^+$ layers form a layered crystal structure.

That is, an oxide semiconductor with [In]:[M]:[Zn]=(1+α):(1−α):1 has a layered crystal structure in which one $(InO_2)^-$ layer and two $(GaZnO_2)^+$ layers are alternately stacked, when α=0. When 1≥α>0, the oxide semiconductor has a layered crystal structure in which one $(InO_2)^-$ layer and two $(In_\gamma Ga_{1-\gamma}ZnO_2)^+$ layers are alternately stacked. When 0≤α≥−1, the oxide semiconductor has a layered crystal structure in which one $(In_{1-\gamma}Ga_\gamma O_2)^-$ layer and two $(GaZnO_2)^+$ layers are alternately stacked.

Therefore, oxide semiconductors with atomic ratios shown in a region along a line representing [In]:[M]=(1+α):(1−α) in the phase diagram have a layered crystal structure; thus, it is highly probable that the oxide semiconductors have the same crystal structure.

An oxide semiconductor with [In]:[M]:[Zn]=1:1:2 has a layered structure in which one $(InO_2)^-$ layer and three $(GaZnO_2)^+$ layers are alternately stacked. Therefore, when [Zn] is an integer, $(InO_2)^-$ layers and $(GaZnO_2)^+$ layers are periodically stacked and form a layered crystal structure.

Even when [Zn] is a positive non-integer, a layered crystal structure may be formed in some cases. For example, when 1< [Zn]< 2, the layered structure formed when [Zn]=1 and the layered structure formed when [Zn]=2 are included and form a layered crystal structure.

Therefore, the oxide semiconductor of one embodiment of the present invention preferably has an atomic ratio shown in a region 11, 12, 13, 14, or 15 in FIG. 2. Note that the region 11 shows the atomic ratio of [In]:[M]:[Zn]=(1+α):(1−α):1 or a neighborhood thereof. The region 12 shows the atomic ratio of [In]:[M]:[Zn]=(1+α):(1−α):2 or a neighborhood thereof. The region 13 shows the atomic ratio of [In]:[M]:[Zn]=(1+α):(1−α):3 or a neighborhood thereof. The region 14 shows the atomic ratio of [In]:[M]:[Zn]=(1+α):(1−α):4 or a neighborhood thereof. The region 15 shows the atomic ratio of [In]:[M]:[Zn]=(1+α):(1−α):5 or a neighborhood thereof.

Figure 3:
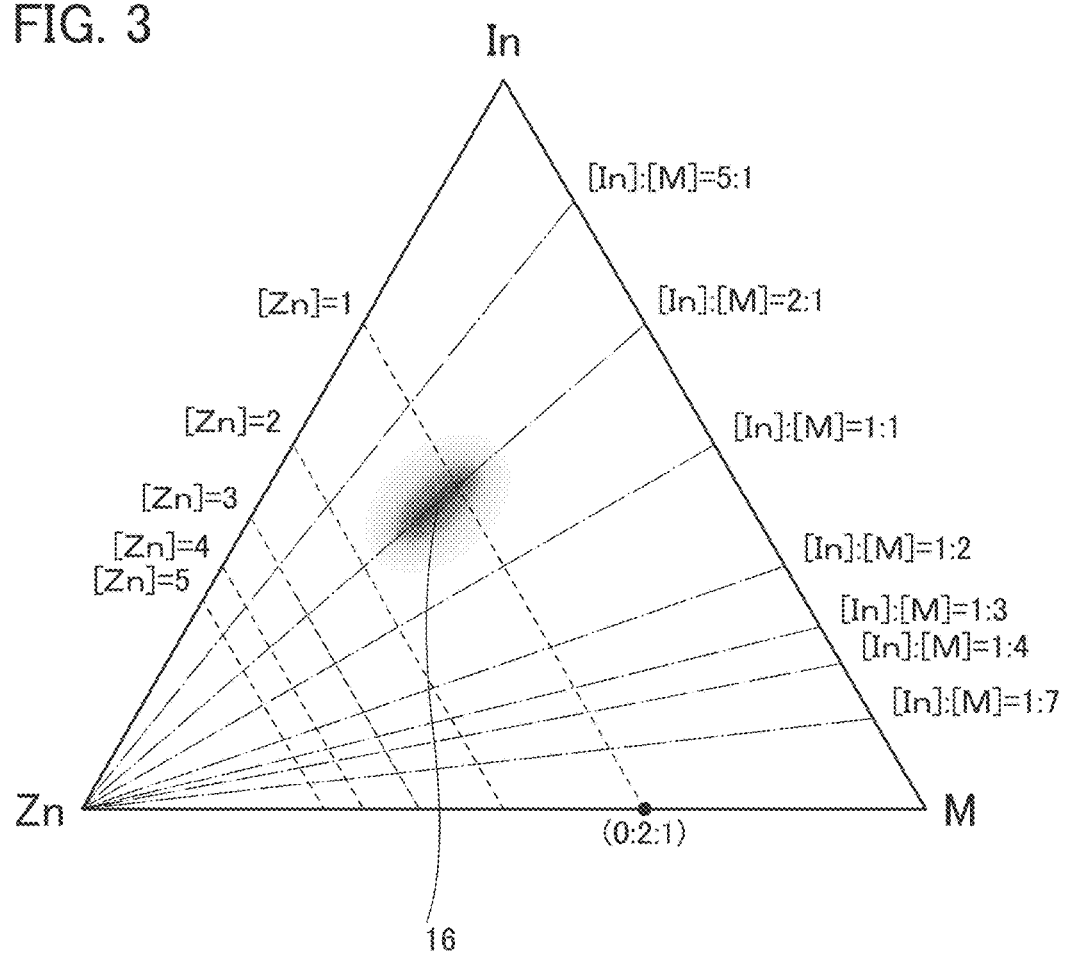
FIG. 3 illustrates an atomic ratio of an oxide semiconductor.
Figure 4:
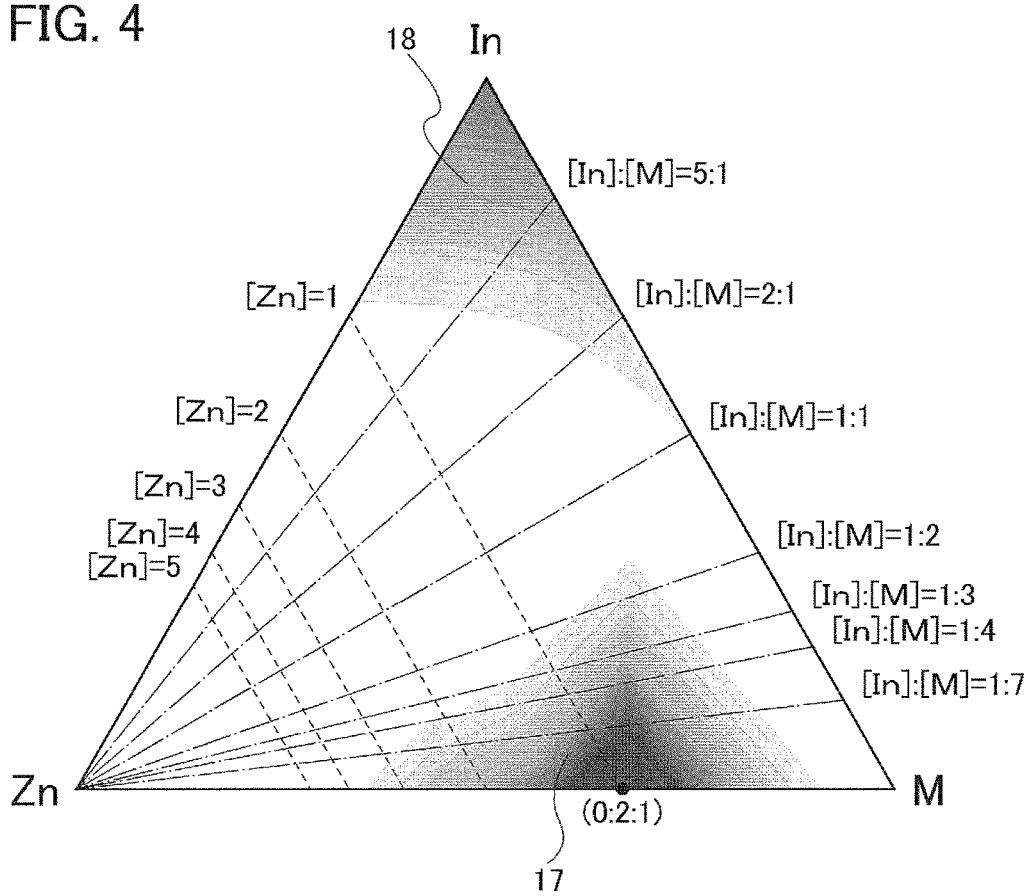
FIG. 4 illustrates an atomic ratio of an oxide semiconductor.
Figure 5:
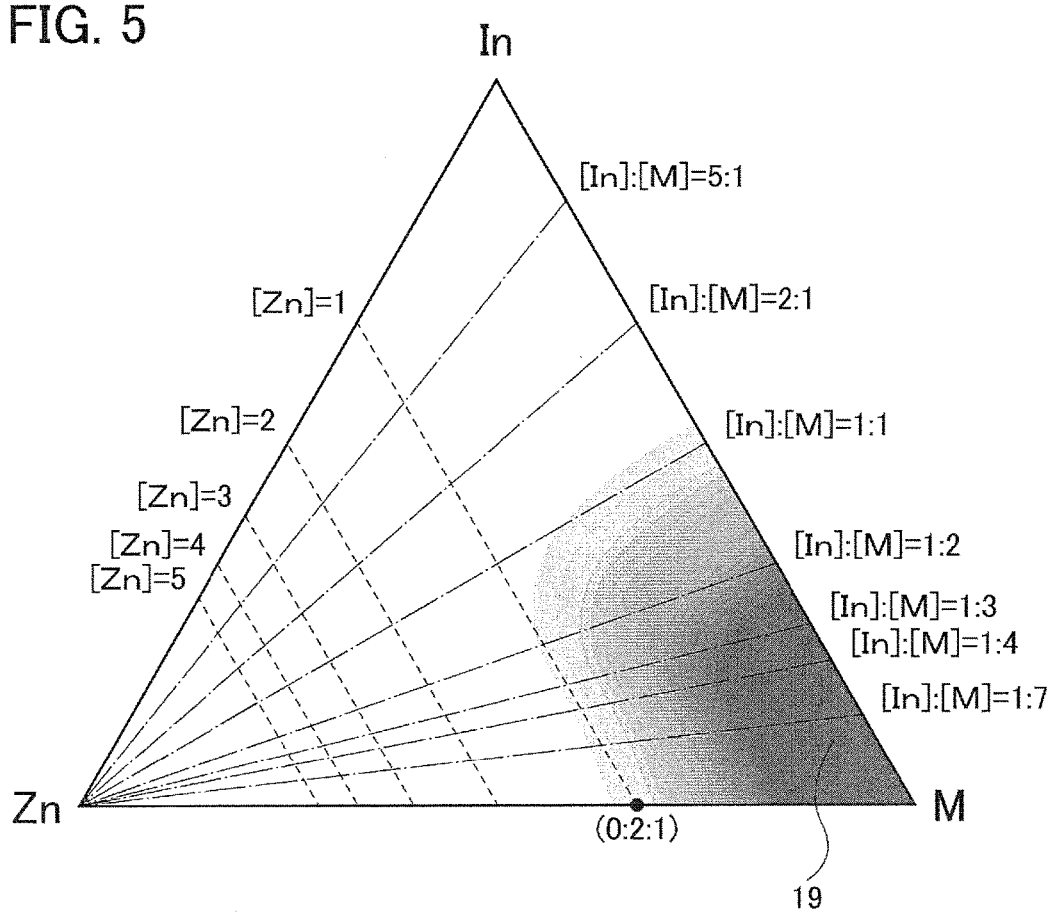
FIG. 5 illustrates an atomic ratio of an oxide semiconductor.

An oxide semiconductor with an atomic ratio shown in a region 16 in FIG. 3 is particularly preferable because of having little characteristics variation and structure change and also having high electron mobility. Note that the region 16 shows atomic ratios from [In]:[M]:[Zn]=4:2:3 to [In]:[M]:[Zn]=4:2:4.1 and neighborhoods thereof.

Note that conditions where a layered structure of an oxide semiconductor is formed are not uniquely determined by the atomic ratio. Although the atomic ratio affects difficulty in forming a layered structure, oxide semiconductors with the same atomic ratio have a layered structure in some cases, but not in others, depending on formation conditions. Therefore, the illustrated regions show atomic ratios at which a layered structure of an oxide semiconductor can be formed; boundaries of the regions 10 to 19 are not clear.

The structure and method described in this embodiment can be implemented by being combined as appropriate with any of the other structures and methods described in the other embodiments.

(Embodiment 2)

In this embodiment, semiconductor devices including the oxide semiconductor of one embodiment of the present invention, and manufacturing methods of the semiconductor devices will be described with reference to FIGS. 29A to 29C, FIGS. 30A to 30C, FIGS. 31A to 31C, FIGS. 32A to 32C, FIGS. 33A to 33D, FIGS. 34A and 34B, FIGS. 35A to 35D, FIGS. 36A to 36F, FIGS. 37A to 37F, FIGS. 38A to 38F, FIGS. 39A and 39B, FIGS. 40A to 40F, and FIGS. 41A to 41F.

<2-1. Structural Example of Semiconductor Device>

Figure 29A:
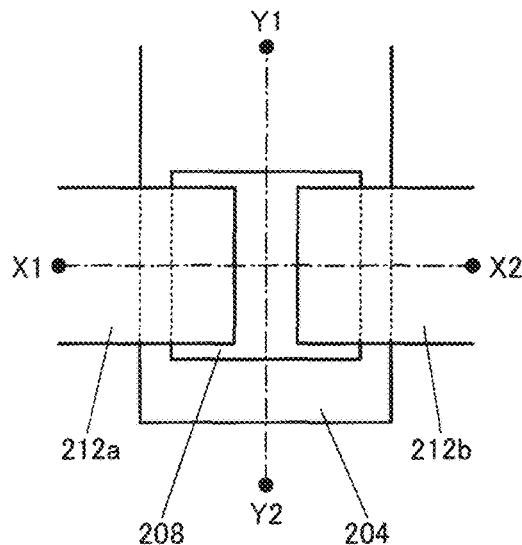
FIGS. 29A to 29C illustrate a top view and cross-sectional views of an example of a semiconductor device.
Figure 29B:
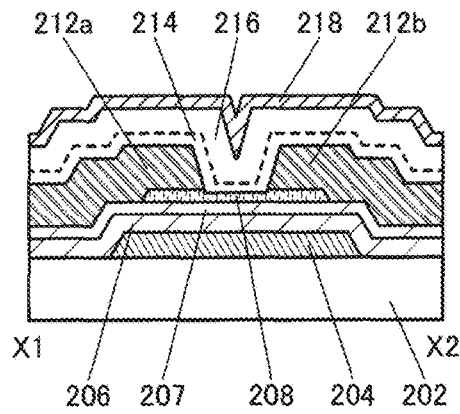
Figure 29C:
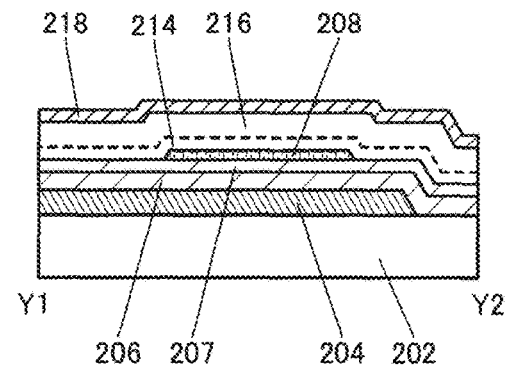

FIG. 29A is a top view of a transistor 200 that is a semiconductor device of one embodiment of the present invention. FIG. 29B is a cross-sectional view taken along a dashed-dotted line X1-X2 in FIG. 29A, and FIG. 29C is a cross-sectional view taken along a dashed-dotted line Y1-Y2 in FIG. 29A. Note that in FIG. 29A, some components of the transistor 200 (e.g., an insulating film serving as a gate insulating film) are not illustrated to avoid complexity. Furthermore, the direction of the dashed-dotted line X1-X2 may be referred to as a channel length direction, and the direction of the dashed-dotted line Y1-Y2 may be referred to as a channel width direction. As in FIG. 29A, some components are not illustrated in some cases in top views of transistors described below.

The transistor 200 includes a conductive film 204 functioning as a gate electrode over a substrate 202, an insulating film 206 over the substrate 202 and the conductive film 204, an insulating film 207 over the insulating film 206, an oxide 208 over the insulating film 207, a conductive film 212a functioning as a source electrode electrically connected to the oxide 208, and a conductive film 212b functioning as a drain electrode electrically connected to the oxide 208. Over the transistor 200, specifically, over the conductive films 212a and 212b and the oxide 208, an insulating film 214, an insulating film 216, and an insulating film 218 are provided. The insulating films 214, 216, and 218 function as protective insulating films for the transistor 200.

Furthermore, the insulating films 206 and 207 function as gate insulating films of the transistor 200.

As the oxide 208, the oxide semiconductor described in Embodiment 1 can be used. Since the oxide semiconductor of one embodiment of the present invention has a layered crystal structure, the highly reliable transistor 200 can be provided.

Components of the semiconductor device of this embodiment will be described below in detail.

[Substrate]

There is no particular limitation on a material and the like of the substrate 202 as long as the material has heat resistance high enough to withstand at least heat treatment to be performed later. For example, a glass substrate, a ceramic substrate, a quartz substrate, a sapphire substrate, or the like may be used as the substrate 202. Alternatively, a single crystal semiconductor substrate or a polycrystalline semiconductor substrate made of silicon or silicon carbide, a compound semiconductor substrate made of silicon germanium or the like, an SOI substrate, or the like may be used as the substrate 202. Further alternatively, any of these substrates provided with a semiconductor element may be used as the substrate 202. In the case where a glass substrate is used as the substrate 202, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Such a large-area substrate is preferably used because the manufacturing cost can be reduced.

Alternatively, a flexible substrate may be used as the substrate 202, and the transistor 200 may be provided directly on the flexible substrate. Further alternatively, a separation layer may be provided between the substrate 202 and the transistor 200. The separation layer can be used when part or the whole of a semiconductor device formed over the separation layer is completed and separated from the substrate 202 and transferred to another substrate. In such a case, the transistor 200 can be transferred to a substrate having low heat resistance or a flexible substrate as well.

[Conductive Films Functioning as Gate Electrode, Source Electrode, and Drain Electrode]

The conductive film 204 functioning as a gate electrode, the conductive film 212a functioning as a source electrode, and the conductive film 212b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

The conductive films 204, 212a, and 212b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 204, 212a, and 212b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 204, 212a, and 212b. Use of a Cu—X alloy film enables the manufacturing cost to be reduced because wet etching process can be used in the processing.

[Insulating Film Functioning as Gate Insulating Film]

As each of the insulating films 206 and 207 functioning as gate insulating films of the transistor 200, an insulating layer including at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of the stacked-layer structure of the insulating films 206 and 207, an insulating film of a single layer formed using a material selected from the above or an insulating film of three or more layers may be used.

The insulating film 206 functions as a blocking film which inhibits penetration of oxygen. For example, in the case where excess oxygen is supplied to the insulating film 207, the insulating film 214, the insulating film 216, and/or the oxide 208, the insulating film 206 can inhibit penetration of oxygen.

Note that the insulating film 207 that is in contact with the oxide 208 functioning as a channel region of the transistor 200 is preferably an oxide insulating film and preferably includes a region including oxygen in excess of the stoichiometric composition (oxygen-excess region). In other words, the insulating film 207 is an insulating film capable of releasing oxygen. In order to provide the oxygen-excess region in the insulating film 207, the insulating film 207 is formed in an oxygen atmosphere, for example. Alternatively, the oxygen-excess region may be formed by introduction of oxygen into the insulating film 207 after the deposition. As a method for introducing oxygen, an ion implantation method, an ion doping method, a plasma immersion ion implantation method, plasma treatment, or the like may be employed.

In the case where hafnium oxide is used as the insulating film 207, the following effect is attained. Hafnium oxide has a higher dielectric constant than silicon oxide and silicon oxynitride. Therefore, by using hafnium oxide, the thickness of the insulating film 207 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 206, and a silicon oxide film is formed as the insulating film 207. The silicon nitride film has a higher dielectric constant than a silicon oxide film and needs a larger thickness for capacitance equivalent to that of the silicon oxide film. Thus, when the silicon nitride film is included as the gate insulating film of the transistor 200, the thickness of the insulating film can be physically increased. This makes it possible to reduce a decrease in withstand voltage of the transistor 200 and furthermore to increase the withstand voltage, thereby reducing electrostatic discharge damage to the transistor 200.

[Oxide Semiconductor]

As the oxide 208, the oxide semiconductor of one embodiment of the present invention described in Embodiment 1 can be used.

The energy gap of the oxide 208 is 2 eV or more, preferably 2.5 eV or more, further preferably 3 eV or more. The use of an oxide semiconductor having such a wide energy gap can reduce off-state current of the transistor 200.

An oxide semiconductor with low carrier density is used as the oxide 208. For example, an oxide semiconductor whose carrier density is lower than $8 \times 10^{11}/cm^3$, preferably lower than $1 \times 10^{11}/cm^3$, or further preferably lower than $1 \times 10^{10}/cm^3$, and greater than or equal to $1 \times 10^{-9}/cm^3$ is used as the oxide 208.

Note that, without limitation to those described above, an oxide semiconductor with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide 208 be set to be appropriate.

Note that it is preferable to use, as the oxide 208, an oxide semiconductor in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus can have a low carrier density. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Furthermore, the highly purified intrinsic or substantially highly purified intrinsic oxide semiconductor has an extremely low off-state current; even when an element has a channel width of $1 \times 10^6$ μm and a channel length L of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor can have a small change in electrical characteristics and high reliability. Note that charges trapped by the trap states in the oxide semiconductor take a long time to be released and may behave like fixed charges. Thus, the transistor whose channel region is formed in the oxide semiconductor having a high density of trap states has unstable electrical characteristics in some cases. As examples of the impurities, hydrogen, nitrogen, alkali metal, alkaline earth metal, iron, nickel, silicon, and the like are given.

In the case where the oxide 208 includes In, Ga, and Zn, for example, the highly purified intrinsic oxide 208 preferably includes a region where the total amount of In, Ga, Zn, and O is higher than or equal to 99.97 atomic %.

Hydrogen included in the oxide semiconductor reacts with oxygen bonded to a metal atom to be water, and also causes oxygen vacancies in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen be reduced as much as possible in the oxide 208. Specifically, the hydrogen concentration of the oxide 208, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. In other words, the oxide 208 includes a region whose hydrogen concentration measured by SIMS is lower than $1 \times 10^{20}$ atoms/cm$^3$.

When silicon or carbon that is one of elements belonging to Group 14 is contained in the oxide 208, oxygen vacancies are increased in the oxide 208, and the oxide 208 becomes n-type. Thus, the concentration of silicon or carbon (the concentration is measured by SIMS) in the oxide 208 or the concentration of silicon or carbon (the concentration is measured by SIMS) in the vicinity of an interface with the oxide 208 is set to be lower than or equal to $2 \times 10^{18}$ atoms/cm$^3$, preferably lower than or equal to $2 \times 10^{17}$ atoms/cm$^3$.

When the oxide 208 contains alkali metal or alkaline earth metal, the alkali metal or the alkaline earth metal is bonded to the oxide semiconductor, so that carriers are generated in some cases. Thus, a transistor including an oxide semiconductor which contains alkali metal or alkaline earth metal is likely to be normally on. Therefore, it is preferable to reduce the concentration of alkali metal or alkaline earth metal in the oxide 208. Specifically, the concentration of alkali metal or alkaline earth metal in the oxide 208, which is measured by SIMS, is lower than or equal to $1\times10^{18}$ atoms/cm$^3$, preferably lower than or equal to $2\times10^{16}$ atoms/cm$^3$.

In some cases, iron, nickel, and silicon contained in the oxide 208 are bonded to the oxide semiconductor, so that carriers are generated. Thus, a transistor including an oxide semiconductor which contains iron, nickel, and silicon is likely to be normally on. Therefore, it is preferable to reduce the concentrations of iron, nickel, and silicon in the oxide 208. For example, the total concentration of impurities, i.e., iron, nickel, and silicon in the oxide 208 may be lower than 0.03 atomic %.

When the oxide 208 contains nitrogen, the oxide 208 easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the concentration of nitrogen which is measured by SIMS is preferably set to be, for example, lower than or equal to $5\times10^{18}$ atoms/cm$^3$.

[Insulating Film Functioning as Protective Insulating Film for Transistor]

The insulating films 214 and 216 each have a function of supplying oxygen to the oxide 208. The insulating film 218 functions as a protective insulating film for the transistor 200. The insulating films 214 and 216 contain oxygen. Furthermore, the insulating film 214 is an insulating film which is permeable to oxygen. Note that the insulating film 214 serves also as a film which relieves damage to the oxide 208 at the time of forming the insulating film 216 later.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 214.

In addition, it is preferable that the amount of defects in the insulating film 214 be small; as a typical example, the spin density corresponding to a signal that appears at around g=2.001 due to a dangling bond of silicon be lower than or equal to $3\times10^{17}$ spins/cm$^3$ by electron spin resonance (ESR) measurement. This is because if the density of defects in the insulating film 214 is high, oxygen is bonded to the defects and the amount of oxygen that passes through the insulating film 214 is decreased.

Note that not all oxygen entering the insulating film 214 from the outside move to the outside of the insulating film 214 and some oxygen remains in the insulating film 214. Furthermore, movement of oxygen occurs in the insulating film 214 in some cases in such a manner that oxygen enters the insulating film 214 and oxygen contained in the insulating film 214 moves to the outside of the insulating film 214. When an oxide insulating film which is permeable to oxygen is formed as the insulating film 214, oxygen released from the insulating film 216 provided over the insulating film 214 can be moved to the oxide 208 through the insulating film 214.

The insulating film 214 can be formed using an oxide insulating film having a low density of states due to nitrogen oxide. Note that the density of states due to nitrogen oxide can be formed between the valence band maximum ($E_{v\_os}$) and the conduction band minimum ($E_{c\_os}$) of the oxide semiconductor film.

Note that a silicon oxynitride film that releases less nitrogen oxide is a film of which the amount of released ammonia is larger than the amount of released nitrogen oxide in thermal desorption spectroscopy analysis; as a typical example, the amount of released ammonia molecules is greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes a temperature higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typified by NO$_2$ or NO, forms a level in the insulating film 214, for example. The level is positioned in the energy gap of the oxide 208. Therefore, when nitrogen oxide is diffused to the interface between the insulating film 214 and the oxide 208, an electron is in some cases trapped by the level on the insulating film 214 side. As a result, the trapped electron remains in the vicinity of the interface between the insulating film 214 and the oxide 208; thus, the threshold voltage of the transistor is shifted in the positive direction.

Nitrogen oxide reacts with ammonia and oxygen in heat treatment. Since nitrogen oxide contained in the insulating film 214 reacts with ammonia contained in the insulating film 216 in heat treatment, nitrogen oxide contained in the insulating film 214 is reduced. Therefore, an electron is hardly trapped at the interface between the insulating film 214 and the oxide 208.

With such an oxide insulating film, the insulating film 214 can reduce a shift in the threshold voltage of the transistor, which leads to a smaller change in the electrical characteristics of the transistor.

Note that in an ESR spectrum at 100 K or lower of the insulating film 214 subjected to heat treatment of a manufacturing process of the transistor, typically, heat treatment at a temperature lower than 400° C. or lower than 375° C. (preferably higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The width of the split between the first and second signals and the width of the split between the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the smaller the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 216 is formed using an oxide insulating film whose oxygen content is higher than that in the stoichiometric composition. Part of oxygen is released by heating from the oxide insulating film whose oxygen content is higher than that in the stoichiometric composition. The oxide insulating film whose oxygen content is higher than that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in thermal desorption spectroscopy (TDS). Note that the surface temperature of the film in the TDS is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 216.

It is preferable that the amount of defects in the insulating film 216 be small; as a typical example, the spin density corresponding to a signal which appears at g=2.001 due to a dangling bond of silicon be lower than $1.5\times10^{18}$ spins/cm$^3$, further preferably lower than or equal to $1\times10^{18}$ spins/cm$^3$ by ESR measurement. Note that the insulating film 216 is provided more apart from the oxide 208 than the insulating film 214 is; thus, the insulating film 216 may have higher defect density than the insulating film 214.

Furthermore, the insulating films 214 and 216 can be formed using insulating films formed of the same kinds of materials; thus, a boundary between the insulating films 214 and 216 cannot be clearly observed in some cases. Thus, in this embodiment, the boundary between the insulating films 214 and 216 is shown by a dashed line. Although a two-layer structure of the insulating films 214 and 216 is described in this embodiment, the present invention is not limited to this structure. For example, a single-layer structure of either one of the insulating films 214 and 216 may be employed.

The insulating film 218 has a function of blocking oxygen, hydrogen, water, alkali metal, alkaline earth metal, or the like. It is possible to prevent outward diffusion of oxygen from the oxide 208, outward diffusion of oxygen included in the insulating films 214 and 216, and entry of hydrogen, water, or the like into the oxide 208 from the outside by providing the insulating film 218.

As the insulating film 218, a nitride insulating film can be used, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

<2-2. Structural Example of Semiconductor Device>

A structural example different from that of the transistor 200 in FIGS. 29A to 29C is described with reference to FIGS. 30A to 30C.

Figure 30A:
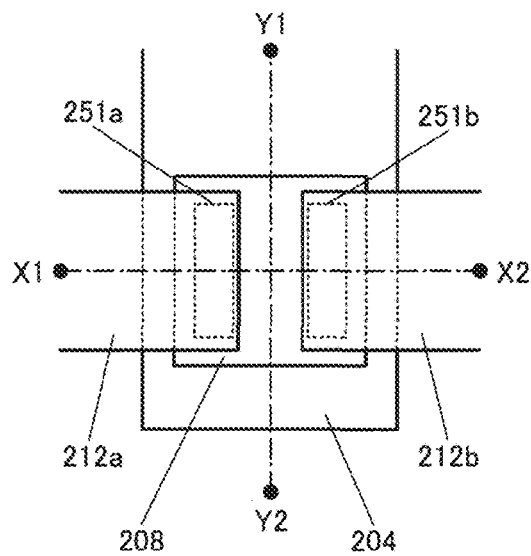
FIGS. 30A to 30C illustrate a top view and cross-sectional views of an example of a semiconductor device.

FIG. 30A is a top view of a transistor 250 that is a semiconductor device of one embodiment of the present invention. FIG. 30B is a cross-sectional view taken along dashed-dotted line X1-X2 in FIG. 30A, and FIG. 30C is a cross-sectional view taken along dashed-dotted line Y1-Y2 in FIG. 30A.

The transistor 250 includes the conductive film 204 functioning as a gate electrode over the substrate 202, the insulating film 206 over the substrate 202 and the conductive film 204, the insulating film 207 over the insulating film 206, the oxide 208 over the insulating film 207, the insulating films 214 and 216 over the oxide 208, the conductive film 212a functioning as a source electrode electrically connected to the oxide 208 through an opening 251a provided in the insulating films 214 and 216, and the conductive film 212b functioning as a drain electrode electrically connected to the oxide 208 through an opening 251b provided in the insulating films 214 and 216. Over the transistor 250, specifically over the conductive films 212a and 212b and the insulating film 216, the insulating film 218 is provided. The insulating films 214 and 216 function as protective insulating films for the oxide 208. The insulating film 218 functions as a protective insulating film for the transistor 250.

Figure 30B:
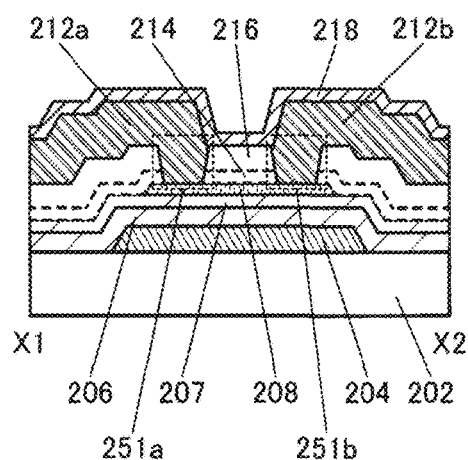
Figure 30C:
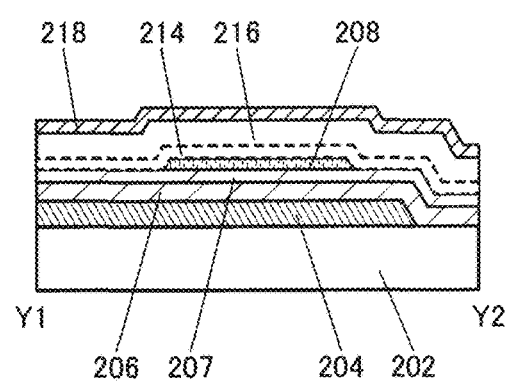

Although the transistor 200 has a channel-etched structure, the transistor 250 in FIGS. 30A to 30C has a channel-protective structure. Thus, the oxide semiconductor of one embodiment of the present invention can be used in either the channel-etched transistor or the channel-protective transistor. The other components are the same as those of the transistor 200 and a similar effect can be obtained.

<2-3. Structural Example of Semiconductor Device>

A structural example different from that of the transistor 250 in FIGS. 30A to 30C is described with reference to FIGS. 31A to 31C.

FIG. 31A is a top view of a transistor 260 that is a semiconductor device of one embodiment of the present invention. FIG. 31B is a cross-sectional view taken along dashed-dotted line X1-X2 illustrated in FIG. 31A, and FIG. 31C is a cross-sectional view taken along dashed-dotted line Y1-Y2 illustrated in FIG. 31A.

The transistor 260 includes the conductive film 204 functioning as a gate electrode over the substrate 202, the insulating film 206 over the substrate 202 and the conductive film 204, the insulating film 207 over the insulating film 206, the oxide 208 over the insulating film 207, the insulating films 214 and 216 over the oxide 208, the conductive film 212a functioning as a source electrode electrically connected to the oxide 208, and the conductive film 212b functioning as a drain electrode electrically connected to the oxide 208. Over the transistor 260, specifically over the conductive films 212a and 212b and the insulating film 216, the insulating film 218 is provided. The insulating films 214 and 216 function as protective insulating films for the oxide 208. The insulating film 218 functions as a protective insulating film for the transistor 260.

The transistor 260 is different from the transistor 250 illustrated in FIGS. 30A to 30C in the shape of the insulating films 214 and 216. Specifically, the insulating films 214 and 216 of the transistor 260 have an island shape over a channel region of the oxide 208. The other components are the same as those of the transistor 250, and a similar effect is obtained.

<2-4. Structural Example of Semiconductor Device>

A structural example different from that of the transistor 200 in FIGS. 29A to 29C is described with reference to FIGS. 32A to 32C.

Figure 32A:
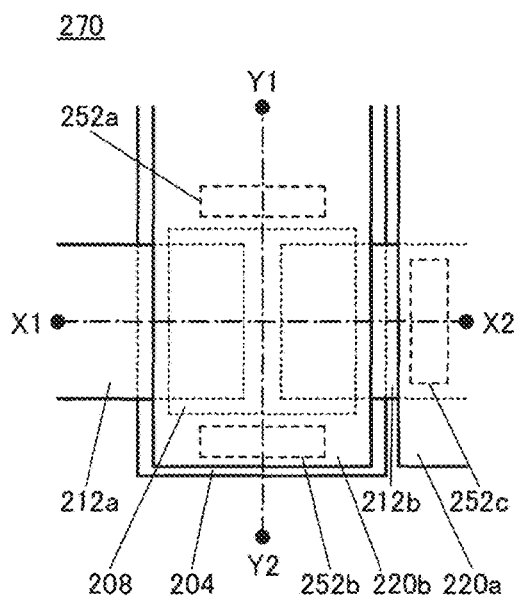
FIGS. 32A to 32C illustrate a top view and cross-sectional views of an example of a semiconductor device.

FIG. 32A is a top view of a transistor 270 that is a semiconductor device of one embodiment of the present invention. FIG. 32B is a cross-sectional view taken along dashed-dotted line X1-X2 in FIG. 32A, and FIG. 32C is a cross-sectional view taken along dashed-dotted line Y1-Y2 in FIG. 32A.

The transistor 270 includes the conductive film 204 functioning as a first gate electrode over the substrate 202, the insulating film 206 over the substrate 202 and the conductive film 204, the insulating film 207 over the insulating film 206, the oxide 208 over the insulating film 207, the insulating films 214 and 216 over the oxide 208, the conductive film 212a functioning as a source electrode electrically connected to the oxide 208, the conductive film 212b functioning as a drain electrode electrically connected to the oxide 208, the insulating film 218 over the conductive films 212a and 212b and the insulating film 216, and conductive films 220a and 220b over the insulating film 218.

In the transistor 270, the insulating films 214, 216, and 218 function as second gate insulating films of the transistor 270. Furthermore, the conductive film 220a in the transistor 270 functions as, for example, a pixel electrode used for a display device. The conductive film 220a is connected to the conductive film 212b through an opening 252c provided in the insulating films 214, 216, and 218. The conductive film 220b in the transistor 270 functions as a second gate electrode (also referred to as a back gate electrode).

Figure 32B:
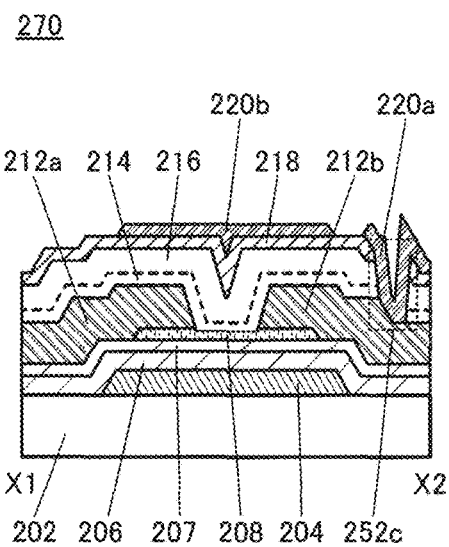
Figure 32C:
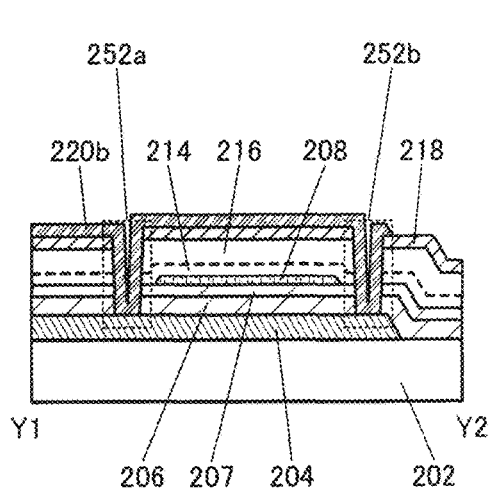

As illustrated in FIG. 32C, the conductive film 220b is connected to the conductive film 204 functioning as the first gate electrode through openings 252a and 252b provided in the insulating films 206, 207, 214, 216, and 218. Accordingly, the conductive film 220b and the conductive film 204 are supplied with the same potential.

Note that although the structure in which the openings 252a and 252b are provided so that the conductive film 220b and the conductive film 204 are connected to each other is described in this embodiment, one embodiment of the present invention is not limited thereto. For example, a structure in which only one of the openings 252a and 252b is provided so that the conductive film 220b and the conductive film 204 are connected to each other, or a structure in which the openings 252a and 252b are not provided and the conductive film 220b and the conductive film 204 are not connected to each other may be employed. Note that in the case where the conductive film 220b and the conductive film 204 are not connected to each other, it is possible to apply different potentials to the conductive film 220b and the conductive film 204.

As illustrated in FIG. 32B, the oxide 208 is positioned to face each of the conductive film 204 functioning as the first gate electrode and the conductive film 220b functioning as the second gate electrode, and is sandwiched between the two conductive films functioning as gate electrodes. The lengths in the channel length direction and the channel width direction of the conductive film 220b functioning as the second gate electrode are longer than those in the channel length direction and the channel width direction of the oxide 208. The whole oxide 208 is covered with the conductive film 220b with the insulating films 214, 216, and 218 positioned therebetween. Since the conductive film 220b functioning as the second gate electrode is connected to the conductive film 204 functioning as the first gate electrode through the openings 252a and 252b provided in the insulating films 206 and 207 and the insulating films 214, 216, and 218, a side surface of the oxide 208 in the channel width direction faces the conductive film 220b functioning as the second gate electrode with the insulating films 214, 216, and 218 positioned therebetween.

In other words, in the channel width direction of the transistor 270, the conductive film 204 functioning as the first gate electrode and the conductive film 220b functioning as the second gate electrode are connected to each other through the openings provided in the insulating films 206 and 207 functioning as first gate insulating films and the insulating films 214, 216, and 218 functioning as second gate insulating films; and the conductive film 204 and the conductive film 220b surround the oxide 208 with the insulating films 206 and 207 functioning as the first gate insulating films and the insulating films 214, 216, and 218 functioning as the second gate insulating films positioned therebetween.

Such a structure enables the oxide 208 included in the transistor 270 to be electrically surrounded by electric fields of the conductive film 204 functioning as the first gate electrode and the conductive film 220b functioning as the second gate electrode. A device structure of a transistor, like that of the transistor 270, in which electric fields of a first gate electrode and a second gate electrode electrically surround an oxide semiconductor where a channel region is formed can be referred to as a surrounded channel (s-channel) structure.

Since the transistor 270 has the s-channel structure, an electric field for inducing a channel can be effectively applied to the oxide 208 by the conductive film 204 functioning as the first gate electrode; therefore, the current drive capability of the transistor 270 can be improved and high on-state current characteristics can be obtained. Since the on-state current can be increased, it is possible to reduce the size of the transistor 270. In addition, since the transistor 270 has a structure in which the oxide 208 is surrounded by the conductive film 204 functioning as the first gate electrode and the conductive film 220b functioning as the second gate electrode, the mechanical strength of the transistor 270 can be increased.

<2-5. Structural Example of Semiconductor Device>

Structural examples different from that of the transistor 270 in FIGS. 32A to 32C are described with reference to FIGS. 33A to 33D.

Figure 33A:
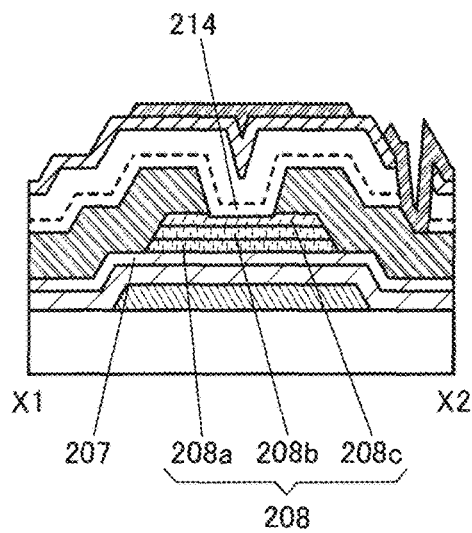
FIGS. 33A to 33D each illustrate a cross-sectional view of an example of a semiconductor device.
Figure 33B:
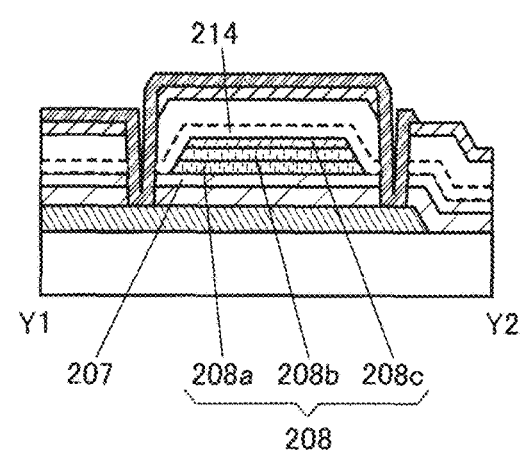
Figure 33C:
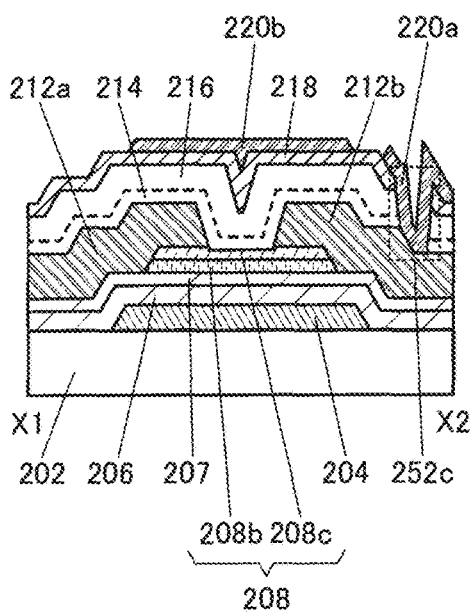
Figure 33D:
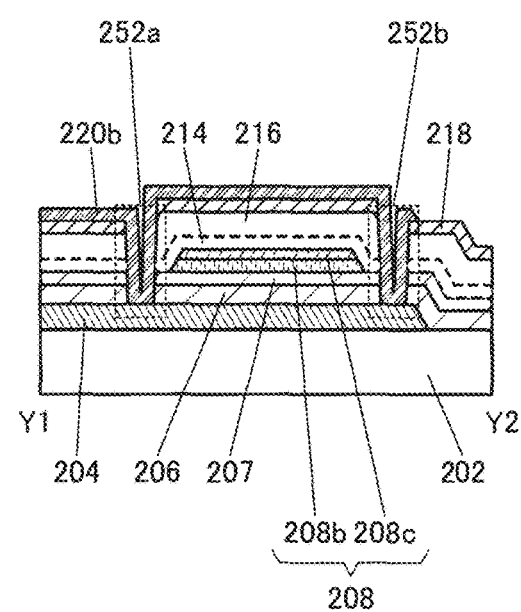

FIGS. 33A and 33B are cross-sectional views illustrating a variation of the transistor 270 in FIGS. 32B and 32C. FIGS. 33C and 33D are cross-sectional views illustrating another variation of the transistor 270 in FIGS. 32B and 32C.

A transistor 270A in FIGS. 33A and 33B has the same structure as the transistor 270 in FIGS. 32B and 32C except that the oxide 208 has a three-layer structure. Specifically, the oxide 208 of the transistor 270A includes an oxide 208a, an oxide 208b, and an oxide 208c.

A transistor 270B in FIGS. 33C and 33D has the same structure as the transistor 270 in FIGS. 32B and 32C except that the oxide 208 has a two-layer structure. Specifically, the oxide 208 of the transistor 270B includes the oxide 208b and the oxide 208c.

Here, a band structure including the oxide 208 and insulating films in contact with the oxide 208 is described with reference to FIGS. 34A and 34B.

Figure 34A:
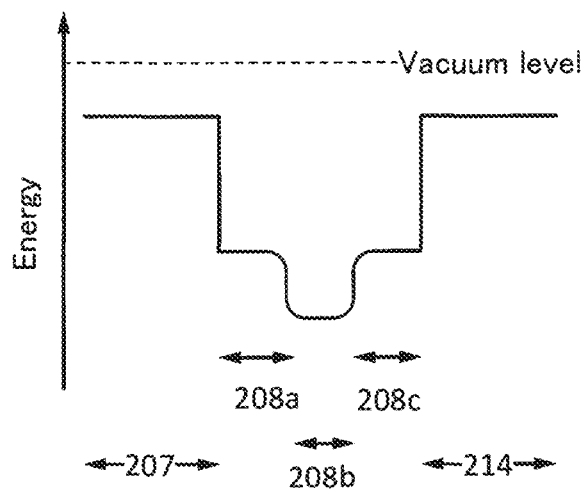
FIGS. 34A and 34B each illustrate a band structure.

FIG. 34A shows an example of a band structure in the thickness direction of a stacked-layer structure including the insulating film 207, the oxides 208a, 208b, and 208c, and the insulating film 214. FIG. 34B shows an example of a band structure in the thickness direction of a stacked-layer structure including the insulating film 207, the oxides 208b and 208c, and the insulating film 214. For easy understanding, the energy level of the conduction band minimum (Ec) of each of the insulating film 207, the oxides 208a, 208b, and 208c, and the insulating film 214 is shown in the band structures.

In the band structure of FIG. 34A, a silicon oxide film is used as each of the insulating films 207 and 214, an oxide semiconductor formed using a metal oxide target having an atomic ratio of metal elements, [In]:[Ga]:[Zn]=1:1:1.2, is used as the oxide 208a, an oxide semiconductor formed using a metal oxide target having an atomic ratio of metal elements, [In]:[Ga]:[Zn]=4:2:4.1, is used as the oxide 208b, and an oxide semiconductor formed using a metal oxide target having an atomic ratio of metal elements, [In]:[Ga]:[Zn]=1:1:1.2, is used as the oxide 208c.

Figure 34B:
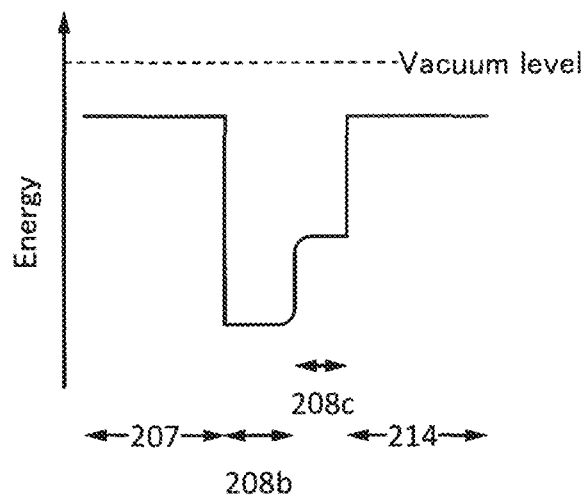

In the band structure of FIG. 34B, a silicon oxide film is used as each of the insulating films 207 and 214, an oxide semiconductor formed using a metal oxide target having an atomic ratio of metal elements, [In]:[Ga]:[Zn]=4:2:4.1, is used as the oxide 208b, and an oxide semiconductor formed using a metal oxide target having an atomic ratio of metal elements, [In]:[Ga]:[Zn]=1:1:1.2, is used as the oxide 208c.

As illustrated in FIGS. 34A and 34B, the energy level of the conduction band minimum gradually changes between the oxide 208a and the oxide 208b and between the oxide 208b and the oxide 208c. In other words, the energy level of the conduction band minimum is continuously changed or continuously connected. To obtain such a band structure, there exists no impurity, which forms a defect state such as a trap center or a recombination center, at the interface between the oxide 208a and the oxide 208b or at the interface between the oxide 208b and the oxide 208c.

To form a continuous junction between the oxide 208a and the oxide 208b and between the oxide 208b and the oxide 208c, it is necessary to form the oxides successively without exposure to the air by using a multi-chamber deposition apparatus (sputtering apparatus) provided with a load lock chamber.

With the band structure of FIG. 34A or FIG. 34B, the oxide 208b serves as a well, and a channel region is formed in the oxide 208b in the transistor with the stacked-layer structure.

By providing the oxide 208a and the oxide 208c, the oxide 208b can be distanced away from trap states.

In addition, the trap states might be more distant from the vacuum level than the energy level of the conduction band minimum (Ec) of the oxide 208b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide 208b. Such a structure inhibits accumulation of electrons in the trap states. As a result, the on-state current and the field-effect mobility of the transistor can be increased.

The energy level of the conduction band minimum of each of the oxides 208a and 208c is closer to the vacuum level than that of the oxide 208b. Typically, a difference in energy level between the conduction band minimum of the oxide 208b and the conduction band minimum of each of the oxides 208a and 208c is 0.15 eV or more or 0.5 eV or more and 2 eV or less or 1 eV or less. That is, the difference between the electron affinity of each of the oxides 208a and 208c and the electron affinity of the oxide 208b is 0.15 eV or more or 0.5 eV or more and 2 eV or less or 1 eV or less.

In such a structure, the oxide 208b serves as a main path of current and functions as a channel region. In addition, since the oxides 208a and 208c each include one or more metal elements included in the oxide 208b in which a channel region is formed, interface scattering is less likely to occur at the interface between the oxide 208a and the oxide 208b or at the interface between the oxide 208b and the oxide 208c. Thus, the transistor can have high field-effect mobility because the movement of carriers is not hindered at the interface.

To prevent each of the oxides 208a and 208c from functioning as part of a channel region, a material having sufficiently low conductivity is preferably used for the oxides 208a and 208c. For example, an oxide semiconductor containing less In and Zn has lower electron mobility. Therefore, an oxide semiconductor having an atomic ratio shown in the region 19, where the insulating property is increased as described in the above embodiment with FIG. 5, can be used. Note that the region 19 shows the atomic ratio at the coordinates representing M or a neighborhood thereof.

Alternatively, a material which has a smaller electron affinity (a difference in energy level between the vacuum level and the conduction band minimum) than the oxide 208b and has a difference in energy level of the conduction band minimum from the oxide 208b (band offset) is preferably used for the oxides 208a and 208c. Furthermore, to inhibit generation of a difference in threshold voltage due to the value of the drain voltage, it is preferable to form the oxides 208a and 208c using a material whose energy level of the conduction band minimum is closer to the vacuum level than that of the oxide 208b. For example, the difference between the energy level of the conduction band minimum of the oxide 208b and that of the oxides 208a and 208c is preferably 0.2 eV or more, further preferably 0.5 eV or more.

It is preferable that the oxides 208a and 208c not have a spinel crystal structure. This is because if the oxides 208a and 208c have a spinel crystal structure, constituent elements of the conductive films 212a and 212b might be diffused to the oxide 208b at the interface between the spinel crystal structure and another region. Note that each of the oxides 208a and 208c is preferably a CAAC-OS, in which case a higher blocking property against constituent elements of the conductive films 212a and 212b, for example, copper elements, is obtained.

The thickness of each of the oxides 208a and 208c is greater than or equal to a thickness that is capable of inhibiting diffusion of the constituent elements of the conductive films 212a and 212b to the oxide 208b, and less than a thickness that inhibits supply of oxygen from the insulating film 214 to the oxide 208b. For example, when the thickness of each of the oxides 208a and 208c is greater than or equal to 10 nm, diffusion of the constituent elements of the conductive films 212a and 212b to the oxide 208b can be inhibited. When the thickness of each of the oxides 208a and 208c is less than or equal to 100 nm, oxygen can be effectively supplied from the insulating film 214 to the oxide 208b.

Although the example where an oxide semiconductor formed using a metal oxide target having an atomic ratio of metal elements, [In]:[Ga]:[Zn]=1:1:1.2, is used as each of the oxides 208a and 208c is described in this embodiment, one embodiment of the present invention is not limited thereto. For example, an oxide semiconductor formed using a metal oxide target having an atomic ratio of metal elements, [In]:[Ga]: [Zn]=1:1:1, [In]:[Ga]: [Zn]=1:3:2, [In]:[Ga]:[Zn]=1:3:4, [In]:[Ga]:[Zn]=1:3:6, or a neighborhood thereof, may be used as each of the oxides 208a and 208c.

Note that in the case where the oxide semiconductor is deposited with a sputtering apparatus, a film having an atomic ratio deviated from the atomic ratio of the target is formed. Especially for zinc, [Zn] in the atomic ratio of a deposited film is smaller than that in the atomic ratio of the target in some cases depending on the substrate temperature during deposition.

Therefore, when the oxides 208a and 208c are formed using a metal oxide target having an atomic ratio of [In]:[Ga]:[Zn]=1:1:1, the oxides 208a and 208c have an atomic ratio of [In]:[Ga]:[Zn]=1:θ1:θ2 (0<θ1≤2, 0<θ2≤3) in some cases. When the oxides 208a and 208c are formed using a metal oxide target having an atomic ratio of [In]:[Ga]:[Zn]=1:3:4, the oxides 208a and 208c have an atomic ratio of [In]:[Ga]:[Zn]=1:θ3:θ4 (1≤θ3≤5, 2≤θ4≤6) in some cases. When the oxides 208a and 208c are formed using a metal oxide target having an atomic ratio of [In]:[Ga]:[Zn]=1:3:6, the oxides 208a and 208c have an atomic ratio of [In]:[Ga]:[Zn]=1:θ5:θ6 (1≤θ5≤5, 4≤θ6≤8) in some cases.

When an oxide having an atomic ratio deviated from the atomic ratio of the target is deposited, a wide range of compositions are distributed in the deposited oxide, leading to less variation over the substrate. Thus, the wide range of compositions of the oxide makes it possible to provide a transistor with excellent electrical characteristics and excellent reliability.

Figure 35A:
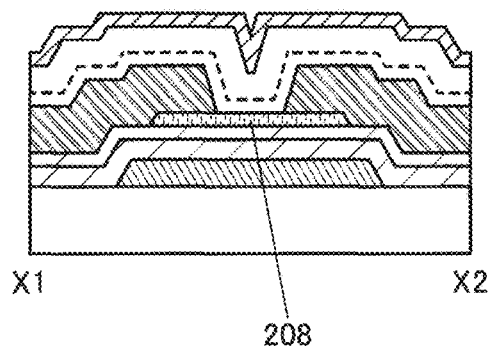
FIGS. 35A to 35D each illustrate a cross-sectional view of an example of a semiconductor device.
Figure 35B:
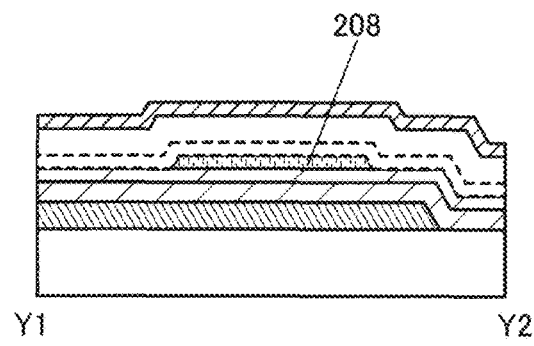
Figure 35C:
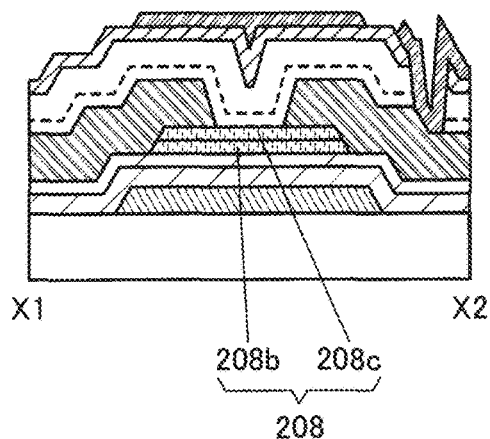
Figure 35D:
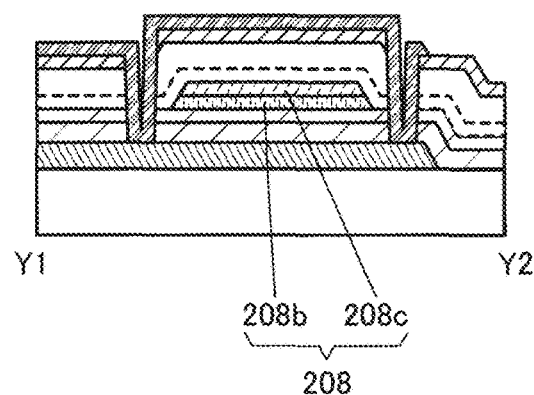

The drawings illustrate an example where the oxide 208 in the transistors 200 and 270 and the oxide 208c in the transistors 270A and 270B have a small thickness in a region which is not covered with the conductive films 212a and 212b, that is, an example where part of the oxide semiconductor has a depressed portion. However, one embodiment of the present invention is not limited thereto, and the oxide semiconductor does not necessarily have a depressed portion in a region which is not covered with the conductive films 212a and 212b. FIGS. 35A to 35D illustrate examples in this case. FIGS. 35A to 35D are cross-sectional views illustrating examples of the semiconductor device. FIGS. 35A and 35B illustrate a structure where the oxide 208 in the transistor 200 does not have a depressed portion, and FIGS. 35C and 35D illustrate a structure where the oxide 208 in the transistor 270B does not have a depressed portion.

The structures of the transistors of this embodiment can be freely combined with each other.

<2-6. Method for Manufacturing Semiconductor Device>

Next, a method for manufacturing the semiconductor device of one embodiment of the present invention is described with reference to drawings.

The films included in the semiconductor device of one embodiment of the present invention (i.e., the conductive film, the insulating film, the oxide semiconductor, and the like) can be formed by a sputtering method, a chemical vapor deposition (CVD) method, a plasma-enhanced CVD (PECVD) method, a vacuum evaporation method, or a pulsed laser deposition (PLD) method. However, the present invention is not limited thereto, and the films may be formed by a coating method, a printing method, a thermal CVD method, or an atomic layer deposition (ALD) method, for example. By a thermal CVD method such as a metal organic chemical vapor deposition (MOCVD) method, the conductive film, the insulating film, the oxide semiconductor, and the like may be formed.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time while the pressure in the chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then, the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; thus, an ALD method makes it possible to adjust the film thickness accurately and thus is suitable for manufacturing a minute FET.

The above conductive films, insulating films, oxide semiconductors, the metal oxide films, and the like can be formed by a thermal CVD method such as an MOCVD method. To form an In—Ga—Zn—O film, for example, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed with a deposition apparatus employing ALD, two kinds of gases, i.e., H$_2$O as an oxidizer and a source gas which is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on the surface where a film is to be formed, chlorine contained in the adsorbate is removed, and radicals of an oxidizing gas (e.g., O$_2$ or dinitrogen monoxide) are supplied to react with the adsorbate.

For example, in the case where a tungsten film is formed by a deposition apparatus using an ALD method, a WF$_6$ gas and a B$_2$H$_6$ gas are sequentially introduced a plurality of times to form an initial tungsten film, and then a WF$_6$ gas and an H$_2$ gas are introduced to form a tungsten film. Note that an SiH$_4$ gas may be used instead of a B$_2$H$_6$ gas.

For example, in the case where an oxide semiconductor film, e.g., an In—Ga—Zn—O film is formed with a deposition apparatus using an ALD method, an In(CH$_3$)$_3$ gas and an O$_3$ gas are sequentially introduced a plurality of times to form an In—O layer, a Ga(CH$_3$)$_3$ gas and an O$_3$ gas are introduced to form a GaO layer, and then a Zn(CH$_3$)$_2$ gas and an O$_3$ gas are introduced to form a ZnO layer. Note that the order of these layers is not limited to this example. A mixed compound layer such as an In—Ga—O layer, an In—Zn—O layer, or a Ga—Zn—O layer may be formed by using these gases. Note that although an H$_2$O gas which is obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, Zn(CH$_3$)$_2$ gas may be used.

[Method 1 for Manufacturing Semiconductor Device]

First, a method for manufacturing the transistor 270B that is a semiconductor device of one embodiment of the present invention, which is illustrated in FIGS. 33C and 33D, is described with reference to FIGS. 36A to 36F, FIGS. 37A to 37F, and FIGS. 38A to 38F. FIGS. 36A to 36F, FIGS. 37A to 37F, and FIGS. 38A to 38F are cross-sectional views illustrating a method for manufacturing a semiconductor device. FIGS. 36A, 36C, and 36E, FIGS. 37A, 37C, and 37E, and FIGS. 38A, 38C, and 38E are cross-sectional views in the channel length direction, and FIGS. 36B, 36D, and 36F, FIGS. 37B, 37D, and 37F, and FIGS. 38B, 38D, and 38F are cross-sectional views in the channel width direction.

First, a conductive film is formed over the substrate 202 and processed through a lithography process and an etching process, whereby the conductive film 204 functioning as a gate electrode is formed. Then, the insulating films 206 and 207 functioning as gate insulating films are formed over the conductive film 204 (see FIGS. 36A and 36B).

In this embodiment, a glass substrate is used as the substrate 202, and as the conductive film 204 functioning as a gate electrode, a 100-nm-thick tungsten film is formed by a sputtering method. A 400-nm-thick silicon nitride film as the insulating film 206 and a 50-nm-thick silicon oxynitride film as the insulating film 207 are formed by a PECVD method.

The insulating film 206 can have a stacked-layer structure of silicon nitride films. Specifically, the insulating film 206 can have a three-layer stacked-layer structure of a first silicon nitride film, a second silicon nitride film, and a third silicon nitride film. An example of the three-layer stacked-layer structure can be formed as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C. or lower.

When the insulating film 206 has the three-layer stacked-layer structure of silicon nitride films, for example, in the case where a conductive film containing copper (Cu) is used as the conductive film 204, the following effect can be obtained.

The first silicon nitride film can inhibit diffusion of a copper (Cu) element from the conductive film 204. The second silicon nitride film has a function of releasing hydrogen and can improve withstand voltage of the insulating film serving as a gate insulating film. The third silicon nitride film releases a small amount of hydrogen and can inhibit diffusion of hydrogen released from the second silicon nitride film.

The insulating film 207 is preferably an insulating film containing oxygen to improve characteristics of an interface with the oxide 208 (specifically the oxide 208b) formed later.

Figure 36A:
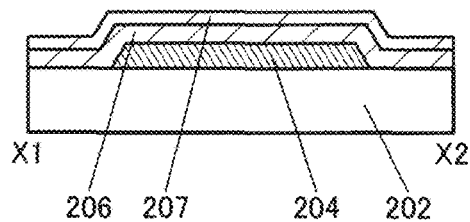
FIGS. 36A to 36F are cross-sectional views illustrating an example of a process for manufacturing a semiconductor device.
Figure 36B:
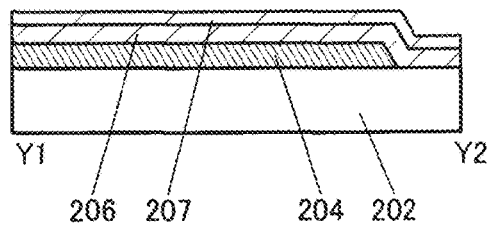
Figure 36C:
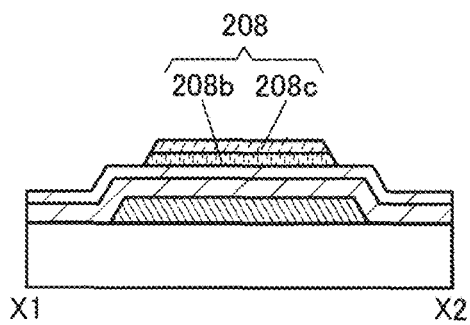
Figure 36D:
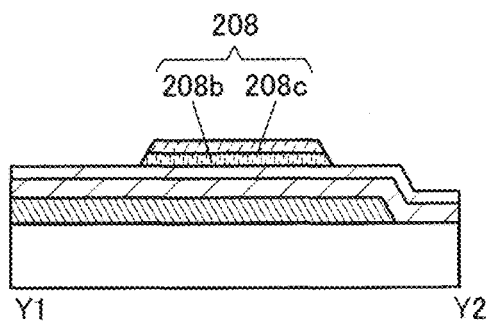

Next, a stacked-layer film of oxide semiconductors is formed over the insulating film 207 and is processed into a desired shape, so that the island-shaped oxide 208 including the oxide 208b and the oxide 208c is formed (see FIGS. 36C and 36D).

The oxide 208 is formed at a temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide 208 is formed while being heated, so that the crystallinity of the oxide 208 can be increased. On the other hand, in the case where a large-sized glass substrate (e.g., the 6th generation to the 10th generation) is used as the substrate 202 and the oxide 208 is formed at a temperature higher than or equal to 150° C. and lower than 340° C., the substrate 202 might be changed in shape (distorted or warped). In the case where a large-sized glass substrate is used, the change in the shape of the glass substrate can be suppressed by forming the oxide 208 at a temperature higher than or equal to 100° C. and lower than 150° C.

The oxides 208b and 208c may be formed at the same substrate temperature or different substrate temperatures. Note that the oxides 208b and 208c are preferably formed at the same substrate temperature, in which case the manufacturing cost can reduced.

In this embodiment, an oxide semiconductor to be the oxide 208b is deposited by a sputtering method using an In—Ga—Zn metal oxide target (having an atomic ratio of [In]:[Ga]:[Zn]=4:2:4.1), and an oxide semiconductor to be the oxide 208c is successively deposited in a vacuum by a sputtering method using an In—Ga—Zn metal oxide target (having an atomic ratio of [In]:[Ga]:[Zn]=1:1:1.2). The substrate temperature during the deposition of the oxide semiconductor to be the oxide 208 is 170° C. Oxygen and argon are used as deposition gases for the oxide semiconductor to be the oxide 208.

As the oxide 208b, a GZO film or a $GaO_x$ film having a highly insulating property may be used. Note that the $GaO_x$ film is formed using a target of $Ga_2O_3$ as a sputtering target with application of a high-frequency (RF) power. Note that oxygen and argon are preferably used as a deposition gas. The GZO film is formed using a target containing Ga and Zn as a sputtering target with application of a high-frequency (RF) power. Note that oxygen and argon are preferably used as a deposition gas.

In the case where the oxide semiconductor is deposited by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, when a gas which is highly purified to have a dew point of −40° C. or lower, preferably −80° C. or lower, further preferably −100° C. or lower, still further preferably −120° C. or lower, is used as a sputtering gas, i.e., the oxygen gas or the argon gas, entry of moisture or the like into the oxide semiconductor can be minimized.

In the case where the oxide semiconductor is deposited by a sputtering method, the sputtering gas containing oxygen is preferably used. When the oxide semiconductor is deposited using the sputtering gas containing oxygen, oxygen can be added to a film under the oxide semiconductor (here, the insulating film 207) at the same time as the deposition of the oxide semiconductor. Therefore, an oxygen-excess region can be provided in the insulating film 207.

In the case where the oxide semiconductor is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor, as much as possible. Alternatively, a turbo molecular pump and a cold trap are preferably combined so as to prevent a backflow of a gas, especially a gas containing carbon or hydrogen from an exhaust system to the inside of the chamber.

Figure 36E:
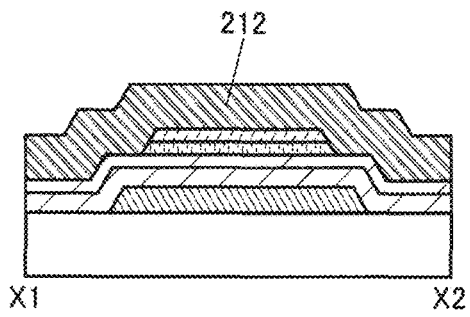
Figure 36F:
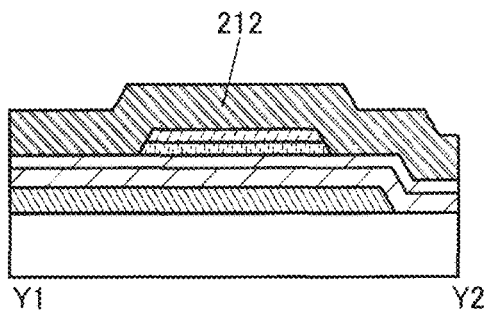

Next, a conductive film 212 to be the source electrode and the drain electrode is formed over the insulating film 207 and the oxide 208 by a sputtering method (see FIGS. 36E and 36F).

In this embodiment, a stacked-layer film in which a 50-nm-thick tungsten film and a 400-nm-thick aluminum film are sequentially stacked is formed as the conductive film 212 by a sputtering method. Although the conductive film 212 has a two-layer structure in this embodiment, one embodiment of the present invention is not limited thereto. For example, the conductive film 212 may have a three-layer structure in which a 50-nm-thick tungsten film, a 400-nm-thick aluminum film, and a 100-nm-thick titanium film are sequentially stacked.

Figure 37A:
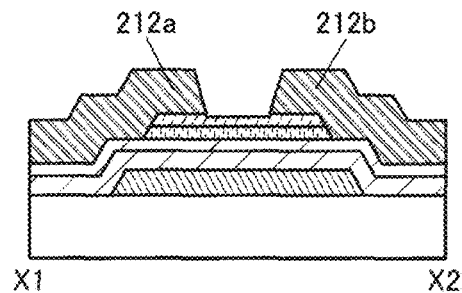
FIGS. 37A to 37F are cross-sectional views illustrating an example of a process for manufacturing a semiconductor device.
Figure 37B:
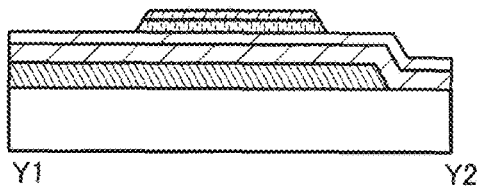

Next, the conductive film 212 is processed into desired shapes, so that the separate conductive films 212a and 212b are formed (see FIGS. 37A and 37B).

In this embodiment, the conductive film 212 is processed with a dry etching apparatus. Note that the method for processing the conductive film 212 is not limited thereto, and a wet etching apparatus may be used, for example. The conductive film 212 can be processed into a finer pattern with a dry etching apparatus than with a wet etching apparatus. On the other hand, the conductive film 212 can be processed at lower manufacturing cost with a wet etching apparatus than with a dry etching apparatus.

After the conductive films 212a and 212b are formed, a surface (on the back channel side) of the oxide 208 (specifically, the oxide 208c) may be cleaned. The cleaning may be performed, for example, using a chemical solution such as phosphoric acid. The cleaning using a chemical solution such as a phosphoric acid can remove impurities (e.g., an element included in the conductive films 212a and 212b) attached to the surface of the oxide 208c. Note that the cleaning is not necessarily performed, and thus the cleaning may be unnecessary.

In the step of forming the conductive films 212a and 212b and/or the cleaning step, the thickness of a region of the oxide 208 which is not covered by the conductive films 212a and 212b might be reduced. For example, a region where the oxide 208c has a smaller thickness than the oxide 208b is formed in some cases.

Figure 37C:
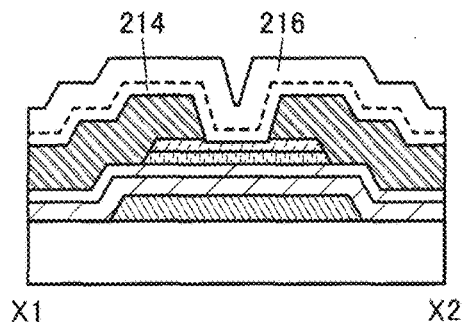
Figure 37D:
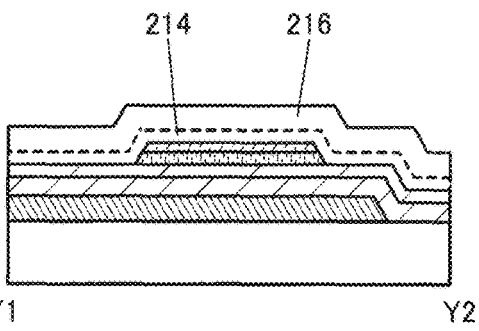

Next, the insulating films 214 and 216 are formed over the oxide 208 and the conductive films 212a and 212b (see FIGS. 37C and 37D).

Note that after the insulating film 214 is formed, the insulating film 216 is preferably formed in succession without exposure to the air. After the insulating film 214 is formed, the insulating film 216 is formed in succession without exposure to the air while at least one of the flow rate of a source gas, pressure, a high-frequency power, and a substrate temperature is adjusted, whereby the concentration of impurities attributed to the atmospheric component at the interface between the insulating film 214 and the insulating film 216 can be reduced and oxygen in the insulating films 214 and 216 can be moved to the oxide 208; accordingly, the amount of oxygen vacancies in the oxide 208 can be reduced.

As the insulating film 214, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulator containing nitrogen and having a small amount of defects can be formed as the insulating film 214 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating film 214 by a PECVD method under the conditions where the substrate 202 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 216, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 216, the high-frequency power having the above power density is supplied to a reaction chamber having the above pressure, whereby the decomposition efficiency of the source gas in plasma is increased, oxygen radicals are increased, and oxidation of the source gas is promoted; thus, the oxygen content in the insulating film 216 becomes higher than that in the stoichiometric composition. In addition, in the film formed at a substrate temperature within the above temperature range, the bond between silicon and oxygen is weak, and accordingly, part of oxygen in the film is released by heat treatment in a later step. Thus, it is possible to form an oxide insulating film whose oxygen content is higher than that in the stoichiometric composition and from which part of oxygen is released by heating.

Note that the insulating film 214 functions as a protective film for the oxide 208 in the step of forming the insulating film 216. Therefore, the insulating film 216 can be formed using the high-frequency power having a high power density while damage to the oxide 208 is reduced.

Note that in the deposition conditions of the insulating film 216, when the flow rate of the deposition gas containing silicon with respect to the oxidizing gas is increased, the amount of defects in the insulating film 216 can be reduced. As a typical example, it is possible to form an oxide insulating layer in which the amount of defects is small, i.e., the spin density corresponding to a signal which appears at g=2.001 due to a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

Heat treatment (hereinafter referred to as first heat treatment) is preferably performed after the insulating films 214 and 216 are formed. The first heat treatment can reduce nitrogen oxide contained in the insulating films 214 and 216. By the first heat treatment, part of oxygen contained in the insulating films 214 and 216 can be moved to the oxide 208, so that the amount of oxygen vacancies included in the oxide 208 can be reduced.

In the case where the oxide 208 has an atomic ratio of [In]:[Ga]:[Zn]=$(1+\alpha)$:$(1-\alpha)$:$\beta$ where $-1 \leq \alpha \leq 1$ and $\beta$ is a positive non-integer, at least a first layered structure and a second layered structure are included in the oxide. In a region where the first layered structure and the second layered structure are mixed, the alignment is disordered and the binding energy between atoms is weak. Thus, oxygen diffuses in the oxide 208 through that region as a movement path. Therefore, oxygen diffuses more easily than in the case where $\beta$ is a positive integer; thus, the amount of oxygen vacancies in the oxide 208 can be further reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air with a water content of 20 ppm or less, preferably 1 ppm or less, further preferably 10 ppb or less), or a rare gas (argon, helium, or the like). Note that an electric furnace, a rapid thermal annealing (RTA) apparatus, or the like can be used for the first heat treatment, in which it is preferable that hydrogen, water, and the like not be contained in the atmosphere of nitrogen, oxygen, ultra-dry air, or a rare gas.

Figure 37E:
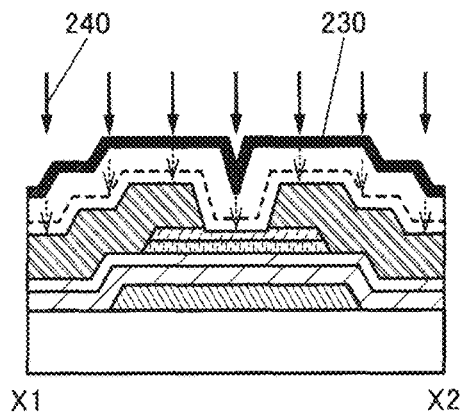
Figure 37F:
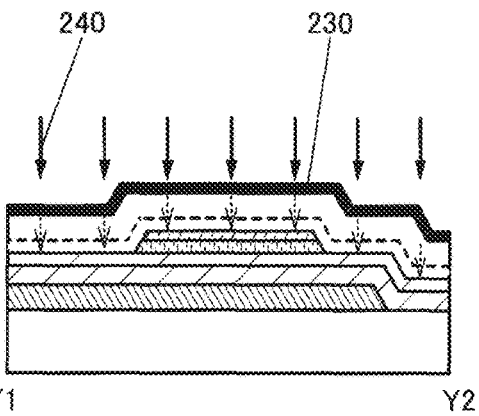

Next, a barrier film 230 is formed over the insulating film 216, and oxygen 240 is added to the insulating film 216, the insulating film 214, or the oxide 208 through the barrier film 230 (see FIGS. 37E and 37F).

In FIGS. 37E and 37F, oxygen added to the insulating film 214 or the insulating film 216 is schematically shown by arrows of broken lines.

The barrier film 230 is permeable to oxygen and inhibits release of oxygen. The barrier film 230 includes, for example, oxygen and metal (at least one element selected from indium, zinc, titanium, aluminum, tungsten, tantalum, molybdenum, hafnium, and yttrium). In particular, the barrier film 230 preferably includes indium tin oxide (also referred to as ITO), indium tin silicon oxide (hereinafter also referred to as ITSO), or indium oxide because an uneven surface can be favorably covered with such a material. Alternatively, as the barrier film 230, the above-described oxide semiconductor (having an atomic ratio of [In]:[Ga]:[Zn]=1:1:1, [In]:[Ga]:[Zn]=1:3:2, [In]:[Ga]:[Zn]=1:3:4, [In]:[Ga]:[Zn]=1:3:6, [In]:[Ga]:[Zn]=4:2:3, or a neighborhood thereof, for example) may be used.

The barrier film 230 can be formed by a sputtering method. When the barrier film 230 is thin, oxygen release from the insulating film 216 to the outside is difficult to suppress in some cases. On the other hand, when the barrier film 230 is thick, oxygen cannot be favorably added to the insulating film 216 in some cases. Accordingly, the thickness of the barrier film 230 is preferably greater than or equal to 1 nm and less than or equal to 20 nm, or greater than or equal to 2 nm and less than or equal to 10 nm. In this embodiment, the barrier film 230 is a 5-nm-thick ITSO film.

Examples of the method for adding the oxygen 240 to the insulating film 216 through the barrier film 230 include an ion doping method, an ion implantation method, and a plasma treatment method. Depending on the apparatus or conditions for adding the oxygen 240, the oxygen 240 can be added to the insulating film 214 or the oxide 208 under the insulating film 216 in some cases. As the oxygen 240, excess oxygen, an oxygen radical, or the like can be used. The oxygen 240 can be effectively added to the insulating film 216 by application of a bias to the substrate side. For the bias, for example, an ashing apparatus is used, and the power density of a bias applied between a pair of electrodes included in the ashing apparatus can be greater than or equal to 1 W/cm² and less than or equal to 5 W/cm². By providing the barrier film 230 over the insulating film 216 and adding the oxygen 240, the barrier film 230 functions as a protective film for inhibiting release of oxygen from the insulating film 216. Thus, a larger amount of oxygen can be added to the insulating film 216.

After the oxygen 240 is added to the insulating film 216 through the barrier film 230, heat treatment (hereinafter referred to as second heat treatment) may be performed. The second heat treatment can be performed under conditions similar to those of the first heat treatment.

Figure 38A:
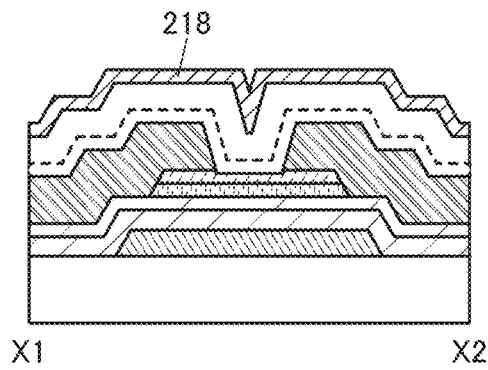
FIGS. 38A to 38F are cross-sectional views illustrating an example of a process for manufacturing a semiconductor device.
Figure 38B:
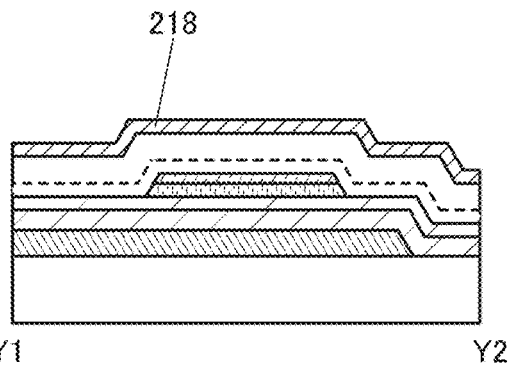
Figure 38C:
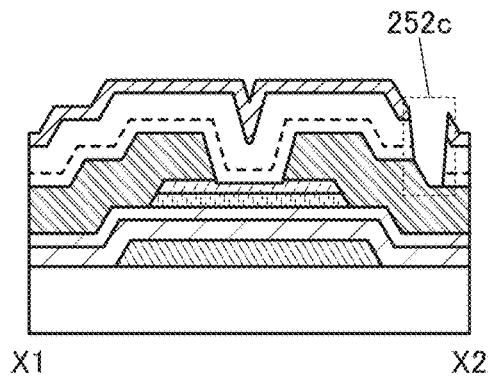
Figure 38D:
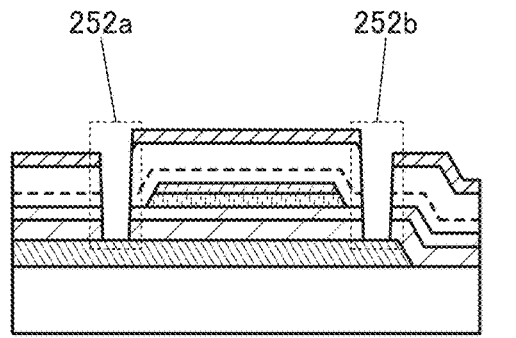

Next, the barrier film 230 is removed to expose a surface of the insulating film 216, and then, the insulating film 218 is formed over the insulating film 216 (see FIGS. 38A and 38B).

When the barrier film 230 is removed, part of the insulating film 216 is also removed in some cases. A method for removing the barrier film 230 is, for example, a dry etching method, a wet etching method, or a combination of a dry etching method and a wet etching method. In this embodiment, a wet etching method is used to remove the barrier film 230. A wet etching method is preferably used as the method for removing the barrier film 230 because of low manufacturing cost.

The insulating film 218 can be formed by a sputtering method or a PECVD method, for example. In the case where the insulating film 218 is formed by a PECVD method, for example, the substrate temperature is lower than 400° C., preferably lower than 375° C., further preferably higher than or equal to 180° C. and lower than or equal to 350° C. The substrate temperature at which the insulating film 218 is formed is preferably within the above range because a dense film can be formed. Furthermore, when the substrate temperature at which the insulating film 218 is formed is within the above range, oxygen or excess oxygen in the insulating films 214 and 216 can be moved to the oxide 208.

After the insulating film 218 is formed, heat treatment similar to the second heat treatment (hereinafter referred to as third heat treatment) may be performed. Through such heat treatment at lower than 400° C., preferably lower than 375° C., further preferably higher than or equal to 180° C. and lower than or equal to 350° C. after the addition of the oxygen 240 to the insulating film 216, oxygen or excess oxygen in the insulating film 216 can be moved to the oxide 208 (particularly, the oxide 208b) to fill oxygen vacancies in the oxide 208.

Figure 39A:
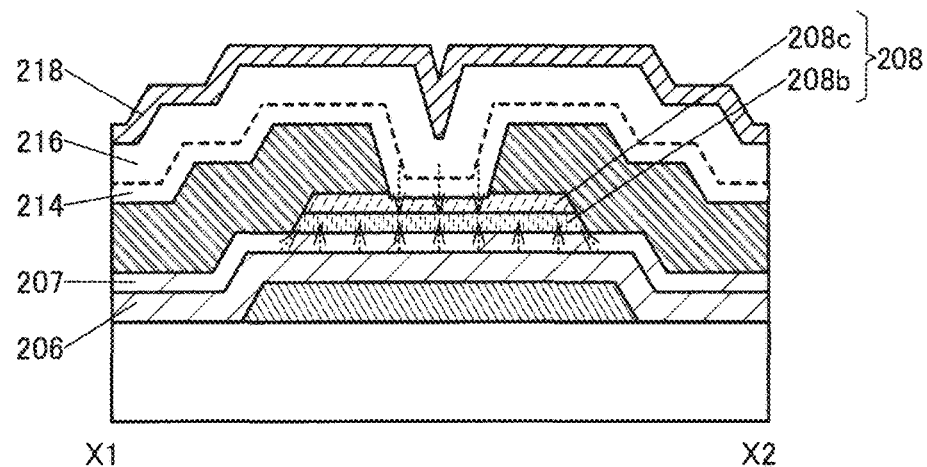
FIGS. 39A and 39B are model diagrams illustrating oxygen moved into an oxide semiconductor film.
Figure 39B:
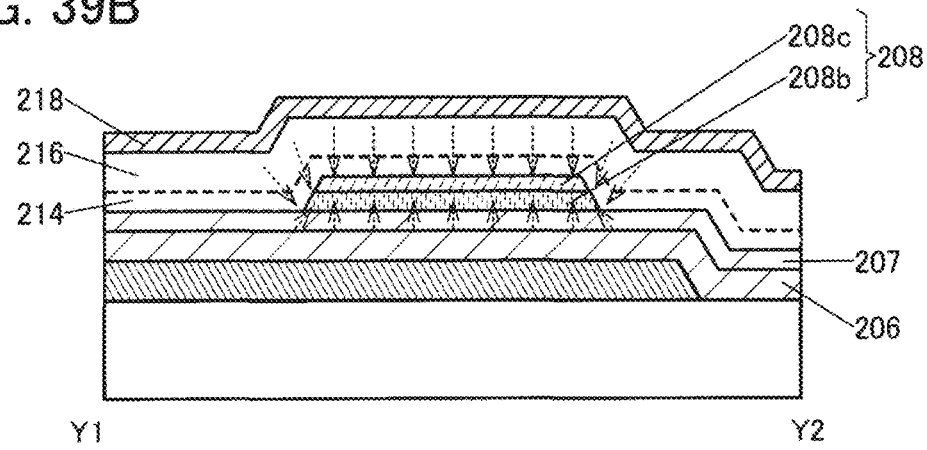

Oxygen moved into the oxide 208 is described with reference to FIGS. 39A and 39B. FIGS. 39A and 39B are model diagrams illustrating oxygen moved into the oxide 208 due to the substrate temperature at the time of forming the insulating film 218 (typically, lower than 375° C.) or the third heat treatment after the formation of the insulating film 218 (typically, lower than 375° C.). In FIGS. 39A and 39B, oxygen (oxygen radicals, oxygen atoms, or oxygen molecules) moved into the oxide 208 is shown by arrows of broken lines.

In the oxide 208 in FIGS. 39A and 39B, oxygen vacancies are filled with oxygen moved from films in contact with the oxide 208 (here, the insulating film 207 and the insulating film 214). Specifically, in the semiconductor device of one embodiment of the present invention, the insulating film 207 includes an oxygen-excess region because an oxygen gas is used at the time of forming the oxide 208 by sputtering and oxygen is added to the insulating film 207. Since oxygen is added through the barrier film 230, the insulating films 214 and 216 also include an oxygen-excess region. In the oxide 208 between the insulating films including the oxygen-excess regions, oxygen vacancies can be favorably filled.

Furthermore, the insulating film 206 is provided under the insulating film 207, and the insulating film 218 is provided over the insulating films 214 and 216. When the insulating films 206 and 218 are formed using a material having low oxygen permeability, e.g., silicon nitride, oxygen contained in the insulating films 207, 214, and 216 can be confined to the oxide 208 side; thus, oxygen can be favorably moved to the oxide 208.

In the case where a silicon nitride film is formed by a PECVD method as the insulating film 218, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in a source gas, the flow rate of nitrogen is set to be preferably 5 times or more and 50 times or less, more preferably 10 times or more and 50 times or less the flow rate of ammonia.

In this embodiment, with the use of a PECVD apparatus, a 50-nm-thick silicon nitride film is formed as the insulating film 218 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and a high-frequency power of 1000 W is supplied to parallel-plate electrodes with a 27.12 MHz high-frequency power source. The PECVD apparatus is a parallel-plate PECVD apparatus in which the electrode area is 6000 cm², and the power per unit area (power density) into which the supplied power is converted is $1.7 \times 10^{-1}$ W/cm².

Next, a mask is formed over the insulating film 218 through a lithography process, and the opening 252c is formed in a desired region in the insulating films 214, 216, and 218. In addition, a mask is formed over the insulating film 218 through a lithography process, and the openings 252a and 252b are formed in desired regions in the insulating films 206, 207, 214, 216, and 218. Note that the opening 252c reaches the conductive film 212b. The openings 252a and 252b reach the conductive film 204 (see FIGS. 38C and 38D).

Note that the openings 252a and 252b and the opening 252c may be formed in the same step or may be formed by different steps. In the case where the openings 252a and 252b and the opening 252c are formed in the same step, for example, a gray-tone mask or a half-tone mask can be used. Moreover, the openings 252a and 252b may be formed in a plurality of steps. For example, openings are formed in the insulating films 206 and 207 in advance, and then, openings are formed in the insulating films 214, 216, and 218 over the openings.

Figure 38E:
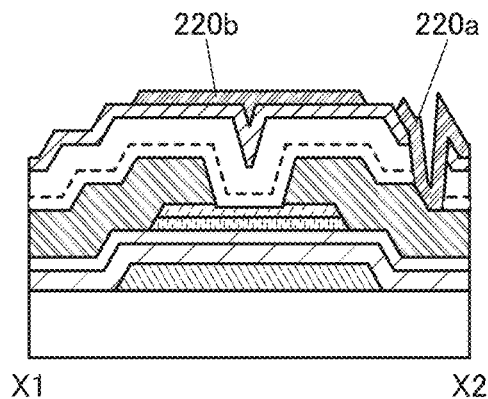
Figure 38F:
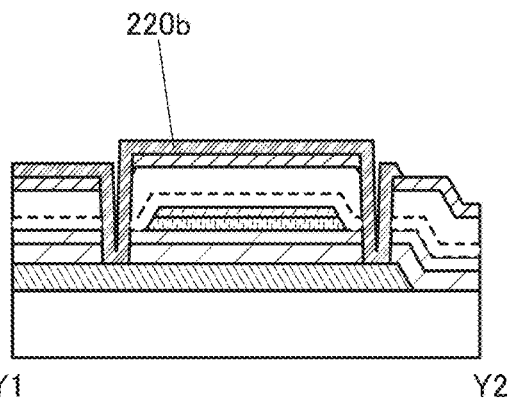

Next, a conductive film is formed over the insulating film 218 to cover the openings 252a, 252b, and 252c and processed into desired shapes, so that the conductive films 220a and 220b are formed (see FIGS. 38E and 38F).

For the conductive film to be the conductive films 220a and 220b, for example, a material including one of indium (In), zinc (Zn), and tin (Sn) can be used. In particular, for the conductive films 220a and 220b, a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin silicon oxide (ITSO) can be used. Moreover, the conductive film to be the conductive films 220a and 220b can be formed by a sputtering method, for example. In this embodiment, a 110-nm-thick ITSO film is formed by a sputtering method.

Through the above process, the transistor 270B illustrated in FIGS. 33C and 33D can be manufactured.

In the entire manufacturing process of the transistor 270B, the substrate temperature is preferably lower than 400° C., further preferably lower than 375° C., still further preferably higher than or equal to 180° C. and lower than or equal to 350° C. because a change in shape of the substrate (distortion or warp) can be reduced even when the substrate is a large-area substrate. Typical examples of high substrate temperatures in the manufacturing process of the transistor 270B are as follows: the substrate temperature at the time of forming the insulating films 206 and 207 (lower than 400° C., preferably higher than or equal to 250° C. and lower than or equal to 350° C.), the substrate temperature at the time of forming the oxide 208 (higher than or equal to room temperature and lower than 340° C., preferably higher than or equal to 100° C. and lower than or equal to 200° C., more preferably higher than or equal to 100° C. and lower than 150° C.), the substrate temperature at the time of forming the insulating films 216 and 218 (lower than 400° C., preferably lower than 375° C., more preferably higher than or equal to 180° C. and lower than or equal to 350° C.), and the substrate temperature at the time of the first heat treatment or the second heat treatment after the addition of the oxygen 240 (lower than 400° C., preferably lower than 375° C., more preferably higher than or equal to 180° C. and lower than or equal to 350° C.).

The structure and method described in this embodiment can be implemented by being combined as appropriate with any of the other structures and methods described in the other embodiments.

[Method 2 for Manufacturing Semiconductor Device]

A manufacturing method different from [Method 1 for manufacturing semiconductor device] is described below.

First, steps up to the step illustrated in FIGS. 37C and 37D are performed in a similar manner to that of [Method 1 for manufacturing semiconductor device]. Next, the barrier film 230 is formed as illustrated in FIGS. 37E and 37F, and the oxygen 240 is not added. Then, the step illustrated in FIGS. 38A and 38B is not performed, and the steps illustrated in FIGS. 38C and 38D and FIGS. 38E and 38F are performed.

In this case, for the barrier film 230, a material having a highly insulating property is selected from the above materials. For the barrier film 230 used in this manufacturing method, aluminum oxide, hafnium oxide, or yttrium oxide is preferably used.

When the barrier film 230 is formed by a sputtering method using aluminum oxide, hafnium oxide, or yttrium oxide, the sputtering gas preferably contains at least oxygen. Oxygen used for the sputtering gas in the formation of the barrier film 230 becomes oxygen radicals in plasma, and the oxygen and/or the oxygen radicals are added to the insulating film 216 in some cases. Therefore, the step of adding the oxygen 240 illustrated in FIGS. 37E and 37F is not necessarily performed. In other words, oxygen adding treatment and the formation of the barrier film 230 can be performed at the same time. Note that the barrier film 230 has a function of adding oxygen in the formation of the barrier film 230 (particularly in an early stage of the formation), whereas the barrier film 230 has a function of blocking oxygen after the formation of the barrier film 230 (particularly in a later stage of the formation).

In the case where the barrier film 230 is formed by a sputtering method using aluminum oxide, for example, a mixed layer might be formed in the vicinity of the interface between the insulating film 216 and the barrier film 230. For example, when the insulating film 216 is a silicon oxynitride film, an $Al_xSi_yO_z$ layer might be formed as the mixed layer. The mixed layer may include an oxygen-excess region.

When the barrier film 230 is formed using aluminum oxide, hafnium oxide, or yttrium oxide, which have a highly insulating property and a high oxygen barrier property, the step of forming the insulating film 218 illustrated in FIGS. 38A and 38B is not necessarily performed. Instead of the insulating film 218, the barrier film 230 may be used without being removed.

When the substrate temperature in the formation of the barrier film 230 is lower than 400° C., preferably lower than 375° C., further preferably higher than or equal to 180° C. and lower than or equal to 350° C., oxygen or excess oxygen added to the insulating film 216 can be moved into the oxide 208.

By using aluminum oxide, hafnium oxide, or yttrium oxide for the barrier film 230 as described above, the number of manufacturing steps of the semiconductor device can be reduced, which leads to low manufacturing cost.

[Method 3 for Manufacturing Semiconductor Device]

Next, a method for manufacturing the transistor 250 that is a semiconductor device of one embodiment of the present invention, which is illustrated in FIGS. 30A to 30C, is described with reference to FIGS. 40A to 40F and FIGS. 41A to 41F. FIGS. 40A to 40F and FIGS. 41A to 41F are cross-sectional views illustrating a method for manufacturing a semiconductor device. FIGS. 40A, 40C, and 40E and FIGS. 41A, 41C, and 41E are cross-sectional views in the channel length direction, and FIGS. 40B, 40D, and 40F and FIGS. 41B, 41D, and 41F are cross-sectional views in the channel width direction.

Figure 40A:
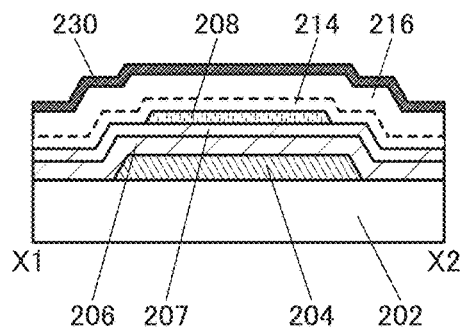
FIGS. 40A to 40F are cross-sectional views illustrating an example of a process for manufacturing a semiconductor device.
Figure 40B:
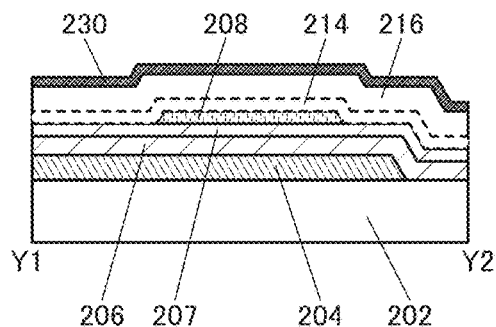

First, the conductive film 204, the insulating films 206 and 207, the oxide 208, the insulating films 214 and 216, and the barrier film 230 are formed over the substrate 202 (see FIGS. 40A and 40B).

The description of [Method 1 for manufacturing semiconductor device] can be referred to for the conductive film 204, the insulating films 206 and 207, the oxide 208, the insulating films 214 and 216, and the barrier film 230.

Figure 40C:
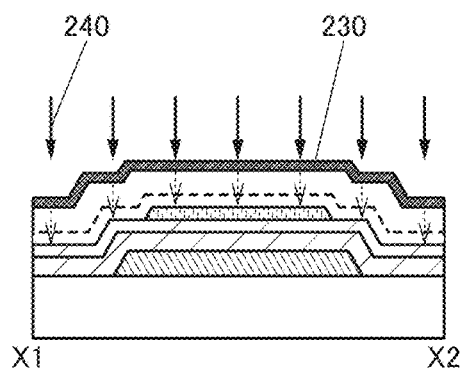
Figure 40D:
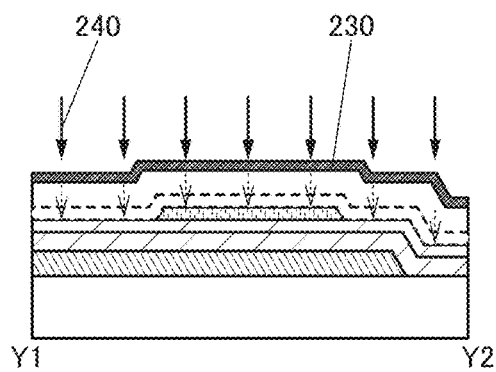
Figure 40E:
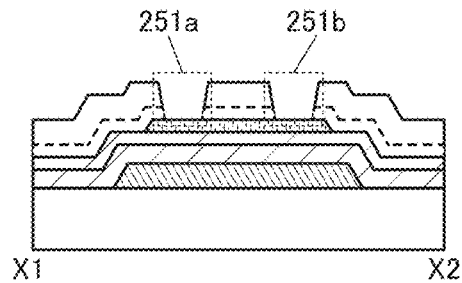
Figure 40F:
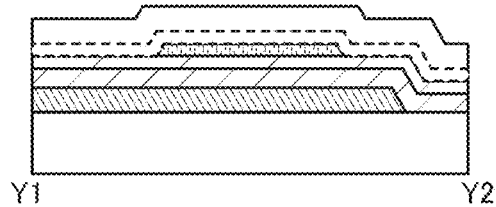

Next, the oxygen 240 is added to the insulating film 214 through the barrier film 230 (see FIGS. 40C and 40D).

Next, the barrier film 230 is removed. Then, a mask is formed over the insulating film 216 through a lithography process, and the openings 251a and 251b are formed in desired regions in the insulating films 214 and 216. Note that the openings 251a and 251b reach the oxide 208 (see FIGS. 40E and 40F).

Figure 41A:
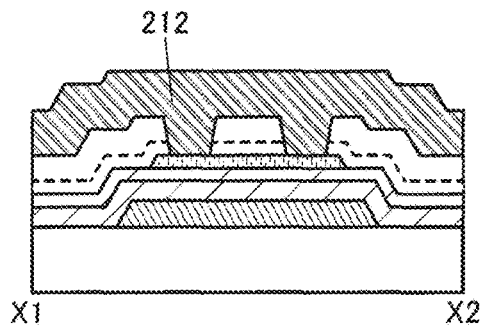
FIGS. 41A to 41F are cross-sectional views illustrating an example of a process for manufacturing a semiconductor device.
Figure 41B:
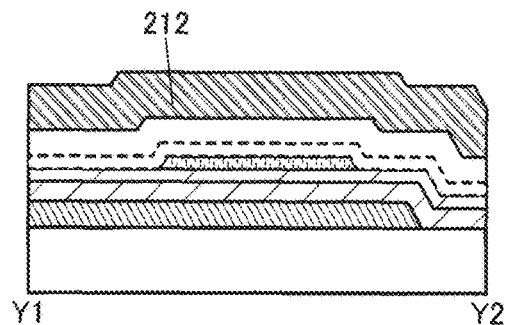

Next, the conductive film 212 is formed over the insulating film 216 to cover the openings 251a and 251b (see FIGS. 41A and 41B).

Figure 41C:
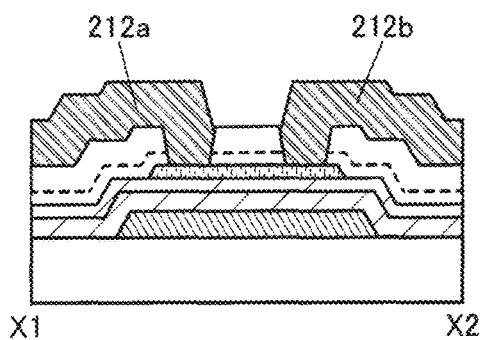
Figure 41D:
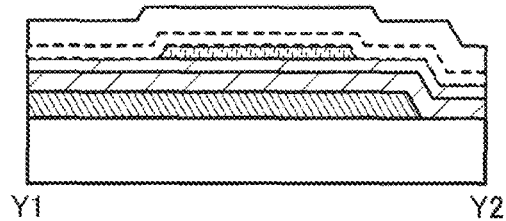

Next, a mask is formed over the conductive film 212 through a lithography process, and the conductive film is processed into desired shapes, so that the conductive films 212a and 212b are formed (see FIGS. 41C and 41D).

Figure 41E:
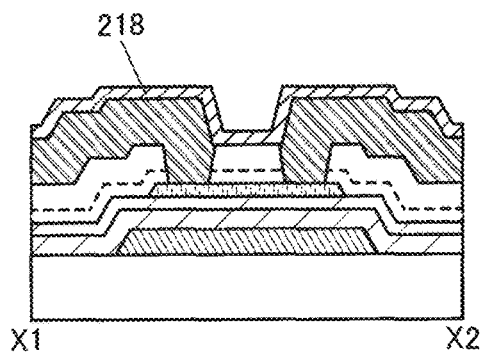
Figure 41F:
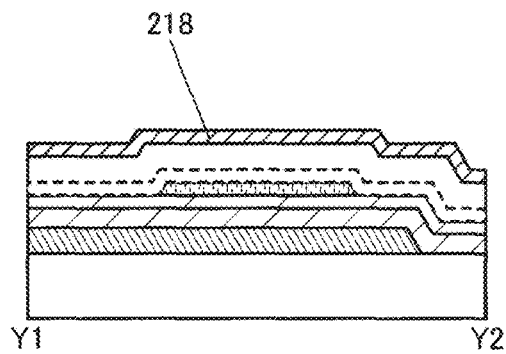

Next, the insulating film 218 is formed over the insulating film 216 and the conductive films 212a and 212b (see FIGS. 41E and 41F).

Through the above process, the transistor 250 illustrated in FIGS. 30A to 30C can be manufactured.

Note that the transistor 260 in FIGS. 31A to 31C can be manufactured in such a manner that the insulating films 214 and 216 are left only over a channel region of the oxide 208 at the step of forming the openings 251a and 251b.

The structure and method described in this embodiment can be implemented by being combined as appropriate with any of the other structures and methods described in the other embodiments.

(Embodiment 3)

In this embodiment, sputtering apparatuses and a deposition apparatus with which the oxide of one embodiment of the present invention can be deposited are described with reference to FIGS. 42A and 42B, FIGS. 43A and 43B, FIGS. 44A to 44C, FIG. 45, FIG. 46, FIGS. 47A and 47B, FIG. 48, and FIGS. 49A to 49C. The following descriptions of the sputtering apparatuses are made for easy understanding or the explanation of the operation during deposition, on the assumption that a substrate, a target, and the like are provided. Note that the substrate, the target, and the like are provided by a user; thus, the sputtering apparatus of one embodiment of the present invention does not necessarily include the substrate and the target.

<3-1. Sputtering Apparatus>

Examples of sputtering apparatuses include a parallel-plate-type sputtering apparatus and a facing-targets sputtering apparatus. Note that deposition using a parallel-plate-type sputtering apparatus can also be referred to as parallel electrode sputtering (PESP), and deposition using a facing-targets sputtering apparatus can also be referred to as vapor deposition sputtering (VDSP).

[Parallel-Plate-Type Sputtering Apparatus (PESP)]

Figure 42A:
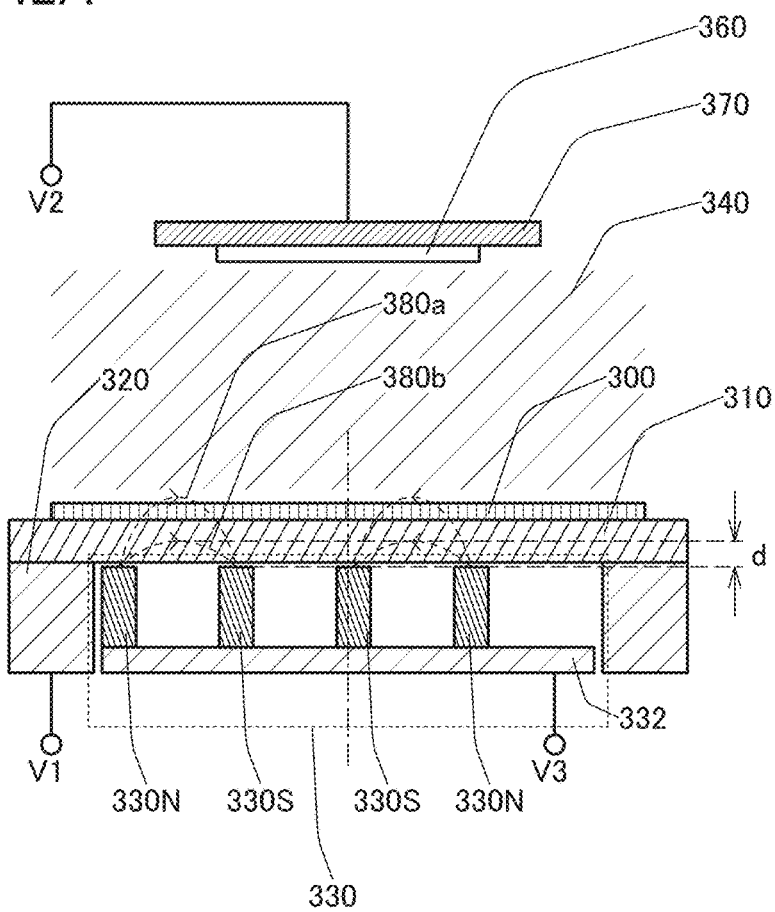
FIGS. 42A and 42B illustrate a sputtering apparatus.

First, the parallel-plate-type sputtering apparatus is described. FIG. 42A is a cross-sectional view of a deposition chamber 301 including a parallel-plate-type sputtering apparatus. The deposition chamber 301 in FIG. 42A includes a target holder 320, a backing plate 310, a target 300, a magnet unit 330, and a substrate holder 370. Note that the target 300 is placed over the backing plate 310. The backing plate 310 is placed over the target holder 320. The magnet unit 330 is placed under the target 300 with the backing plate 310 positioned therebetween. The substrate holder 370 faces the target 300. Note that in this specification, a magnet unit means a group of magnets. The term "magnet unit" can be replaced with "cathode," "cathode magnet," "magnetic member," "magnetic part," or the like. The magnet unit 330 includes a magnet 330N, a magnet 330S, and a magnet holder 332. Note that in the magnet unit 330, the magnet 330N and the magnet 330S are placed over the magnet holder 332. The magnet 330N and the magnet 330S are spaced. When a substrate 360 is transferred into the deposition chamber 301, the substrate 360 is placed on the substrate holder 370.

The target holder 320 and the backing plate 310 are fixed to each other with a screw (e.g., a bolt) and have the same potential. The target holder 320 has a function of supporting the target 300 with the backing plate 310 positioned therebetween.

The target 300 is fixed to the backing plate 310. For example, the target 300 can be fixed to the backing plate 310 with a bonding member containing a low-melting-point metal such as indium.

FIG. 42A illustrates a magnetic line of force 380a and a magnetic line of force 380b formed by the magnet unit 330.

The magnetic line of force 380a is one of magnetic lines of force that form a horizontal magnetic field in the vicinity of the target 300. The vicinity of the target 300 corresponds to a region in which the vertical distance from the top surface of the target 300 is, for example, greater than or equal to 0 mm and less than or equal to 10 mm, in particular, greater than or equal to 0 mm and less than or equal to 5 mm.

The magnetic line of force 380b is one of magnetic lines of force that form a horizontal magnetic field in a plane apart from the top surface of the magnet unit 330 by a vertical distance d. The vertical distance d is, for example, greater than or equal to 0 mm and less than or equal to 20 mm or greater than or equal to 5 mm and less than or equal to 15 mm.

Here, with the use of the strong magnet 330N and the strong magnet 330S, an intense magnetic field can be generated in the vicinity of the substrate 360. Specifically, the magnetic flux density of the horizontal magnetic field in the vicinity of the substrate 360 can be greater than or equal to 10 G and less than or equal to 100 G, preferably greater than or equal to 15 G and less than or equal to 60 G, further preferably greater than or equal to 20 G and less than or equal to 40 G.

Note that the magnetic flux density of the horizontal magnetic field may be measured when the magnetic flux density of the vertical magnetic field is 0 G.

By setting the magnetic flux density of the magnetic field in the deposition chamber 301 to be in the above range, an oxide with high density and high crystallinity can be deposited. The deposited oxide hardly includes a plurality of kinds of crystalline phases and has a substantially single crystalline phase.

Figure 42B:
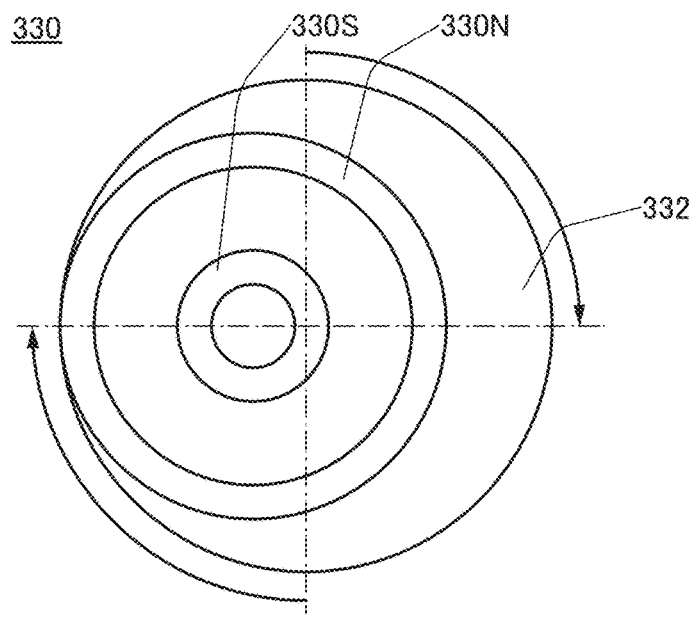

FIG. 42B is a top view of the magnet unit 330. In the magnet unit 330, the magnet 330N having a circular or substantially circular shape and the magnet 330S having a circular or substantially circular shape are fixed to the magnet holder 332. The magnet unit 330 can be rotated about a normal vector at the center of the top surface of the magnet unit 330 or a normal vector substantially at the center of the top surface of the magnet unit 330. For example, the magnet unit 330 may be rotated with a beat (also referred to as rhythm, pulse, frequency, period, cycle, or the like) of greater than or equal to 0.1 Hz and less than or equal to 1 kHz.

Thus, a region where a magnetic field on the target 300 is intense changes as the magnet unit 330 is rotated. The region with an intense magnetic field is a high-density plasma region; thus, sputtering of the target 300 easily occurs in the vicinity of the region. For example, when the region with an intense magnetic field is fixed, only a specific region of the target 300 is used. In contrast, when the magnet unit 330 is rotated as shown in FIG. 42B, the target 300 can be uniformly used. By rotating the magnet unit 330, a film with a uniform thickness and a film with uniform quality can be deposited.

By rotating the magnet unit 330, the direction of the magnetic line of force in the vicinity of the substrate 360 can also be changed.

Although the magnet unit 330 is rotated in this example, one embodiment of the present invention is not limited to this example. For example, the magnet unit 330 may be oscillated vertically or horizontally. For example, the magnet unit 330 may be oscillated with a beat of greater than or equal to 0.1 Hz and less than or equal to 1 kHz. Alternatively, the target 300 may be rotated or moved. For example, the target 300 may be rotated or moved with a beat of greater than or equal to 0.1 Hz and less than or equal to 1 kHz. Further alternatively, the direction of a magnetic line of force in the vicinity of the substrate 360 may be changed relatively by rotating the substrate 360. These methods may be combined.

The deposition chamber 301 may have a water channel inside or under the backing plate 310. By making a fluid (air, nitrogen, a rare gas, water, oil, or the like) flow through the water channel, discharge anomaly due to an increase in the temperature of the target 300 or damage to the deposition chamber 301 due to deformation of a component can be prevented in the sputtering. In that case, the backing plate 310 and the target 300 are preferably adhered to each other with a bonding member because the cooling capability is increased.

A gasket is preferably provided between the target holder 320 and the backing plate 310, in which case an impurity is less likely to enter the deposition chamber 301 from the outside, the water channel, or the like.

In the magnet unit 330, the magnet 330N and the magnet 330S are placed such that their surfaces on the target 300 side have opposite polarities. Here, the case where the pole of the magnet 330N on the target 300 side is the north pole and the pole of the magnet 330S on the target 300 side is the south pole is described. Note that the layout of the magnets and the poles in the magnet unit 330 are not limited to those described here or those illustrated in FIG. 42A.

In the deposition, a potential applied to a terminal V1 connected to the target holder 320 is, for example, lower than a potential applied to a terminal V2 connected to the substrate holder 370. The potential applied to the terminal V2 connected to the substrate holder 370 is, for example, the ground potential. A potential applied to the terminal V3 connected to the magnet holder 332 is, for example, the ground potential. Note that the potentials applied to the terminals V1, V2, and V3 are not limited to the above description. Not all the target holder 320, the substrate holder 370, and the magnet holder 332 are necessarily supplied with potentials. For example, the substrate holder 370 may be electrically floating. Note that it is assumed that a power source capable of controlling a potential applied to the terminal V1 is electrically connected to the terminal V1. As the power source, a DC power source or an RF power source may be used.

A cation in plasma 340 is accelerated toward the target 300 by the potential applied to the terminal V1 connected to the target holder 320. When the cation collides with the target 300, sputtered particles are generated and deposited on the substrate 360.

FIG. 42A illustrates an example where the backing plate 310 and the target holder 320 are not electrically connected to the magnet unit 330 and the magnet holder 332, but electrical connection is not limited thereto. For example, the backing plate 310 and the target holder 320 may be electrically connected to the magnet unit 330 and the magnet holder 332, and the backing plate 310, the target holder 320, the magnet unit 330, and the magnet holder 332 may have the same potential.

To increase the crystallinity of the deposited oxide, the temperature of the substrate 360 may be set high. By setting the temperature of the substrate 360 high, migration of sputtered particles in the vicinity of the substrate 360 can be promoted. Thus, an oxide with higher density and higher crystallinity can be deposited. Note that the temperature of the substrate 360 is, for example, higher than or equal to room temperature and lower than 540° C., preferably higher than or equal to room temperature and lower than or equal to 500° C., further preferably higher than or equal to 100° C. and lower than or equal to 450° C., still further preferably higher than or equal to 100° C. and lower than or equal to 400° C.

When the partial pressure of oxygen in the deposition gas is too high, an oxide including a plurality of kinds of crystalline phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, and still further preferably less than or equal to 15 vol %.

The vertical distance between the target 300 and the substrate 360 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 300 and the substrate 360 can be, in some cases, small enough to suppress a decrease in the energy of the sputtered particles until the sputtered particles reach the substrate 360. Within the above range, the vertical distance between the target 300 and the substrate 360 can be, in some cases, large enough to make the incident direction of the sputtered particle approximately vertical to the substrate 360, so that damage to the substrate 360 caused by collision of the sputtered particles can be reduced.

Figure 43A:
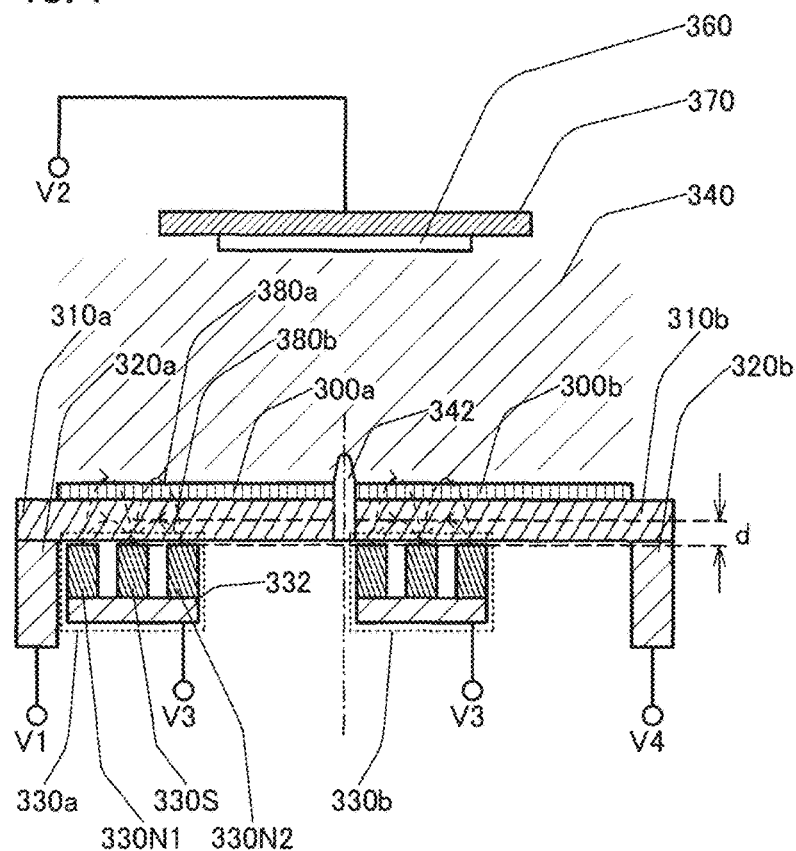
FIGS. 43A and 43B illustrate a sputtering apparatus.

FIG. 43A illustrates an example of a deposition chamber including a sputtering apparatus different from that in FIG. 42A.

The deposition chamber 301 in FIG. 43A includes a target holder 320a, a target holder 320b, a backing plate 310a, a backing plate 310b, a target 300a, a target 300b, a magnet unit 330a, a magnet unit 330b, a member 342, and the substrate holder 370. Note that the target 300a is placed over the backing plate 310a. The backing plate 310a is placed over the target holder 320a. The magnet unit 330a is placed under the target 300a with the backing plate 310a positioned therebetween. The target 300b is placed over the backing plate 310b. The backing plate 310b is placed over the target holder 320b. The magnet unit 330b is placed under the target 300b with the backing plate 310b positioned therebetween.

The magnet unit 330a includes a magnet 330N1, a magnet 330N2, the magnet 330S, and the magnet holder 332. Note that in the magnet unit 330a, the magnet 330N1, the magnet 330N2, and the magnet 330S are placed over the magnet holder 332. The magnet 330N1, the magnet 330N2, and the magnet 330S are spaced. Note that the magnet unit 330b has a structure similar to that of the magnet unit 330a. When the substrate 360 is transferred into the deposition chamber 301, the substrate 360 is placed in contact with the substrate holder 370.

The target 300a, the backing plate 310a, and the target holder 320a are separated from the target 300b, the backing plate 310b, and the target holder 320b by the member 342. Note that the member 342 is preferably an insulator. However, the member 342 may be a conductor or a semiconductor. The member 342 may be a conductor or a semiconductor whose surface is covered with an insulator.

The target holder 320a and the backing plate 310a are fixed to each other with a screw (e.g., a bolt) and have the same potential. The target holder 320a has a function of supporting the target 300a with the backing plate 310a positioned therebetween. The target holder 320b and the backing plate 310b are fixed to each other with a screw (e.g., a bolt) and have the same potential. The target holder 320b has a function of supporting the target 300b with the backing plate 310b positioned therebetween.

The backing plate 310a has a function of fixing the target 300a. The backing plate 310b has a function of fixing the target 300b.

FIG. 43A illustrates the magnetic line of force 380a and the magnetic line of force 380b formed by the magnet unit 330a.

The magnetic line of force 380a is one of magnetic lines of force that form a horizontal magnetic field in the vicinity of the target 300a. The vicinity of the target 300a corresponds to a region in which the vertical distance from the target 300a is, for example, greater than or equal to 0 mm and less than or equal to 10 mm, in particular, greater than or equal to 0 mm and less than or equal to 5 mm.

The magnetic line of force 380b is one of magnetic lines of force that form a horizontal magnetic field in a plane apart from the top surface of the magnet unit 330a by a vertical distance d. The vertical distance d is, for example, greater than or equal to 0 mm and less than or equal to 20 mm or greater than or equal to 5 mm and less than or equal to 15 mm.

Here, with the use of the strong magnet 330N1, the strong magnet 330N2, and the strong magnet 330S, an intense magnetic field can be generated in the vicinity of the substrate 360. Specifically, the magnetic flux density of the horizontal magnetic field in the vicinity of the substrate 360 can be greater than or equal to 10 G and less than or equal to 100 G, preferably greater than or equal to 15 G and less than or equal to 60 G, further preferably greater than or equal to 20 G and less than or equal to 40 G.

By setting the magnetic flux density of the magnetic field in the deposition chamber 301 to be in the above range, an oxide with high density and high crystallinity can be deposited. The deposited oxide hardly includes a plurality of kinds of crystalline phases and has a substantially single crystalline phase.

Note that the magnet unit 330b forms magnetic lines of force similar to those formed by the magnet unit 330a.

Figure 43B:
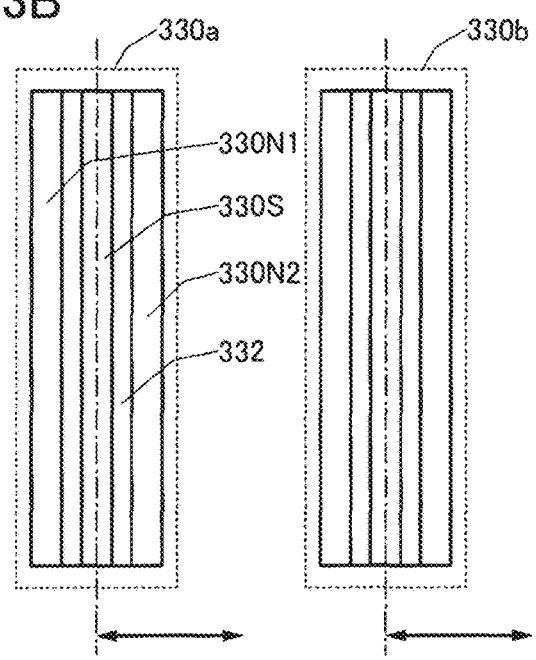

FIG. 43B is a top view of the magnet units 330a and 330b. The magnet unit 330a has a structure in which the magnet 330N1 having a rectangular or substantially rectangular shape, the magnet 330N2 having a rectangular or substantially rectangular shape, and the magnet 330S having a rectangular or substantially rectangular shape are fixed to the magnet holder 332. The magnet unit 330a can be oscillated horizontally as shown in FIG. 43B. For example, the magnet unit 330a may be oscillated with a beat of greater than or equal to 0.1 Hz and less than or equal to 1 kHz.

Thus, a region where a magnetic field on the target 300a is intense changes as the magnet unit 330a is oscillated. The region with an intense magnetic field is a high-density plasma region; thus, sputtering of the target 300a easily occurs in the vicinity of the region. For example, when the region with an intense magnetic field is fixed, only a specific region of the target 300a is used. In contrast, when the magnet unit 330a is oscillated as shown in FIG. 43B, the target 300a can be uniformly used. By oscillating the magnet unit 330a, a film with a uniform thickness and a film with uniform quality can be deposited.

By oscillating the magnet unit 330a, the state of the magnetic lines of force in the vicinity of the substrate 360 can also be changed. The same applies to the magnet unit 330b.

Although the magnet unit 330a and the magnet unit 330b are oscillated in this example, one embodiment of the present invention is not limited to this example. For example, the magnet unit 330a and the magnet unit 330b may be rotated. For example, the magnet unit 330a and the magnet unit 330b may be rotated with a beat of greater than or equal to 0.1 Hz and less than or equal to 1 kHz. Alternatively, the target 300 may be rotated or moved. For example, the target 300 may be rotated or moved with a beat of greater than or equal to 0.1 Hz and less than or equal to 1 kHz. Further alternatively, the state of magnetic lines of force on the top surface of the substrate 360 can be changed relatively by rotating the substrate 360. These methods may be combined.

The deposition chamber 301 may have a water channel inside or under the backing plate 310a and the backing plate 310b. By making a fluid (air, nitrogen, a rare gas, water, oil, or the like) flow through the water channel, discharge anomaly due to an increase in the temperature of the target 300a and the target 300b or damage to the deposition chamber 301 due to deformation of a component can be prevented in the sputtering. In that case, the backing plate 310a and the target 300a are preferably adhered to each other with a bonding member because the cooling capability is increased. Furthermore, the backing plate 310b and the target 300b are preferably adhered to each other with a bonding member because the cooling capability is increased.

A gasket is preferably provided between the target holder 320a and the backing plate 310a, in which case an impurity is less likely to enter the deposition chamber 301 from the outside, the water channel, or the like. A gasket is preferably provided between the target holder 320b and the backing plate 310b, in which case an impurity is less likely to enter the deposition chamber 301 from the outside, the water channel, or the like.

In the magnet unit 330a, the magnets 330N1 and 330N2 and the magnet 330S are placed such that their surfaces on the target 300a side have opposite polarities. Here, the case where the pole of each of the magnets 330N1 and 330N2 on the target 300a side is the north pole and the pole of the magnet 330S on the target 300a side is the south pole is described. Note that the layout of the magnets and the poles in the magnet unit 330a are not limited to those described here or those illustrated in FIG. 43A. The same applies to the magnet unit 330b.

In the deposition, a potential applied to the terminal V1 connected to the target holder 320a and a potential applied to the terminal V4 connected to the target holder 320b may be alternately switched between a high level and a low level. When the potential applied to the terminal V1 is one of the high level and the low level, the potential applied to the terminal V4 is the other of the high level and the low level. A potential applied to the terminal V2 connected to the substrate holder 370 is, for example, the ground potential. A potential applied to the terminal V3 connected to the magnet holder 332 is, for example, the ground potential. Note that the potentials applied to the terminals V1, V2, V3, and V4 are not limited to the above description. Not all the target holder 320a, the target holder 320b, the substrate holder 370, and the magnet holder 332 are necessarily supplied with potentials. For example, the substrate holder 370 may be electrically floating. Note that the potential applied to the terminal V1 connected to the target holder 320a and the potential applied to the terminal V4 connected to the target holder 320b are alternately switched between the high level and the low level (i.e., an AC sputtering method) in the example illustrated in FIG. 43A; however, one embodiment of the present invention is not limited thereto.

FIG. 43A illustrates an example where the backing plate 310a and the target holder 320a are not electrically connected to the magnet unit 330a and the magnet holder 332, but electrical connection is not limited thereto. For example, the backing plate 310a and the target holder 320a may be electrically connected to the magnet unit 330a and the magnet holder 332, and the backing plate 310a, the target holder 320a, the magnet unit 330a, and the magnet holder 332 may have the same potential. The backing plate 310b and the target holder 320b are not electrically connected to the magnet unit 330b and the magnet holder 332 in the example, but electrical connection is not limited thereto. For example, the backing plate 310b and the target holder 320b may be electrically connected to the magnet unit 330b and the magnet holder 332, and the backing plate 310b, the target holder 320b, the magnet unit 330b, and the magnet holder 332 may have the same potential.

To increase the crystallinity of the deposited oxide, the temperature of the substrate 360 may be set high. By setting the temperature of the substrate 360 high, migration of sputtered particles in the vicinity of the substrate 360 can be promoted. Thus, an oxide with higher density and higher crystallinity can be deposited. Note that the temperature of the substrate 360 is, for example, higher than or equal to room temperature and lower than 440° C., preferably higher than or equal to room temperature and lower than or equal to 400° C., further preferably higher than or equal to 150° C. and lower than or equal to 300° C., still further preferably higher than or equal to 100° C. and lower than or equal to 200° C.

When the partial pressure of oxygen in the deposition gas is too high, an oxide including a plurality of kinds of crystalline phases is likely to be deposited; therefore, a mixed gas of oxygen and a rare gas such as argon (other examples of the rare gas are helium, neon, krypton, and xenon) is preferably used as the deposition gas.

For example, the proportion of oxygen in the whole deposition gas is less than 50 vol %, preferably less than or equal to 33 vol %, further preferably less than or equal to 20 vol %, and still further preferably less than or equal to 15 vol %.

The vertical distance between the target 300a and the substrate 360 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 300a and the substrate 360 can be, is some cases, small enough to suppress a decrease in the energy of the sputtered particles until the sputtered particles reach the substrate 360. Within the above range, the vertical distance between the target 300a and the substrate 360 can be, is some cases, large enough to make the incident direction of the sputtered particle approximately vertical to the substrate 360, so that damage to the substrate 360 caused by collision of the sputtered particles can be reduced.

The vertical distance between the target 300b and the substrate 360 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 300b and the substrate 360 can be, is some cases, small enough to suppress a decrease in the energy of the sputtered particles until the sputtered particles reach the substrate 360. Within the above range, the vertical distance between the target 300b and the substrate 360 can be, is some cases, large enough to make the incident direction of the sputtered particle approximately vertical to the substrate 360, so that damage to the substrate 360 caused by collision of the sputtered particles can be reduced.

[Facing-Targets Sputtering Apparatus (VDSP)]

Figure 44A:
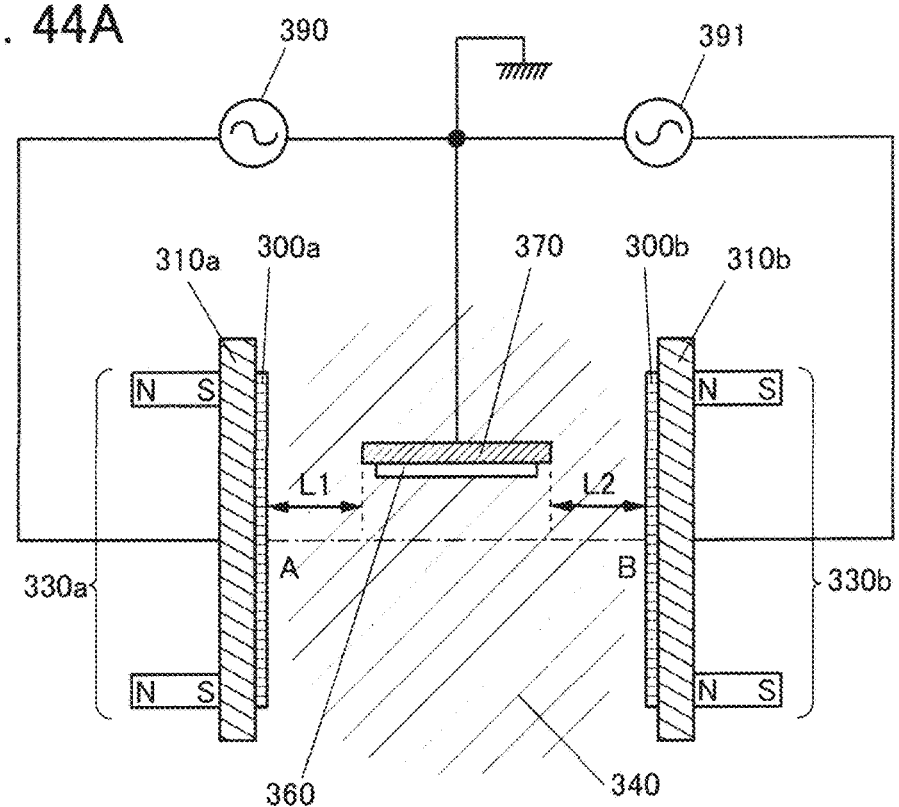
FIGS. 44A to 44C illustrate a sputtering apparatus.

Next, the facing-targets sputtering apparatus is described. FIG. 44A is a cross-sectional view of a deposition chamber including a facing-targets sputtering apparatus. The deposition chamber illustrated in FIG. 44A includes the target 300a, the target 300b, the backing plate 310a for holding the target 300a, the backing plate 310b for holding the target 300b, the magnet unit 330a placed behind the target 300a with the backing plate 310a positioned therebetween, and the magnet unit 330b placed behind the target 300b with the backing plate 310b positioned therebetween. The substrate holder 370 is placed between the target 300a and the target 300b. The substrate 360 is transferred into the deposition chamber, and then the substrate 360 is fixed to the substrate holder 370.

As illustrated in FIG. 44A, a power source 390 and a power source 391 for applying potentials are connected to the backing plates 310a and 310b. It is preferable to use AC power sources, which alternately apply a high-level potential and a low-level potential to the backing plate 310a and the backing plate 310b. When one of the high-level potential and the low-level potential is applied to the backing plate 310a, the other of the high-level potential and the low-level potential is applied to the backing plate 310b. Although AC power sources are used as the power sources 390 and 391 illustrated in FIG. 44A, one embodiment of the present invention is not limited thereto. For example, RF power sources, DC power sources, or the like can be used as the power sources 390 and 391. Alternatively, different kinds of power sources may be used as the power sources 390 and 391.

The substrate holder 370 is preferably connected to GND. The substrate holder 370 may be in a floating state.

Figure 44B:
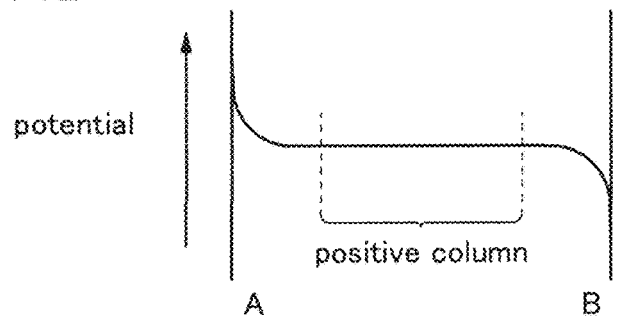
Figure 44C:
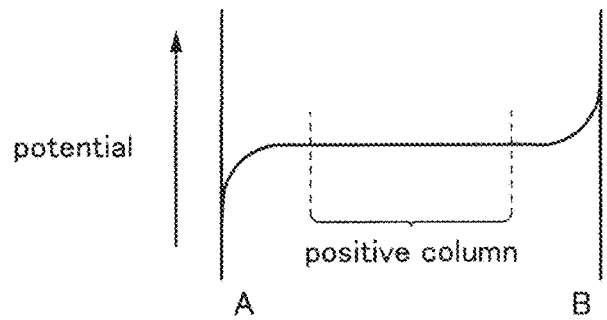

FIGS. 44B and 44C each show potential distribution of plasma 340 along dashed-dotted line A-B in FIG. 44A. FIG. 44B shows the potential distribution in the case where a high potential is applied to the backing plate 310a and a low potential is applied to the backing plate 310b. In that case, a cation is accelerated toward the target 300b. FIG. 44C shows the potential distribution in the case where a low potential is applied to the backing plate 310a and a high potential is applied to the backing plate 310b. In that case, a cation is accelerated toward the target 300a. The deposition can be performed by alternating the state in FIG. 44B and the state in FIG. 44C.

The deposition is preferably performed while the plasma 340 completely reaches the surface of the substrate 360. For example, the substrate holder 370 and the substrate 360 are preferably placed in the plasma 340 as illustrated in FIG. 44A. It is particularly preferable that the substrate holder 370 and the substrate 360 be placed in a positive column of the plasma 340. The positive column of the plasma 340 is, in each of FIGS. 44B and 44C, a region around the midpoint of A and B where the gradient of the potential distribution is small. When the substrate 360 is placed in the positive column of the plasma 340 as illustrated in FIG. 44A, the substrate 360 is not exposed to a high electric field portion in the plasma 340; thus, damage to the substrate 360 due to the plasma 340 can be reduced and defects can be reduced.

It is preferable to place the substrate holder 370 and the substrate 360 in the plasma 340 during deposition as illustrated in FIG. 44A also because utilization efficiencies of the targets 300a and 300b are increased.

As illustrated in FIG. 44A, the horizontal distance between the substrate holder 370 and the target 300a is referred to as L1 and the horizontal distance between the substrate holder 370 and the target 300b is referred to as L2. It is preferable that the distance L1 and the distance L2 each be substantially equal to the length of the substrate 360 in the horizontal direction in FIG. 44A. In addition, it is preferable that the distances L1 and L2 be adjusted as appropriate so that the substrate 360 is placed in the positive column of the plasma 340 as described above. The distances L1 and L2 can each be, for example, greater than or equal to 10 mm and less than or equal to 200 mm.

In FIG. 44A, the target 300a and the target 300b are parallel to each other. Moreover, the magnet unit 330a and the magnet unit 330b are placed so that opposite poles face each other. Magnetic lines of force run from the magnet unit 330b to the magnet unit 330a. Therefore, in the deposition, the plasma 340 is confined in the magnetic field formed by the magnet units 330a and 330b. The substrate holder 370 and the substrate 360 are placed in a region where the target 300a and the target 300b face each other (also referred to as a region between targets). Note that although the substrate holder 370 and the substrate 360 are placed parallel to the direction in which the target 300a and the target 300b face each other in FIG. 44A, the substrate holder 370 and the substrate 360 may be inclined to the direction. By inclination of the substrate holder 370 and the substrate 360 at 300 or more and 60° or less (typified by 45°), for example, the proportion of sputtered particles that perpendicularly reach the substrate 360 during deposition can be increased.

Figure 45:
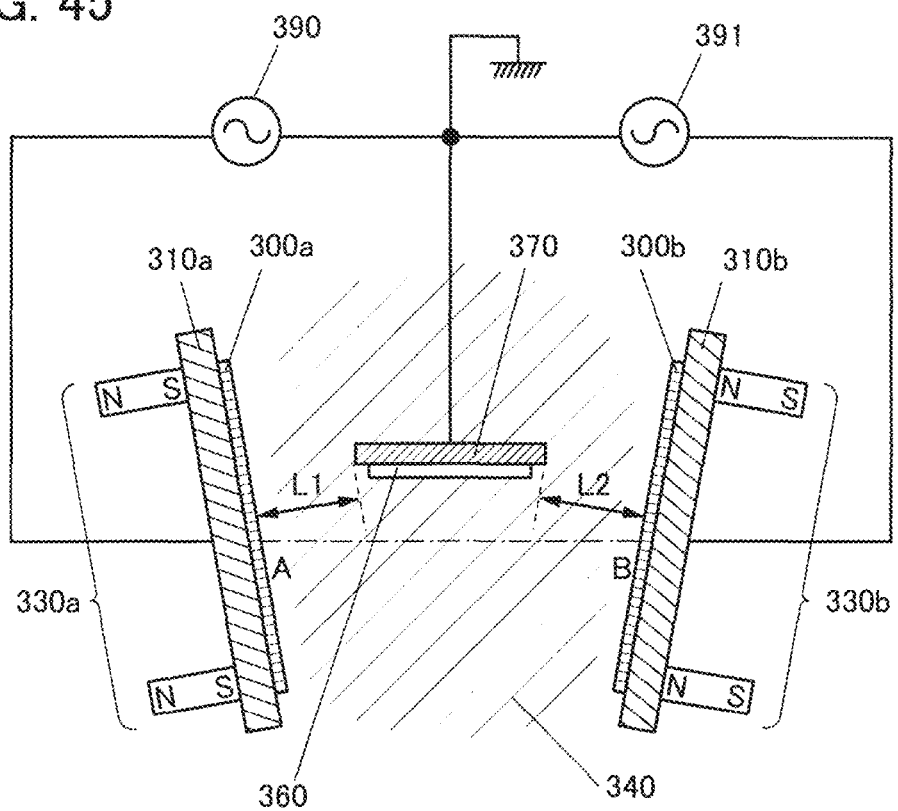
FIG. 45 illustrates a sputtering apparatus.

A structure illustrated in FIG. 45 is different from that illustrated in FIG. 44A in that the target 300a and the target 300b that face each other are not parallel but inclined to each other (in V-shape). Thus, the description for FIG. 44A is referred to for the description except for the arrangement of the targets. The magnet unit 330a and the magnet unit 330b are placed so that opposite poles face each other. The substrate holder 370 and the substrate 360 are placed in the region between targets. With the targets 300a and 300b placed as illustrated in FIG. 45, the proportion of sputtered particles that reach the substrate 360 can be increased; accordingly, the deposition rate can be increased.

Although FIG. 44A illustrates a state in which the substrate holder 370 and the substrate 360 are placed in the plasma 340, one embodiment of the present invention is not limited to this state. The substrate holder 370 and the substrate 360 may be placed outside the plasma 340 as illustrated in FIG. 46, for example. In that case, the substrate 360 is not exposed to a high electric field region of the plasma 340, leading to a reduction in damage due to the plasma 340. Note that the utilization efficiencies of the targets 300a and 300b are decreased as the distance between the plasma 340 and the substrate 360 is increased. It is preferable that the position of the substrate holder 370 be adjustable as illustrated in FIG. 46.

The substrate holder 370 may be placed either above or below the region between targets. Alternatively, the substrate holders 370 may be placed above and below the region. Providing the substrate holders 370 above and below the region allows deposition on two or more substrates at once, leading to an increase in productivity. Note that the position above or below the region where the target 300a and the target 300b face each other can also be referred to as the side of the region where the target 300a and the target 300b face each other.

The facing-targets sputtering apparatus can stably generate plasma even in a high vacuum. Thus, deposition can be performed at a pressure higher than or equal to 0.005 Pa and lower than or equal to 0.09 Pa, for example. As a result, the concentration of impurities contained during deposition can be reduced.

The use of the facing-targets sputtering apparatus allows deposition in a high vacuum or deposition with less plasma damage and thus can provide a film with high crystallinity even when the temperature of the substrate 360 is low (e.g., higher than or equal to 10° C. and lower than 100° C.).

Figure 47A:
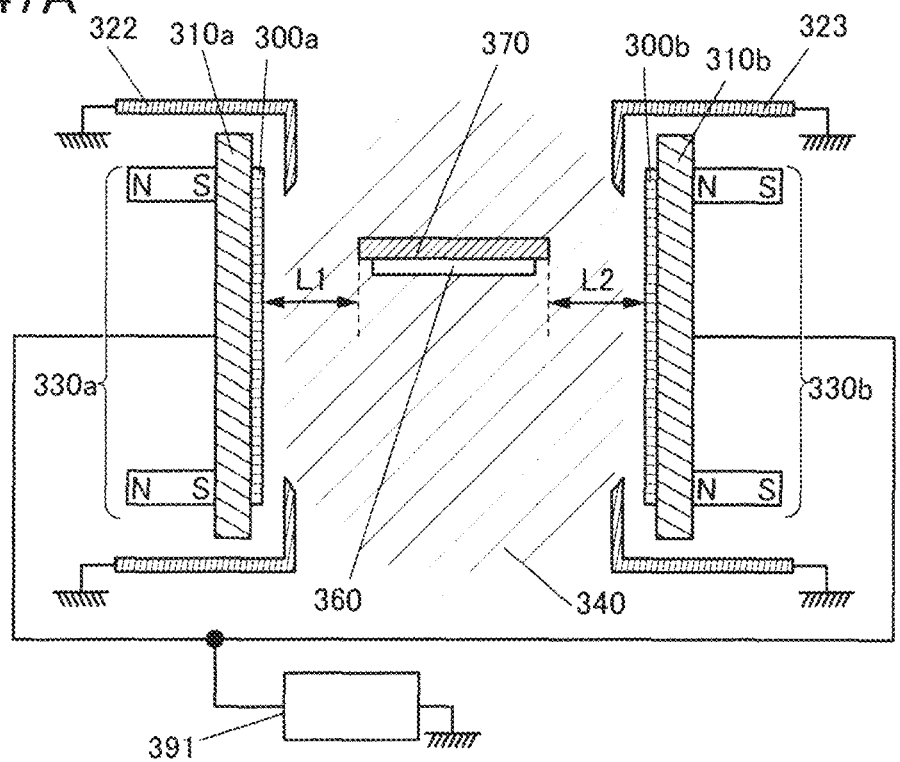
FIGS. 47A and 47B illustrate a sputtering apparatus.

FIG. 47A illustrates another example of a facing-targets sputtering apparatus.

FIG. 47A is a schematic cross-sectional view of a deposition chamber of a facing-targets sputtering apparatus. Unlike in the deposition chamber illustrated in FIG. 44A, a target shield 322 and a target shield 323 are provided. The power source 391 connected to the backing plates 310a and 310b is also provided.

The target shields 322 and 323 are connected to GND as illustrated in FIG. 47A. This means that the plasma 340 is generated by a potential difference between the backing plates 310a and 310b to which a potential of the power source 391 is applied and the target shields 322 and 323 to which GND is applied.

The deposition is preferably performed while the plasma 340 completely reaches the surface of the substrate 360. For example, the substrate holder 370 and the substrate 360 are preferably placed in the plasma 340 as illustrated in FIG. 47A. It is particularly preferable that the substrate holder 370 and the substrate 360 be placed in a positive column of the plasma 340. The positive column of the plasma is a region where the gradient of the potential distribution is small. When the substrate 360 is placed in the positive column of the plasma 340 as illustrated in FIG. 47A, the substrate 360 is not exposed to a high electric field portion in the plasma 340; thus, damage to the substrate 360 due to the plasma 340 can be reduced and an oxide with a favorable film quality can be obtained.

It is preferable to place the substrate holder 370 and the substrate 360 in the plasma 340 during deposition as illustrated in FIG. 47A also because utilization efficiencies of the targets 300a and 300b are increased.

As illustrated in FIG. 47A, the horizontal distance between the substrate holder 370 and the target 300a is referred to as L1 and the horizontal distance between the substrate holder 370 and the target 300b is referred to as L2. It is preferable that the distance L1 and the distance L2 each be substantially equal to the length of the substrate 360 in the horizontal direction in FIG. 47A. In addition, it is preferable that the distances L1 and L2 be adjusted as appropriate so that the substrate 360 is placed in the positive column of the plasma 340 as described above.

Figure 47B:
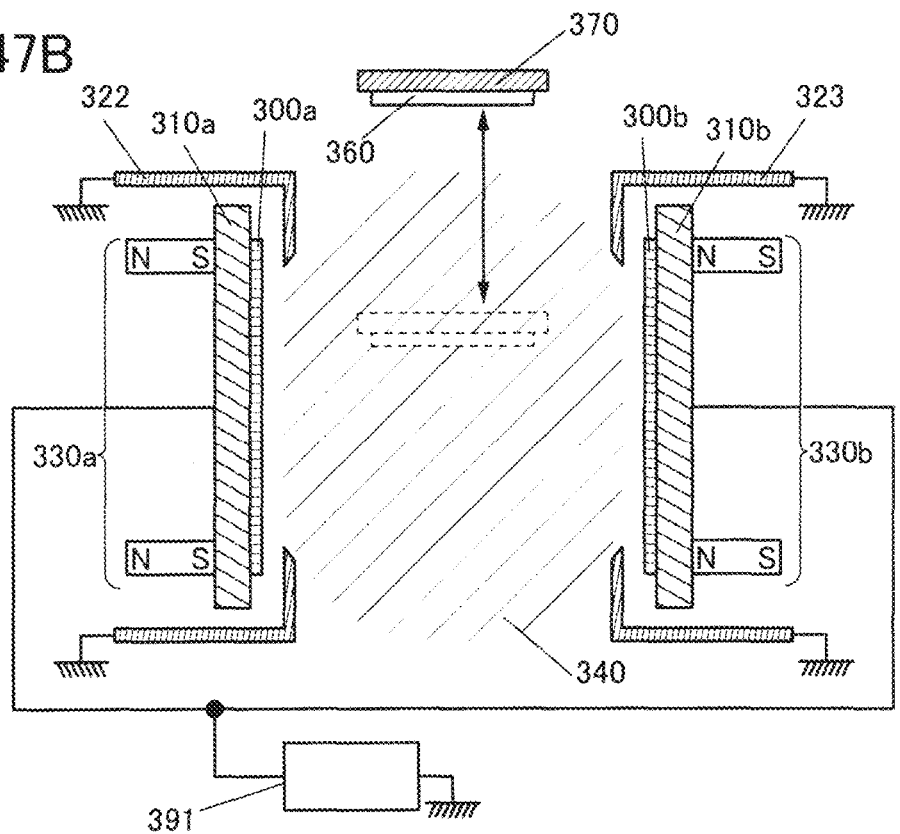

Although FIG. 47A illustrates a state in which the substrate holder 370 and the substrate 360 are placed in the plasma 340, one embodiment of the present invention is not limited to this state. The substrate holder 370 and the substrate 360 may be placed outside the plasma 340 as illustrated in FIG. 47B, for example. In that case, the substrate 360 is not exposed to a high electric field region of the plasma 340, leading to a reduction in damage due to the plasma 340. Note that the utilization efficiencies of the targets 300*a* and 300*b* are decreased as the distance between the plasma 340 and the substrate 360 is increased. It is preferable that the position of the substrate holder 370 be adjustable as illustrated in FIG. 47B.

The substrate holder 370 may be placed above a region where the target 300*a* and the target 300*b* face each other as illustrated in FIG. 47B, or may be placed below the region. Alternatively, the substrate holders 370 may be placed above and below the region. Providing the substrate holders 370 above and below the region allows deposition on two or more substrates at once, leading to an increase in productivity.

In the above-described facing-targets sputtering apparatuses, plasma is confined by magnetic fields between targets; thus, plasma damage to a substrate can be reduced. Furthermore, a deposited film can have improved step coverage because an incident angle of a sputtered particle to a substrate can be made smaller by the inclination of the target. Moreover, deposition in a high vacuum enables the concentration of impurities contained in the film to be reduced.

Note that a parallel-plate-type sputtering apparatus or an ion beam sputtering apparatus may be provided in the deposition chamber.

<3-2. Deposition Apparatus>

A deposition apparatus with a deposition chamber including a sputtering apparatus with which the oxide of one embodiment of the present invention can be deposited is described below.

First, a structure of a deposition apparatus which allows the entry of few impurities into a film at the time of the deposition or the like is described with reference to FIG. 48 and FIGS. 49A to 49C.

Figure 48:
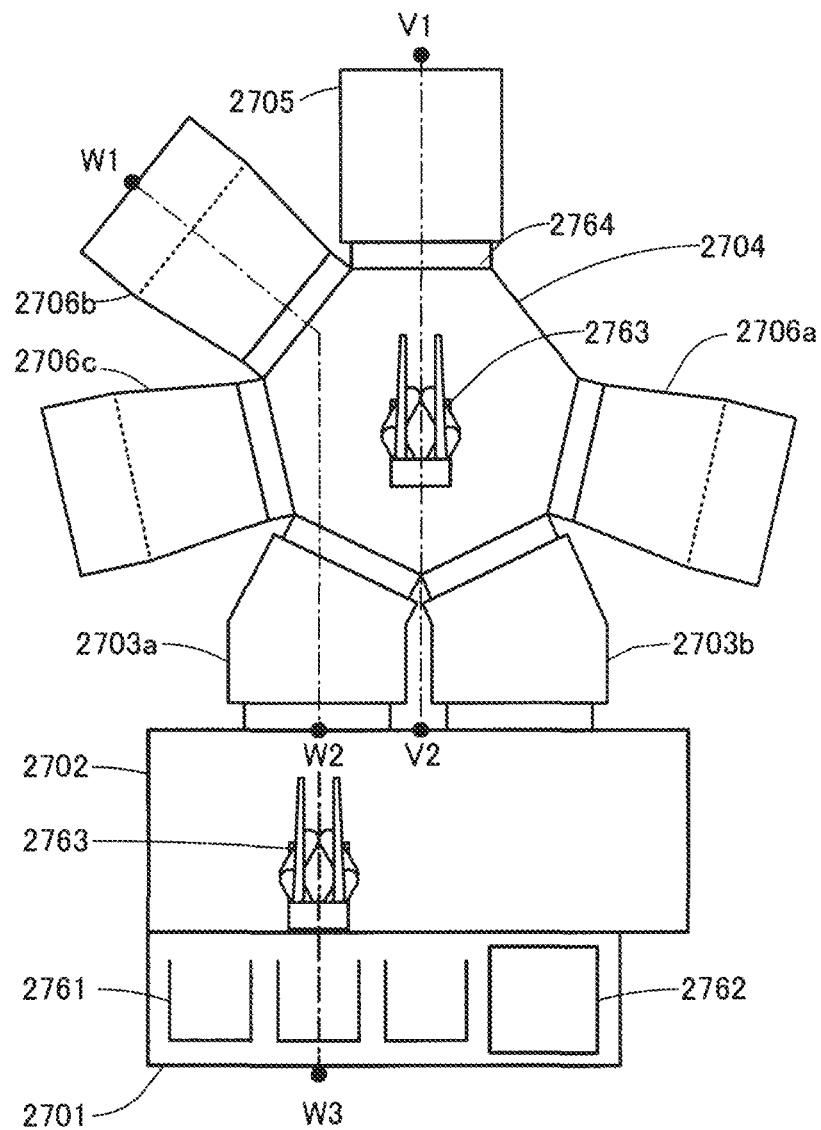
FIG. 48 is a top view illustrating an example of a deposition apparatus.

FIG. 48 is a schematic top view of a single wafer multi-chamber deposition apparatus 2700. The deposition apparatus 2700 includes an atmosphere-side substrate supply chamber 2701 including a cassette port 2761 for storing substrates and an alignment port 2762 for performing alignment of substrates, an atmosphere-side substrate transfer chamber 2702 through which a substrate is transferred from the atmosphere-side substrate supply chamber 2701, a load lock chamber 2703*a* where a substrate is carried in and the pressure is switched from atmospheric pressure to reduced pressure or from reduced pressure to atmospheric pressure, an unload lock chamber 2703*b* where a substrate is carried out and the pressure is switched from reduced pressure to atmospheric pressure or from atmospheric pressure to reduced pressure, a transfer chamber 2704 where a substrate is transferred in a vacuum, a substrate heating chamber 2705 where a substrate is heated, and deposition chambers 2706*a*, 2706*b*, and 2706*c* in each of which a sputtering target is placed for deposition. Note that for the deposition chambers 2706*a*, 2706*b*, and 2706*c*, the structure of a deposition chamber which will be described later can be referred to.

The atmosphere-side substrate transfer chamber 2702 is connected to the load lock chamber 2703*a* and the unload lock chamber 2703*b*, the load lock chamber 2703*a* and the unload lock chamber 2703*b* are connected to the transfer chamber 2704, and the transfer chamber 2704 is connected to the substrate heating chamber 2705 and the deposition chambers 2706*a*, 2706*b*, and 2706*c*.

Note that gate valves 2764 are provided in connecting portions between the chambers so that each chamber excluding the atmosphere-side substrate supply chamber 2701 and the atmosphere-side substrate transfer chamber 2702 can be independently kept in a vacuum state. In each of the atmosphere-side substrate supply chamber 2702 and the transfer chamber 2704, a transfer robot 2763 is provided, which is capable of transferring substrates.

It is preferable that the substrate heating chamber 2705 also serve as a plasma treatment chamber. In the deposition apparatus 2700, substrates can be transferred without being exposed to the air between treatments, and adsorption of impurities to substrates can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement and the process conditions.

Figure 49A:
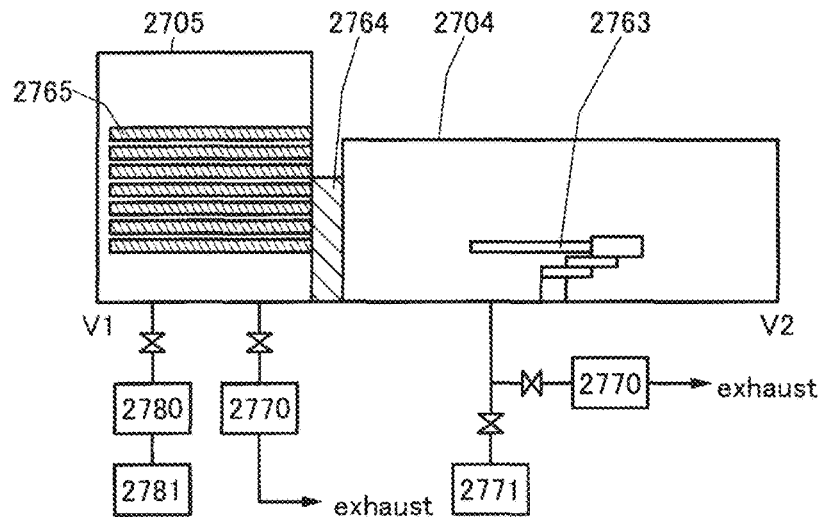
FIGS. 49A to 49C are cross-sectional views illustrating an example of a deposition apparatus.
Figure 49B:
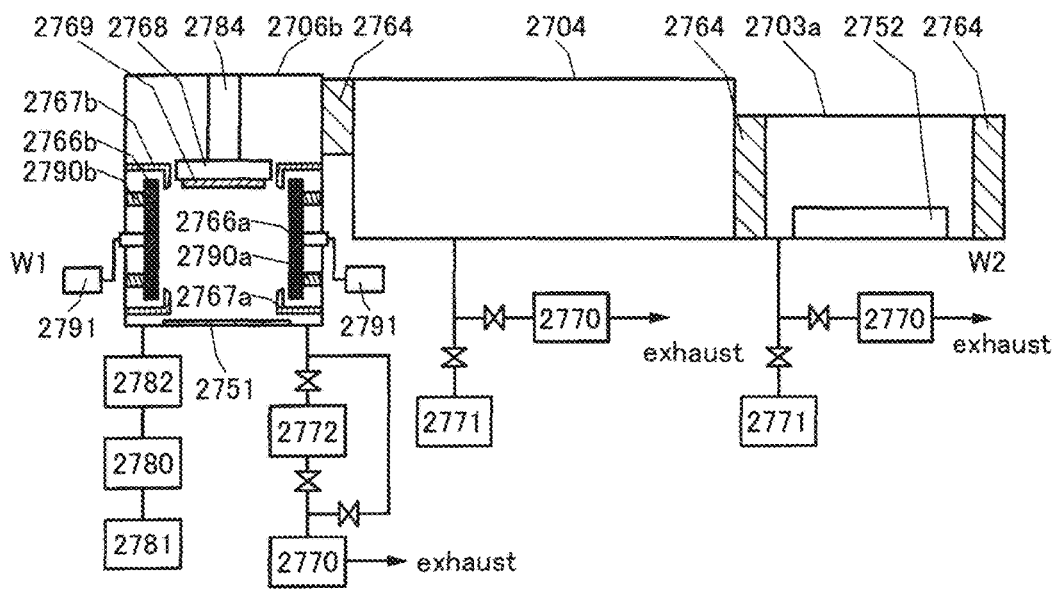
Figure 49C:
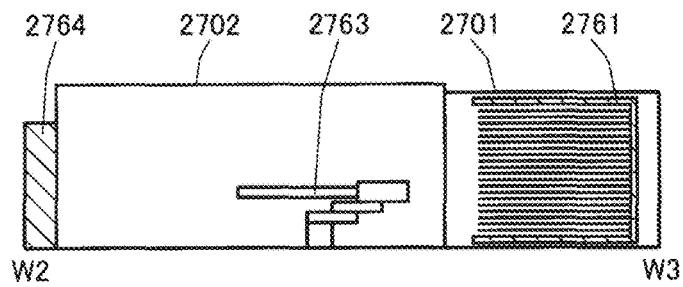

Next, FIG. 49A, FIG. 49B, and FIG. 49C are a cross-sectional view taken along dashed-dotted line V1-V2, a cross-sectional view taken along dashed-dotted line W1-W2, and a cross-sectional view taken along dashed-dotted line W2-W3, respectively, in the deposition apparatus 2700 illustrated in FIG. 48.

FIG. 49A illustrates a cross section of the substrate heating chamber 2705 and the transfer chamber 2704, and the substrate heating chamber 2705 includes a plurality of heating stages 2765 which can hold a substrate. Note that the substrate heating chamber 2705 is connected to a vacuum pump 2770 through a valve. As the vacuum pump 2770, a dry pump and a mechanical booster pump can be used, for example.

As a heating mechanism which can be used for the substrate heating chamber 2705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are provided for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 from the atmospheric pressure to low or medium vacuum (approximately 0.1 Pa) and then the valves are switched and exhaust is performed using the cryopump 2771 from the medium vacuum to high or ultra-high vacuum (0.1 Pa to 1×10⁻⁷ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 49B illustrates a cross section of the deposition chamber 2706b, the transfer chamber 2704, and the load lock chamber 2703a.

Here, the details of the deposition chamber including the sputtering apparatus are described with reference to FIG. 49B. The deposition chamber 2706b illustrated in FIG. 49B includes a target 2766a, a target 2766b, a target shield 2767a, a target shield 2767b, a magnet unit 2790a, a magnet unit 2790b, a substrate holder 2768, and power sources 2791. Although not illustrated, each of the target 2766a and the target 2766b is fixed to a target holder with a backing plate provided therebetween. The power source 2791 is electrically connected to each of the target 2766a and the target 2766b. The magnet unit 2790a is placed on a back side of the target 2766a and the magnet unit 2790b is placed on a back side of the target 2766b. The target shield 2767a is provided so as to surround an end portion of the target 2766a and the target shield 2767b is provided so as to surround an end portion of target 2766b. Note that here, a substrate 2769 is supported by the substrate holder 2768. The substrate holder 2768 is fixed to the deposition chamber 2706b by an adjustment member 2784. Owing to the adjustment member 2784, the substrate holder 2768 can move to a region between the targets 2766a and 2766b (a region between targets). Providing the substrate holder 2768 supporting the substrate 2769 in the region between targets can reduce damage due to plasma in some cases, for example.

Although not illustrated, the substrate holder 2768 may include a substrate holding mechanism which holds the substrate 2769, a heater which heats the substrate 2769 from the back side, or the like.

The target shields 2767 can suppress deposition of a particle which is sputtered from the target 2766 on a region where deposition is not needed. Moreover, the target shields 2767 are preferably processed to prevent accumulated sputtered particles from being separated. For example, blasting treatment which increases surface roughness may be performed, or roughness may be formed on the surfaces of the target shields 2767.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas which is introduced to the deposition chamber 2706b can be heated to a temperature higher than or equal to 40° C. and lower than or equal to 400° C., preferably higher than or equal to 50° C. and lower than or equal to 200° C. Note that although the gas heating mechanism 2782, the mass flow controller 2780, and the refiner 2781 can be provided for each of a plurality of kinds of gases, only one gas heating mechanism 2782, one mass flow controller 2780, and one refiner 2781 are provided for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, and further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism which can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a freezer of the cryotrap 2751 is set to be lower than or equal to 100 K, preferably lower than or equal to 80 K. In the case where the cryotrap 2751 includes a plurality of freezers, it is preferable to set the temperatures of the freezers at different temperatures because efficient exhaust is possible. For example, the temperature of a first-stage freezer may be set to be lower than or equal to 100 K and the temperature of a second-stage freezer may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b which are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, and further preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, and further preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, and further preferably less than or equal to $3 \times 10^{-6}$ Pa. Furthermore, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, and further preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706*b* which are described above preferably have a small amount of external leakage or internal leakage.

For example, in each of the transfer chamber 2704, the substrate heating chamber 2705, and the deposition chamber 2706*b* which are described above, the leakage rate is less than or equal to $3 \times 10^{-6}$ Pa·m$^3$/s, preferably less than or equal to $1 \times 10^{-6}$ Pa·m$^3$/s. The leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s. The leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. The leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706*b* can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to desorb simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen which is a main component of the oxide is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. As the dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703a illustrated in FIG. 49B and the atmosphere-side substrate transfer chamber 2702 and the atmosphere-side substrate supply chamber 2701 illustrated in FIG. 49C are described. Note that FIG. 49C illustrates a cross section of the atmosphere-side substrate transfer chamber 2702 and the atmosphere-side substrate supply chamber 2701.

For the transfer chamber 2704 illustrated in FIG. 49B, the description of the transfer chamber 2704 illustrated in FIG. 49A can be referred to.

The load lock chamber 2703a includes a substrate delivery stage 2752. When a pressure in the load lock chamber 2703a becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703a is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 48 can have a structure similar to that of the load lock chamber 2703a.

The atmosphere-side substrate transfer chamber 2702 includes the transfer robot 2763. The transfer robot 2763 can deliver a substrate from the cassette port 2761 to the load lock chamber 2703a or deliver a substrate from the load lock chamber 2703a to the cassette port 2761. Furthermore, a mechanism for suppressing entry of dust or a particle, such as a high-efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., and further preferably about room temperature (typified by 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal of a bonding material used for adhesion between the backing plate and the target might be sputtered and might cause an increase in impurity concentration. Thus, it is preferable that the target be cooled sufficiently.

Specifically, to efficiently cool the target, a metal having high conductivity and a high heat dissipation property (specifically copper) is used for the backing plate, or a sufficient amount of cooling water is made to flow through a water channel formed in the backing plate.

Note that in the case where the target includes zinc, plasma damage is alleviated by the deposition in an oxygen gas atmosphere; thus, an oxide in which zinc is unlikely to be volatilized can be obtained.

The above-described deposition apparatus enables deposition of an oxide semiconductor whose hydrogen concentration measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$.

Furthermore, an oxide semiconductor whose nitrogen concentration measured by SIMS is lower than $5\times10^{19}$ atoms/cm$^3$, preferably lower than or equal to $1\times10^{19}$ atoms/cm$^3$, further preferably lower than or equal to $5\times10^{18}$ atoms/cm$^3$, and still further preferably lower than or equal to $1\times10^{18}$ atoms/cm$^3$ can be deposited.

Moreover, an oxide semiconductor whose carbon concentration measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ can be deposited.

An oxide having few impurities and oxygen vacancies is an oxide with low carrier density (specifically, lower than $8\times10^{11}$/cm$^3$, preferably lower than $1\times10^{11}$/cm$^3$, further preferably lower than $1\times10^{10}$/cm$^3$, and is higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide having stable characteristics.

Furthermore, an oxide semiconductor can be deposited in which the released amount of each of the following gas molecules (atoms) measured by TDS is less than or equal to $1\times10^{19}$/cm$^3$ and preferably less than or equal to $1\times10^{18}$/cm$^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide can be suppressed. Furthermore, when a film in contact with the oxide is formed with the use of the above deposition apparatus, the entry of impurities into the oxide from the film in contact therewith can be suppressed.

The structure described in this embodiment can be combined with any of the structures described in the other embodiments and examples as appropriate.

(Embodiment 4)

In this embodiment, an example of a circuit of a semiconductor device including the transistor of one embodiment of the present invention will be described.

<Memory Device 1>

Figure 50A:
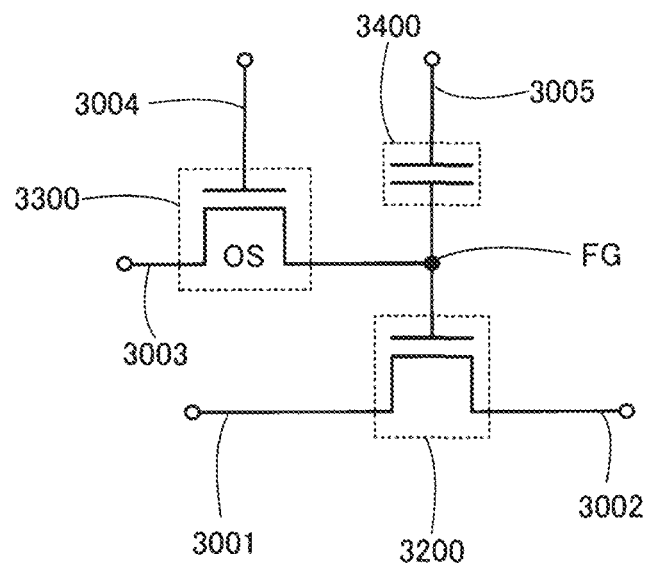
FIGS. 50A and 50B are each a circuit diagram of a memory device of one embodiment of the present invention.
Figure 50B:
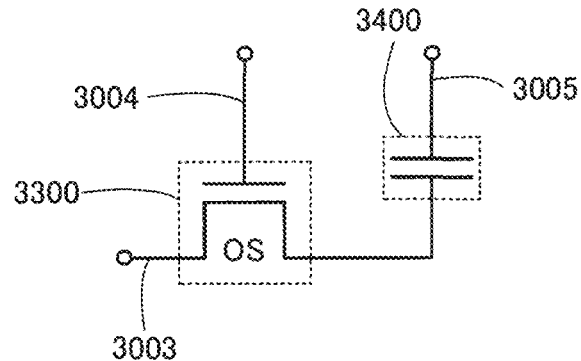

Examples of a semiconductor device (memory device) which includes the transistor of one embodiment of the present invention, which can retain stored data even when not powered, and which has an unlimited number of write cycles are shown in FIGS. 50A and 50B.

The semiconductor device illustrated in FIG. 50A includes a transistor 3200 containing a first semiconductor, a transistor 3300 containing a second semiconductor, and a capacitor 3400. Note that any of the above-described transistors such as the transistor 200 can be used as the transistor 3300.

The transistor 3300 is preferably a transistor with low off-state current. For example, a transistor including an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 50A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 is electrically connected to the other of the source and the drain of the transistor 3300 and one electrode of the capacitor 3400. A fifth wiring 3005 is electrically connected to the other electrode of the capacitor 3400.

The semiconductor device in FIG. 50A has a feature that the potential of the gate of the transistor 3200 can be retained, and thus enables writing, retaining, and reading of data as follows.

Writing and retaining of data will be described. First, the potential of the fourth wiring 3004 is set to a potential at which the transistor 3300 is turned on, so that the transistor 3300 is turned on. Accordingly, the potential of the third wiring 3003 is supplied to a node FG which is electrically connected to the gate of the transistor 3200 and one electrode of the capacitor 3400. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is retained at the node FG (retaining).

Since the off-state current of the transistor 3300 is low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in general, when an n-channel transistor is used as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($> V_{th\_H}$), the transistor 3200 is turned on. In the case where the low-level charge is supplied to the node FG in writing, the transistor 3200 remains off even when the potential of the fifth wiring 3005 is $V_0$ ($< V_{th\_L}$). Thus, the data retained in the node FG can be read by determining the potential of the second wiring 3002.

Note that in the case where memory cells are arrayed, it is necessary that data of a desired memory cell be read in read operation. For example, a configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be a multilevel memory device and the storage capacity can be increased.

<Memory Device 2>

The semiconductor device in FIG. 50B is different from the semiconductor device in FIG. 50A in that the transistor 3200 is not provided. Also in this case, data can be written and retained in a manner similar to that of the semiconductor device in FIG. 50A.

Reading of data in the semiconductor device in FIG. 50B is described. When the transistor 3300 is turned on, the third wiring 3003 which is in a floating state and the capacitor 3400 are electrically connected to each other, and charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + CV)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + CV_1)/(C_B + C)$) is higher than the potential of the third wiring 3003 in the case of retaining the potential $V_0$ ($=(C_B \times V_{B0} + CV_0)/(C_B + C)$).

Then, by comparing the potential of the third wiring 3003 with a predetermined potential, data can be read.

In this case, a transistor containing the first semiconductor may be used in a driver circuit for driving a memory cell, and a transistor containing the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

(Embodiment 5)

In this embodiment, examples of CPUs including semiconductor devices such as the transistor of one embodiment of the present invention and the above-described memory device will be described.

<Configuration of CPU>

Figure 51:
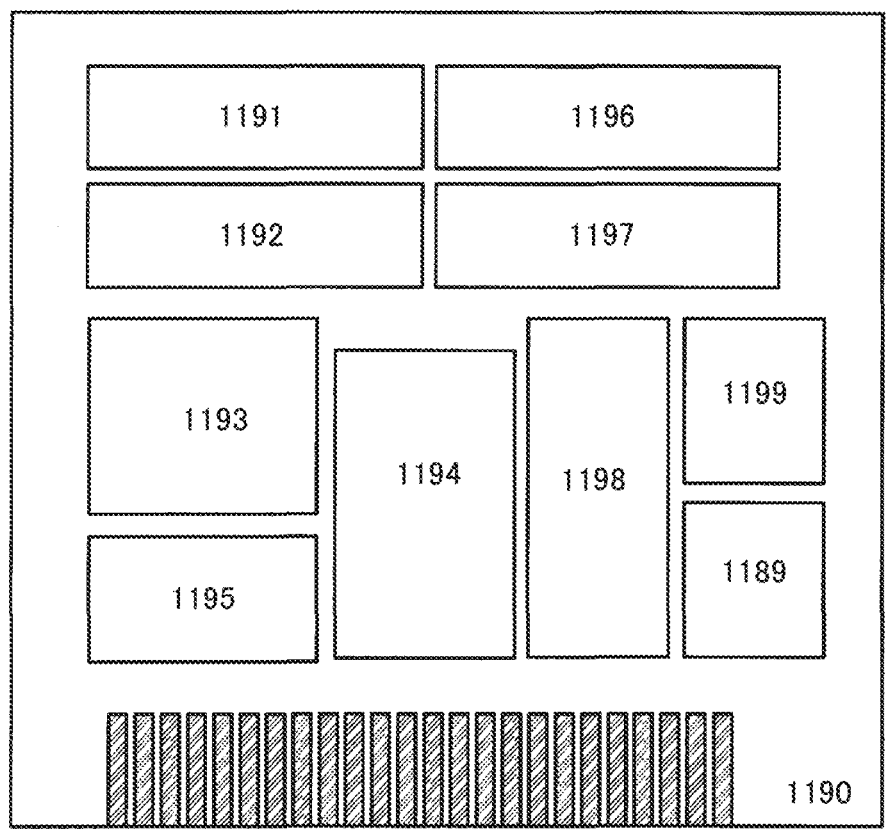
FIG. 51 is a block diagram illustrating a semiconductor device of one embodiment of the present invention.

FIG. 51 is a block diagram illustrating a configuration of an example of a CPU including any of the above-described transistors as a component.

The CPU illustrated in FIG. 51 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 51 is just an example in which the configuration is simplified, and an actual CPU may have a variety of configurations depending on the application. For example, the CPU may have the following configuration: a structure including the CPU illustrated in FIG. 51 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 51, a memory cell is provided in the register 1196. For the memory cell of the register 1196, any of the above-described transistors, the above-described memory device, or the like can be used.

In the CPU illustrated in FIG. 51, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 52:
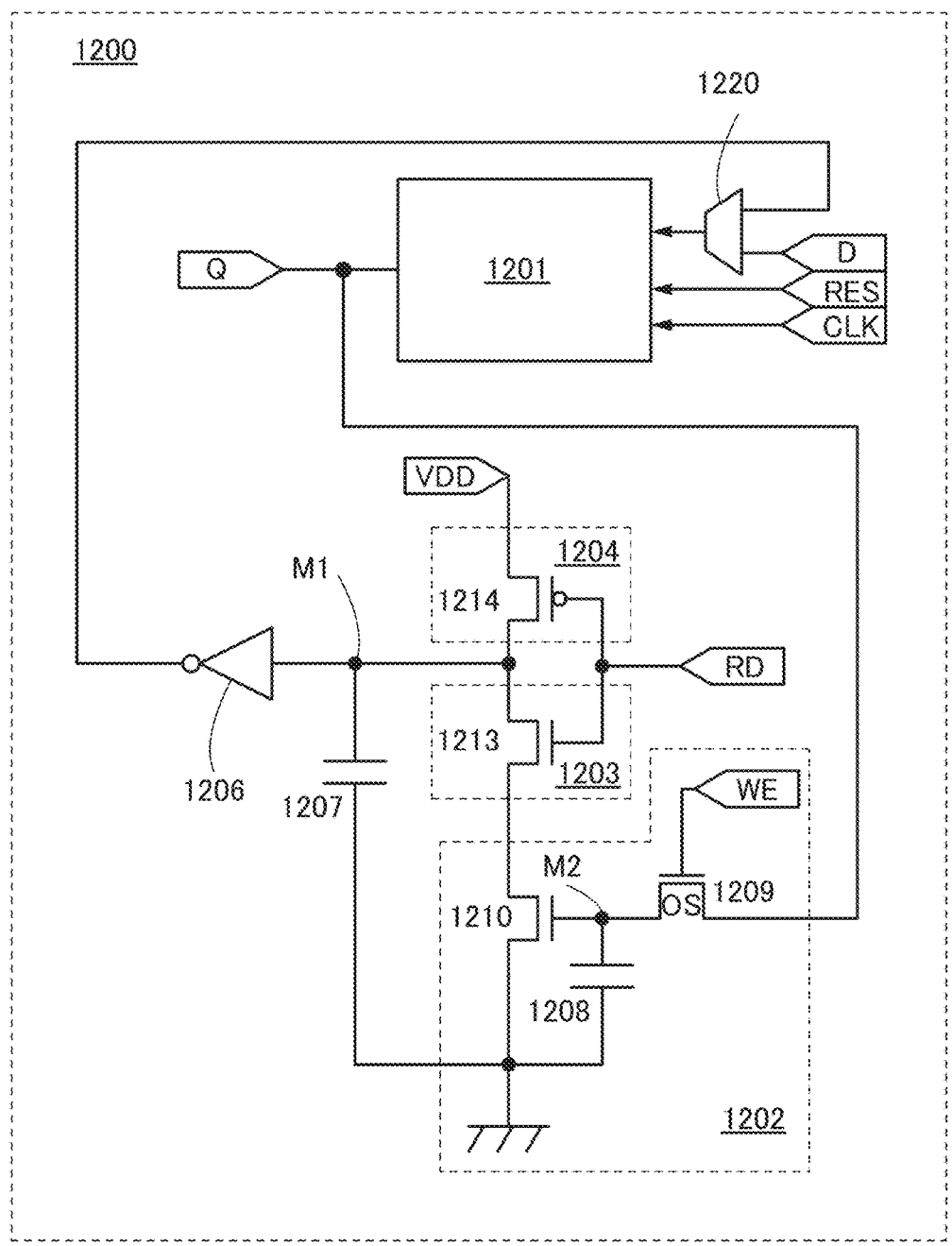
FIG. 52 is a block diagram illustrating a semiconductor device of one embodiment of the present invention.

FIG. 52 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 52 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 52, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 52, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be transistors in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or in the substrate 1190 can be used for the rest of the transistors.

As the circuit 1201 in FIG. 52, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal retained by the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (the on state or the off state) is determined in accordance with the signal retained by the capacitor 1208, and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP) or a custom LSI, and a radio frequency (RF) device. The memory element 1200 can also be used in an LSI such as a programmable logic circuit (or a programmable logic device (PLD)) including a field programmable gate array (FPGA) or a complex programmable logic device (CPLD).

The structure described in this embodiment can be combined with any of the structures described in the other embodiments as appropriate.

(Embodiment 6)

In this embodiment, display devices each using the transistor or the like of one embodiment of the present invention will be described with reference to FIGS. 53A to 53C and FIGS. 54A and 54B.

<Structure of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 53A:
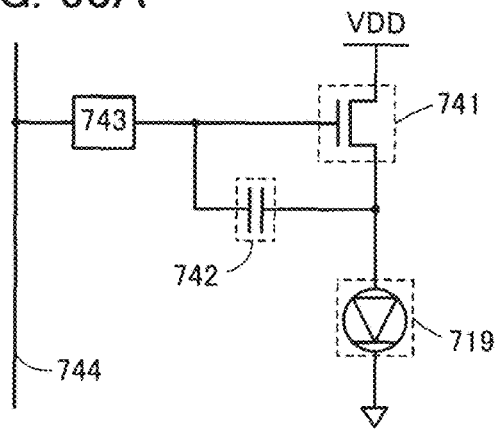
FIGS. 53A to 53C are a circuit diagram, a top view, and a cross-sectional view illustrating a semiconductor device of one embodiment of the present invention.
Figure 53B:
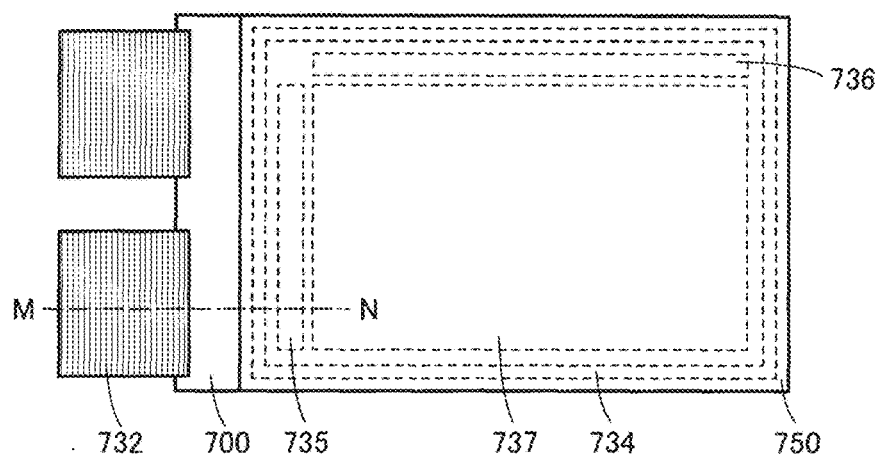
Figure 53C:
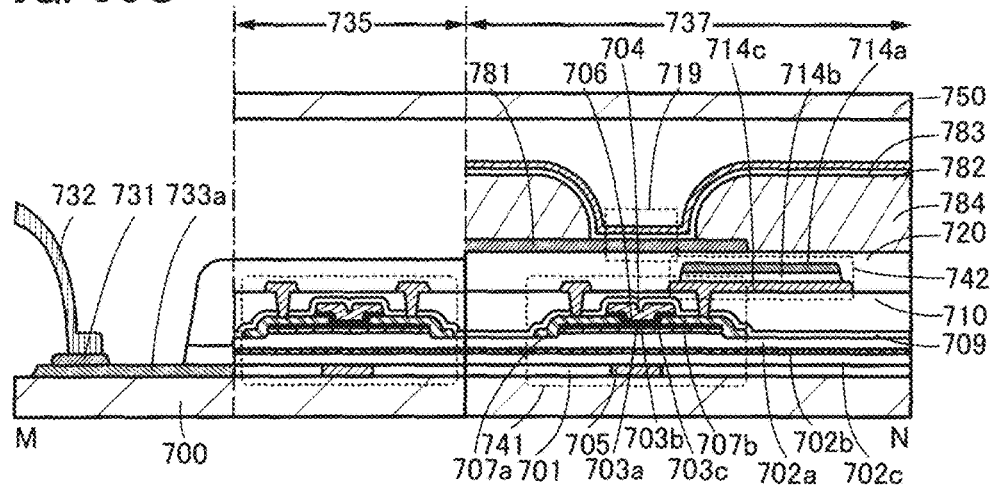

FIGS. 53A to 53C illustrate an example of an EL display device of one embodiment of the present invention. FIG. 53A is a circuit diagram of a pixel in an EL display device. FIG. 53B is a plan view showing the whole of the EL display device. FIG. 53C is a cross-sectional view taken along part of dashed-dotted line M-N in FIG. 53B.

FIG. 53A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 53A includes a switching element 743, a transistor 741, a capacitor 742, and a light-emitting element 719.

Note that FIG. 53A and the like each illustrate an example of a circuit structure; therefore, a transistor can be provided additionally. In contrast, for each node in FIG. 53A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 53B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 53C is a cross-sectional view of the EL display device taken along part of dashed-dotted line M-N in FIG. 53B.

The transistor 741 in FIG. 53C includes a conductor 705 over the substrate 700, an insulator 701 in which the conductor 705 is embedded, an insulator 702 (an insulator 702*a*, an insulator 702*b*, and an insulator 702*c*) over the insulator 701, a semiconductor 703 (a semiconductor 703*a*, a semiconductor 703*b*, and a semiconductor 703*c*) over the insulator 702, a conductor 707*a* and a conductor 707*b* over the semiconductor 703, an insulator 706 over the semiconductor 703, and a conductor 704 over the insulator 706. Note that the structure of the transistor 741 is just an example; the transistor 741 may have a structure different from that illustrated in FIG. 53C.

Thus, in the transistor 741 illustrated in FIG. 53C, the conductors 704 and 705 each function as a gate electrode, the insulators 702 and 706 each function as a gate insulator, and the conductors 707a and 707b function as a source electrode and a drain electrode. Note that in some cases, electrical characteristics of the semiconductor 703 change if light enters the semiconductor 703. To prevent this, it is preferable that one or more of the conductor 705 and the conductor 704 have a light-blocking property.

FIG. 53C illustrates the capacitor 742 that includes a conductor 714a over an insulator 710, an insulator 714b over the conductor 714a, and a conductor 714c over the insulator 714b.

In the capacitor 742, the conductor 714a serves as one electrode, and the conductor 714c serves as the other electrode.

The capacitor 742 illustrated in FIG. 53C has a large capacitance per area occupied by the capacitor. Therefore, the EL display device illustrated in FIG. 53C has high display quality.

An insulator 720 is provided over the transistor 741 and the capacitor 742. Here, the insulator 710 and the insulator 720 may have an opening portion reaching the conductor 707a that serves as the source of the transistor 741. A conductor 781 is provided over the insulator 720. The conductor 781 is electrically connected to the transistor 741 through the opening in the insulator 710 and the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

An example of the EL display device is described above. Next, an example of a liquid crystal display device is described.

Figure 54A:
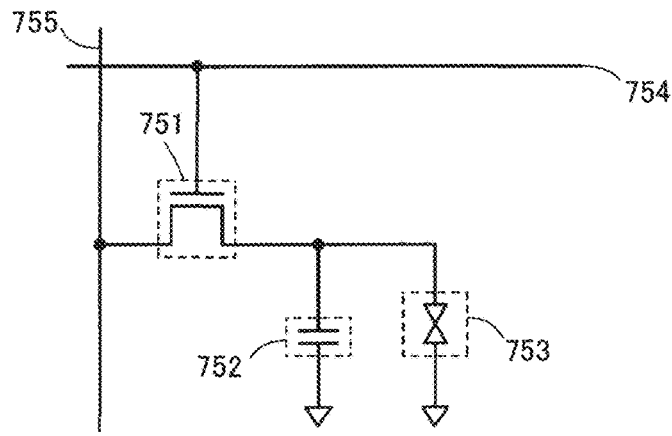
FIGS. 54A and 54B are a circuit diagram and a cross-sectional view illustrating a semiconductor device of one embodiment of the present invention.

FIG. 54A is a circuit diagram illustrating a configuration example of a pixel of a liquid crystal display device. A pixel shown in FIGS. 54A and 54B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which the common potential is supplied. The common potential supplied to the wiring electrically connected to the other electrode of the capacitor 752 may be different from that supplied to the other electrode of the liquid crystal element 753.

Figure 54B:
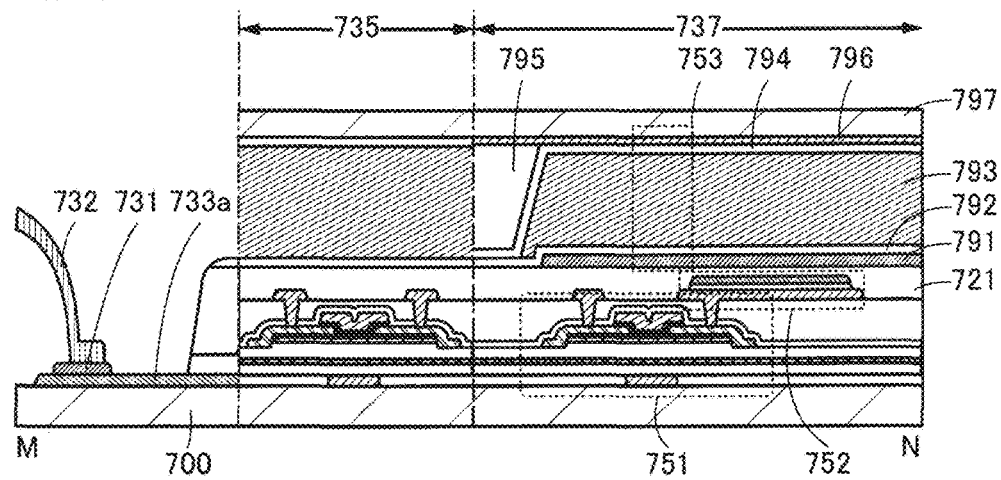

Note that the description of the liquid crystal display device is made on the assumption that the top view of the liquid crystal display device is similar to that of the EL display device. FIG. 54B is a cross-sectional view of the liquid crystal display device taken along dashed-dotted line M-N in FIG. 53B. In FIG. 54B, the FPC 732 is connected to a wiring 733a via a terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 54B corresponds to, but is not limited to, the structure of the capacitor 742 in FIG. 53C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which a moving image with few motions or a still image is displayed, whereby power for the operation of the transistor 751 can be saved in that period; thus, a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectance, transmittance, or the like is changed by electrical or magnetic effect may be included.

Note that examples of display devices including an EL element include an EL display. Examples of display devices including an electron emitter include a field emission display (FED), an SED-type flat panel display (SED: surface-conduction electron-emitter display), and the like. Examples of display devices including a liquid crystal element include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. When graphene or graphite is provided in this manner, a nitride semiconductor, for example, an n-type GaN semiconductor including crystals can be easily formed thereover. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structure described in this embodiment can be combined with any of the structures described in the other embodiments as appropriate.

(Embodiment 7)

In this embodiment, electronic devices each including the transistor or the like of one embodiment of the present invention will be described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 55A to 55F illustrate specific examples of these electronic devices.

Figure 55A:
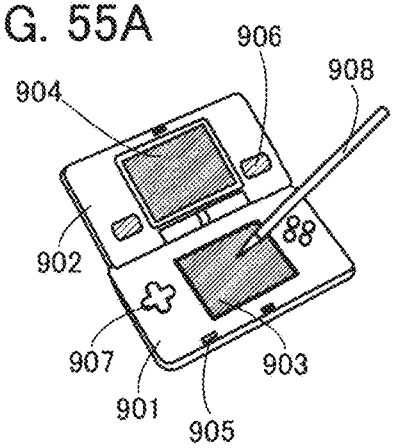
FIGS. 55A to 55F are perspective views each illustrating an electronic device of one embodiment of the present invention.

FIG. 55A illustrates a portable game machine, which includes a housing 901, a housing 902, a display portion 903, a display portion 904, a microphone 905, a speaker 906, an operation key 907, a stylus 908, and the like. Although the portable game machine in FIG. 55A has the two display portions 903 and 904, the number of display portions included in a portable game machine is not limited to this.

Figure 55B:
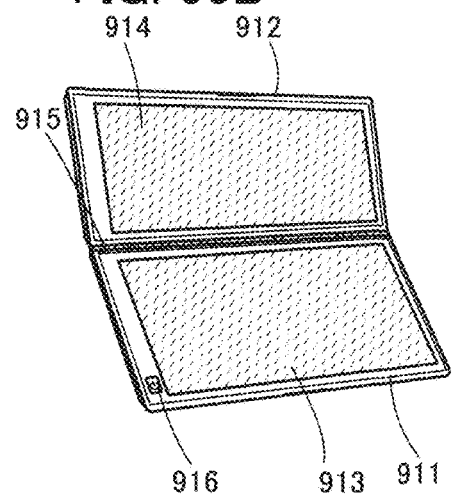

FIG. 55B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 55C:
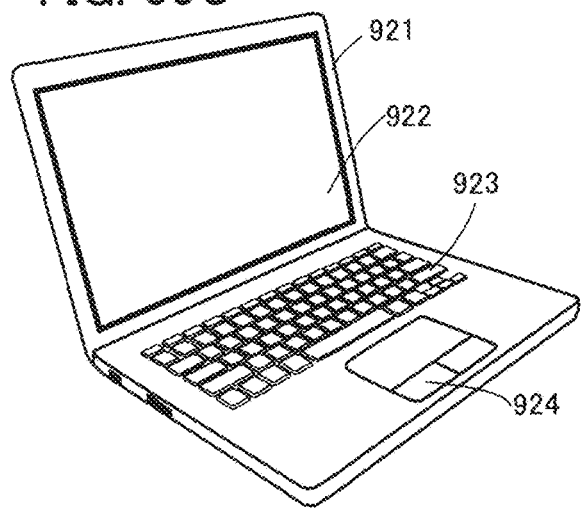

FIG. 55C illustrates a notebook personal computer, which includes a housing 921, a display portion 922, a keyboard 923, a pointing device 924, and the like.

Figure 55D:
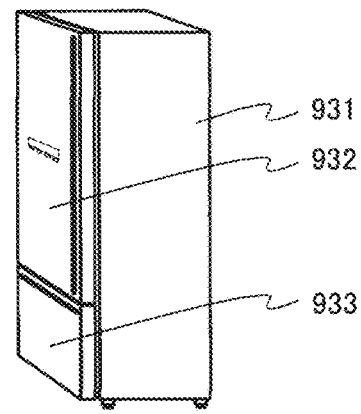

FIG. 55D illustrates an electric refrigerator-freezer including a housing 931, a door for a refrigerator 932, a door for a freezer 933, and the like.

Figure 55E:
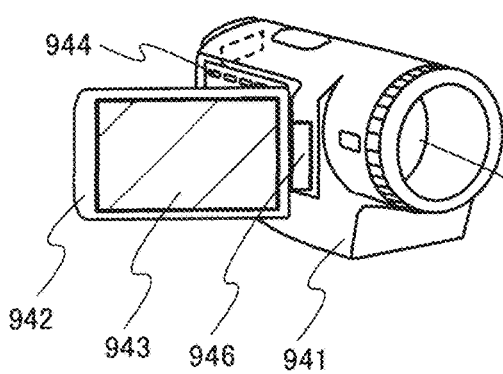

FIG. 55E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 55F:
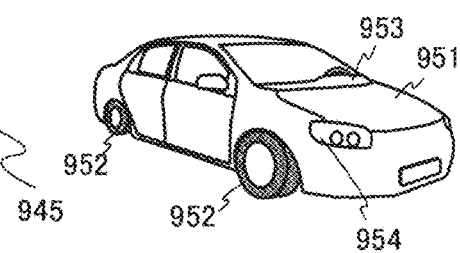

FIG. 55F illustrates a passenger car, which includes a car body 951, wheels 952, a dashboard 953, lights 954, and the like.

The structure described in this embodiment can be combined with any of the structures described in the other embodiments as appropriate.

In the above embodiments, one embodiment of the present invention has been described. Note that one embodiment of the present invention is not limited thereto. In other words, since various embodiments of the invention are described in this embodiment and the like, one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

(Embodiment 8)

In this embodiment, an oxide semiconductor which is one embodiment of the present invention will be described.

The oxide semiconductor of one embodiment of the present invention includes indium (In), M (M represents Al, Ga, Y, or Sn), and zinc (Zn). Specifically, M is preferably gallium (Ga). In the following description, Ga is used as M.

A conduction mechanism in an oxide semiconductor containing an increased proportion of In is described here.

<1. Analysis of Carrier Distribution in Conduction Band of Oxide Semiconductor>

First, in order to examine the influence of the atomic ratio of In ([In]) on carrier distribution in the conduction band of an oxide semiconductor, calculations were performed using models of oxide semiconductors with different [In] values. The details of the calculations are described below.

First, a structure including atom arrangement and a lattice shape was optimized under electrically neutral conditions. Next, an electron density difference, i.e., a difference between the electron density of the optimized structure in the electrically neutral state and the structure after an addition of an electron, was analyzed. Note that the electron density difference corresponds to the electron density in the conduction band with one carrier electron per unit cell.

Figure 56A:
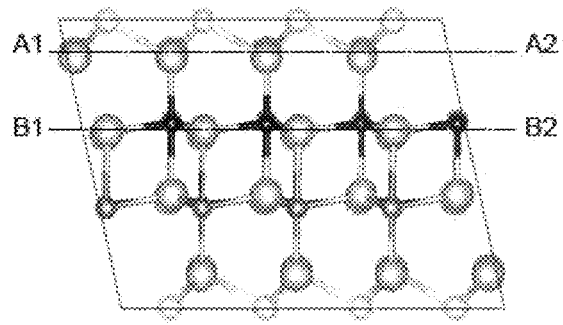
FIGS. 56A to 56C illustrate a calculation model and electron density difference distribution.

The calculation conditions are listed in a table below. A model used for the calculation is shown in FIG. 56A. Note that the mode used is an oxide semiconductor crystal model with [In]:[Ga]:[Zn]=1:1:1.

TABLE 3

| software | VASP |
|---|---|
| functional | GGA/PBE |
| cut-off energy | 800 eV |
| k-points | 2 × 2 × 3 |

Next, the number of electrons belonging to each atom was examined using natural population analysis (NPA). A difference in the number of electrons belonging to each atom, which was calculated by NPA, between the optimized structure in the electrically neutral state and the structure after an addition of an electron was analyzed to quantify the contributions of atoms to carrier distribution in the conduction band.

The results are shown in a table below. Note that well-tempered basis sets were used as basis functions for the projection of the plane wave functions onto the atom-centered wave functions.

TABLE 4

| | Atom | Atomic ratio | Electron population in conduction band (×0.01) |
|---|---|---|---|
| $InO_2$ layer | In | 14.3 | 2.36 |
| | O | 28.6 | 0.07 |
| (Ga,Zn)O layer | Ga | 14.3 | 1.79 |
| | Zn | 14.3 | 1.84 |
| | O | 28.6 | 0.06 |

Similarly, an oxide semiconductor crystal model with [In]:[Ga]:[Zn]=5:3:4 was used for NPA calculation of the number of electrons belonging to each atom. The results are shown in a table below. The oxide semiconductor crystal model with [In]:[Ga]:[Zn]=5:3:4 has a structure obtained by substituting In atoms for some Ga atoms in the oxide semiconductor crystal model with [In]:[Ga]:[Zn]=1:1:1. Therefore, the oxide semiconductor crystal model with [In]:[Ga]:[Zn]=5:3:4 has a higher atomic ratio of In and a lower atomic ratio of Ga than the oxide semiconductor crystal model with [In]:[Ga]:[Zn]=1:1:1.

TABLE 5

| | Atom | Atomic ratio | Electron population in conduction band (×0.01) |
|---|---|---|---|
| $InO_2$ layer | In | 14.3 | 2.23 |
| | O | 28.6 | 0.07 |
| (Ga,Zn) layer | In | 3.6 | 2.90 |
| | Ga | 10.7 | 1.67 |
| | Zn | 14.3 | 1.78 |
| | O | 28.6 | 0.06 |

Electron population in the conduction band is larger on metal atoms, and thus it is highly probable that electron carriers are distributed near metal atoms. This suggests that a conduction path is formed centering around the metal atoms. In addition, electron population in the conduction band in the oxide semiconductor crystal model with [In]:[Ga]:[Zn]=5:3:4 is found to be the largest on the In atoms substituted into the (Ga,Zn)O layer. This indicates that In atoms make a significant contribution to carrier movement in the conduction band.

FIGS. 56C, 57A, 57B, 58A, 58B, 59A, and 59B show spatial distributions of electron density differences.

Figure 56B:
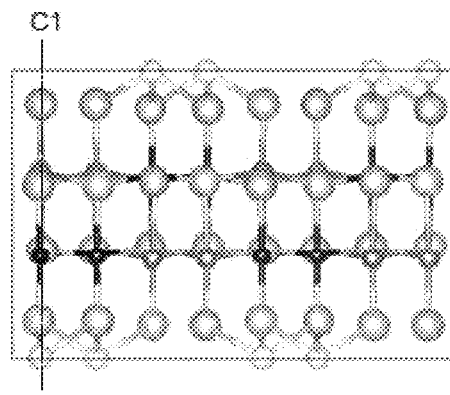
Figure 56C:
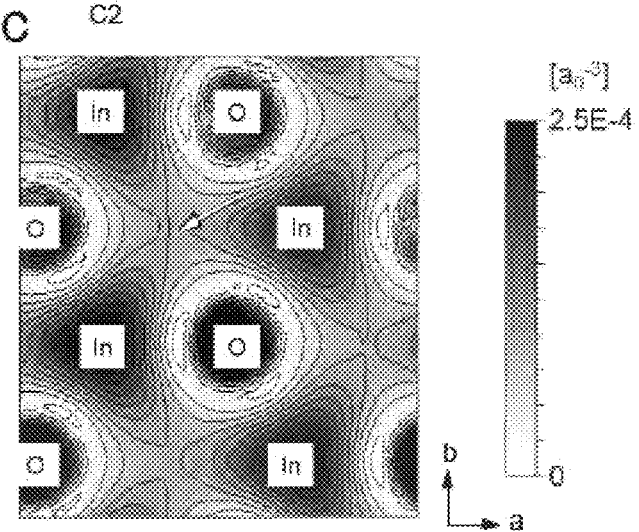

FIG. 56C shows the distribution of an electron density difference in the a-b plane direction along A1-A2 (an $InO_2$ layer) in FIG. 56A. Regions with a large electron density difference are spread throughout interatomic regions and connect electron distributions around In atoms. The In atoms are not on the a-b plane along A1-A2, and the spatially spread electron distributions include an electron distribution around an In atom and electron distributions around other In atoms which overlap with each other on the a-b plane along A1-A2. The electron density in a region where the electron distributions overlap with each other (a region indicated by a white arrow in the diagram) is $9.35 \times 10^{-3}$ $[a_0^{-3}]$. Fewer electrons are distributed around O atoms. Therefore, in the a-b plane along A1-A2, the regions with the large electron density difference which connect electron distributions around In atoms appear to serve as a carrier conduction path in the conduction band.

Figure 57A:
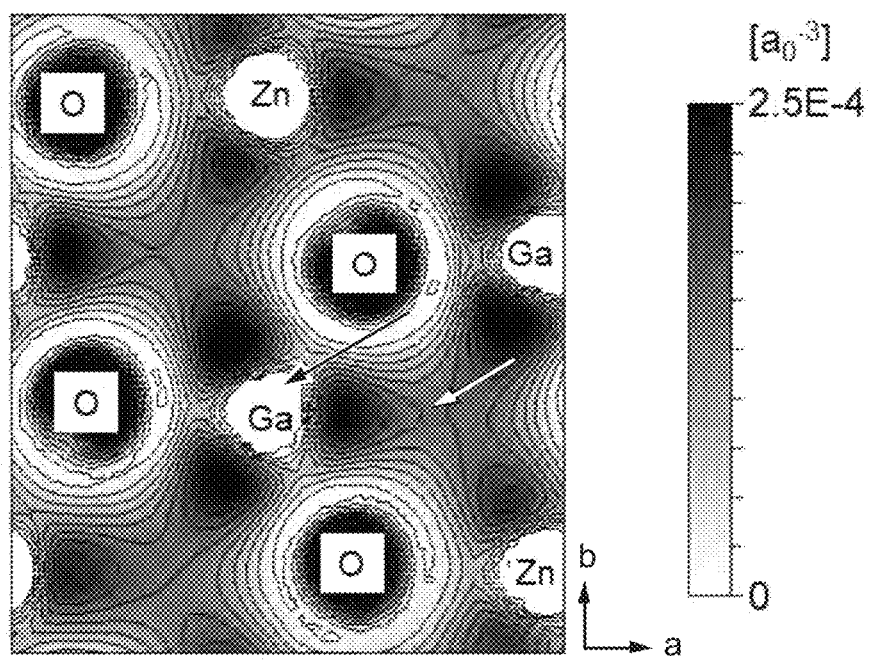
FIGS. 57A and 57B illustrate electron density difference distribution.
Figure 57B:
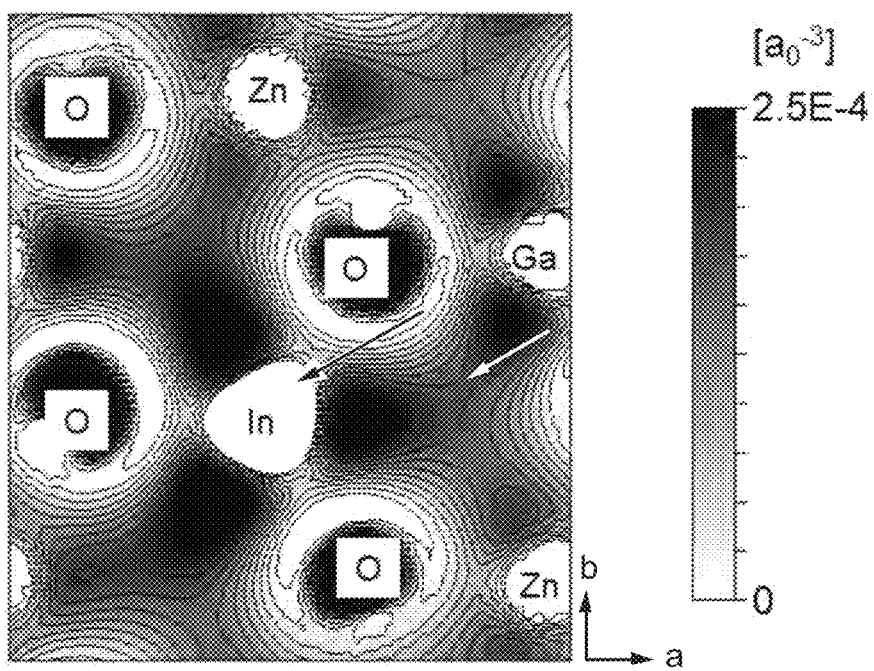

FIG. 57A shows the distribution of an electron density difference in the a-b plane direction along B1-B2 (a (Ga, Zn)O layer) in FIG. 56A. FIG. 57B shows the distribution of an electron density difference in the a-b plane direction in the (Ga,Zn)O layer of the oxide semiconductor crystal model with [In]:[Ga]:[Zn]=5:3:4 with an In atom substituted for a Ga atom indicated by a black arrow in FIG. 57A.

As shown in FIG. 57A, electron distributions derived from Ga and Zn atoms spread in three directions and overlap with each other in regions between the Ga and Zn atoms. Fewer electrons are distributed around O atoms. Therefore, the regions where the electron distributions derived from Ga and Zn atoms overlap with each other appear to serve as a carrier conduction path in the conduction band.

In FIG. 57B, electron distributions derived from a Ga atom, Zn atoms, and the In atom substituted for the Ga atom spread in three directions and overlap with each other in regions between the metal atoms. In particular, the electron density is spread more widely around the In atom substituted for the Ga atom than around the Ga atom.

The electron density in a region between metal atoms where the electron distributions derived from the metal atoms overlap with each other (a region indicated by a white arrow in the diagram) is $1.48 \times 10^{-3}$ [$a_0^{-3}$] in FIG. 57A, while it is $1.78 \times 10^{-3}$ [$a_0^{-3}$] in FIG. 57B. This means that the electron distribution around the In atom substituted for the Ga atom increases the electron densities in regions between the In atom and a Ga atom and between the In and a Zn atom. Therefore, as the proportion of In increases in the atomic composition, the carrier densities in interatomic regions become higher and carrier movement between metal atoms becomes easy, which probably leads to an increased mobility.

Figure 58A:
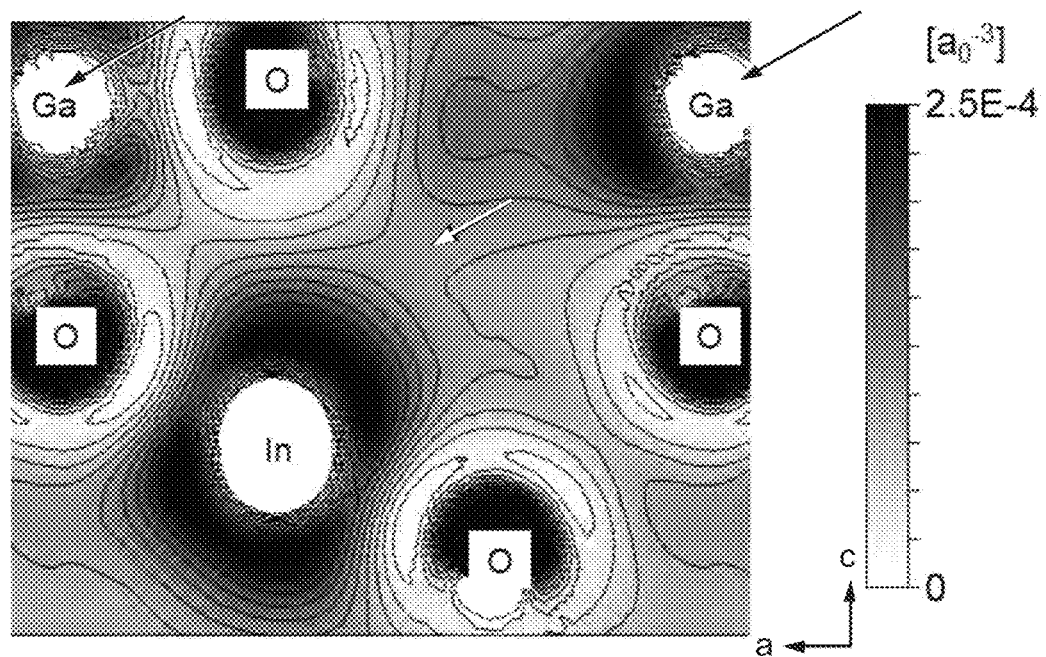
FIGS. 58A and 58B illustrate electron density difference distribution.
Figure 58B:
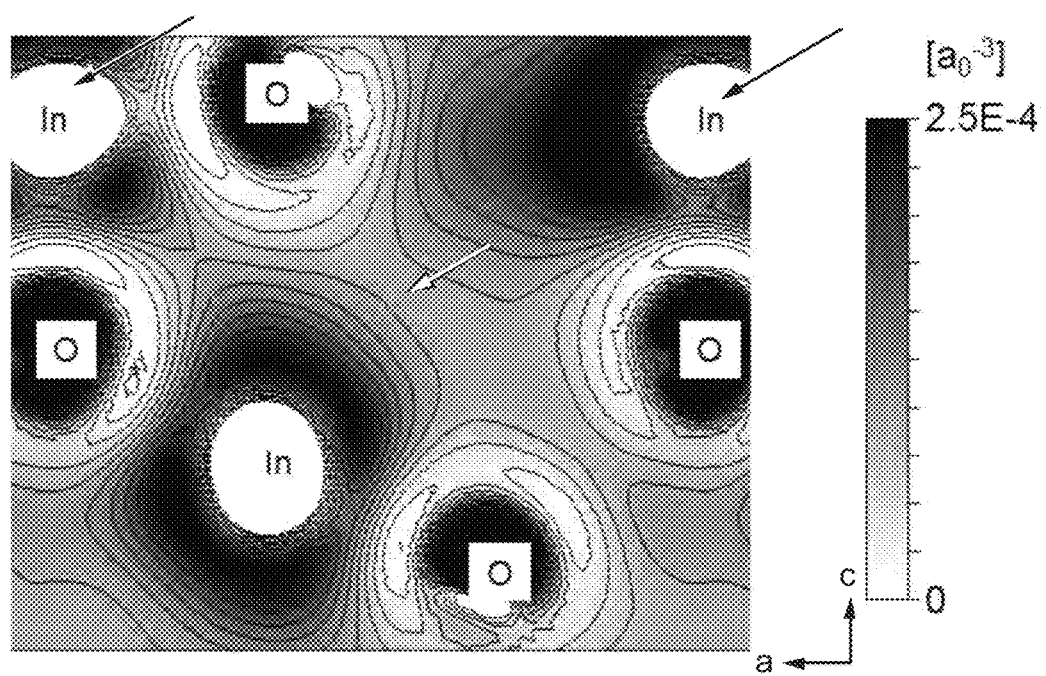
Figure 59A:
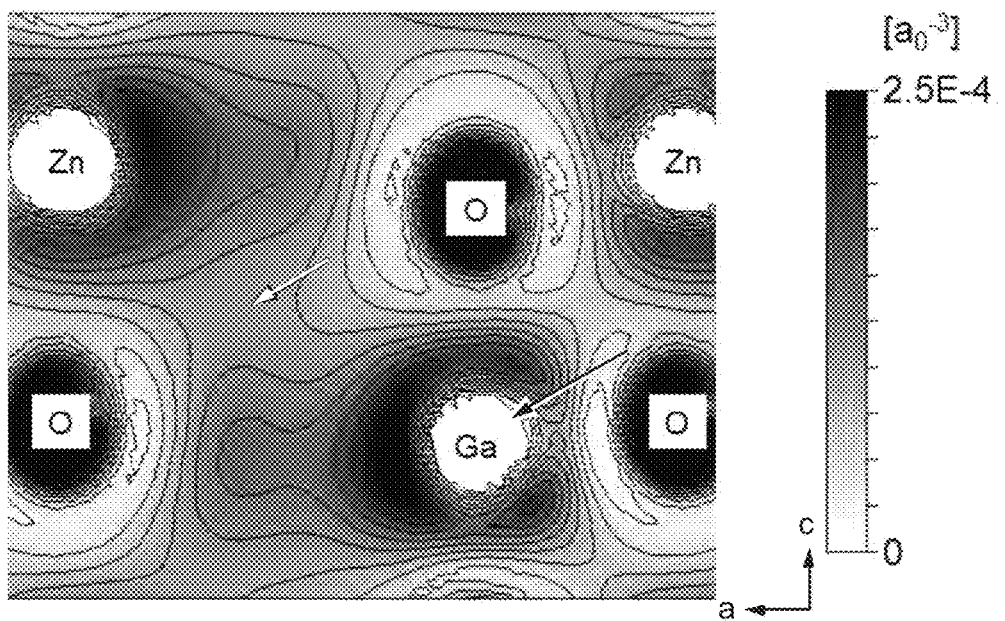
FIGS. 59A and 59B illustrate electron density difference distribution.
Figure 59B:
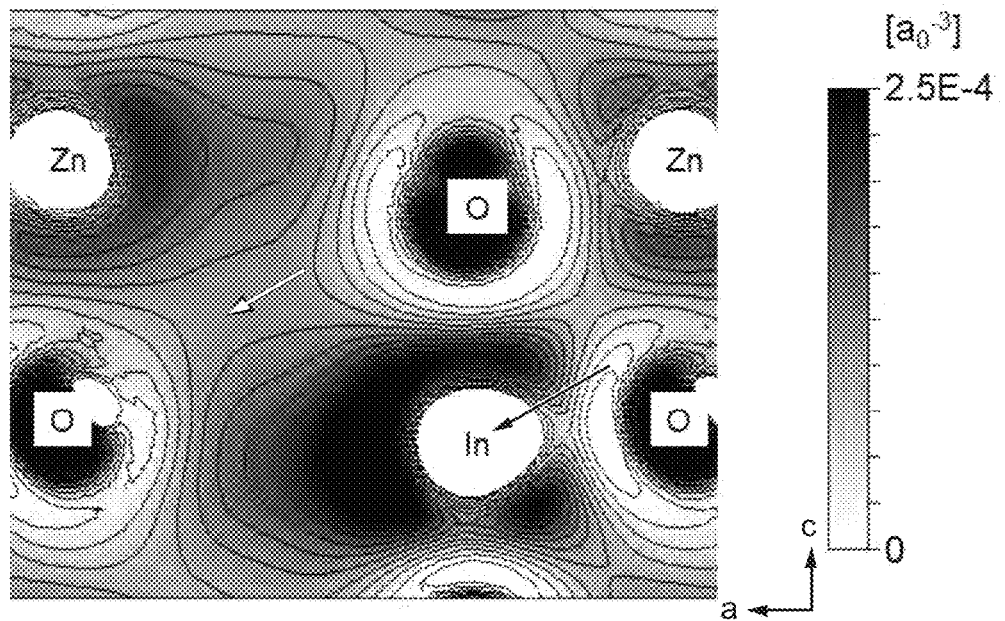

FIGS. 58A and 59A each show the distribution of an electron density difference in the a-c plane direction along C1-C2 in FIG. 56B. FIG. 58B shows the distribution of an electron density difference in the a-c plane direction in the oxide semiconductor crystal model with [In]:[Ga]:[Zn]=5:3:4 with In atoms substituted for Ga atoms indicated by black arrows in FIG. 58A. FIG. 59B shows the distribution of an electron density difference in the a-c plane direction in the oxide semiconductor crystal model with [In]:[Ga]:[Zn]=5:3:4 with an In atom substituted for a Ga atom indicated by a black arrow in FIG. 59A.

As shown in each of FIGS. 58A and 59A, electron distributions derived from In, Ga, and Zn atoms spread and overlap with each other in regions between the metal atoms. Therefore, the regions where the electron distributions derived from the In, Ga, and Zn atoms overlap with each other appear to serve as a carrier conduction path in the conduction band.

In each of FIGS. 58B and 59B, electron distributions derived from Ga atoms, Zn atoms, and the In atoms substituted for the Ga atoms spread and overlap with each other in regions between the metal atoms. In particular, the electron density is spread more widely around the In atoms substituted for the Ga atoms than around the Ga atoms.

The electron density in a region between metal atoms where the electron distributions derived from the metal atoms overlap with each other (a region indicated by a white arrow in the diagram) is $1.05 \times 10^{-3}$ [$a_0^{-3}$] in FIG. 58A, while it is $9.45 \times 10^{-3}$ [$a_0^{-3}$] in FIG. 58B. The electron density in a region between metal atoms where the electron distributions derived from the metal atoms overlap with each other (a region indicated by a white arrow in the diagram) is $1.10 \times 10^{-3}$ [$a_0^{-3}$] in FIG. 59A, while it is $1.16 \times 10^{-3}$ [$a_0^{-3}$] in FIG. 59B. This means that the electron distribution around the In atom substituted for the Ga atom increases the electron densities in regions between the In atom and a Ga atom and between the In atom and a Zn atom. Therefore, as the proportion of In increases in the atomic composition, the carrier densities in interatomic regions become higher and carrier movement between metal atoms becomes easy, which probably leads to an increased mobility.

The above results reveal that as [In] in the atomic ratio increases in the oxide semiconductor of this embodiment, In is substituted for Ga or Zn in a (Ga,Zn)O layer, the electron density in a region between metal atoms increases, and carrier movement between metal atoms becomes easy, which leads to an increased mobility.

The structure and method described in this embodiment can be implemented by being combined as appropriate with any of the other structures and methods described in the other embodiments.

(Embodiment 9)

In this embodiment, an oxide semiconductor which is one embodiment of the present invention will be described.

The oxide semiconductor of one embodiment of the present invention includes indium (In), M (M represents Al, Ga, Y, or Sn), and zinc (Zn). Specifically, M is preferably gallium (Ga). In the following description, Ga is used as M.

The likelihood of oxygen vacancy ($V_O$) formation in InGaZnO$_4$ is described here in connection with the composition.

<1. Calculation Model and Calculation Method>

First, calculations were performed using a reference crystal model with a certain composition, a crystal model with a higher In content than that in the reference model, and a crystal model with a higher Ga content than that in the reference model.

Figure 60A:
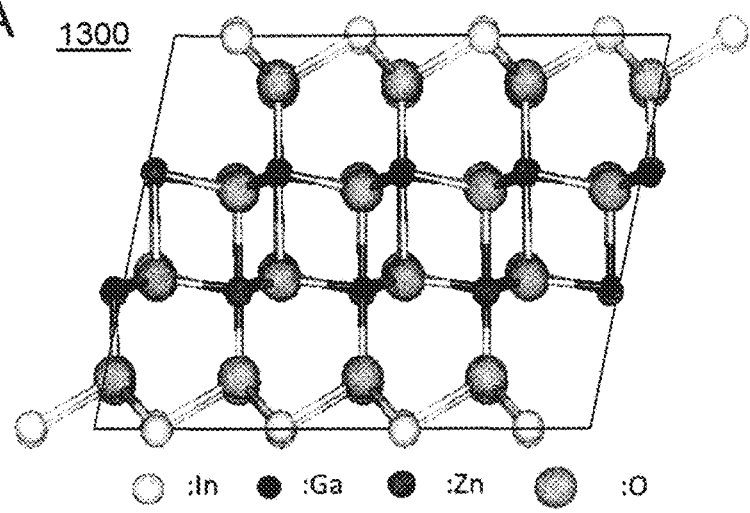
FIGS. 60A to 60C each illustrate a structure model of an oxide semiconductor of one embodiment.

Specifically, a crystal structure 1300 with [In]:[Ga]:[Zn]=1:1:1 shown in FIG. 60A was used as the reference crystal model.

Figure 60B:
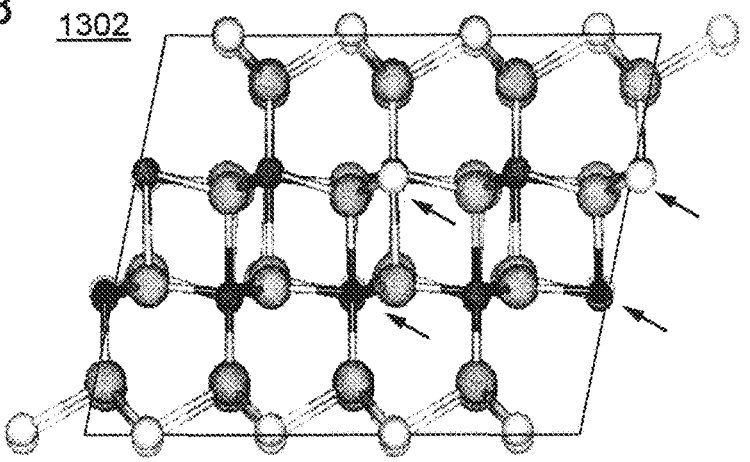

A crystal structure 1302 with [In]:[Ga]:[Zn]=5:3:4 shown in FIG. 60B was used as the crystal model with the high In content. In the crystal structure 1302, In forms a solid solution with GaZnO$_2$ layers in the crystal structure 1300. Note that In which forms a solid solution with the GaZnO$_2$ layers is indicated by arrows in the diagram.

Figure 60C:
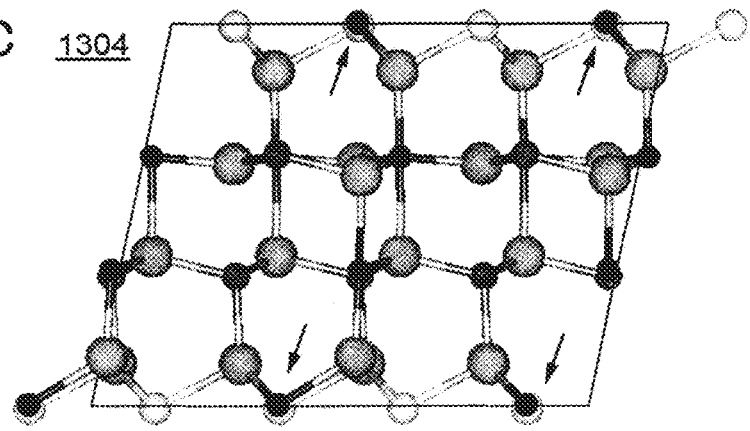

A crystal structure 1304 with [In]:[Ga]:[Zn]=3:5:4 shown in FIG. 60C was used as the crystal model with the high Ga content. In the crystal structure 1304, Ga forms a solid solution with InO$_2$ layers in the crystal structure 1300. Note that Ga which forms a solid solution with the InO$_2$ layers is indicated by arrows in the diagram.

The oxygen vacancy ($V_O$) formation energy $E_{form}(V_O)$ in each crystal structure can be obtained according to the following formula (4). $E_{form}(V_O)$ is an energy required to form oxygen vacancies ($V_O$), and a smaller $E_{form}(V_O)$ means an easier formation of the oxygen vacancies ($V_O$).

[Formula 4]

$$E_{form}(V_O) = E_{tot}(V_O) + \mu_O - E_{tot}(\text{bulk}) \tag{4}$$

In the formula, $E_{tot}(V_O)$ is the total energy of the model with an oxygen vacancy ($V_O$), $E_{tot}(\text{bulk})$ is the total energy of a perfect crystal, and $\mu_O$ is the chemical potential of an oxygen atom. Note that to was obtained from an oxygen molecule to produce a condition where excess oxygen was supplied.

The details of the calculations are described below. A first-principles electronic state calculation package, Vienna ab initio simulation package (VASP), was used for atomic relaxation calculation. The calculation conditions are listed in a table below.

TABLE 6

| | |
|---|---|
| Exchange-correlation functional | GGA |
| Pseudopotential | PAW method |
| Plane-wave cutoff energy | 800 eV |
| Sampling k-points | 2 × 2 × 3 (optimized structure) |
| | 3 × 3 × 4 (total energy) |

<2. Oxygen Vacancy ($V_O$) Formed in $InO_2$ Layer>

FIGS. 61A to 61E show local structures 1310, 1312, 1314, 1316, and 1318 of oxygen in an $InO_2$ layer before oxygen vacancy ($V_O$) formation. Note that the local structure 1312 in FIG. 61B is obtained by substituting In for Ga of a $GaZnO_2$ layer in the local structure 1310 in FIG. 61A. The local structure 1314 in FIG. 61C is obtained by substituting Ga for In of an $InO_2$ layer in the local structure 1310. The local structure 1318 in FIG. 61E is obtained by substituting Ga for In of an $InO_2$ layer in the local structure 1316 in FIG. 61D. Note that arrows in the diagrams indicate the substituted atoms.

In the crystal structure 1300 with [In]:[Ga]:[Zn]=1:1:1, an oxygen vacancy ($V_O$) is formed when an oxygen atom included in the local structure 1310 or the local structure 1316 is released.

In the crystal structure 1302 with [In]:[Ga]:[Zn]=5:3:4, an oxygen vacancy ($V_O$) is formed when an oxygen atom included in the local structure 1310, the local structure 1312, or the local structure 1316 is released.

In the crystal structure 1304 with [In]:[Ga]:[Zn]=3:5:4, an oxygen vacancy ($V_O$) is formed when an oxygen atom included in the local structure 1310, the local structure 1314, the local structure 1316, or the local structure 1318 is released.

The oxygen vacancy ($V_O$) formation energy $E_{form}(V_O)$ in the $InO_2$ layer was calculated for each local structure of each crystal structure. The calculation results are listed in a table below. Note that the unit of the formation energy $E_{form}(V_O)$ is [eV].

TABLE 7

| | | Crystal structure | | |
|---|---|---|---|---|
| | | 1300 | 1302 | 1304 |
| Local structure | 1310 | 4.03 | 3.84 | 3.97 |
| | 1312 | — | 3.39 | — |
| | 1314 | — | — | 4.12 |
| | 1316 | 3.64 | 3.64 | 3.66 |
| | 1318 | — | — | 3.66 |

The calculation results confirm that the oxygen vacancy ($V_O$) formation energy $E_{form}(V_O)$ does not depend on the composition when the local structure is the same.

The results also confirm that, in the crystal structure 1302 with large [In], the oxygen vacancy ($V_O$) formation energy $E_{form}(V_O)$ for the local structure 1312 in which In is substituted for Ga is smaller than that for the local structure 1310. This is because In, which weakly bonds with oxygen, is substituted for Ga, which strongly bonds with oxygen.

In the crystal structure 1304 with large [Ga], the oxygen vacancy ($V_O$) formation energy $E_{form}(V_O)$ for the local structures 1314 and 1318 in which Ga is substituted for In is substantially equal to that for the local structures 1310 and 1316. In other words, it is confirmed that the likelihood of oxygen vacancy ($V_O$) formation does not change even when Ga forms a solid solution with the $InO_2$ layer.

A probable cause of this is low bonding energy because the bond distance between O and Ga which forms a solid solution with the $InO_2$ layer is long and is approximately $2.0 \times 10^{-1}$ nm, whereas the bond distance between O and Ga in the $GaZnO_2$ layer is approximately $1.8 \times 10^{-1}$ to $1.9 \times 10^{-1}$ nm. It is also probable that a metal in the $GaZnO_2$ layer is in a distorted pentacoordinate state, whereas a metal in the $InO_2$ layer is hexacoordinate and has a lower bonding energy for each ligand than that in the $GaZnO_2$ layer. Accordingly, the bonding strength between O and Ga which forms a solid solution with the $InO_2$ layer can be estimated to be substantially equal to the bonding strength between O and In in the $InO_2$ layer.

<3. Oxygen Vacancy ($V_O$) Formed in $GaZnO_2$ Layer>

Figure 62A:
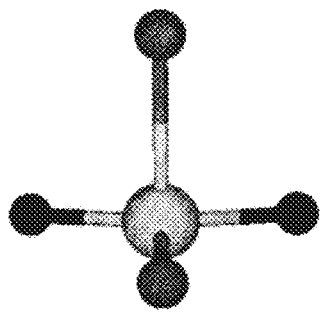
FIGS. 62A to 62E each illustrate a structure model of an oxide semiconductor of one embodiment.
Figure 62B:
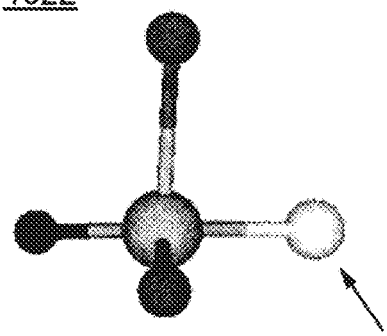
Figure 62C:
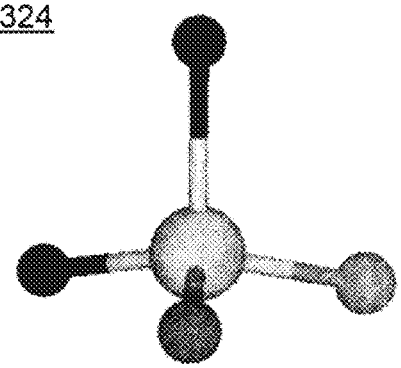
Figure 62D:
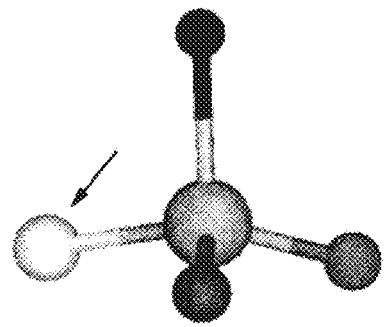
Figure 62E:
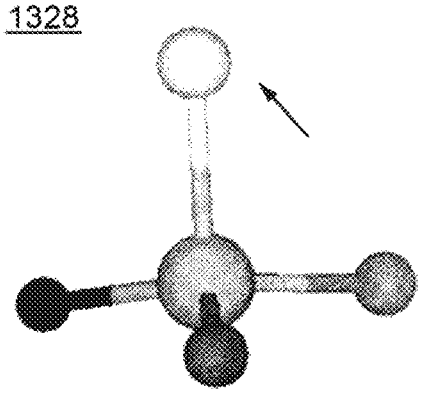

FIGS. 62A to 62E show local structures 1320, 1322, 1324, 1326, and 1328 of oxygen in a $GaZnO_2$ layer before oxygen vacancy ($V_O$) formation. Note that the local structure 1322 in FIG. 62B is obtained by substituting In for Ga of a $GaZnO_2$ layer in the local structure 1320 in FIG. 62A. The local structure 1326 in FIG. 62D is obtained by substituting In for Ga of a $GaZnO_2$ layer in the local structure 1324 in FIG. 62C. The local structure 1328 in FIG. 62E is obtained by substituting In for Ga of a $GaZnO_2$ layer in the local structure 1324 in FIG. 62C. Note that arrows in the diagrams indicate the substituted atoms.

In the crystal structure 1300 with [In]:[Ga]:[Zn]=1:1:1, an oxygen vacancy ($V_O$) is formed when an oxygen atom included in the local structure 1320 or the local structure 1324 is released.

In the crystal structure 1302 with [In]:[Ga]:[Zn]=5:3:4, an oxygen vacancy ($V_O$) is formed when an oxygen atom included in the local structure 1320, the local structure 1322, the local structure 1324, the local structure 1326, or the local structure 1328 is released.

In the crystal structure 1304 with [In]:[Ga]:[Zn]=3:5:4, an oxygen vacancy ($V_O$) is formed when an oxygen atom included in the local structure 1320 or the local structure 1324 is released.

The oxygen vacancy ($V_O$) formation energy $E_{form}(V_O)$ in the $GaZnO_2$ layer was calculated for each local structure of each crystal structure. The calculation results are listed in a table below. Note that the unit of the formation energy $E_{form}(V_O)$ is [eV].

TABLE 8

| | | Crystal structure | | |
|---|---|---|---|---|
| | | 1300 | 1302 | 1304 |
| Local structure | 1320 | 3.90 | 3.77 | 3.85 |
| | 1322 | — | 3.11 | — |
| | 1324 | 3.60 | 3.59 | 3.55 |
| | 1326 | — | 2.86 | — |
| | 1328 | — | 3.88 | — |

The calculation results confirm that the oxygen vacancy ($V_O$) formation energy $E_{form}(V_O)$ does not depend on the composition when the local structure is the same.

The results also confirm that, in the crystal structure 1302 with large [In], the oxygen vacancy ($V_O$) formation energy $E_{form}(V_O)$ for the local structures 1322 and 1326 in which In is substituted for Ga is smaller than that for the local structures 1320 and 1324. This is because In, which weakly bonds with oxygen, is substituted for Ga, which strongly bonds with oxygen.

On the other hand, the results also confirm that the oxygen vacancy ($V_O$) formation energy $E_{form}(V_O)$ for the local structure 1328 in which In is substituted for Ga in the c-axis direction is larger than that for the local structure 1324. This is because oxygen in the local structure 1324 has a long bond distance to Ga in the c-axis direction and thus has small bonding energy, whereas oxygen in the local structure 1328 has a long bond distance to In in the c-axis direction but has large bonding energy owing to the large atomic radius of In. Therefore, it is probable that the oxygen atom in the local structure 1328 is unlikely to be released and an oxygen vacancy ($V_O$) is unlikely to be formed.

The structure and method described in this embodiment can be implemented by being combined as appropriate with any of the other structures and methods described in the other embodiments.

(Embodiment 10)

In this embodiment, an oxide semiconductor which is one embodiment of the present invention will be described.

The oxide semiconductor of one embodiment of the present invention includes indium (In), M (M represents Al, Ga, Y, or Sn), and zinc (Zn). Specifically, M is preferably gallium (Ga). In the following description, Ga is used as M.

The likelihood of oxygen vacancy ($V_O$) formation in InGaZnO$_4$ is described here in connection with the atomic ratio.

<1. Calculation Model and Calculation Method>

Figure 63A:
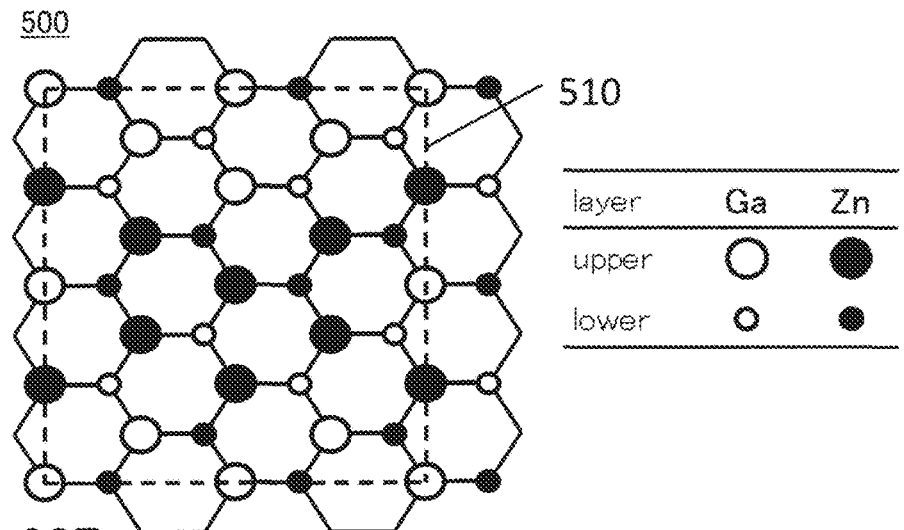
FIGS. 63A to 63C illustrates models of oxide semiconductors of one embodiment.
Figure 63B:
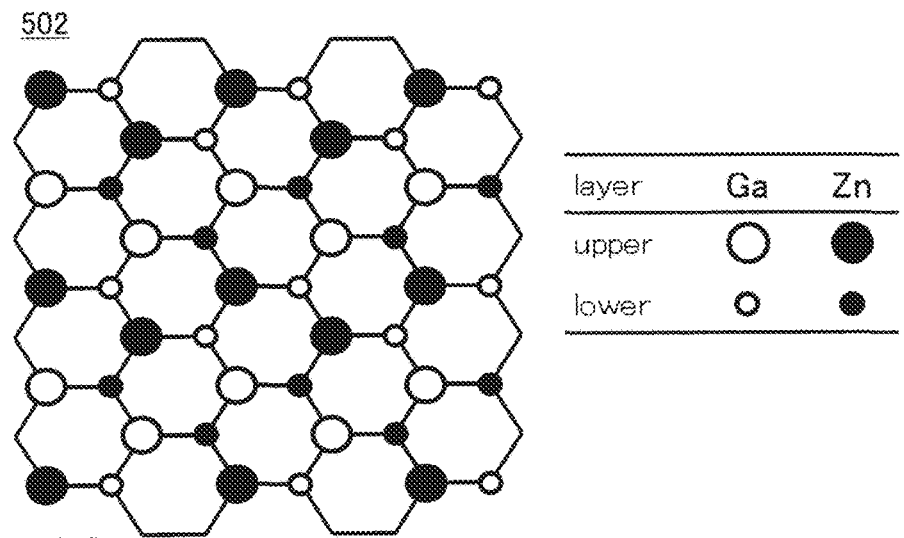

First, calculations were performed using two types of models of crystal structures which have an atomic ratio of [In]:[Ga]:[Zn]:[O]=1:1:1:4 and have different arrangements of Ga and Zn as shown in FIGS. 63A and 63B. Note that FIGS. 63A and 63B each show a layer composed of Ga, Zn, and O in the crystal structure with the atomic ratio of [In]:[Ga]:[Zn]:[O]=1:1:1:4, which is seen in the c-axis direction of the crystal structure. A model 500 shown in FIG. 63A was used as a model in which Ga and Zn are aggregated. A region 510 enclosed by a broken line in the diagram includes a region where Zn is aggregated and was used for calculation. This region was subjected to calculation under three-dimensional periodic boundary conditions. A model 502 shown in FIG. 63B was used as a reference model in which Ga and Zn are arranged in an ordered manner.

Figure 63C:
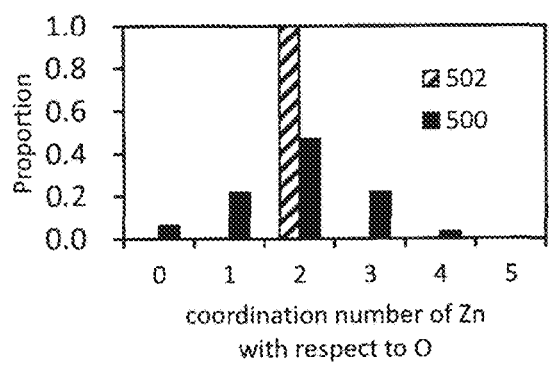

FIG. 63C shows the coordination number of Zn with respect to O existing in the layer composed of Ga, Zn, and O in each of the models shown in FIGS. 63A and 63B. Note that the interatomic distance between Zn and O in the a-b plane direction is shorter and the bond therebetween is stronger than those between Zn and O in the c-axis direction, but these are not distinguished from each other here.

Next, a model with an oxygen vacancy ($V_O$) was created by removing one O atom existing in a layer composed of Ga, Zn, and O from a model with no defect. In the model with an oxygen vacancy ($V_O$), the oxygen vacancy ($V_O$) formation energy $E_{form}(V_O)$ can be obtained according to the formula (4) given in the above embodiment.

The details of the calculations are described below. A first-principles electronic state calculation package, Vienna ab initio simulation package (VASP), was used for atomic relaxation calculation. The calculation conditions are listed in a table below.

TABLE 9

| Exchange-correlation functional | GGA |
| Pseudopotential | PAW method |
| Plane-wave cutoff energy | 800 eV |
| Sampling k-points | 2 × 2 × 3 |

Figure 64A:
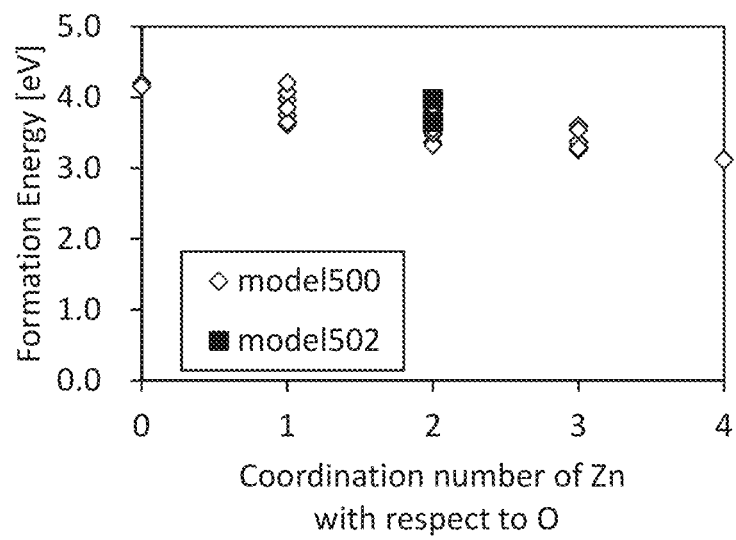
FIGS. 64A and 64B each illustrate oxygen vacancy ($V_O$) formation energy of one embodiment.
Figure 64B:
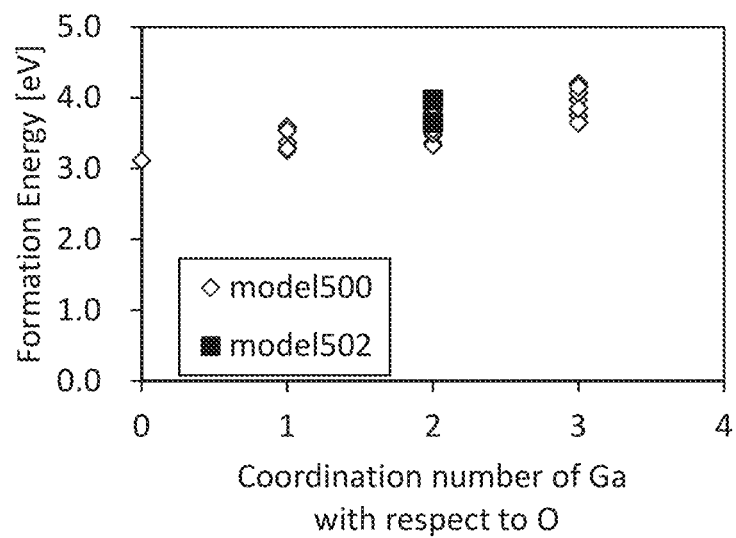

FIGS. 64A and 64B each show the relationship between the coordination number with respect to O and the calculated oxygen vacancy ($V_O$) formation energy. FIG. 64A shows a graph on which the calculated oxygen vacancy ($V_O$) formation energy is plotted as a function of the coordination number of Zn with respect to O. FIG. 64B shows a graph on which the calculated oxygen vacancy ($V_O$) formation energy is plotted as a function of the coordination number of Ga with respect to O. Note that the unit of the formation energy $E_{form}(V_O)$ is [eV].

Two values of the oxygen vacancy ($V_O$) formation energy in the model 502 in which Zn was coordinated in the c-axis direction and that in which Ga was coordinated in the c-axis direction were calculated.

FIG. 64A shows that, in the model 500, the oxygen vacancy ($V_O$) formation energy tends to be smaller for O with respect to which the coordination number of Zn is larger. That is, it is confirmed that O with respect to which the coordination number of Zn is larger is more likely to cause a vacancy. In contrast, FIG. 64B shows that, in the model 500, the oxygen vacancy ($V_O$) formation energy tends to be larger for O with respect to which the coordination number of Ga is larger. That is, it is confirmed that O with respect to which the coordination number of Ga is larger is less likely to cause a vacancy. Therefore, it is probable that an oxygen atom with respect to which the coordination number of Ga is larger is less likely to be released and to cause an oxygen vacancy ($V_O$) to be formed.

It can be considered here that oxygen with respect to which the coordination number of Zn is 4 (indicated by arrows in FIG. 65) is more likely to appear as the proportion of Zn increases in the composition of IGZO. Thus, the oxygen vacancy formation energy for oxygen with respect to which the coordination number of Zn is 4 was calculated using a crystal structure with [In]:[Ga]:[Zn]=1:1:3 where the atomic ratio of Zn is high. The calculation was performed using a model in which a range enclosed by a solid line in a model 520 shown in FIG. 65 was doubled in the depth direction and using the above-described first-principles electronic state calculation package VASP. The calculation conditions are listed in a table below.

TABLE 10

| Exchange-correlation functional | GGA |
| Pseudopotential | PAW method |
| Plane-wave cutoff energy | 800 eV |
| Sampling k-points | 3 × 4 × 2 |

Figure 65:
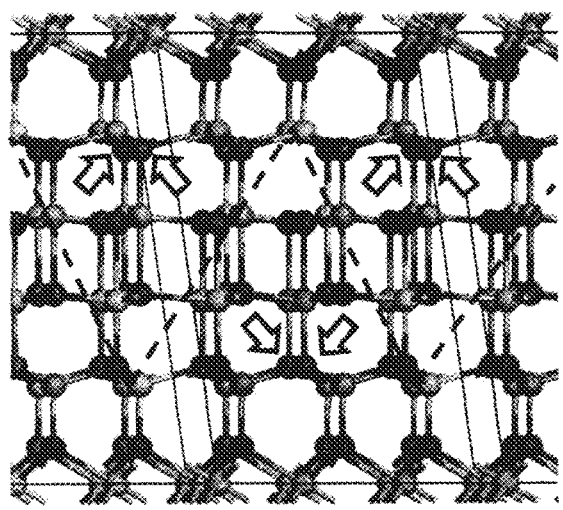
FIG. 65 illustrates a model of an oxide semiconductor of one embodiment.

Note that it was assumed that, as shown in FIG. 65, trivalent Ga ions in (Ga,Zn)O layers in the model 520 are arranged in a zigzag (indicated by a broken line in the diagram).

The oxygen vacancy formation energy was calculated for oxygen with respect to which the coordination number of Zn is 4 in the model 520. The result shows that the oxygen vacancy formation energy is 3.38 eV or 3.42 eV. These values are greater than the value for oxygen with respect to which the coordination number of Zn is 4 in the model 500.

Table 11 shows Zn—O bond lengths.

TABLE 11

|  | Model 500 (111) | Model 520 (113) | ZnO |
|---|---|---|---|
| Zn—O bond length (c-axis) [nm] | 0.210 | 0.204 (Vo1) 0.201 (Vo2) | 0.200 |
| Zn—O bond length (a-b plane) [nm] | 0.193, 0.195, 0.196 | 0.197, 0.198 (Vo1) 0.198, 0.199 (Vo2) | 0.199 |

TABLE 11-continued

| | Model 500 (111) | Model 520 (113) | ZnO |
|---|---|---|---|
| Vo formation energy [eV] | 3.12 | 3.38 (Vo1) 3.42 (Vo2) | 3.44 |

([In][Ga][Zn])

According to Table 11, differences of the bond lengths in the model 520 from those in ZnO are less than or equal to 0.004 nm. Difference of the bond lengths in the model 500 from those in ZnO are more than or equal to 0.007 nm and less than or equal to 0.01 nm. Therefore, the differences between the bond lengths in ZnO and those in the model 500 are larger than the differences between the bond lengths in ZnO and those in the model 520. The value of oxygen vacancy formation energy in the model 520 is substantially equal to that in ZnO. However, the value in the model 500 is relatively smaller than that in ZnO.

Accordingly, it appears that oxygen with respect to which the coordination number of Zn is 4 is likely to cause a vacancy because the Zn—O bond lengths in the model 500 are not optimal and the Zn—O bonding energy is low.

The structure and method described in this embodiment can be implemented by being combined as appropriate with any of the other structures and methods described in the other embodiments.

EXAMPLE 1

In this example, the crystallinity and composition of the oxide semiconductor of one embodiment of the present invention were evaluated. Note that Samples 1A and 1B were fabricated in this example. Sample 1A is a comparative oxide semiconductor, and Sample 1B is the oxide semiconductor of one embodiment of the present invention.

Samples 1A and 1B fabricated in this example are described.

Samples 1A and 1B each have a structure where a 100-nm-thick oxide semiconductor was formed over a glass substrate. Note that the oxide semiconductors of Samples 1A and 1B were deposited under the same conditions except for the composition of a target and the pressure in a treatment chamber.

As Sample 1A, the 100-nm-thick oxide semiconductor was deposited over the glass substrate by a sputtering method. As sputtering gases, oxygen and argon were supplied into a treatment chamber of a sputtering apparatus each at a flow rate of 100 sccm ($O_2$=50% and Ar=50%); the pressure in the treatment chamber was controlled to 0.3 Pa; and an AC power of 2.5 kW was supplied. Note that the oxide semiconductor was deposited at a substrate temperature of 170° C. A target having a composition with [In]:[Ga]:[Zn]=1:1:1.2 was used.

As Sample 1B, the 100-nm-thick oxide semiconductor was deposited over the glass substrate by a sputtering method. As sputtering gases, oxygen and argon were supplied into a treatment chamber of a sputtering apparatus each at a flow rate of 100 sccm ($O_2$=50% and Ar=50%); the pressure in the treatment chamber was controlled to 0.6 Pa; and an AC power of 2.5 kW was supplied. Note that the oxide semiconductor was deposited at a substrate temperature of 170° C. A target having a composition with [In]:[Ga]:[Zn]=4:2:4.1 was used for Sample 1B.

Figure 66A:
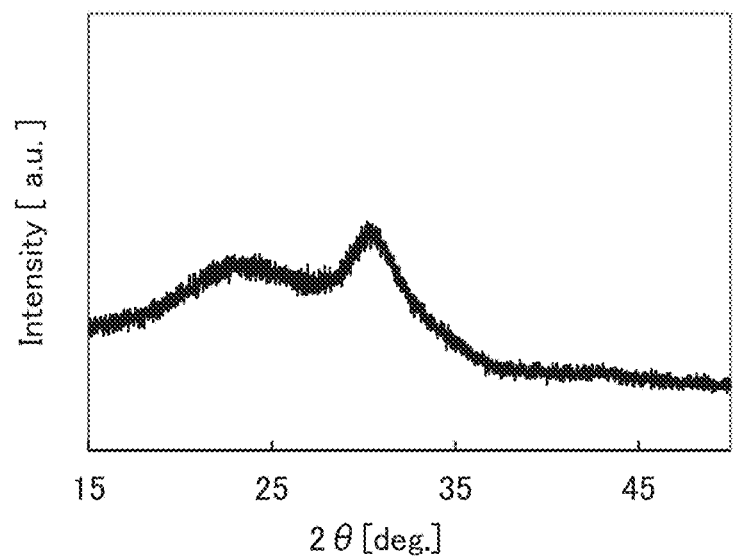
FIGS. 66A and 66B show XRD results of samples of an example.
Figure 66B:
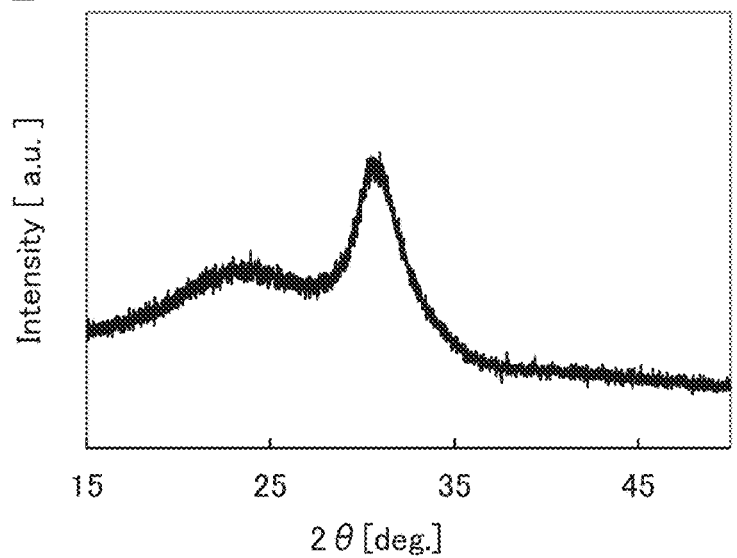

Next, the crystallinities of Samples 1A and 1B were evaluated by XRD. FIGS. 66A and 66B show the XRD results. For the XRD evaluation, a multifunction thin film material evaluation X-ray diffractometer, D8 DISCOVER Hybrid, manufactured by Bruker AXS was used. The XRD results shown in FIGS. 66A and 66B are results of analysis by an out-of-plane method. Note that FIG. 66A shows the XRD measurement result of Sample 1A, and FIG. 66B shows the XRD measurement result of Sample 1B.

As shown in FIGS. 66A and 66B, each of Samples 1A and 1B exhibits a peak indicating crystallinity at around 2θ=31°. This peak at around 2θ=31° is derived from the (009) plane of the $InGaZnO_4$ crystal, which indicates that crystals in the oxide semiconductor in each sample have c-axis alignment, and that the c-axes are aligned in a direction substantially perpendicular to the formation surface or the top surface of the oxide semiconductor. The intensity of the peak around 2θ=31° of Sample 1B is higher than that of Sample 1A.

Next, a high-angle annular dark field STEM (HAADF-STEM) image of Sample 1B fabricated in the above manner was observed. In the HAADF-STEM observation, the brightness of an atom is proportional to the square of its atomic number. In a HAADF-STEM image, a contrast proportional to the square of an atomic number is obtained; therefore, a brighter dot indicates a heavier atom.

Figure 67A:
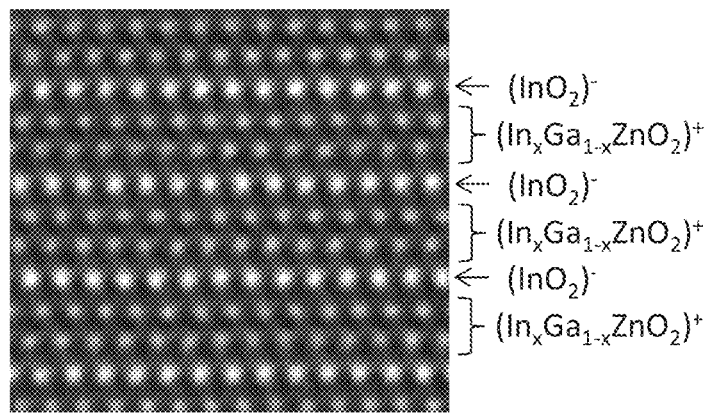
FIGS. 67A and 67B are cross-sectional TEM images of samples of an example.

In addition, Sample 1C was prepared by heating Sample 1B at 1350° C. in a nitrogen atmosphere. FIG. 67A shows a cross-sectional image of Sample 1C, and FIG. 67B shows a cross-sectional image of Sample 1B.

In FIG. 67A, an ordered structure can be found at positions of white dots each corresponding to an atom, and formation of a layered structure similar to that of the oxide semiconductor with [In]:[Ga]:[Zn]=1:1:1 has been confirmed. Note that bright dots represent In and dark dots represent Ga or Zn. Furthermore, at dots with an intermediate brightness between the bright and dark dots, formation of a solid solution by In with $(GaZnO_2)^+$ layers has been confirmed.

Figure 67B:
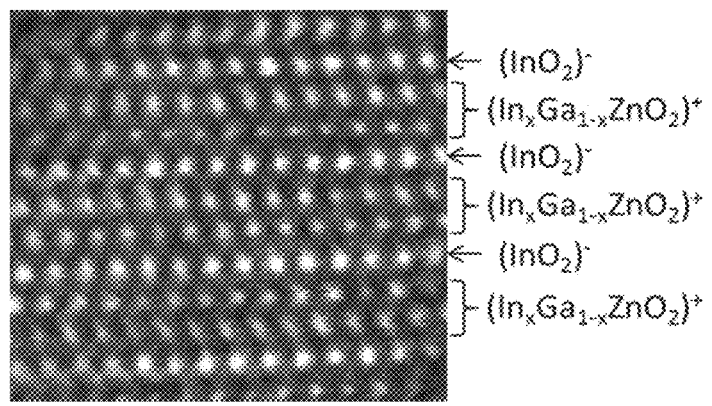

In FIG. 67B, although the contrast is low compared with the oxide semiconductor with [In]:[Ga]:[Zn]=1:1:1 because In forms a solid solution with $(GaZnO_2)^+$ layers, a stacked structure including $(InO_2)^-$ layers with high brightness and $(In_xGa_{1-x}ZnO_2)^+$ layers with low brightness has been confirmed. Thus, Sample 1B has been confirmed to have a layered structure similar to that of $InGaZnO_4$, though it has a different composition.

As shown in FIGS. 67A and 67B, a clear lattice image of a c-axis aligned crystal is observed from Samples 1B and 1C.

The structure described above in this example can be combined with any of the structures described in the other embodiments and examples as appropriate.

EXAMPLE 2

In this example, the crystal structure and mobility of the oxide semiconductor of one embodiment of the present invention were evaluated. Note that four types of oxide semiconductors with different crystal structures or atomic ratios were formed as samples in this example.

<1. Structure and Formation Method of Samples>

As samples, an oxide semiconductor having a CAAC structure with [In]:[Ga]:[Zn]=1:1:1 and an oxide semiconductor having a CAAC structure with [In]:[Ga]:[Zn]=4:2:3 were formed. In addition, an oxide semiconductor having a single crystal structure with [In]:[Ga]:[Zn]=1:1:1 and an oxide semiconductor having a single crystal structure with [In]:[Ga]:[Zn]=4:2:3 were formed.

The oxide semiconductor having the CAAC structure with [In]:[Ga]:[Zn]=1:1:1 and the oxide semiconductor having the CAAC structure with [In]:[Ga]:[Zn]=4:2:3 were each formed by depositing the oxide semiconductor to a thickness of 100 nm over a Si substrate by a sputtering method.

The oxide semiconductor having the single crystal structure with [In]:[Ga]:[Zn]=1:1:1 and the oxide semiconductor having the single crystal structure with [In]:[Ga]:[Zn]=4:2:3 were each formed by depositing the oxide semiconductor to a thickness of 100 nm over a YSZ substrate by a sputtering method, followed by baking at 1200° C. for one hour in an oxygen atmosphere.

<2. Crystal Structure of Each Sample>

Figure 68A:
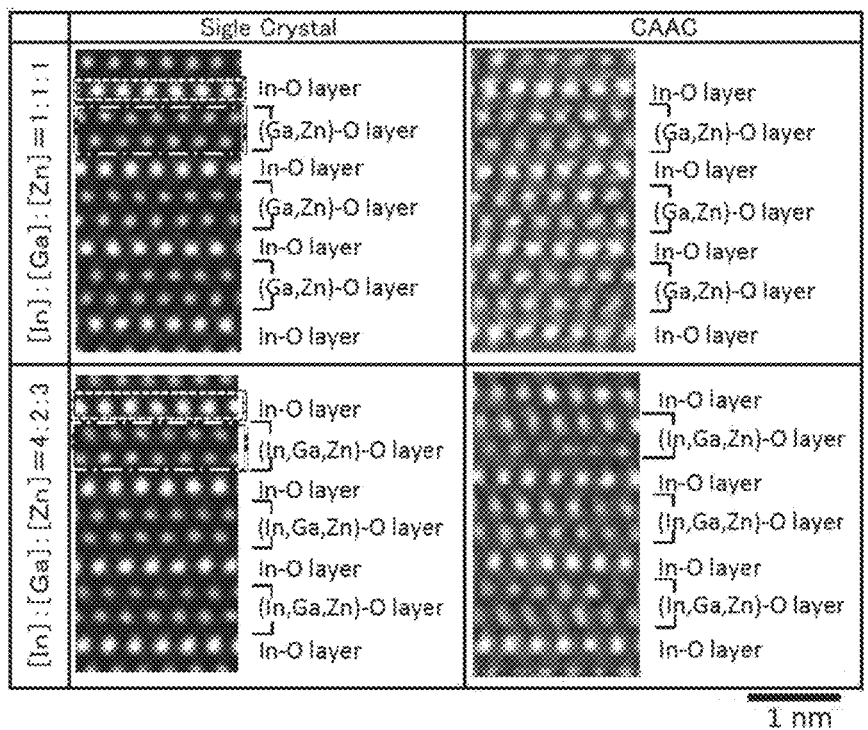
FIGS. 68A and 68B are cross-sectional TEM images and an EDX image of samples of an example.

FIG. 68A shows observation results of HAADF-STEM images of the formed samples.

In the oxide semiconductor having the CAAC structure with [In]:[Ga]: [Zn]=1:1:1, an ordered structure can be found at positions of white dots each corresponding to an atom, and formation of a layered structure similar to that of the oxide semiconductor having the single crystal structure with [In]:[Ga]:[Zn]=1:1:1 has been confirmed. Note that in the HAADF-STEM image of the oxide semiconductor having the single crystal structure with [In]:[Ga]:[Zn]=1:1:1, bright dots enclosed by a dashed line represent In and dark dots enclosed by a dashed-dotted line represent Ga or Zn.

An ordered structure at positions of white dots each corresponding to an atom can be observed also in the oxide semiconductor having the CAAC structure with [In]: [Ga]: [Zn]=4:2:3 and the oxide semiconductor having the single crystal structure with [In]:[Ga]:[Zn]=4:2:3.

In the HAADF-STEM image of the oxide semiconductor having the single crystal structure with [In]:[Ga]:[Zn]=4:2:3, the brightness spectra of a layer enclosed by a dashed line and a layer enclosed by a dashed-dotted line were integrated to compare the relative brightness levels. The results are shown in a table below.

TABLE 12

| Layer | Integrated brightness | Relative intensity |
|---|---|---|
| Layer enclosed by dashed line | 490.229 | 1.00 |
| Layer enclosed by dashed-dotted line | 218.103 | 0.44 |
| | 212.222 | 0.43 |

Here, the scattering intensity, the square of atomic elastic scattering amplitude, and the square of the atomic number in the case of high-angle scattering are in proportional relationship. This leads to the inference that In is partly substituted for Ga or Zn in the layer enclosed by the dashed-dotted line of the oxide semiconductor having the single crystal structure with [In]:[Ga]: [Zn]=4:2:3.

In view of this, the oxide semiconductor having the single crystal structure with [In]:[Ga]:[Zn]=4:2:3 was subjected to elemental analysis using SEM-EDX (energy dispersive X-ray spectroscopy). The results are shown in FIG. 68B together with the HAADF-STEM image.

Figure 68B:
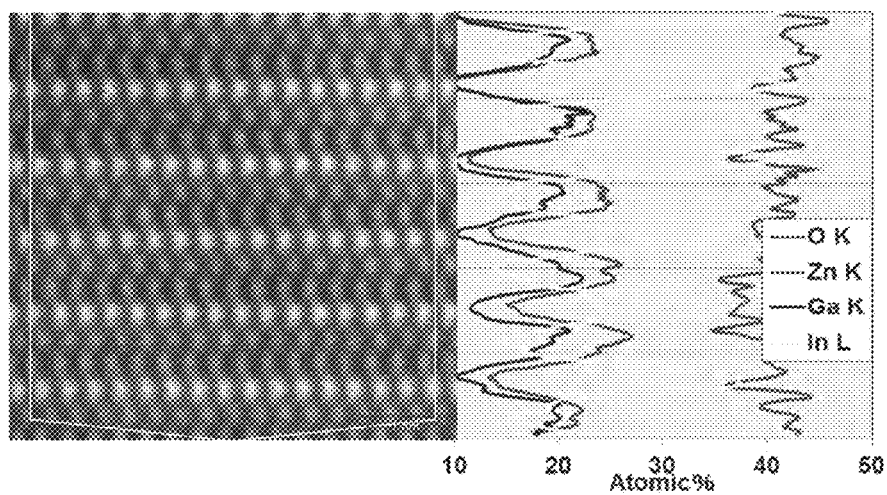

In FIG. 68B, the SEM-EDX spectrum of each layer is expressed by the atomic percent, and it has been confirmed that approximately 15% of In is detected from the layer with relatively low brightness.

<3. Mobility of Each Sample>

Next, the mobilities of the oxide semiconductor having the CAAC structure with [In]:[Ga]:[Zn]=1:1:1 and the oxide semiconductor having the CAAC structure with [In]: [Ga]: [Zn]=4:2:3 were measured to examine the influence of the atomic ratio of the oxide semiconductor on the mobility.

Figure 69A:
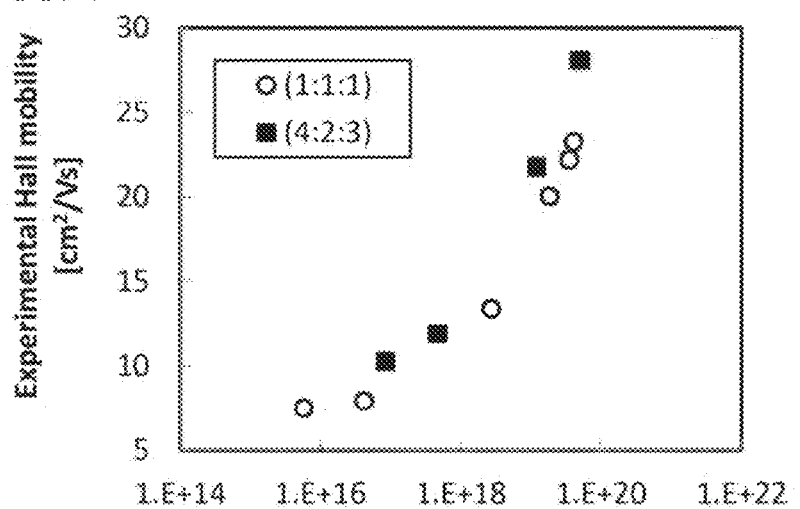
FIGS. 69A and 69B illustrate mobilities of samples of an example.

The mobility of each sample was obtained by Hall effect measurement using a Hall effect measurement system (ResiTest 8300 Series manufactured by TOYO Corporation). The results are shown in FIG. 69A.

In the case where the carrier concentration is the same, the mobility of the oxide semiconductor having the CAAC structure with [In]:[Ga]:[Zn]=4:2:3 is found to be 1.0 to 1.3 times the mobility of the oxide semiconductor having the CAAC structure with [In]:[Ga]:[Zn]=1:1:1. The difference in mobility between the oxide semiconductor having the CAAC structure with [In]:[Ga]:[Zn]=4:2:3 and the oxide semiconductor having the CAAC structure with [In]:[Ga]: [Zn]=1:1:1 is found to tend to increase as the carrier concentration increases.

Next, the influence on mobility of electron scattering due to a random potential that originates from a difference in atom-specific valence state was examined by obtaining the ratio of the electron mobility of the oxide semiconductor having the CAAC structure with [In]:[Ga]:[Zn]=4:2:3 ($\mu_{InGaZn}$) to the electron mobility of the oxide semiconductor having the CAAC structure with [In]:[Ga]:[Zn]=1:1:1 ($\mu_{GaZn}$) (this ratio is hereinafter referred to as the electron mobility ratio ($\mu_{InGaZn}/\mu_{GaZn}$)) using Formula (5).

[Formula 5]

$$\frac{\mu_{InGaZn}}{\mu_{GaZn}} = \frac{f_{Zn}f_{Ga}}{g_{In}(g_{Ga}(r_{In/Ga}-1)^2 + g_{Zn}r_{In/Ga}^2) + g_{Zn}g_{Ga}} \quad (5)$$

$$\frac{\rho_{GaZn}}{\rho_{InGaZn}}\left(\frac{\varepsilon_{InGaZn}}{\varepsilon_{GaZn}}\right)^2 \sqrt{\frac{m^*_{InGaZn}}{m^*_{GaZn}}}$$

In the formula, $\rho_{GaZn}$ is the cation number density in a (Ga,Zn)O layer, and $\rho_{InGaZn}$ is the cation number density in an (In,Ga,Zn)O layer. Note that the subscript "GaZn" means the value of the oxide semiconductor having the CAAC structure with [In]:[Ga]:[Zn]=1:1:1, and the subscript "InGaZn" means the value of the oxide semiconductor having the CAAC structure with [In]:[Ga]:[Zn]=4:2:3. In addition, c is the relative permittivity and m* is the effective mass. The subscripts "GaZn" and "InGaZn" mean being In-rich and being not In-rich, respectively. It is assumed here that the oxide semiconductor having the CAAC structure with [In]:[Ga]:[Zn]=1:1:1 and the oxide semiconductor having the CAAC structure with [In]:[Ga]:[Zn]=4:2:3 have the same values of $\rho$, $\in$, and m*.

Furthermore, $f_{Zn}$ and $f_{Ga}$ represent the atomic occupancies of Ga and Zn ions in the (Ga,Zn)O layer of the oxide semiconductor having the CAAC structure with [In]:[Ga]:[Zn]=1:1:1, and $g_{In}$, $g_{Zn}$, and $g_{Ga}$ represent the atomic occupancies of In, Ga, and Zn ions in the (In,Ga,Zn)O layer of the oxide semiconductor having the CAAC structure with [In]:[Ga]:[Zn]=4:2:3. Moreover, $\gamma_{In/Ga}$ represents the relative charge ratio of In to Ga with respect to Zn. Note that $f_{Zn}$ is equal to ½, $f_{Ga}$ is equal to ½, $g_{In}$ is equal to ⅙, $g_{Zn}$ is equal to ⅓, and $g_{Ga}$ is equal to ½.

Figure 69B:
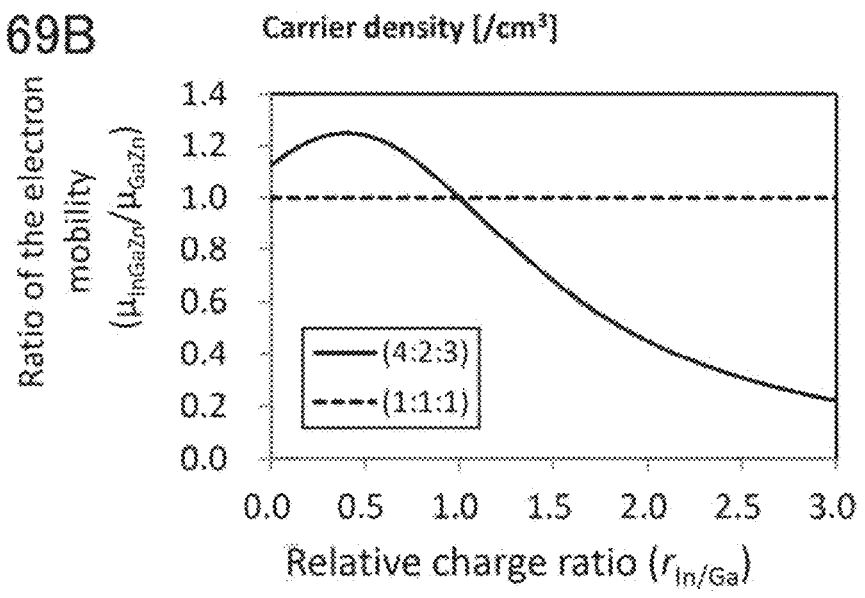

FIG. 69B shows the electron mobility ratio ($\mu_{InGaZn}/\mu_{GaZn}$) as a function of the relative charge ratio ($\gamma_{In/Ga}$). The results in FIG. 69B confirm that in the case where the relative charge ratio $\gamma_{In/Ga}$ is less than 1, the random potential originating from the difference in the valence states of Ga and Zn is reduced, and the electron mobility ratio ($\mu_{InGaZn}/\mu_{GaZn}$) ranges from 1.0 to 1.3.

The results in FIGS. 69A and 69B suggest that in the case where the relative charge ratio $\gamma_{In/Ga}$ is less than 1, the random potential originating from the difference in the valence states of Ga and Zn is reduced, and the electron mobility is improved.

The above results show that the improvement in the mobility of the oxide semiconductor having the CAAC structure with large [In] in the atomic ratio originates from a reduction in the frequency of scattering due to random potential caused by substitution of In for G or Zn in the (Ga,Zn)O layer in the CAAC structure.

The structure described above in this example can be combined with any of the structures described in the other embodiments and examples as appropriate.

EXAMPLE 3

In this example, the mobility of the oxide semiconductor of one embodiment of the present invention was evaluated. Note that four types of oxide semiconductors with different atomic ratios were formed as samples in this example.

<1. Structure and Formation Method of Samples>

As each of Samples 3A to 3D, a 100-nm-thick oxide semiconductor was deposited over a Si substrate by a sputtering method. As a deposition gas, argon (Ar) at a flow rate of 20 sccm and oxygen ($O_2$) at a flow rate of 10 sccm were used. During the deposition, the pressure in a reaction chamber was 0.4 Pa, the substrate surface temperature was 200° C., and a voltage of 200 W was applied from a DC power source.

As Sample 3A, the oxide semiconductor was formed using a target of an oxide semiconductor with [In]:[Ga]:[Zn]= 3:1:2. As Sample 3B, the oxide semiconductor was formed using a target of an oxide semiconductor with [In]:[Ga]:[Zn]=4:2:4.1. As Sample 3C, the oxide semiconductor was formed using a target of an oxide semiconductor with [In]:[Ga]:[Zn]=1:1:1. As Sample 3D, the oxide semiconductor was formed using a target of an oxide semiconductor with [In]:[Ga]:[Zn]=5:1:6.

Note that Samples 3A to 3C each have a layered structure in which one $(InO_2)^-$ layer and two $(GaZnO_2)^+$ layers are alternately stacked. Sample 3D has a layered structure in which one $(InO_2)^-$ layer and three $(GaZnO_2)^+$ layers are alternately stacked.

<2. Mobility of Each Sample>

Next, the mobilities of Samples 3A to 3D were measured to examine the influence of the atomic ratio and the crystal structure of the oxide semiconductor on the mobility.

Note that the mobility of each of Samples 3A to 3D was obtained by Hall effect measurement using a Hall effect measurement system (ResiTest 8300 Series manufactured by TOYO Corporation). The results are shown in FIG. 70A.

Figure 70A:
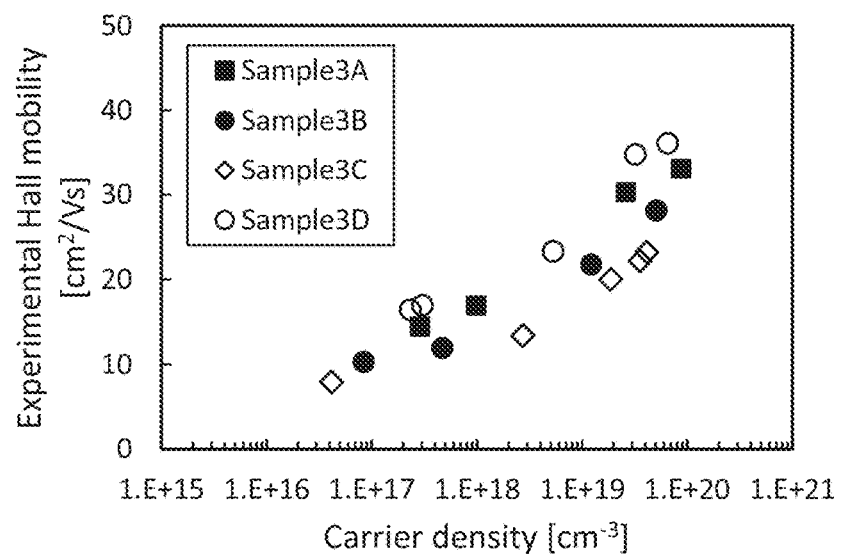
FIGS. 70A and 70B show measurement results of Hall mobilities and band diagrams of oxide semiconductors of an example.

According to FIG. 70A, as the proportion of In increases in the composition of each of Samples 3A to 3C having the same crystal structure, the mobility of the oxide semiconductor as a function of the carrier concentration is found to tend to increase.

Even when having substantially the same proportion of In in the compositions, Samples 3B and 3D with different crystal structures show different mobilities of the oxide semiconductors as a function of the carrier concentration. This is probably because an increase in the proportion of Zn causes an increase in the proportion of $(GaZnO_2)^+$ layers for every $(InO_2)^-$ layer. It is probably also because the proportions of Ga and Zn in Sample 3C are equal to each other and therefore Sample 3C has a further decreased mobility due to the random potential originating from the difference in the valence states of Ga and Zn.

<3. Energy Band Diagram of Each Sample>

Next, band gaps in Samples 3A to 3D were obtained by ellipsometry. In addition, ionization potentials in Samples 3A to 3D were obtained by ultraviolet photoelectron spectroscopy (UPS). The results are shown in FIG. 70B.

The measured band gap of Sample 3A is 2.8 eV. The measured band gap of Sample 3B is 3.0 eV. The measured band gap of Sample 3C is 3.1 eV. The measured band gap of Sample 3D is 2.7 eV.

Figure 70B:
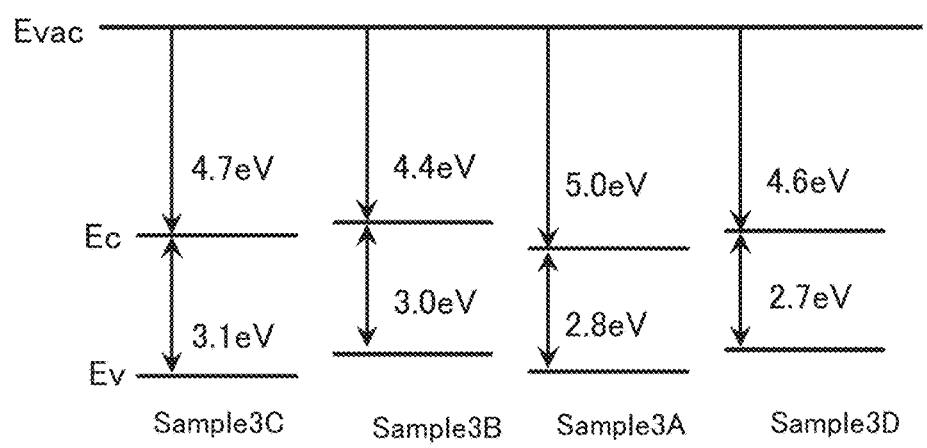

As shown in FIG. 70B, an oxide semiconductor with a smaller band gap tends to have a higher mobility.

The structure described above in this example can be combined with any of the structures described in the other embodiments and examples as appropriate.

EXAMPLE 4

In this example, transistors were formed using the oxide semiconductor of one embodiment of the present invention, and the threshold voltage and field-effect mobility of each transistor were evaluated. Note that eight types of transistors including oxide semiconductors with different atomic ratios in each of which a channel was formed were fabricated as Samples 4A to 4H in this example.

<Transistor Structure>

Figure 71A:
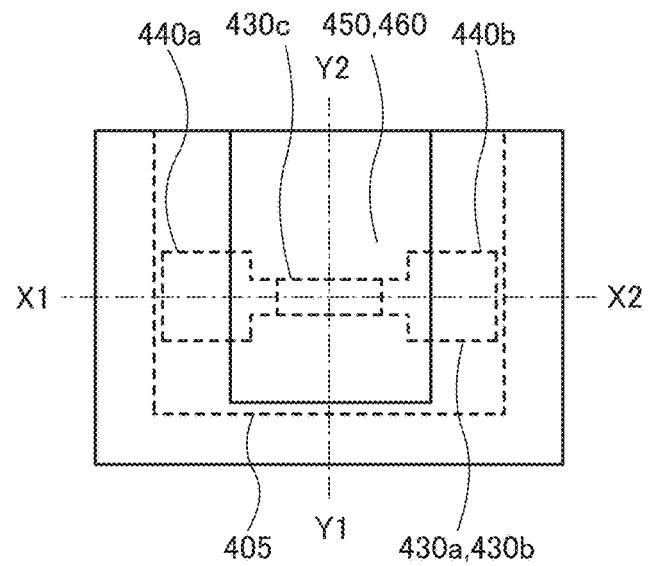
FIGS. 71A to 71C illustrate top-view and cross-sectional structures of a sample of an example.
Figure 71B:
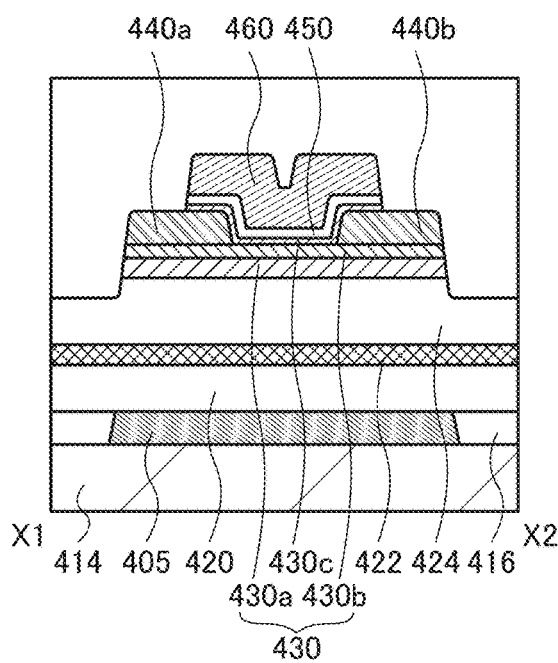
Figure 71C:
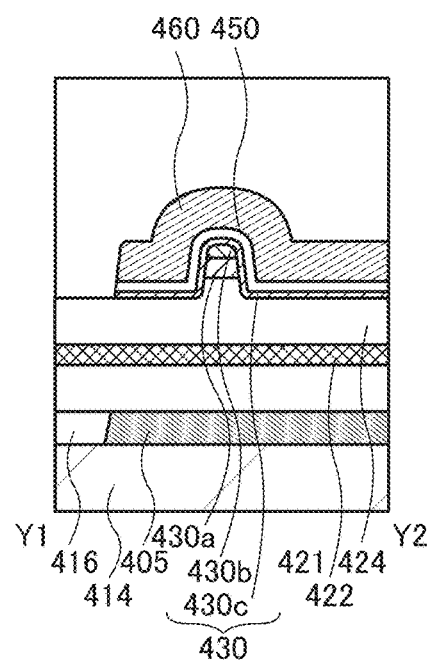

A transistor of one embodiment of the present invention is described below. FIGS. 71A to 71C are a top view and cross-sectional views of the transistor of one embodiment of the present invention. FIG. 71A is a top view. FIG. 71B is a cross-sectional view taken along dashed-dotted line X1-X2 in FIG. 71A. FIG. 71C is a cross-sectional view taken along dashed-dotted line Y1-Y2 in FIG. 71A. Furthermore, the direction of the dashed-dotted line X1-X2 may be referred to as a channel length direction, and the direction of the dashed-dotted line Y1-Y2 may be referred to as a channel width direction. Note that for simplification of the drawing, some components are not illustrated in the top view in FIG. 71A.

A transistor 400 provided over a substrate 414 includes a conductor 405 embedded in an insulator 416 and a conductor 460 which function as gate electrodes, insulators 420, 422, and 424 and an insulator 450 functioning as gate insulating layers, an oxide 430 having a region where a channel is formed, a conductor 440a functioning as one of a source and a drain, and a conductor 440b functioning as the other of the source and the drain.

The oxide 430 includes an oxide 430a, an oxide 430b over the oxide 430a, and an oxide 430c over the oxide 430b. When the transistor 400 is turned on, current flows (a channel is formed) mainly in the oxide 430b. In contrast, although a current might flow in the vicinity of the interface (a mixed region in some cases) between the oxide 430b and the oxide 430a or 430c, the rest of the oxides 430a and 430c might function as insulators.

The oxide 430 containing In, Ga, and Zn was deposited by a sputtering method for each of Samples 4A to 4H. Note that a table below shows atomic ratios of targets each used for deposition of the oxide 430 including the oxide 430a, the oxide 430b, and the oxide 430c.

TABLE 13

|  | 430 | | |
| --- | --- | --- | --- |
|  | 430a | 430b | 430c |
| Sample 4A | (1:3:2) | (3:1:2) | (1:3:4) |
| Sample 4B | (1:3:2) | (4:2:4.1) | (1:3:4) |

TABLE 13-continued

|  | 430 | | |
| --- | --- | --- | --- |
|  | 430a | 430b | 430c |
| Sample 4C | (1:3:4) | (1:1:1) | (1:3:4) |
| Sample 4D | (1:3:4) | (2:1:3) | (1:3:4) |
| Sample 4E | (1:3:2) | (1:1:1.2) | (1:3:4) |
| Sample 4F | (1:3:2) | (1:1:2) | (1:3:2) |
| Sample 4G | (1:3:4) | (1:1:1.5) | (1:3:4) |
| Sample 4H | (1:3:2) | (1:1:5) | (1:3:2) |

([In]:[Ga]:[Zn]) = (x:y:z)

Note that the channel length was 0.8 μm, and the channel width was 0.8 μm. As the insulator 450 functioning as the gate insulating film, silicon oxynitride was formed to a thickness of 20 nm.

<Field-Effect Mobility and Threshold Voltage of Each Transistor>

Figure 72A:
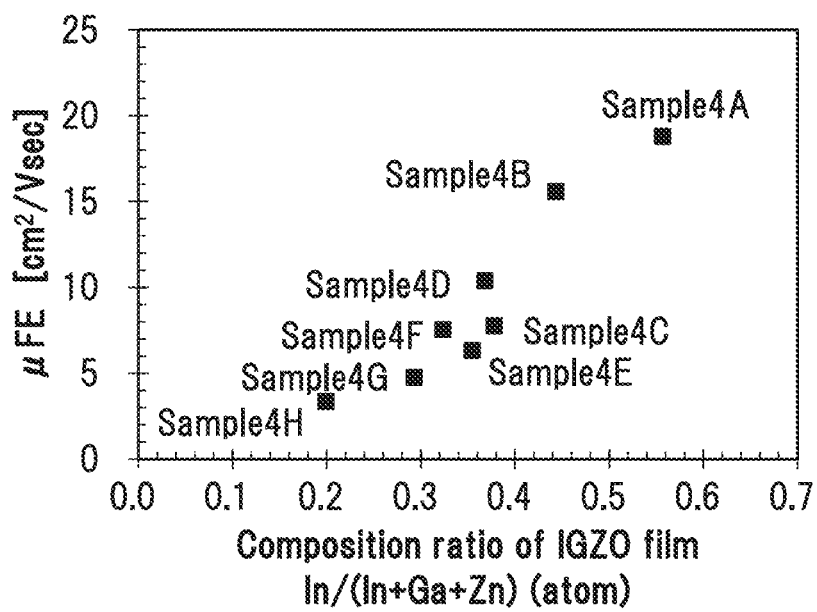
FIGS. 72A and 72B show mobilities and Shift values of samples of an example.
Figure 72B:
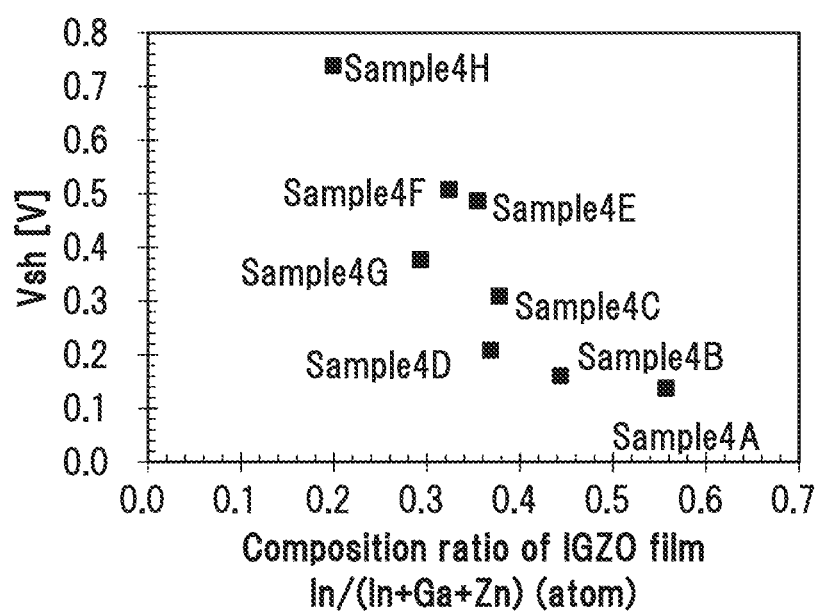

The field-effect mobilities and threshold voltages of Samples 4A to 4H were measured. The results of the field-effect mobilities are shown in FIG. 72A. The results of calculating Shift values from the threshold voltages are shown in FIG. 72B.

The threshold voltage and Shift value in this specification will be described. The threshold voltage is defined as, in the $V_g$-$I_d$ curve where the horizontal axis represents gate voltage $V_g$ [V] and the vertical axis represents the square root of drain current $I_d^{1/2}$ [A], a gate voltage at the intersection point of the line of $I_d^{1/2}$=0 ($V_g$ axis) and the tangent to the curve at a point where the slope of the curve is the steepest.

The gate voltage at the rising of drain current in $I_d$-$V_g$ characteristics is referred to as Shift. Furthermore, Shift in this specification is defined as, in the $V_g$-$I_d$ curve where the horizontal axis represents the gate voltage $V_g$ [V] and the vertical axis represents the logarithm of the drain current $I_d$ [A], a gate voltage at the intersection point of the line of $I_d$=1.0×10$^{-12}$ [A] and the tangent to the curve at a point where the slope of the curve is the steepest.

FIG. 72A shows that an increase of [In] in the oxide 430b tends to lead to an increase in field-effect mobility. In contrast, FIG. 72B shows the increase of [In] tends to cause a negative shift of threshold voltage (into normally-on characteristics).

The above results show that an increase of [In] in the atomic ratio in the oxide semiconductor containing In, Ga, and Zn leads to an improvement in field-effect mobility.

The structure described above in this example can be combined with any of the structures described in the other embodiments and examples as appropriate.

EXAMPLE 5

In this example, the crystallinity and composition of the oxide semiconductor of one embodiment of the present invention were evaluated. Note that Samples 5A to 5F were fabricated in this example.

First, Samples 5A to 5C fabricated in this example will be described.

Samples 5A to 5C are each a solid obtained by mixing and baking raw materials. Note that an oxide semiconductor with [In]:[Ga]:[Zn]=1:1:1 was formed as Sample 5A. An oxide semiconductor with [In]:[Ga]:[Zn]=1:1:2 was formed as Sample 5B. An oxide semiconductor with [In]:[Ga]:[Zn]=1:1:1.5 was formed as Sample 5C.

A method for forming Samples 5A to 5C is as follows. First, $In_2O_3$, $Ga_2O_3$, and ZnO used as raw materials were mixed at a predetermined ratio using a container and a ball made of zirconia. Note that the purities of the above raw materials $In_2O_3$, $Ga_2O_3$, and ZnO were 4N (99.99%), 3N (99.9%), and 5N (99.999%), respectively. Next, the mixture was put in an alumina crucible and then baked at 1250° C. to obtain a solid. Thus, Samples 5A to 5C were formed.

Next, Samples 5D to 5F formed in this example will be described.

Sample 5D has a structure in which a 100-nm-thick oxide semiconductor was deposited over a Si substrate. Samples 5E and 5F have a structure in which a 100-nm-thick oxide semiconductor was deposited over a quartz substrate. A sputtering method was used as a method for forming Samples 5D to 5F.

For Sample 5D, oxygen at a flow rate of 30 sccm ($O_2$=100%) was supplied as a sputtering gas to a treatment chamber of a sputtering apparatus. In addition, during the deposition for Sample 5D, the pressure in the treatment chamber was controlled to 0.4 Pa, and a DC power of 0.2 kW was supplied. The substrate temperature for the deposition of the oxide semiconductor was set to 300° C.

Note that a target having a composition with [In]:[Ga]:[Zn]=1:1:1.5 was used for Sample 5D.

For Samples 5E and 5F, oxygen at a flow rate of 24 sccm and argon at a flow rate of 8 sccm ($O_2$=75% and Ar=25%) were supplied as a sputtering gas to a treatment chamber of a sputtering apparatus. In addition, during the deposition for Samples 5E and 5F, the pressure in the treatment chamber was controlled to 0.4 Pa, and a DC power of 0.2 kW was supplied. The substrate temperature for deposition of the oxide semiconductor was set to 300° C. After that, for Sample 5E, heat treatment was performed at a substrate temperature of 600° C. for one hour in an atmosphere of $N_2$:$O_2$=4:1.

A target having a composition with [In]:[Ga]:[Zn]=1:1:2 was used for Sample 5E. A target having a composition with [In]:[Ga]:[Zn]=1:1:1 was used for Sample 5F.

The concentrations of the elements in the oxide semiconductor deposited as Sample 5F were measured by inductively coupled plasma mass spectrometry (ICP-MS). The result was [In]:[Ga]:[Zn]=1.00:0.99:0.56. This means that when an oxide semiconductor is deposited by a sputtering method, the atomic ratio of Zn in the deposited oxide semiconductor is lower than that in a target used for the deposition.

Figure 73A:
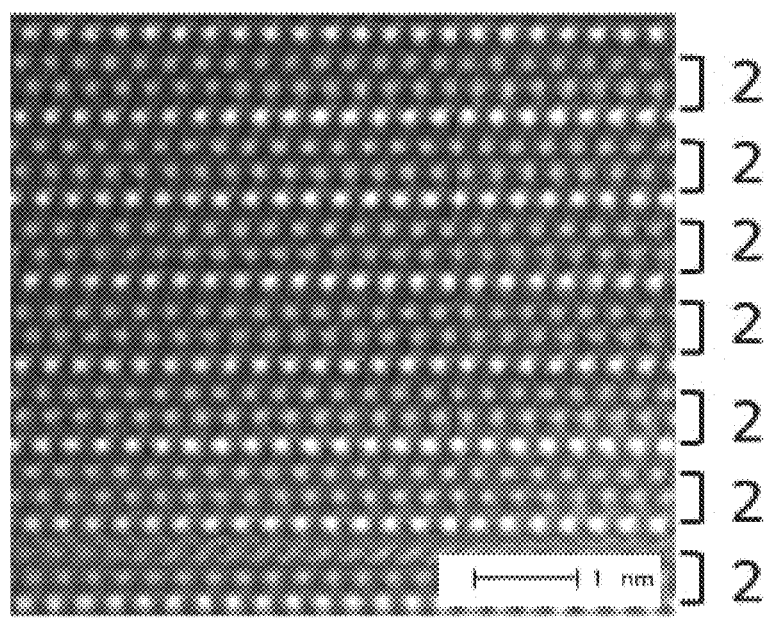
FIGS. 73A and 73B are cross-sectional TEM images of samples of an example.
Figure 73B:
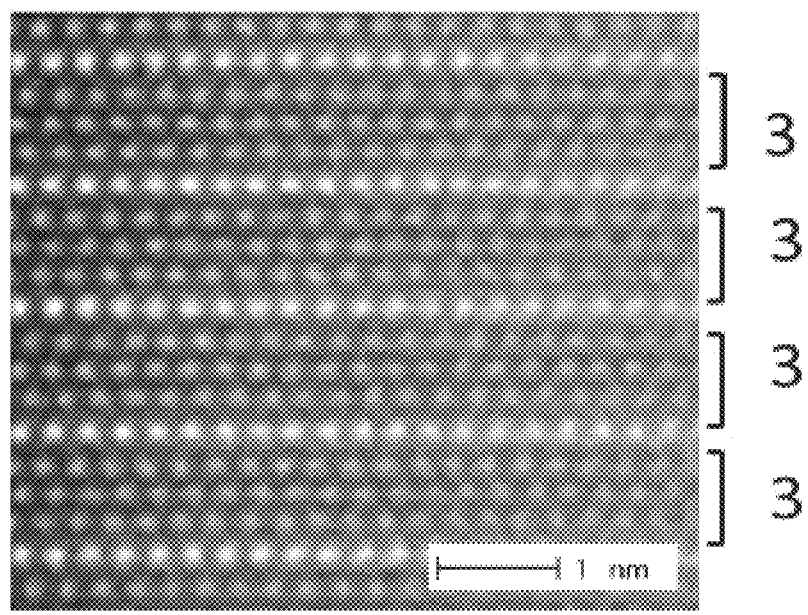
Figure 74A:
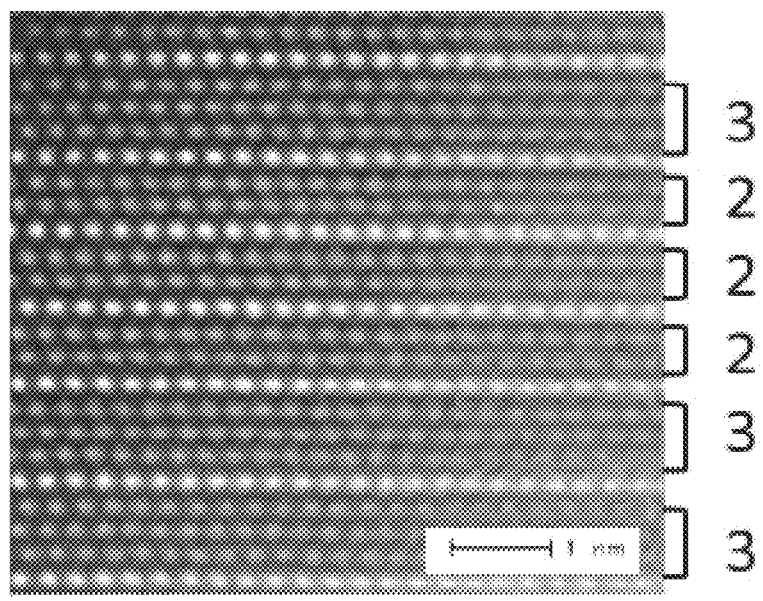
FIGS. 74A and 74B are cross-sectional TEM images of a sample of an example.
Figure 74B:
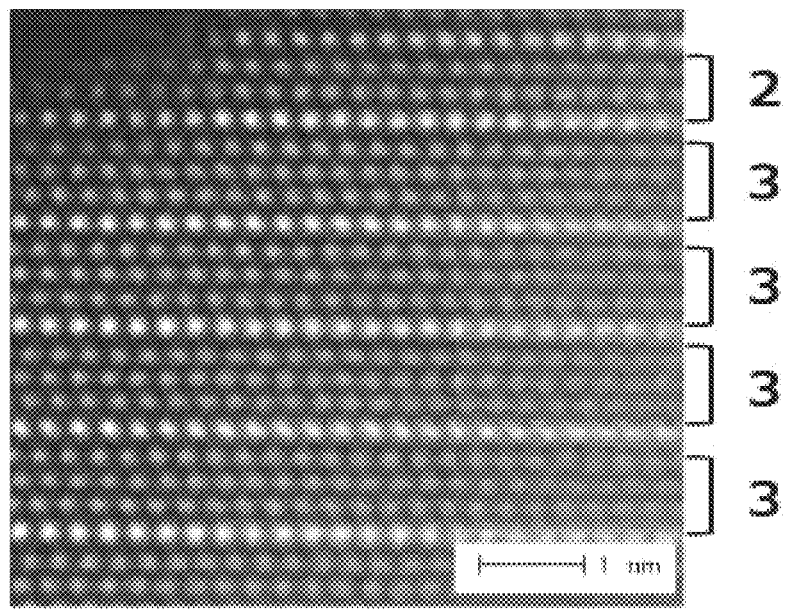
Figure 75A:
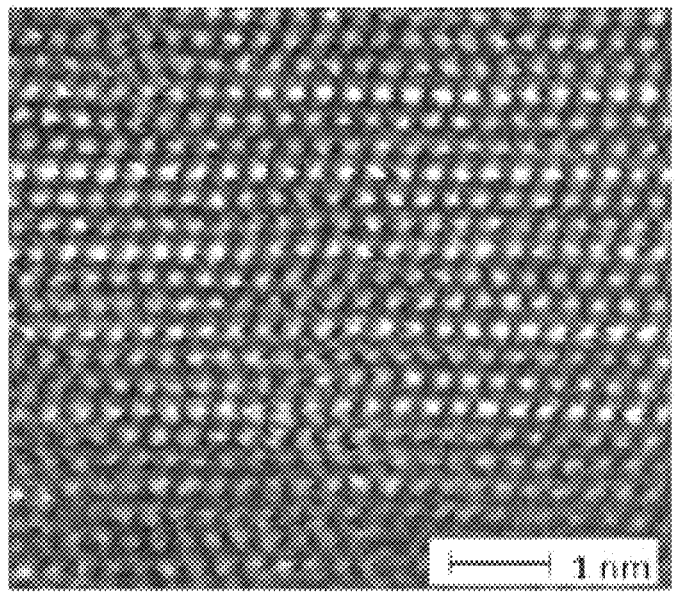
FIGS. 75A and 75B are cross-sectional TEM images of samples of an example.
Figure 75B:
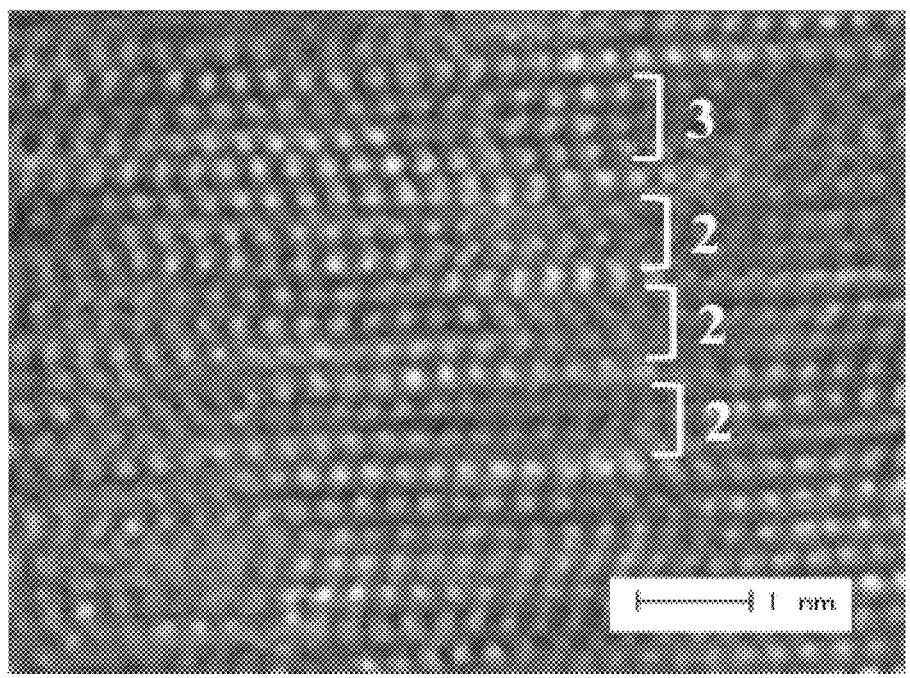

Then, HAADF-STEM images of Samples 5A to 5E fabricated in the above manner were observed. FIG. 73A shows a cross-sectional image of Sample 5A. FIG. 73B shows a cross-sectional image of Sample 5B. FIGS. 74A and 74B show cross-sectional images of Sample 5C. FIG. 75A shows a cross-sectional image of Sample 5D. FIG. 75B shows a cross-sectional image of Sample 5E.

In FIGS. 73A, 73B, 74A, 74B, 75A, and 75B, an ordered structure can be found at positions of white dots each corresponding to an atom, and formation of a layered structure has been confirmed. Note that bright dots represent In and dark dots represent Ga or Zn in HAADF-STEM images.

Sample 5A in FIG. 73A is confirmed to have a layered structure in which the number of (Ga,Zn)—O layers between In—O layers is two. Sample 5B in FIG. 73B is confirmed to have a layered structure in which the number of (Ga,Zn)—O layers between In—O layers is three.

Sample 5C in FIGS. 74A and 74B is confirmed to have a mixed layered structure in which the number of (Ga,Zn)—O layers between In—O layers is two in some portions and is three in the other portions.

Also in FIGS. 75A and 75B, a stacked structure including $(InO_2)^-$ layers with high brightness and $(In_xGa_{1-x}ZnO_2)^+$ layers with low brightness has been confirmed. Thus, Samples 5D and 5E have been confirmed to have a layered structure similar to that of $InGaZnO_4$, thought they have different compositions.

Sample 5D in FIG. 75A is also confirmed to have a layered structure in which the number of (Ga,Zn)—O layers between In—O layers is two. Sample 5E in FIG. 75B is confirmed to have a mixed layered structure in which the number of (Ga,Zn)—O layers between In—O layers is two in some portions and is three in the other portions.

Therefore, $(InGaO_3)_n(ZnO)_m$ is found to have a layered crystal structure even when m/n in the compositional formula is not strictly an integer.

Figure 76A:
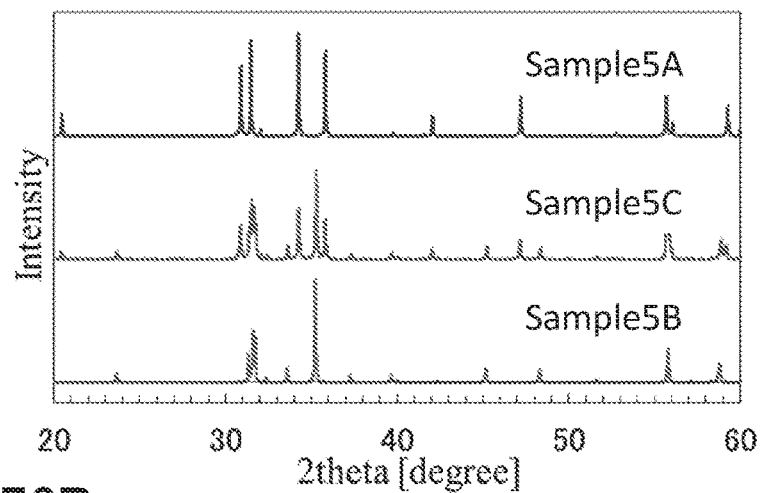
FIGS. 76A to 76C show XRD results of samples of an example.
Figure 76B:
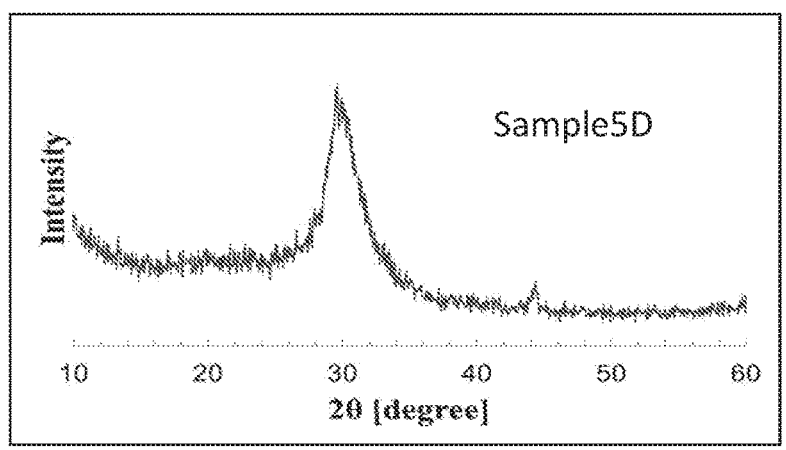
Figure 76C:
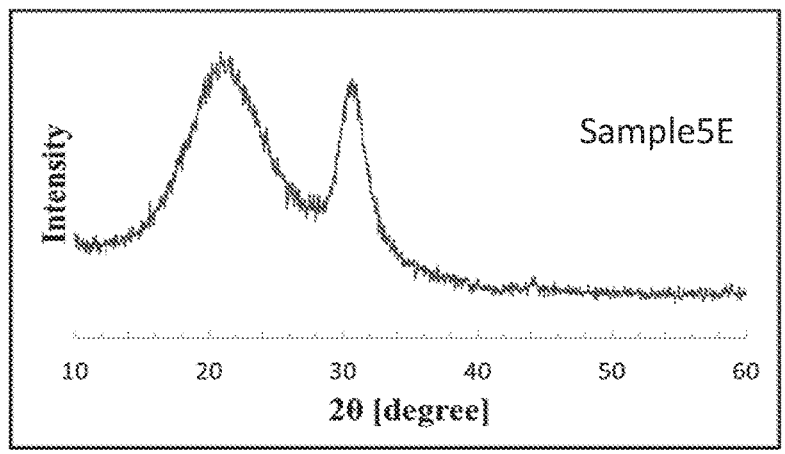

Next, the crystallinities of Samples 5A to 5E were evaluated by XRD measurement. FIG. 76A shows the XRD measurement results of Samples 5A to 5C. FIG. 76B shows the XRD measurement results of Sample 5D. FIG. 76C shows the XRD measurement results of Sample 5E. For the XRD measurement in FIG. 76A, an X-ray diffractometer, D8 ADVANCE, manufactured by Bruker AXS was used. For the XRD measurement in FIGS. 76B and 76C, a multifunction thin film material evaluation X-ray diffractometer, D8 DISCOVER Hybrid, manufactured by Bruker AXS was used. The XRD measurement results shown in FIGS. 76A to 76C are results of analysis by an out-of-plane method.

As shown in FIG. 76A, Sample 5A exhibits a crystallinity peak derived from $InGaZnO_4$. Sample 5B exhibits a crystallinity peak derived from $InGaZn_2O_5$. In FIG. 76A, the middle row corresponding to Sample 5C shows both the crystallinity peak derived from $InGaZnO_4$ and the crystallinity peak derived from $InGaZn_2O_5$.

As shown in FIGS. 76B and 76C, each of Samples 5D and 5E exhibits a peak indicating crystallinity at around $2\theta=31°$. This peak at around $2\theta=31°$ is derived from the (009) plane of the $InGaZnO_4$ crystal, which indicates that crystals in the oxide semiconductor in each sample have c-axis alignment, and that the c-axes are aligned in a direction substantially perpendicular to the formation surface or the top surface of the oxide semiconductor. Therefore, it is indicated that crystals in the oxide semiconductor in each of Samples 5D and 5E have c-axis alignment, and that the c-axes are aligned in a direction substantially perpendicular to the formation surface or the top surface of the oxide semiconductor.

The structure described above in this example can be combined with any of the structures described in the other embodiments and examples as appropriate.

EXPLANATION OF REFERENCE

10: region, 11: region, 12: region, 13: region, 14: region, 15: region, 16: region, 17: region, 18: region, 19: region, 21: perpendicular line, 22: perpendicular line, 23: perpendicular line, 100: substrate, 106: oxide, 170: X-ray source, 172: detection unit, 200: transistor, 202: substrate, 204: conductive film, 206: insulating film, 207: insulating film, 208: oxide, 208a: oxide, 208b: oxide, 208c: oxide, 212: conductive film, 212a: conductive film, 212b: conductive film, 214: insulating film, 216: insulating film, 218: insulating film, 220a: conductive film, 220b: conductive film, 230: barrier film, 240: oxygen, 250: transistor, 251a: opening, 251b: opening, 252a: opening, 252b: opening, 252c: opening, 260: transistor, 270: transistor, 270A: transistor, 270B: transistor, 300: target, 300a: target, 300b: target, 301: deposition chamber, 310: backing plate, 310a: backing plate, 310b: backing plate, 320: target holder, 320a: target holder, 320b: target holder, 322: target shield, 323: target shield, 330: magnet unit, 330a: magnet unit, 330b: magnet unit, 330N: magnet, 330N1: magnet, 330N2: magnet, 330S: magnet, 332: magnet holder, 340: plasma, 342: member, 360: substrate, 370: substrate holder, 380a: magnetic line of force, 380b: magnetic line of force, 390: power source, 391: power source, 400: transistor, 405: conductor, 414: substrate, 416: insulator, 420: insulator, 422: insulator, 424: insulator, 430: oxide, 430a: oxide, 430b: oxide, 430c: oxide, 440a: conductor, 440b: conductor, 450: insulator, 460: conductor, 500: model, 502: model, 510: region, 520: model, 700: substrate, 701: insulator, 702: insulator, 703: semiconductor, 704: conductor, 705: conductor, 706: insulator, 707a: conductor, 707b: conductor, 710: insulator, 714a: conductor, 714b: insulator, 714c: conductor, 719: light-emitting element, 720: insulator, 721: insulator, 731: terminal, 732: FPC, 733a: wiring, 734: sealant, 735: driver circuit, 736: driver circuit, 737: pixel, 741: transistor, 742: capacitor, 743: switching element, 744: signal line, 750: substrate, 751: transistor, 752: capacitor, 753: liquid crystal element, 754: scan line, 755: signal line, 781: conductor, 782: light-emitting layer, 783: conductor, 784: partition wall, 791: conductor, 792: insulator, 793: liquid crystal layer, 794: insulator, 795: spacer, 796: conductor, 797: substrate, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for refrigerator, 933: door for freezer, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 1300: crystal structure, 1302: crystal structure, 1304: crystal structure, 1310: local structure, 1312: local structure, 1314: local structure, 1316: local structure, 1318: local structure, 1320: local structure, 1322: local structure, 1324: local structure, 1326: local structure, 1328: local structure, 2400: pellet, 2401: ion, 2402: lateral growth portion, 2403: atomic particle, 2410: backing plate, 2420: substrate, 2430: target, 2450: magnet, 2700: deposition apparatus, 2701: atmosphere-side substrate supply chamber, 2702: atmosphere-side substrate transfer chamber, 2703a: load lock chamber, 2703b: unload lock chamber, 2704: transfer chamber, 2705: substrate heating chamber, 2706a: deposition chamber, 2706b: deposition chamber, 2706c: deposition chamber, 2751: cryotrap, 2752: stage, 2761: cassette port, 2762: alignment port, 2763: transfer robot, 2764: gate valve, 2765: heating stage, 2766: target, 2766a: target, 2766b: target, 2767: target shield, 2767a: target shield, 2767b: target shield, 2768: substrate holder, 2769: substrate, 2770: vacuum pump, 2771: cryopump, 2772: turbo molecular pump, 2780: mass flow controller, 2781: refiner, 2782: gas heating mechanism, 2784: adjustment member, 2790a: magnet unit, 2790b: magnet unit, 2791: power source, 3001: wiring, 3002: wiring, 3003: wiring, 3004: wiring, 3005: wiring, 3200: transistor, 3300: transistor, and 3400: capacitor.

This application is based on Japanese Patent Application serial no. 2015-168931 filed with Japan Patent Office on Aug. 28, 2015, Japanese Patent Application serial no. 2015-256922 filed with Japan Patent Office on Dec. 28, 2015, Japanese Patent Application serial no. 2016-040237 filed with Japan Patent Office on Mar. 2, 2016, and Japanese Patent Application serial no. 2016-055215 filed with Japan Patent Office on Mar. 18, 2016, the entire contents of which are hereby incorporated by reference.

The invention claimed is:

1. An oxide semiconductor film comprising In, an element M, and Zn,
   wherein the element M represents aluminum, gallium, yttrium, or tin,
   wherein an atomic ratio of the In to the element M and the Zn in the oxide semiconductor film is $(1+\alpha):(1-\alpha):\beta$ (where $-1 \leq \alpha \leq 1$ and $\beta$ is a positive real number or a positive non-integer) or a neighborhood thereof, and
   wherein, when $1 \geq \alpha > 0$, the oxide semiconductor film has a layered crystal structure in which one $(InO_2)^-$ layer and two $(In_\gamma Ga_{1-\gamma} ZnO_2)^+$ layers are alternately stacked.

2. The oxide semiconductor film according to claim 1, wherein the oxide semiconductor film includes a nanocrystal.

3. A transistor comprising the oxide semiconductor film according to claim 1.

4. The oxide semiconductor film according to claim 1, wherein the atomic ratio of the In to the element M and the Zn is $(1+\alpha):(1-\alpha):3$, $(1+\alpha):(1-\alpha):4$, $(1+\alpha):(1-\alpha):5$, or a neighborhood thereof.

5. The oxide semiconductor film according to claim 1, wherein the oxide semiconductor film includes a crystal whose c-axis is aligned in a direction substantially perpendicular to a formation surface or a top surface of the oxide semiconductor film.

6. An oxide semiconductor film comprising In, an element M, and Zn,
   wherein the element M represents aluminum, gallium, yttrium, or tin,
   wherein an atomic ratio of the In to the element M and the Zn in the oxide semiconductor film is $(1+\alpha):(1-\alpha):\beta$ (where $-1 \leq \alpha \leq 1$ and $\beta$ is a positive real number or a positive non-integer) or a neighborhood thereof, and
   wherein, when $0 > \alpha \geq -1$, the oxide semiconductor film has a layered crystal structure in which one $(In_{1-\gamma} Ga_\gamma O_2)^-$ layer and two $(GaZnO_2)^+$ layers are alternately stacked.

7. The oxide semiconductor film according to claim 6, wherein the oxide semiconductor film includes a nanocrystal.

8. A transistor comprising the oxide semiconductor film according to claim 6.

9. The oxide semiconductor film according to claim 6, wherein the atomic ratio of the In to the element M and the Zn is $(1+\alpha):(1-\alpha):3$, $(1+\alpha):(1-\alpha):4$, $(1+\alpha):(1-\alpha):5$, or a neighborhood thereof.

10. The oxide semiconductor film according to claim 6, wherein the oxide semiconductor film includes a crystal whose c-axis is aligned in a direction substantially perpendicular to a formation surface or a top surface of the oxide semiconductor film.

11. An oxide semiconductor film comprising In, an element M, and Zn,
    wherein the element M represents aluminum, gallium, yttrium, or tin,
    wherein an atomic ratio of the In to the element M and the Zn in the oxide semiconductor film is $(1+\alpha):(1-\alpha):\beta$ (where $-1 \leq \alpha \leq 1$ and $\beta$ is a positive real number or a positive non-integer) or a neighborhood thereof,
    wherein, when $\alpha=0$, the oxide semiconductor film has a layered crystal structure in which one $(InO_2)^-$ layer and two $(GaZnO_2)^+$ layers are alternately stacked,
    wherein, when $1 \geq \alpha > 0$, the oxide semiconductor film has a layered crystal structure in which one $(InO_2)^-$ layer and two $(In_\gamma Ga_{1-\gamma} ZnO_2)^+$ layers are alternately stacked, and
    wherein, when $0 > \alpha \geq -1$, the oxide semiconductor film has a layered crystal structure in which one $(In_{1-\gamma} Ga_\gamma O_2)^-$ layer and two $(GaZnO_2)^+$ layers are alternately stacked.

12. The oxide semiconductor film according to claim 11, wherein the oxide semiconductor film includes a nanocrystal.

13. A transistor comprising the oxide semiconductor film according to claim 11.

14. The oxide semiconductor film according to claim 11, wherein the atomic ratio of the In to the element M and the Zn is $(1+\alpha):(1-\alpha):3$, $(1+\alpha):(1-\alpha):4$, $(1+\alpha):(1-\alpha):5$, or a neighborhood thereof.

15. The oxide semiconductor film according to claim 11, wherein the oxide semiconductor film includes a crystal whose c-axis is aligned in a direction substantially perpendicular to a formation surface or a top surface of the oxide semiconductor film.

* * * * *